US012741981B2

(12) United States Patent
Yan et al.

(10) Patent No.: US 12,741,981 B2
(45) Date of Patent: Sep. 22, 2026

(54) METAL COMPLEX AND USE THEREOF

(71) Applicant: GUANGDONG AGLAIA OPTOELECTRONIC MATERIALS CO., LTD, Foshan (CN)

(72) Inventors: Liangliang Yan, Foshan (CN); Lei Dai, Foshan (CN); Lifei Cai, Foshan (CN)

(73) Assignee: GUANGDONG AGLAIA OPTOELECTRONIC MATERIALS CO., LTD, Foshan (CN)

( * ) Notice: Subject to any disclaimer, the term of this patent is extended or adjusted under 35 U.S.C. 154(b) by 961 days.

(21) Appl. No.: 17/927,330

(22) PCT Filed: May 9, 2021

(86) PCT No.: PCT/CN2021/092525
§ 371 (c)(1),
(2) Date: Nov. 22, 2022

(87) PCT Pub. No.: WO2021/244222
PCT Pub. Date: Dec. 9, 2021

(65) Prior Publication Data

US 2023/0295204 A1 Sep. 21, 2023

(30) Foreign Application Priority Data

Jun. 3, 2020 (CN) ......................... 202010494128.3

(51) Int. Cl.

| | |
|---|---|
| *H01L 51/50* | (2006.01) |
| *C07F 15/00* | (2006.01) |
| *H10K 50/15* | (2023.01) |
| *H10K 59/70* | (2023.01) |

(52) U.S. Cl.
CPC ......... *C07F 15/0033* (2013.01); *H10K 50/15* (2023.02); *H10K 59/70* (2023.02)

(58) Field of Classification Search
None
See application file for complete search history.

(56) References Cited

U.S. PATENT DOCUMENTS

| | | | | |
|---|---|---|---|---|
| 2015/0090981 | A1 | 4/2015 | Xia | |
| 2015/0315222 | A1 * | 11/2015 | Boudreault | ........ C07D 491/048 546/4 |
| 2016/0380216 | A1 | 12/2016 | Tsai | |
| 2017/0084849 | A1 | 3/2017 | Tsai | |

FOREIGN PATENT DOCUMENTS

| | | | |
|---|---|---|---|
| CN | 106459114 | A | 2/2017 |
| CN | 107973823 | | 5/2018 |
| CN | 109721628 | | 5/2019 |
| CN | 111620910 | A | 9/2020 |
| WO | 2012158851 | A1 | 11/2021 |

* cited by examiner

*Primary Examiner* — Gregory D Clark
(74) *Attorney, Agent, or Firm* — Maschoff Brennan

(57) ABSTRACT

The present invention relates to a metal complex and application thereof. The metal complex has a general formula of Ir(La)(Lb)(Lc), and includes a structure as shown in the following formula (1) as a ligand La. The metal complex provided in the present invention has the advantages of high optical and electrical stability, high luminescence efficiency, long service life, and high color saturation, and can be used in organic light-emitting devices. In particular, the metal complex has the potential for application in the AMOLED industry as a red light-emitting phosphorescent material.

Formula (1)

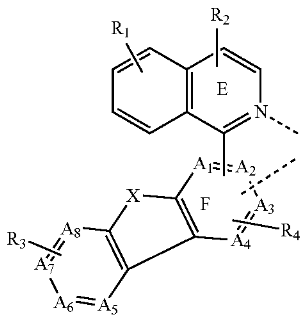

12 Claims, No Drawings

METAL COMPLEX AND USE THEREOF

TECHNICAL FIELD

The present invention relates to the technical field of organic electroluminescence, in particular to an organic light-emitting material applicable to organic electroluminescent devices, and specially in particular to a metal complex and application thereof in an organic electroluminescent device.

BACKGROUND

At present, as a new-generation display technology, an organic electroluminescent device (OLED) has attracted more and more attention in display and lighting technologies, thus having a wide application prospect. However, compared with market application requirements, properties, such as luminescence efficiency, driving voltage, and service life of OLED devices still need to be strengthened and improved.

In generally, the OLED devices include various organic functional material films with different functions between metal electrodes as basic structures, which are similar to sandwich structures. Under the driving of a current, holes and electrons are injected from a cathode and an anode, respectively. After moving a certain distance, the holes and the electrons are compounded in a light-emitting layer, and then released in the form of light or heat to achieve luminescence of the OLED.

However, organic functional materials are core components of the OLED devices, and the thermal stability, photochemical stability, electrochemical stability, quantum yield, film forming stability, crystallinity, and color saturation of the materials are main factors affecting properties of the devices. In general, the organic functional materials include fluorescent materials and phosphorescent materials. The fluorescent materials are usually organic small-molecule materials, which can only use 25% of singlet luminescence, thus having low luminescence efficiency. Meanwhile, due to a spin-orbit coupling effect caused by a heavy atom effect, the phosphorescent materials can use 25% of a singlet state, and can also use 75% of energy of a triplet exciton, so that the luminescence efficiency can be improved. However, compared with the fluorescent materials, the phosphorescent materials are started later, and the thermal stability, service life, and color saturation of the materials need to be improved. Thus, the phosphorescent materials are a challenging topic. Various organometallic compounds have been developed to serve as the phosphorescent materials. For example, according to an invention patent document CN107973823, a quinoline iridium compound is disclosed. However, the color saturation and device properties, especially luminescence efficiency and device service life, of the compound need to be improved. According to an invention patent document CN106459114, an iridium compound coordinated with a β-dione coordination group is disclosed. However, the compound has high sublimation temperature and low color saturation. In particular, the device performance is unsatisfactory, which needs to be further improved. According to an invention patent CN109721628, a compound with a fluorenyl thiophenpyrimidine structure and an organic electroluminescent device and compound including the above compound are disclosed.

However, a novel material capable of further improving properties of organic electroluminescent devices is still expected to be developed.

SUMMARY

Objectives of the present invention are to provide an organic electroluminescent device with high properties and to provide a novel material capable of realizing the organic electroluminescent device.

In order to achieve the above objectives, the inventor has conducted in-depth studies repeatedly and found that an organic electroluminescent device with high properties can be obtained by using a metal complex including a structure as shown in the following formula (1) as a ligand.

One of the objectives of the present invention is to provide a metal complex. The metal complex has the advantages of high optical and electrochemical stability, high color saturation, high luminescence efficiency, and long service life, and can be used in organic electroluminescent devices. In particular, the metal complex has the potential for application in the OLED industry as a red light-emitting dopant.

A metal complex has a general formula of Ir(La)(Lb)(Lc), and includes a ligand La as shown in the following formula (1), Formula (1)

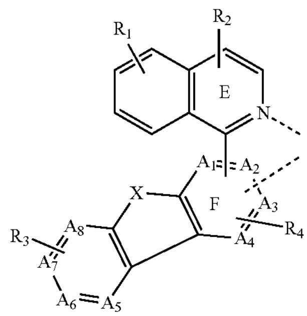

where among $A_1$-$A_4$, one group is a C—C bond connected to an E ring, one group is a C-metal bond connected to a metal, one group is $CR_4$, and the other group is $CR_0$ or N; among $A_5$-$A_8$, one group is $CR_3$, and the other three groups independently refer to $CR_0$ or N;

the number of R1-R2 is a maximum substitution number;

$R_0$-$R_4$ are independently selected from hydrogen, deuterium, halogen, substituted or unsubstituted $C_1$-$C_{10}$ alkyl, substituted or unsubstituted $C_3$-$C_{20}$ cycloalkyl, substituted or unsubstituted $C_1$-$C_{10}$ heteroalkyl, substituted or unsubstituted C7-$C_{30}$ aralkyl, substituted or unsubstituted $C_1$-$C_{10}$ alkoxy, substituted or unsubstituted $C_6$-$C_{30}$ aryloxy, substituted or unsubstituted $C_2$-$C_{20}$ alkenyl, substituted or unsubstituted $C_3$-$C_{30}$ silyl, substituted or unsubstituted $C_6$-$C_{30}$ aryl, substituted or unsubstituted $C_3$-$C_{30}$ heteroaryl, substituted or unsubstituted $C_3$-$C_{30}$ arylsilyl, substituted or unsubstituted $C_0$-$C_{20}$ amino, cyano, nitrile, isonitrile, and phosphino; at least one of $R_3$ and $R_4$ is not hydrogen; when $A_7$ is $CR_0$, $R_0$ is not F;

X is independently selected from O, S, Se, $C(R)_2$, $Si(R)_2$, NR, BR, and POR; the R is independently selected from substituted or unsubstituted $C_1$-$C_{10}$ alkyl or alkoxy, substituted or unsubstituted $C_2$-$C_{30}$ cycloalkyl, substituted or unsubstituted $C_6$-$C_{30}$ aryl, and substituted or unsubstituted $C_1$-$C_{18}$ heteroaryl;

the "substituted" refers to substitution with deuterium, F, Cl, Br, C1-$C_4$ alkyl, C1-$C_4$ alkoxy, C3-$C_6$ cycloalkyl, amino substituted with C1-$C_4$ alkyl, cyano, nitrile, isonitrile, and phosphino;

a heteroatom in the heteroalkyl or heteroaryl is at least one of S, O, and N;

a dotted line refers to a bond connected to metal iridium;

La, Lb, and Lc are different from each other, and any two of the three groups are connected to form a multidentate ligand, or the three groups are connected by a group; both the Lb and the Lc are a monoanionic bidentate ligand;

and the "different from each other" refers to having different parent nucleus structures, having a same parent nucleus structure with different substituents, or having a same parent nucleus structure with a same substituent at different positions.

Preferably, the metal complex has a structure as shown in the following formula (2):

Formula (2)

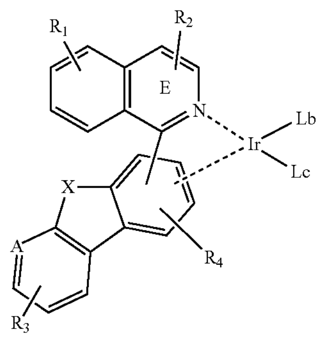

where the A is $CR_0$ or N; the $R_0$-$R_4$ are independently selected from hydrogen, deuterium, halogen, substituted or unsubstituted $C_1$-$C_{10}$ alkyl, substituted or unsubstituted $C_3$-$C_{20}$ cycloalkyl, substituted or unsubstituted $C_1$-$C_{10}$ heteroalkyl, substituted or unsubstituted $C_7$-$C_{30}$ aralkyl, substituted or unsubstituted $C_1$-$C_{10}$ alkoxy, substituted or unsubstituted $C_6$-$C_{30}$ aryloxy, substituted or unsubstituted $C_2$-$C_{20}$ alkenyl, substituted or unsubstituted $C_3$-$C_{30}$ silyl, substituted or unsubstituted $C_6$-$C_{30}$ aryl, substituted or unsubstituted $C_3$-$C_{30}$ heteroaryl, substituted or unsubstituted $C_3$-$C_{30}$ arylsilyl, substituted or unsubstituted $C_0$-$C_{20}$ amino, cyano, nitrile, isonitrile, and phosphino; at least one of the $R_3$ and the $R_4$ is not hydrogen;

and the X, the Lb, and the Lc are defined the same as above.

More preferably, the A is CH or N.

More preferably, the A is N, and the $R_3$ substituent is located adjacent to the N.

Further preferably, the $R_3$ is D, $C_1$-$C_4$ alkyl, or $C_1$-$C_4$ alkyl including at least one D.

Most preferably, the $R_3$ is $CD_3$.

Preferably, the $R_4$ substituent is located adjacent or opposite to a metal Ir-carbon bond.

Preferably, the metal compound has one of the following structures:

(Formula 3)

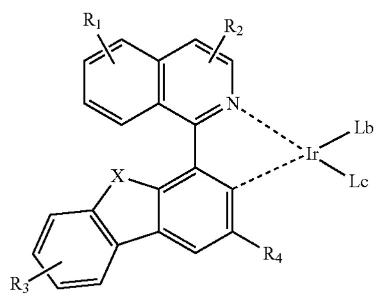

or (Formula 4)

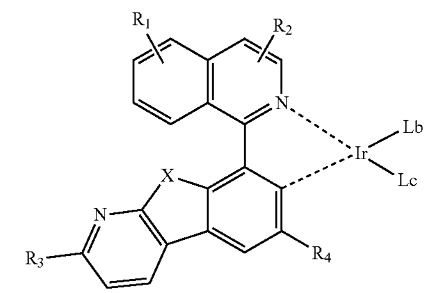

where the $R_1$ and the $R_2$ have a maximum substitution number; the $R_1$-$R_2$ are independently selected from hydrogen, substituted or unsubstituted $C_1$-$C_6$ alkyl, substituted or unsubstituted $C_3$-$C_6$ cycloalkyl, substituted or unsubstituted $C_7$-$C_{20}$ aralkyl, substituted or unsubstituted $C_3$-$C_{30}$ heteroaryl, or substituted or unsubstituted $C_6$-$C_{30}$ aryl; at least one of the $R_1$ and the $R_2$ is not hydrogen;

the $R_3$ and the $R_4$ are independently selected from hydrogen, substituted or unsubstituted $C_1$-$C_6$ alkyl, and substituted or unsubstituted $C_3$-$C_{10}$ cycloalkyl; at least one of the $R_3$ and the $R_4$ is not hydrogen;

the X is independently selected from O, S, Se, $C(R)_2$, $Si(R)_2$, and NR; the R is independently selected from substituted or unsubstituted $C_1$-$C_{10}$ alkyl or alkoxy, substituted or unsubstituted $C_3$-$C_{30}$ cycloalkyl, and substituted or unsubstituted $C_6$-$C_{30}$ aryl;

and the "substituted" refers to substitution with deuterium, F, Cl, Br, or $C_1$-$C_4$ alkyl.

Preferably, the X is O, S, Se, NR, or $C(R)_2$; and the R is independently selected from substituted or unsubstituted $C_1$-$C_8$ alkyl.

Preferably, the La is independently selected from one of the following structural formulas, corresponding parts or complete deuterides thereof, or corresponding parts or complete fluorides thereof:

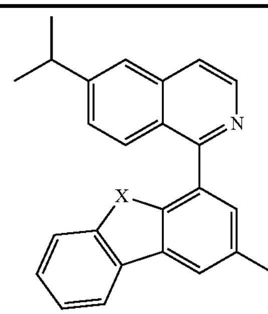

| | |
|---|---|
| X = O | La1 |
| X = S | La2 |
| X = Se | La3 |
| X = $C(CH_3)_2$ | La4 |
| X = $NCH_3$ | La5 |
| X = N(i-Pr) | La6 |
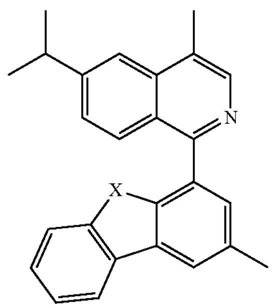
| | |
|---|---|
| X = O | La7 |
| X = S | La8 |
| X = Se | La9 |
| X = $C(CH_3)_2$ | La10 |
| X = $NCH_3$ | La11 |
| X = N(i-Pr) | La12 |
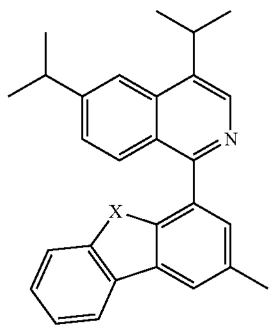
| | |
|---|---|
| X = O | La13 |
| X = S | La14 |
| X = Se | La15 |
| X = $C(CH_3)_2$ | La16 |
| X = $NCH_3$ | La17 |
| X = N(i-Pr) | La18 |
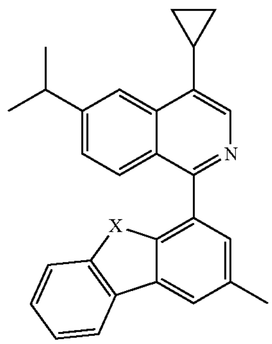
| | |
|---|---|
| X = O | La19 |
| X = S | La20 |
| X = Se | La21 |
| X = $C(CH_3)_2$ | La22 |
| X = $NCH_3$ | La23 |
| X = N(i-Pr) | La24 |
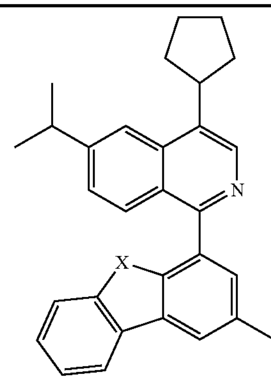
| | |
|---|---|
| X = O | La25 |
| X = S | La26 |
| X = Se | La27 |
| X = $C(CH_3)_2$ | La28 |
| X = $NCH_3$ | La29 |
| X = N(i-Pr) | La30 |
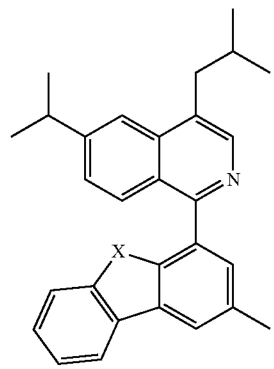
| | |
|---|---|
| X = O | La31 |
| X = S | La32 |
| X = Se | La33 |
| X = $C(CH_3)_2$ | La34 |
| X = $NCH_3$ | La35 |
| X = N(i-Pr) | La36 |
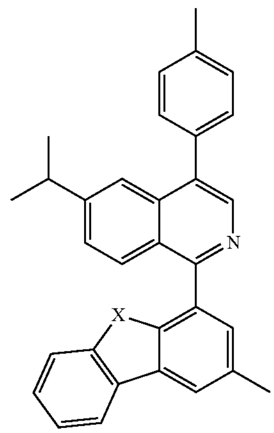
| | |
|---|---|
| X = O | La37 |
| X = S | La38 |
| X = Se | La39 |
| X = $C(CH_3)_2$ | La40 |
| X = $NCH_3$ | La41 |
| X = N(i-Pr) | La42 |

-continued
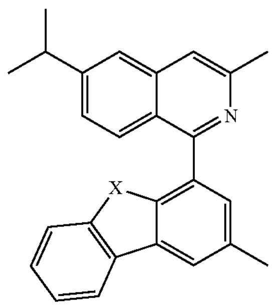
| | |
|---|---|
| X = O | La43 |
| X = S | La44 |
| X = Se | La45 |
| X = $C(CH_3)_2$ | La46 |
| X = $NCH_3$ | La47 |
| X = N(i-Pr) | La48 |
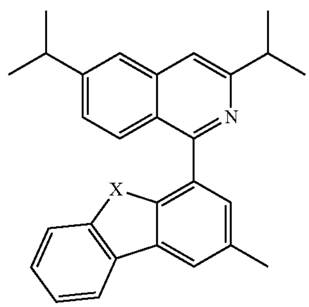
| | |
|---|---|
| X = O | La49 |
| X = S | La50 |
| X = Se | La51 |
| X = $C(CH_3)_2$ | La52 |
| X = $NCH_3$ | La53 |
| X = N(i-Pr) | La54 |
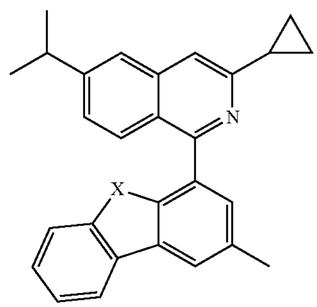
| | |
|---|---|
| X = O | La55 |
| X = S | La56 |
| X = Se | La57 |
| X = $C(CH_3)_2$ | La58 |
| X = $NCH_3$ | La59 |
| X = N(i-Pr) | La60 |
-continued
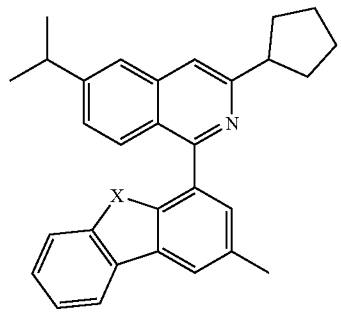
| | |
|---|---|
| X = O | La61 |
| X = S | La62 |
| X = Se | La63 |
| X = $C(CH_3)_2$ | La64 |
| X = $NCH_3$ | La65 |
| X = N(i-Pr) | La66 |
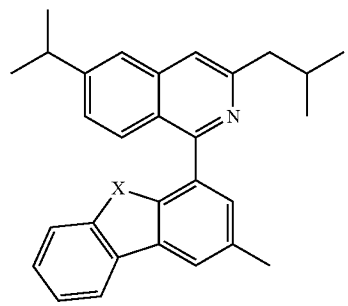
| | |
|---|---|
| X = O | La67 |
| X = S | La68 |
| X = Se | La69 |
| X = $C(CH_3)_2$ | La70 |
| X = $NCH_3$ | La71 |
| X = N(i-Pr) | La72 |
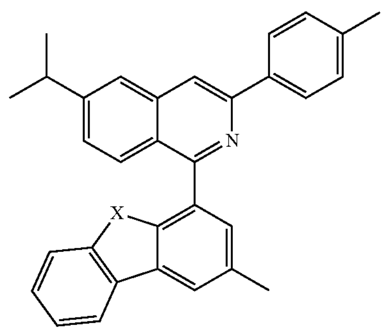
| | |
|---|---|
| X = O | La73 |
| X = S | La74 |
| X = Se | La75 |
| X = $C(CH_3)_2$ | La76 |
| X = $NCH_3$ | La77 |
| X = N(i-Pr) | La78 |
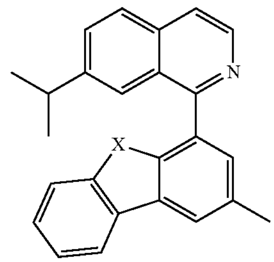

-continued

X = O La79
X = S La80
X = Se La81
X = $C(CH_3)_2$ La82
X = $NCH_3$ La83
X = N(i-Pr) La84

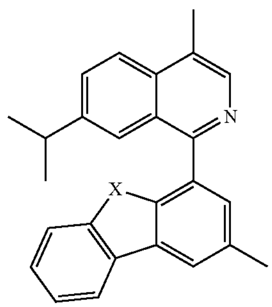

X = O La85
X = S La86
X = Se La87
X = $C(CH_3)_2$ La88
X = $NCH_3$ La89
X = N(i-Pr) La90

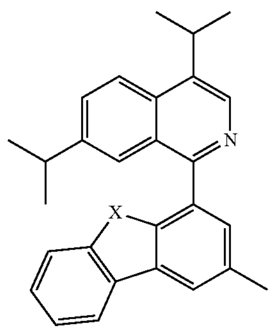

X = O La91
X = S La92
X = Se La93
X = $C(CH_3)_2$ La94
X = $NCH_3$ La95
X = N(i-Pr) La96

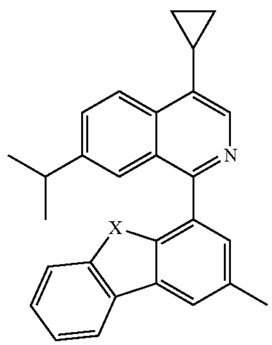

X = O La97
X = S La98
X = Se La99
X = $C(CH_3)_2$ La100
X = $NCH_3$ La101
X = N(i-Pr) La102

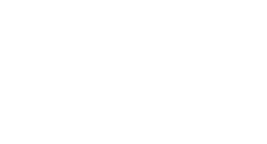

-continued

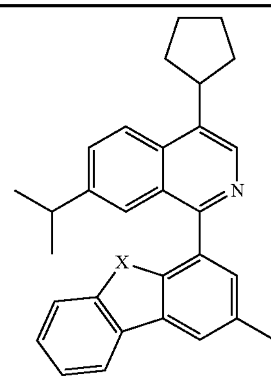

X = O La103
X = S La104
X = Se La105
X = $C(CH_3)_2$ La106
X = $NCH_3$ La107
X = N(i-Pr) La108

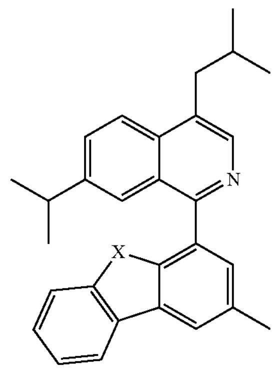

X = O La109
X = S La110
X = Se La111
X = $C(CH_3)_2$ La112
X = $NCH_3$ La113
X = N(i-Pr) La114

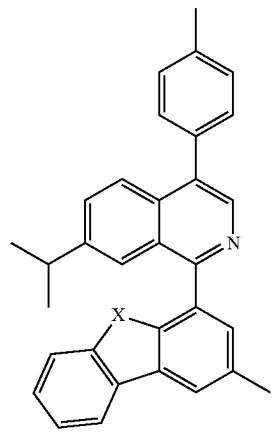

X = O La115
X = S La116
X = Se La117
X = $C(CH_3)_2$ La118
X = $NCH_3$ La119
X = N(i-Pr) La120

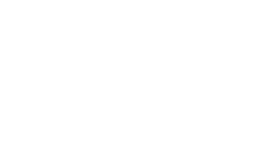

-continued
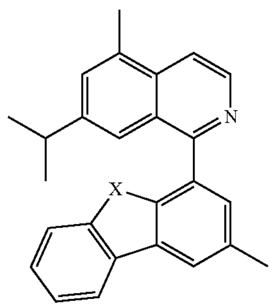
| | |
|---|---|
| X = O | La121 |
| X = S | La122 |
| X = Se | La123 |
| X = $C(CH_3)_2$ | La124 |
| X = $NCH_3$ | La125 |
| X = N(i-Pr) | La126 |
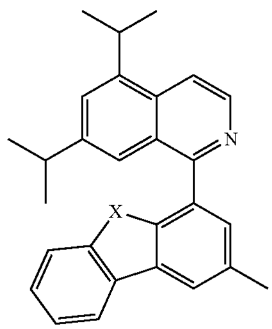
| | |
|---|---|
| X = O | La127 |
| X = S | La128 |
| X = Se | La129 |
| X = $C(CH_3)_2$ | La130 |
| X = $NCH_3$ | La131 |
| X = N(i-Pr) | La132 |
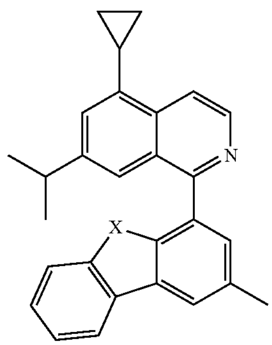
| | |
|---|---|
| X = O | La133 |
| X = S | La134 |
| X = Se | La135 |
| X = $C(CH_3)_2$ | La136 |
| X = $NCH_3$ | La137 |
| X = N(i-Pr) | La138 |
-continued
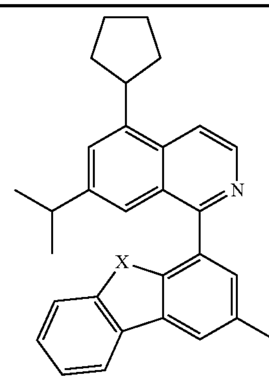
| | |
|---|---|
| X = O | La139 |
| X = S | La140 |
| X = Se | La141 |
| X = $C(CH_3)_2$ | La142 |
| X = $NCH_3$ | La143 |
| X = N(i-Pr) | La144 |
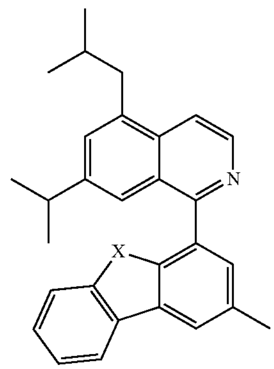
| | |
|---|---|
| X = O | La145 |
| X = S | La146 |
| X = Se | La147 |
| X = $C(CH_3)_2$ | La148 |
| X = $NCH_3$ | La149 |
| X = N(i-Pr) | La150 |
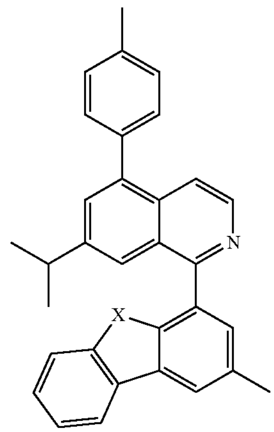
| | |
|---|---|
| X = O | La151 |
| X = S | La152 |
| X = Se | La153 |
| X = $C(CH_3)_2$ | La154 |
| X = $NCH_3$ | La155 |
| X = N(i-Pr) | La156 |

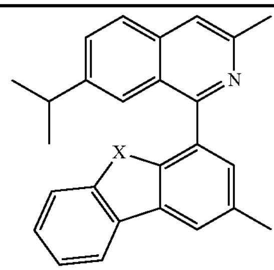
| | |
|---|---|
| X = O | La157 |
| X = S | La158 |
| X = Se | La159 |
| X = $C(CH_3)_2$ | La160 |
| X = $NCH_3$ | La161 |
| X = N(i-Pr) | La162 |
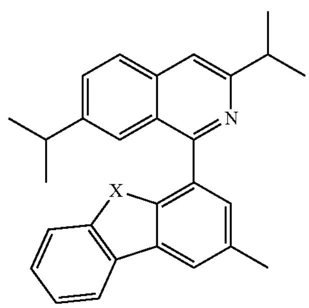
| | |
|---|---|
| X = O | La163 |
| X = S | La164 |
| X = Se | La165 |
| X = $C(CH_3)_2$ | La166 |
| X = $NCH_3$ | La167 |
| X = N(i-Pr) | La168 |
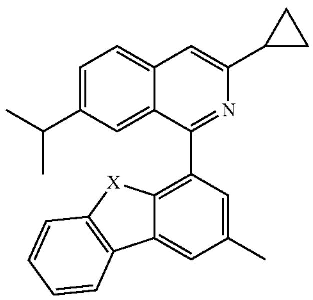
| | |
|---|---|
| X = O | La169 |
| X = S | La170 |
| X = Se | La171 |
| X = $C(CH_3)_2$ | La172 |
| X = $NCH_3$ | La173 |
| X = N(i-Pr) | La174 |
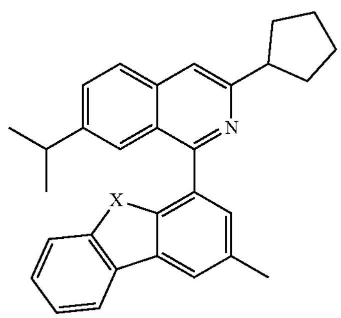
| | |
|---|---|
| X = O | La175 |
| X = S | La176 |
| X = Se | La177 |
| X = $C(CH_3)_2$ | La178 |
| X = $NCH_3$ | La179 |
| X = N(i-Pr) | La180 |
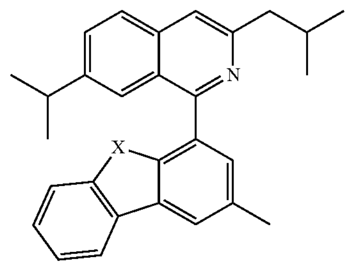
| | |
|---|---|
| X = O | La181 |
| X = S | La182 |
| X = Se | La183 |
| X = $C(CH_3)_2$ | La184 |
| X = $NCH_3$ | La185 |
| X = N(i-Pr) | La186 |
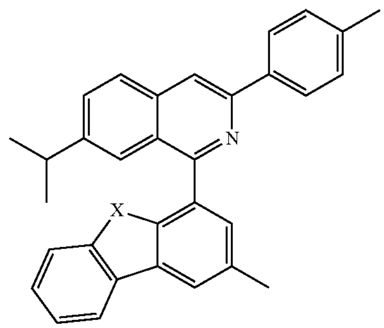
| | |
|---|---|
| X = O | La187 |
| X = S | La188 |
| X = Se | La189 |
| X = $C(CH_3)_2$ | La190 |
| X = $NCH_3$ | La191 |
| X = N(i-Pr) | La192 |
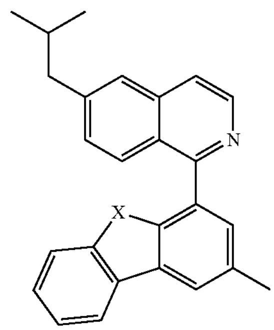
| | |
|---|---|
| X = O | La193 |
| X = S | La194 |
| X = Se | La195 |
| X = $C(CH_3)_2$ | La196 |
| X = $NCH_3$ | La197 |
| X = N(i-Pr) | La198 |

-continued
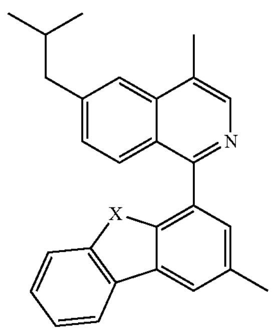
| | |
|---|---|
| X = O | La199 |
| X = S | La200 |
| X = Se | La201 |
| X = $C(CH_3)_2$ | La202 |
| X = $NCH_3$ | La203 |
| X = N(i-Pr) | La204 |
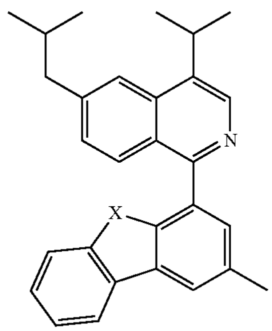
| | |
|---|---|
| X = O | La205 |
| X = S | La206 |
| X = Se | La207 |
| X = $C(CH_3)_2$ | La208 |
| X = $NCH_3$ | La209 |
| X = N(i-Pr) | La210 |
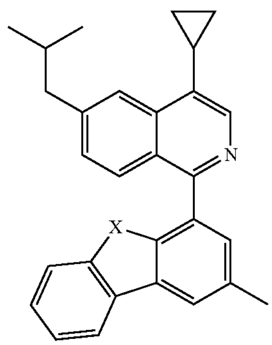
| | |
|---|---|
| X = O | La211 |
| X = S | La212 |
| X = Se | La213 |
| X = $C(CH_3)_2$ | La214 |
| X = $NCH_3$ | La215 |
| X = N(i-Pr) | La216 |
-continued
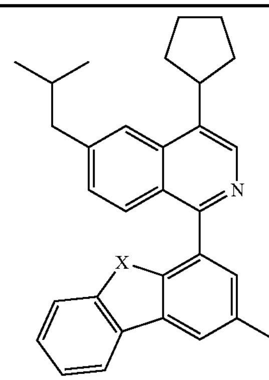
| | |
|---|---|
| X = O | La217 |
| X = S | La218 |
| X = Se | La219 |
| X = $C(CH_3)_2$ | La220 |
| X = $NCH_3$ | La221 |
| X = N(i-Pr) | La222 |
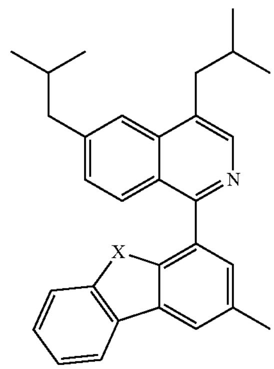
| | |
|---|---|
| X = O | La223 |
| X = S | La224 |
| X = Se | La225 |
| X = $C(CH_3)_2$ | La226 |
| X = $NCH_3$ | La227 |
| X = N(i-Pr) | La228 |
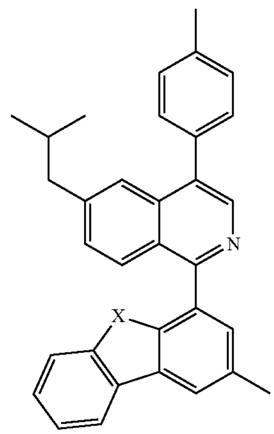
| | |
|---|---|
| X = O | La229 |
| X = S | La230 |
| X = Se | La231 |
| X = $C(CH_3)_2$ | La232 |
| X = $NCH_3$ | La233 |
| X = N(i-Pr) | La234 |

-continued
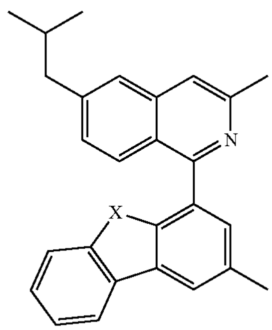
| | |
|---|---|
| X = O | La235 |
| X = S | La236 |
| X = Se | La237 |
| X = $C(CH_3)_2$ | La238 |
| X = $NCH_3$ | La239 |
| X = N(i-Pr) | La240 |
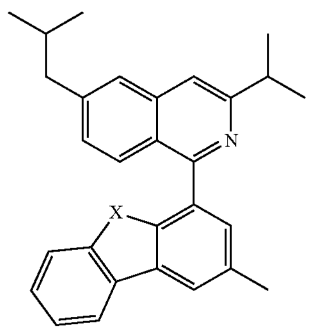
| | |
|---|---|
| X = O | La241 |
| X = S | La242 |
| X = Se | La243 |
| X = $C(CH_3)_2$ | La244 |
| X = $NCH_3$ | La245 |
| X = N(i-Pr) | La246 |
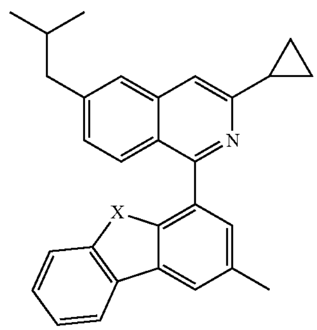
| | |
|---|---|
| X = O | La247 |
| X = S | La248 |
| X = Se | La249 |
| X = $C(CH_3)_2$ | La250 |
| X = $NCH_3$ | La251 |
| X = N(i-Pr) | La252 |
-continued
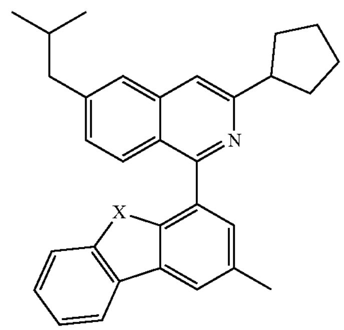
| | |
|---|---|
| X = O | La253 |
| X = S | La254 |
| X = Se | La255 |
| X = $C(CH_3)_2$ | La256 |
| X = $NCH_3$ | La257 |
| X = N(i-Pr) | La258 |
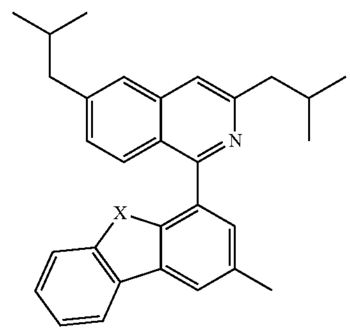
| | |
|---|---|
| X = O | La259 |
| X = S | La260 |
| X = Se | La261 |
| X = $C(CH_3)_2$ | La262 |
| X = $NCH_3$ | La263 |
| X = N(i-Pr) | La264 |
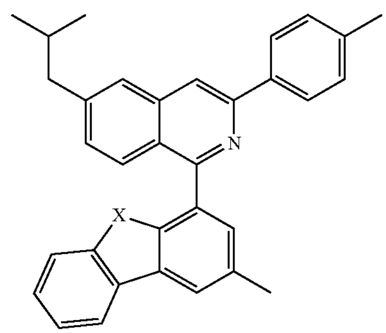
| | |
|---|---|
| X = O | La265 |
| X = S | La266 |
| X = Se | La267 |
| X = $C(CH_3)_2$ | La268 |
| X = $NCH_3$ | La269 |
| X = N(i-Pr) | La270 |

-continued
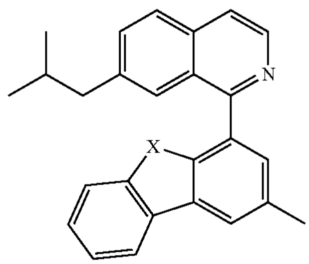
| | |
|---|---|
| X = O | La271 |
| X = S | La272 |
| X = Se | La273 |
| X = $C(CH_3)_2$ | La274 |
| X = $NCH_3$ | La275 |
| X = N(i-Pr) | La276 |
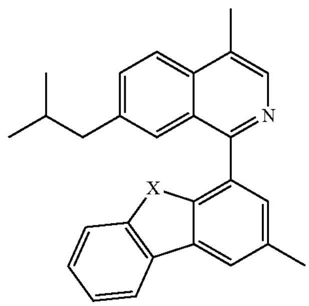
| | |
|---|---|
| X = O | La277 |
| X = S | La278 |
| X = Se | La279 |
| X = $C(CH_3)_2$ | La280 |
| X = $NCH_3$ | La281 |
| X = N(i-Pr) | La282 |
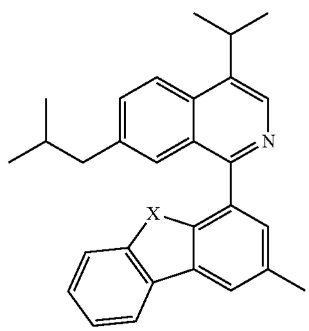
| | |
|---|---|
| X = O | La283 |
| X = S | La284 |
| X = Se | La285 |
| X = $C(CH_3)_2$ | La286 |
| X = $NCH_3$ | La287 |
| X = N(i-Pr) | La288 |
-continued
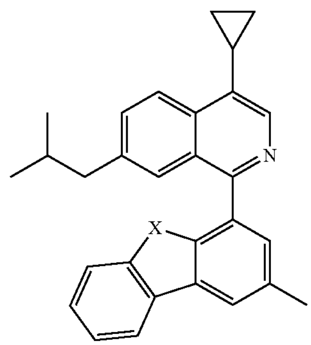
| | |
|---|---|
| X = O | La289 |
| X = S | La290 |
| X = Se | La291 |
| X = $C(CH_3)_2$ | La292 |
| X = $NCH_3$ | La293 |
| X = N(i-Pr) | La294 |
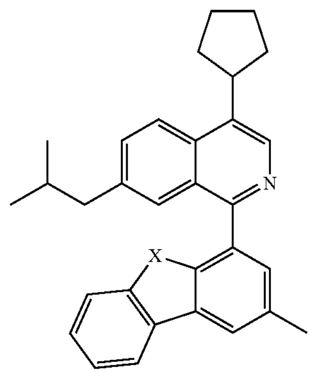
| | |
|---|---|
| X = O | La295 |
| X = S | La296 |
| X = Se | La297 |
| X = $C(CH_3)_2$ | La298 |
| X = $NCH_3$ | La299 |
| X = N(i-Pr) | La300 |
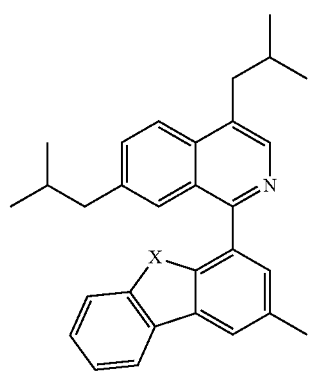
| | |
|---|---|
| X = O | La301 |
| X = S | La302 |
| X = Se | La303 |
| X = $C(CH_3)_2$ | La304 |
| X = $NCH_3$ | La305 |
| X = N(i-Pr) | La306 |

-continued
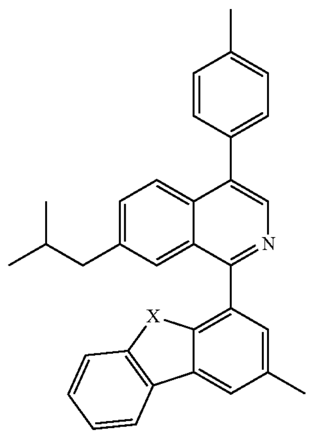
| | |
|---|---|
| X = O | La307 |
| X = S | La308 |
| X = Se | La309 |
| X = $C(CH_3)_2$ | La310 |
| X = $NCH_3$ | La311 |
| X = N(i-Pr) | La312 |
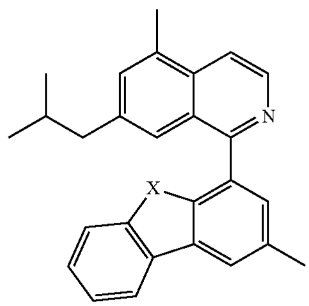
| | |
|---|---|
| X = O | La313 |
| X = S | La314 |
| X = Se | La315 |
| X = $C(CH_3)_2$ | La316 |
| X = $NCH_3$ | La317 |
| X = N(i-Pr) | La318 |
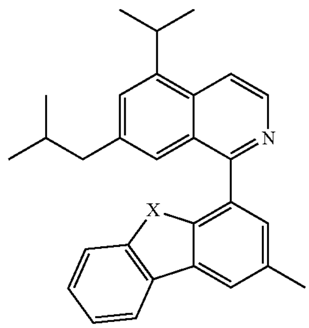
| | |
|---|---|
| X = O | La319 |
| X = S | La320 |
| X = Se | La321 |
| X = $C(CH_3)_2$ | La322 |
| X = $NCH_3$ | La323 |
| X = N(i-Pr) | La324 |
-continued
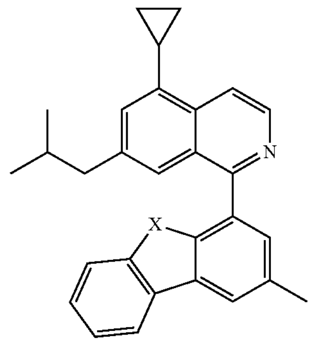
| | |
|---|---|
| X = O | La325 |
| X = S | La326 |
| X = Se | La327 |
| X = $C(CH_3)_2$ | La328 |
| X = $NCH_3$ | La329 |
| X = N(i-Pr) | La330 |
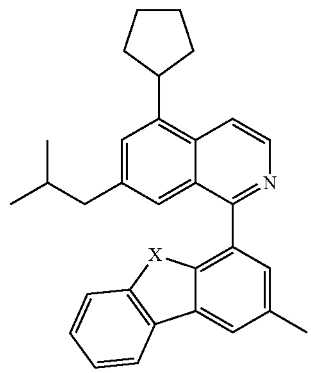
| | |
|---|---|
| X = O | La331 |
| X = S | La332 |
| X = Se | La333 |
| X = $C(CH_3)_2$ | La334 |
| X = $NCH_3$ | La335 |
| X = N(i-Pr) | La336 |
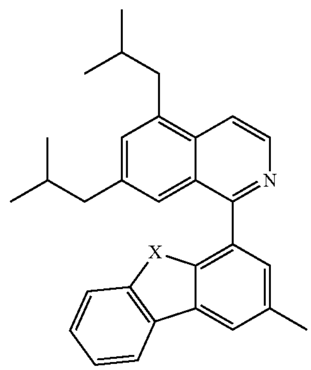
| | |
|---|---|
| X = O | La337 |
| X = S | La338 |
| X = Se | La339 |
| X = $C(CH_3)_2$ | La340 |
| X = $NCH_3$ | La341 |
| X = N(i-Pr) | La342 |

-continued
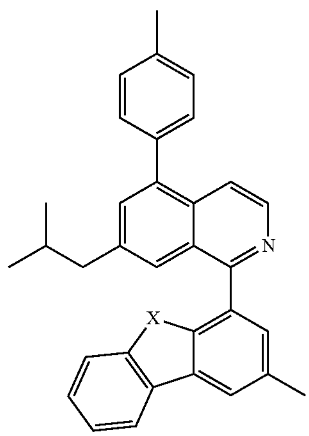
| | |
|---|---|
| X = O | La343 |
| X = S | La344 |
| X = Se | La345 |
| X = $C(CH_3)_2$ | La346 |
| X = $NCH_3$ | La347 |
| X = N(i-Pr) | La348 |
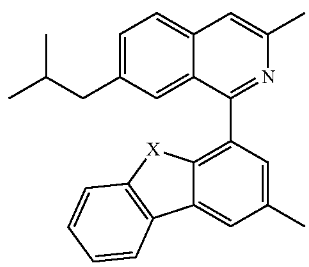
| | |
|---|---|
| X = O | La349 |
| X = S | La350 |
| X = Se | La351 |
| X = $C(CH_3)_2$ | La352 |
| X = $NCH_3$ | La353 |
| X = N(i-Pr) | La354 |
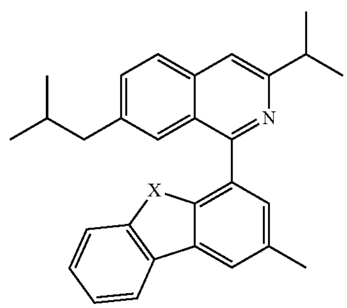
| | |
|---|---|
| X = O | La355 |
| X = S | La356 |
| X = Se | La357 |
| X = $C(CH_3)_2$ | La358 |
| X = $NCH_3$ | La359 |
| X = N(i-Pr) | La360 |
-continued
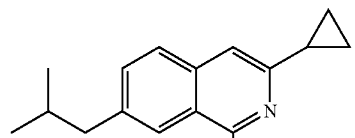
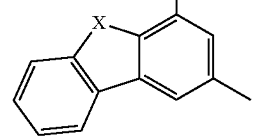
| | |
|---|---|
| X = O | La361 |
| X = S | La362 |
| X = Se | La363 |
| X = $C(CH_3)_2$ | La364 |
| X = $NCH_3$ | La365 |
| X = N(i-Pr) | La366 |
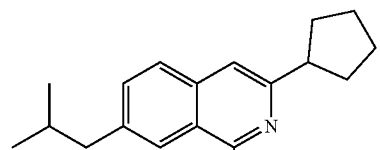
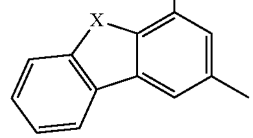
| | |
|---|---|
| X = O | La367 |
| X = S | La368 |
| X = Se | La369 |
| X = $C(CH_3)_2$ | La370 |
| X = $NCH_3$ | La371 |
| X = N(i-Pr) | La372 |
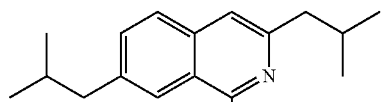
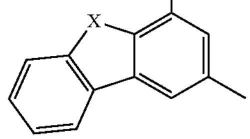
| | |
|---|---|
| X = O | La373 |
| X = S | La374 |
| X = Se | La375 |
| X = $C(CH_3)_2$ | La376 |
| X = $NCH_3$ | La377 |
| X = N(i-Pr) | La378 |
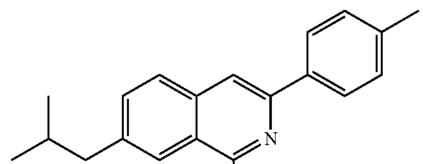
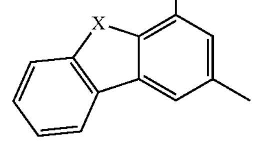

-continued

| | |
|---|---|
| X = O | La379 |
| X = S | La380 |
| X = Se | La381 |
| X = $C(CH_3)_2$ | La382 |
| X = $NCH_3$ | La383 |
| X = N(i-Pr) | La384 |

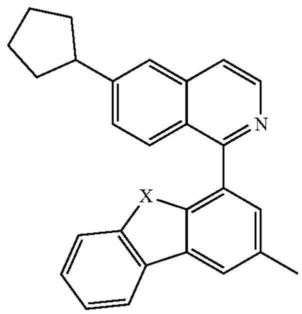

| | |
|---|---|
| X = O | La385 |
| X = S | La386 |
| X = Se | La387 |
| X = $C(CH_3)_2$ | La388 |
| X = $NCH_3$ | La389 |
| X = N(i-Pr) | La390 |

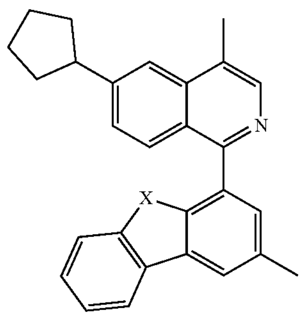

| | |
|---|---|
| X = O | La391 |
| X = S | La392 |
| X = Se | La393 |
| X = $C(CH_3)_2$ | La394 |
| X = $NCH_3$ | La395 |
| X = N(i-Pr) | La396 |

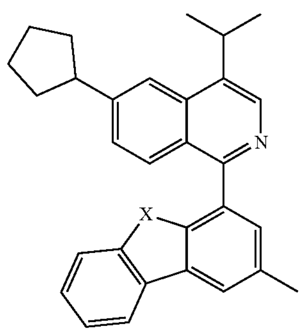

| | |
|---|---|
| X = O | La397 |
| X = S | La398 |
| X = Se | La399 |
| X = $C(CH_3)_2$ | La400 |
| X = $NCH_3$ | La401 |
| X = N(i-Pr) | La402 |

-continued

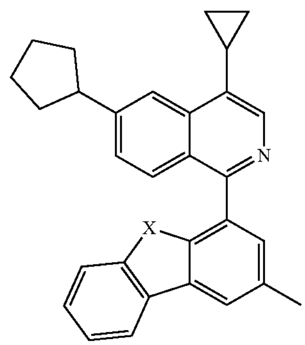

| | |
|---|---|
| X = O | La403 |
| X = S | La404 |
| X = Se | La405 |
| X = $C(CH_3)_2$ | La406 |
| X = $NCH_3$ | La407 |
| X = N(i-Pr) | La408 |

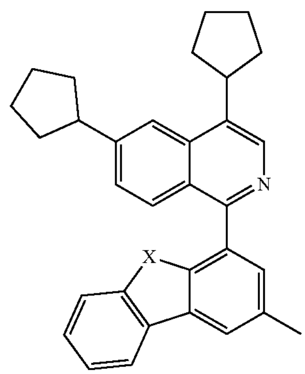

| | |
|---|---|
| X = O | La409 |
| X = S | La410 |
| X = Se | La411 |
| X = $C(CH_3)_2$ | La412 |
| X = $NCH_3$ | La413 |
| X = N(i-Pr) | La414 |

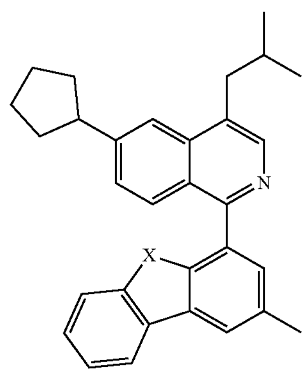

| | |
|---|---|
| X = O | La415 |
| X = S | La416 |
| X = Se | La417 |
| X = $C(CH_3)_2$ | La418 |
| X = $NCH_3$ | La419 |
| X = N(i-Pr) | La420 |

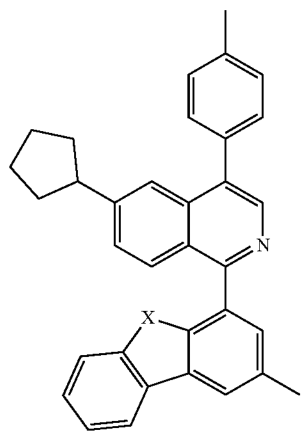
| | |
|---|---|
| X = O | La421 |
| X = S | La422 |
| X = Se | La423 |
| X = $C(CH_3)_2$ | La424 |
| X = $NCH_3$ | La425 |
| X = N(i-Pr) | La426 |
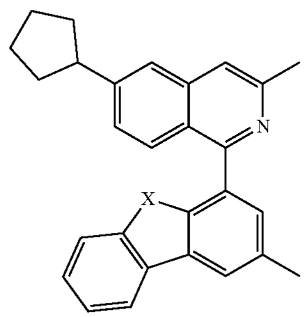
| | |
|---|---|
| X = O | La427 |
| X = S | La428 |
| X = Se | La429 |
| X = $C(CH_3)_2$ | La430 |
| X = $NCH_3$ | La431 |
| X = N(i-Pr) | La432 |
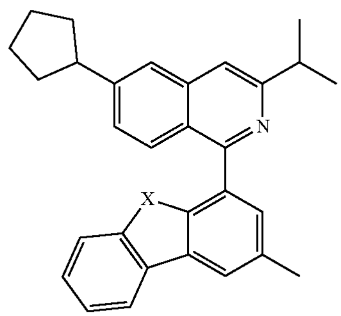
| | |
|---|---|
| X = O | La433 |
| X = S | La434 |
| X = Se | La435 |
| X = $C(CH_3)_2$ | La436 |
| X = $NCH_3$ | La437 |
| X = N(i-Pr) | La438 |
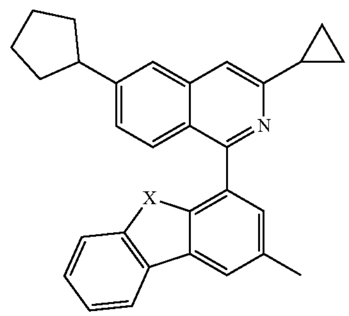
| | |
|---|---|
| X = O | La439 |
| X = S | La440 |
| X = Se | La441 |
| X = $C(CH_3)_2$ | La442 |
| X = $NCH_3$ | La443 |
| X = N(i-Pr) | La444 |
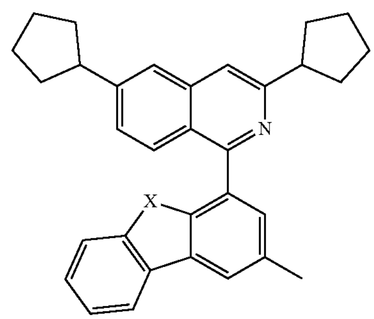
| | |
|---|---|
| X = O | La445 |
| X = S | La446 |
| X = Se | La447 |
| X = $C(CH_3)_2$ | La448 |
| X = $NCH_3$ | La449 |
| X = N(i-Pr) | La450 |
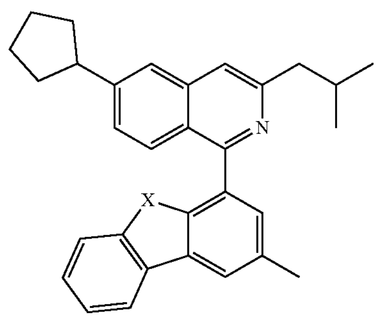
| | |
|---|---|
| X = O | La451 |
| X = S | La452 |
| X = Se | La453 |
| X = $C(CH_3)_2$ | La454 |
| X = $NCH_3$ | La455 |
| X = N(i-Pr) | La456 |

-continued
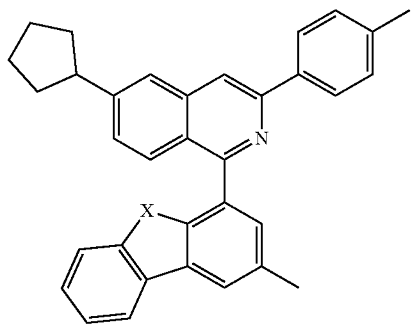
| | |
|---|---|
| X = O | La457 |
| X = S | La458 |
| X = Se | La459 |
| X = $C(CH_3)_2$ | La460 |
| X = $NCH_3$ | La461 |
| X = N(i-Pr) | La462 |
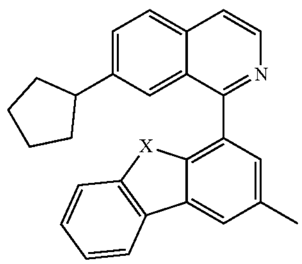
| | |
|---|---|
| X = O | La463 |
| X = S | La464 |
| X = Se | La465 |
| X = $C(CH_3)_2$ | La466 |
| X = $NCH_3$ | La467 |
| X = N(i-Pr) | La468 |
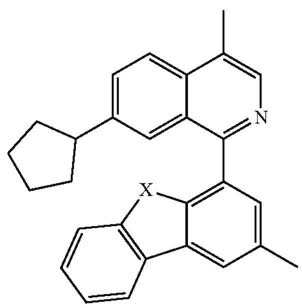
| | |
|---|---|
| X = O | La469 |
| X = S | La470 |
| X = Se | La471 |
| X = $C(CH_3)_2$ | La472 |
| X = $NCH_3$ | La473 |
| X = N(i-Pr) | La474 |
-continued
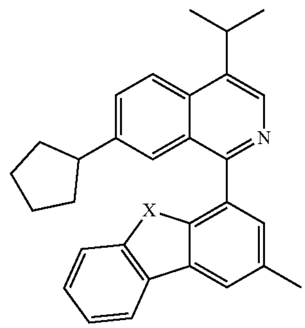
| | |
|---|---|
| X = O | La475 |
| X = S | La476 |
| X = Se | La477 |
| X = $C(CH_3)_2$ | La478 |
| X = $NCH_3$ | La479 |
| X = N(i-Pr) | La480 |
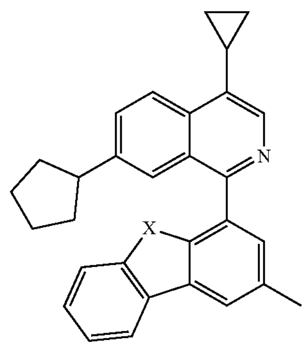
| | |
|---|---|
| X = O | La481 |
| X = S | La482 |
| X = Se | La483 |
| X = $C(CH_3)_2$ | La484 |
| X = $NCH_3$ | La485 |
| X = N(i-Pr) | La486 |
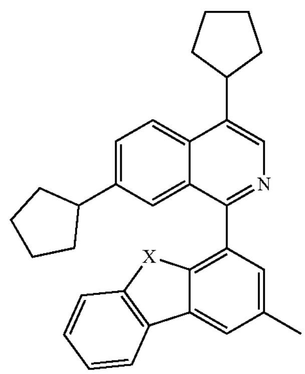
| | |
|---|---|
| X = O | La487 |
| X = S | La488 |
| X = Se | La489 |
| X = $C(CH_3)_2$ | La490 |
| X = $NCH_3$ | La491 |
| X = N(i-Pr) | La492 |

-continued
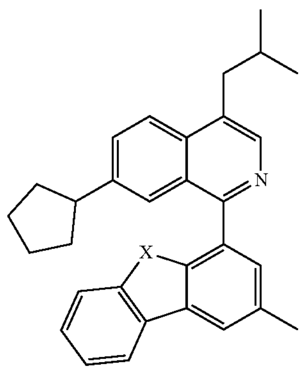
| | |
|---|---|
| X = O | La493 |
| X = S | La494 |
| X = Se | La495 |
| X = $C(CH_3)_2$ | La496 |
| X = $NCH_3$ | La497 |
| X = N(i-Pr) | La498 |
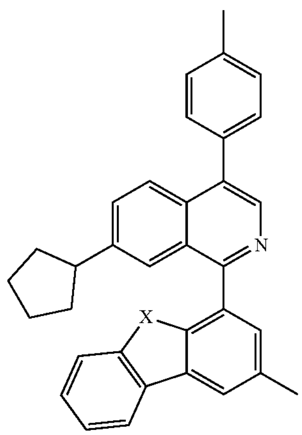
| | |
|---|---|
| X = O | La499 |
| X = S | La500 |
| X = Se | La501 |
| X = $C(CH_3)_2$ | La502 |
| X = $NCH_3$ | La503 |
| X = N(i-Pr) | La504 |
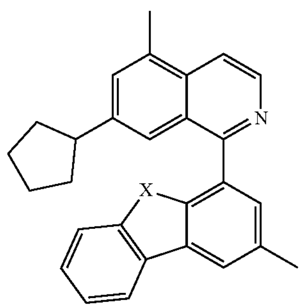
| | |
|---|---|
| X = O | La505 |
| X = S | La506 |
| X = Se | La507 |
| X = $C(CH_3)_2$ | La508 |
| X = $NCH_3$ | La509 |
| X = N(i-Pr) | La510 |
-continued
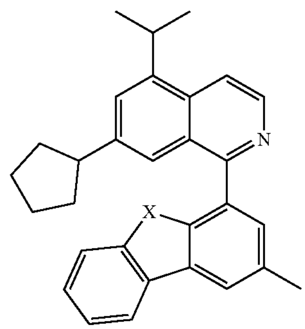
| | |
|---|---|
| X = O | La511 |
| X = S | La512 |
| X = Se | La513 |
| X = $C(CH_3)_2$ | La514 |
| X = $NCH_3$ | La515 |
| X = N(i-Pr) | La516 |
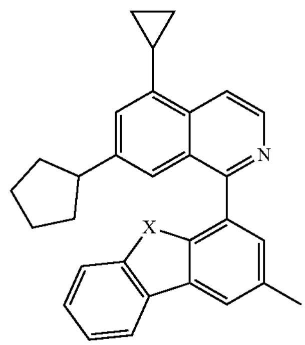
| | |
|---|---|
| X = O | La517 |
| X = S | La518 |
| X = Se | La519 |
| X = $C(CH_3)_2$ | La520 |
| X = $NCH_3$ | La521 |
| X = N(i-Pr) | La522 |
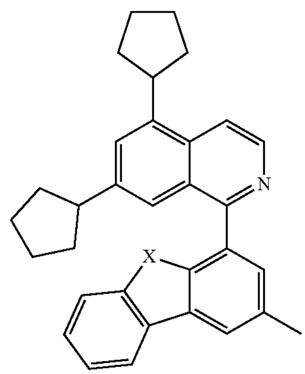
| | |
|---|---|
| X = O | La523 |
| X = S | La524 |
| X = Se | La525 |
| X = $C(CH_3)_2$ | La526 |
| X = $NCH_3$ | La527 |
| X = N(i-Pr) | La528 |

-continued
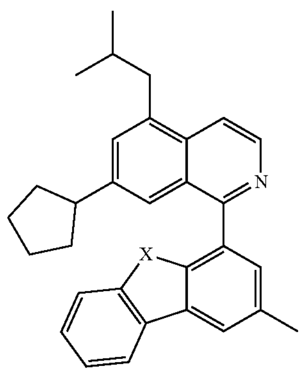
| | |
|---|---|
| X = O | La529 |
| X = S | La530 |
| X = Se | La531 |
| X = $C(CH_3)_2$ | La532 |
| X = $NCH_3$ | La533 |
| X = N(i-Pr) | La534 |
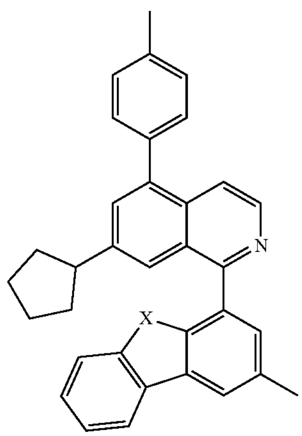
| | |
|---|---|
| X = O | La535 |
| X = S | La536 |
| X = Se | La537 |
| X = $C(CH_3)_2$ | La538 |
| X = $NCH_3$ | La539 |
| X = N(i-Pr) | La540 |
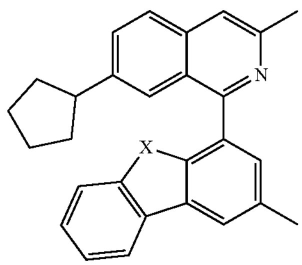
| | |
|---|---|
| X = O | La541 |
| X = S | La542 |
| X = Se | La543 |
| X = $C(CH_3)_2$ | La544 |
| X = $NCH_3$ | La545 |
| X = N(i-Pr) | La546 |
-continued
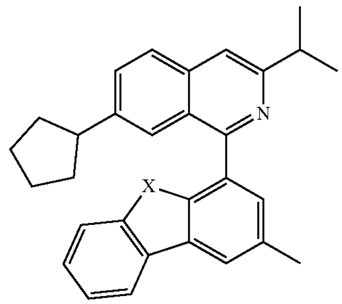
| | |
|---|---|
| X = O | La547 |
| X = S | La548 |
| X = Se | La549 |
| X = $C(CH_3)_2$ | La550 |
| X = $NCH_3$ | La551 |
| X = N(i-Pr) | La552 |
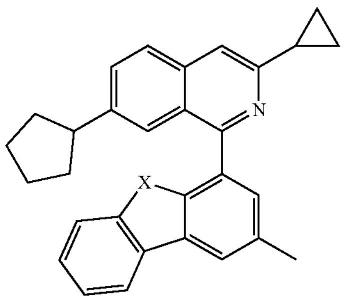
| | |
|---|---|
| X = O | La553 |
| X = S | La554 |
| X = Se | La555 |
| X = $C(CH_3)_2$ | La556 |
| X = $NCH_3$ | La557 |
| X = N(i-Pr) | La558 |
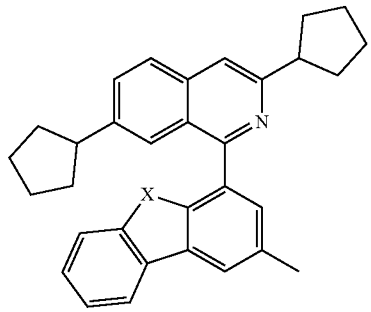
| | |
|---|---|
| X = O | La559 |
| X = S | La560 |
| X = Se | La561 |
| X = $C(CH_3)_2$ | La562 |
| X = $NCH_3$ | La563 |
| X = N(i-Pr) | La564 |
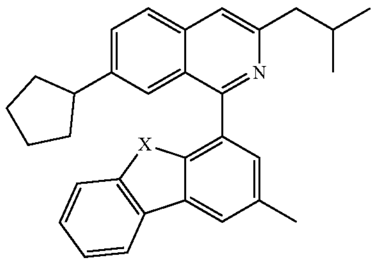

X = O La565
X = S La566
X = Se La567
X = $C(CH_3)_2$ La568
X = $NCH_3$ La569
X = N(i-Pr) La570
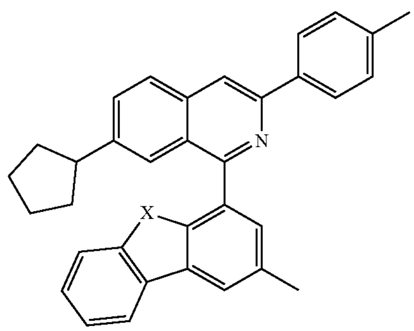
X = O La571
X = S La572
X = Se La573
X = $C(CH_3)_2$ La574
X = $NCH_3$ La575
X = N(i-Pr) La576
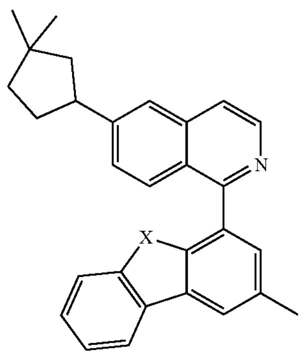
X = O La577
X = S La578
X = Se La579
X = $C(CH_3)_2$ La580
X = $NCH_3$ La581
X = N(i-Pr) La582
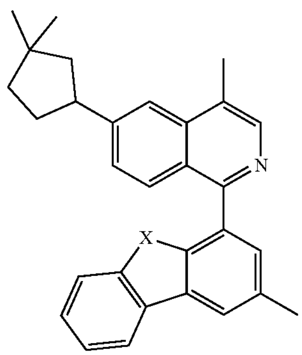
X = O La583
X = S La584
X = Se La585
X = $C(CH_3)_2$ La586
X = $NCH_3$ La587
X = N(i-Pr) La588
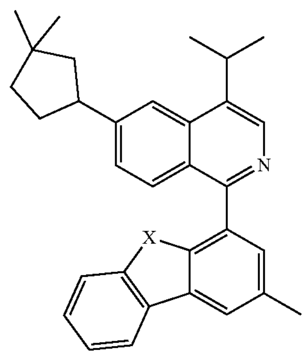
X = O La589
X = S La590
X = Se La591
X = $C(CH_3)_2$ La592
X = $NCH_3$ La593
X = N(i-Pr) La594
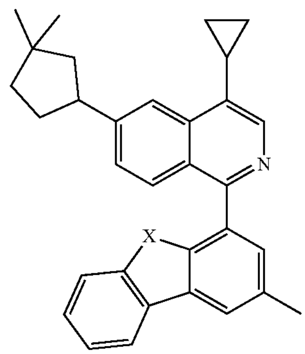
X = O La595
X = S La596
X = Se La597
X = $C(CH_3)_2$ La598
X = $NCH_3$ La599
X = N(i-Pr) La600
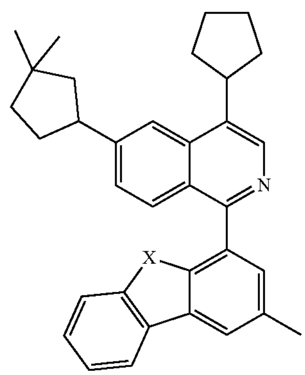
X = O La601
X = S La602
X = Se La603
X = $C(CH_3)_2$ La604
X = $NCH_3$ La605
X = N(i-Pr) La606

-continued
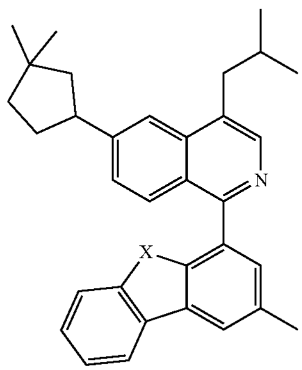
| | |
|---|---|
| X = O | La607 |
| X = S | La608 |
| X = Se | La609 |
| X = $C(CH_3)_2$ | La610 |
| X = $NCH_3$ | La611 |
| X = N(i-Pr) | La612 |
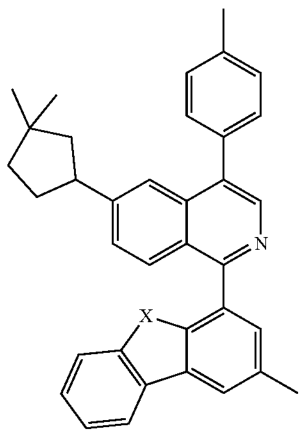
| | |
|---|---|
| X = O | La613 |
| X = S | La614 |
| X = Se | La615 |
| X = $C(CH_3)_2$ | La616 |
| X = $NCH_3$ | La617 |
| X = N(i-Pr) | La618 |
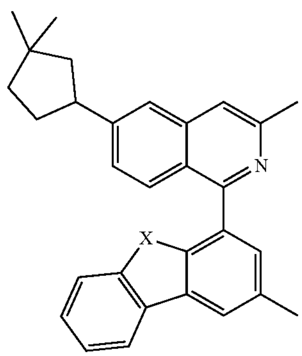
| | |
|---|---|
| X = O | La619 |
| X = S | La620 |
| X = Se | La621 |
| X = $C(CH_3)_2$ | La622 |
| X = $NCH_3$ | La623 |
| X = N(i-Pr) | La624 |
-continued
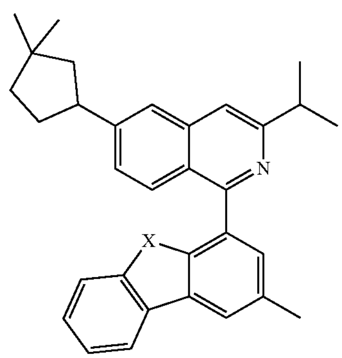
| | |
|---|---|
| X = O | La625 |
| X = S | La626 |
| X = Se | La627 |
| X = $C(CH_3)_2$ | La628 |
| X = $NCH_3$ | La629 |
| X = N(i-Pr) | La630 |
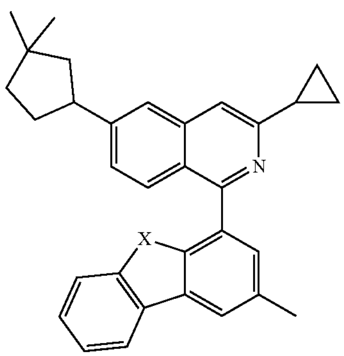
| | |
|---|---|
| X = O | La631 |
| X = S | La632 |
| X = Se | La633 |
| X = $C(CH_3)_2$ | La634 |
| X = $NCH_3$ | La635 |
| X = N(i-Pr) | La636 |
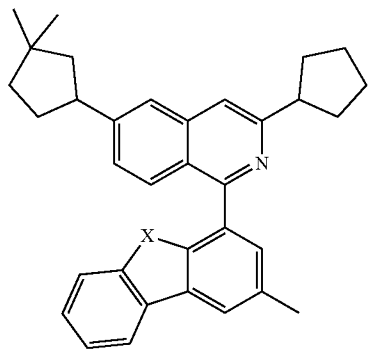
| | |
|---|---|
| X = O | La637 |
| X = S | La638 |
| X = Se | La639 |
| X = $C(CH_3)_2$ | La640 |
| X = $NCH_3$ | La641 |
| X = N(i-Pr) | La642 |

-continued
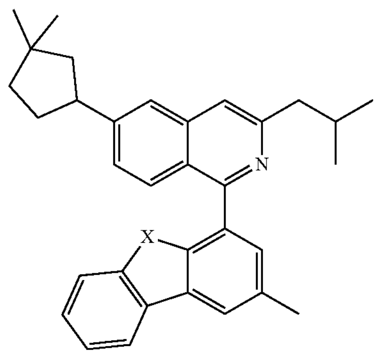
| | |
|---|---|
| X = O | La643 |
| X = S | La644 |
| X = Se | La645 |
| X = $C(CH_3)_2$ | La646 |
| X = $NCH_3$ | La647 |
| X = N(i-Pr) | La648 |
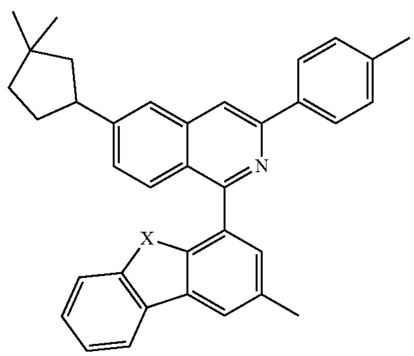
| | |
|---|---|
| X = O | La649 |
| X = S | La650 |
| X = Se | La651 |
| X = $C(CH_3)_2$ | La652 |
| X = $NCH_3$ | La653 |
| X = N(i-Pr) | La654 |
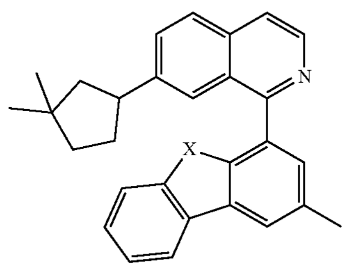
| | |
|---|---|
| X = O | La655 |
| X = S | La656 |
| X = Se | La657 |
| X = $C(CH_3)_2$ | La658 |
| X = $NCH_3$ | La659 |
| X = N(i-Pr) | La660 |
-continued
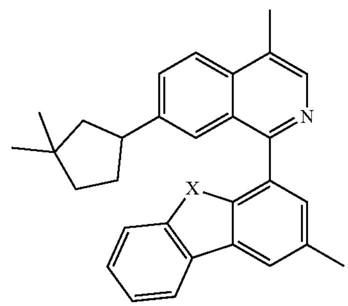
| | |
|---|---|
| X = O | La661 |
| X = S | La662 |
| X = Se | La663 |
| X = $C(CH_3)_2$ | La664 |
| X = $NCH_3$ | La665 |
| X = N(i-Pr) | La666 |
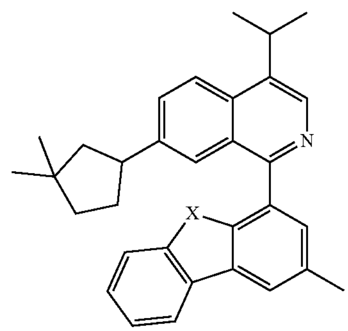
| | |
|---|---|
| X = O | La667 |
| X = S | La668 |
| X = Se | La669 |
| X = $C(CH_3)_2$ | La670 |
| X = $NCH_3$ | La671 |
| X = N(i-Pr) | La672 |
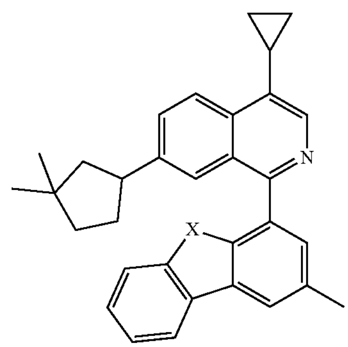
| | |
|---|---|
| X = O | La673 |
| X = S | La674 |
| X = Se | La675 |
| X = $C(CH_3)_2$ | La676 |
| X = $NCH_3$ | La677 |
| X = N(i-Pr) | La678 |

-continued
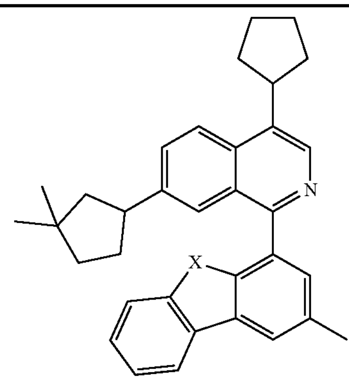
| | |
|---|---|
| X = O | La679 |
| X = S | La680 |
| X = Se | La681 |
| X = $C(CH_3)_2$ | La682 |
| X = $NCH_3$ | La683 |
| X = N(i-Pr) | La684 |
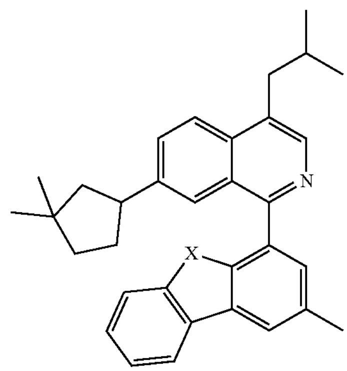
| | |
|---|---|
| X = O | La685 |
| X = S | La686 |
| X = Se | La687 |
| X = $C(CH_3)_2$ | La688 |
| X = $NCH_3$ | La689 |
| X = N(i-Pr) | La690 |
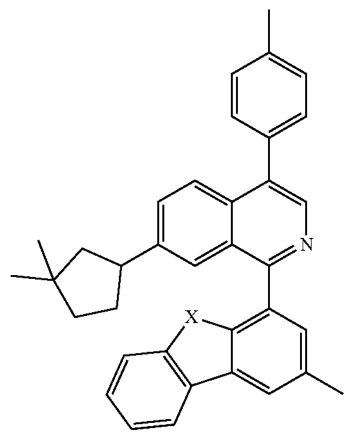
| | |
|---|---|
| X = O | La691 |
| X = S | La692 |
| X = Se | La693 |
| X = $C(CH_3)_2$ | La694 |
| X = $NCH_3$ | La695 |
| X = N(i-Pr) | La696 |
-continued
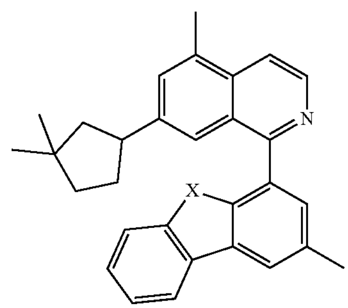
| | |
|---|---|
| X = O | La697 |
| X = S | La698 |
| X = Se | La699 |
| X = $C(CH_3)_2$ | La700 |
| X = $NCH_3$ | La701 |
| X = N(i-Pr) | La702 |
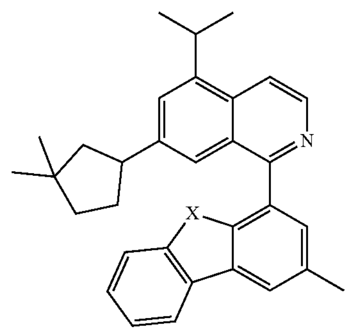
| | |
|---|---|
| X = O | La703 |
| X = S | La704 |
| X = Se | La705 |
| X = $C(CH_3)_2$ | La706 |
| X = $NCH_3$ | La707 |
| X = N(i-Pr) | La708 |
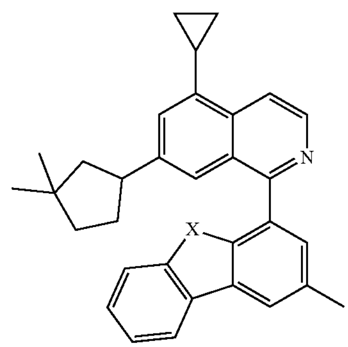
| | |
|---|---|
| X = O | La709 |
| X = S | La710 |
| X = Se | La711 |
| X = $C(CH_3)_2$ | La712 |
| X = $NCH_3$ | La713 |
| X = N(i-Pr) | La714 |

-continued
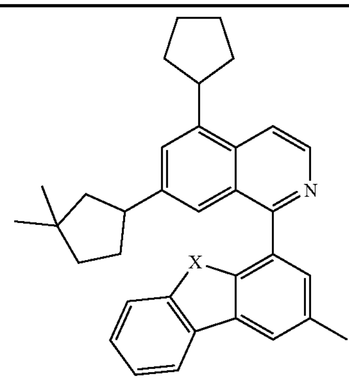
| | |
|---|---|
| X = O | La715 |
| X = S | La716 |
| X = Se | La717 |
| X = $C(CH_3)_2$ | La718 |
| X = $NCH_3$ | La719 |
| X = N(i-Pr) | La720 |
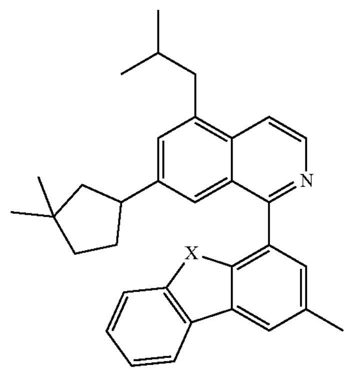
| | |
|---|---|
| X = O | La721 |
| X = S | La722 |
| X = Se | La723 |
| X = $C(CH_3)_2$ | La724 |
| X = $NCH_3$ | La725 |
| X = N(i-Pr) | La726 |
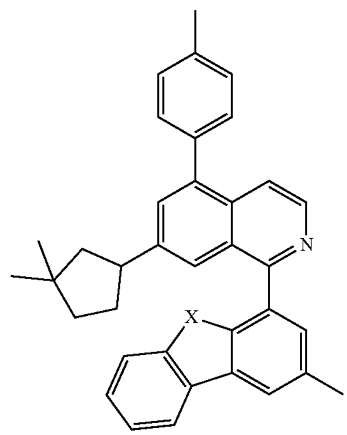
| | |
|---|---|
| X = O | La727 |
| X = S | La728 |
| X = Se | La729 |
| X = $C(CH_3)_2$ | La730 |
| X = $NCH_3$ | La731 |
| X = N(i-Pr) | La732 |
-continued
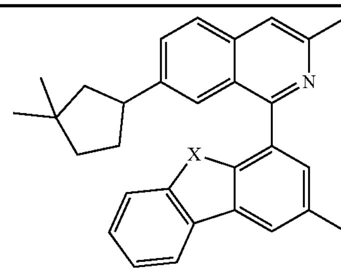
| | |
|---|---|
| X = O | La733 |
| X = S | La734 |
| X = Se | La735 |
| X = $C(CH_3)_2$ | La736 |
| X = $NCH_3$ | La737 |
| X = N(i-Pr) | La738 |
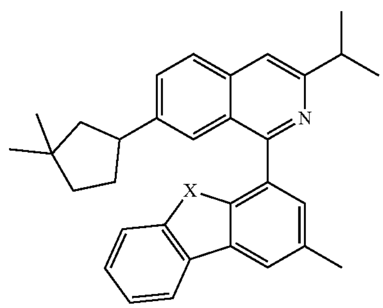
| | |
|---|---|
| X = O | La739 |
| X = S | La740 |
| X = Se | La741 |
| X = $C(CH_3)_2$ | La742 |
| X = $NCH_3$ | La743 |
| X = N(i-Pr) | La744 |
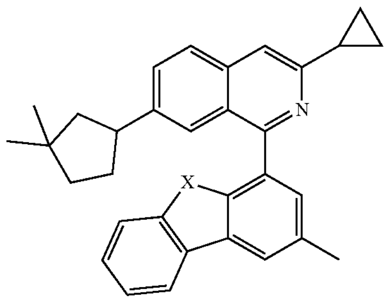
| | |
|---|---|
| X = O | La745 |
| X = S | La746 |
| X = Se | La747 |
| X = $C(CH_3)_2$ | La748 |
| X = $NCH_3$ | La749 |
| X = N(i-Pr) | La750 |
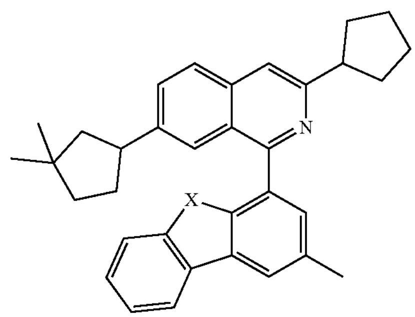

-continued

| X = O | La751 |
| --- | --- |
| X = S | La752 |
| X = Se | La753 |
| X = $C(CH_3)_2$ | La754 |
| X = $NCH_3$ | La755 |
| X = N(i-Pr) | La756 |

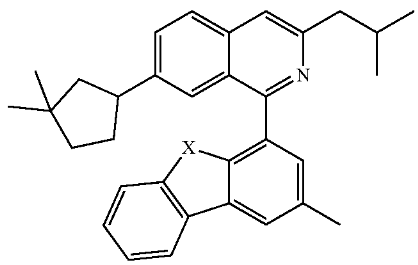

| X = O | La757 |
| --- | --- |
| X = S | La758 |
| X = Se | La759 |
| X = $C(CH_3)_2$ | La760 |
| X = $NCH_3$ | La761 |
| X = N(i-Pr) | La762 |

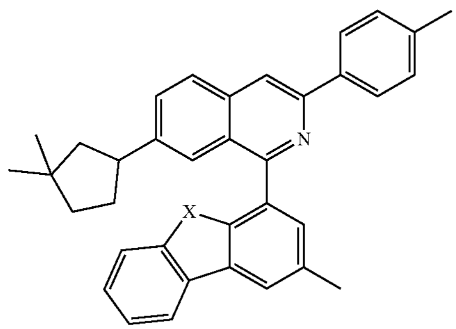

| X = O | La763 |
| --- | --- |
| X = S | La764 |
| X = Se | La765 |
| X = $C(CH_3)_2$ | La766 |
| X = $NCH_3$ | La767 |
| X = N(i-Pr) | La768 |

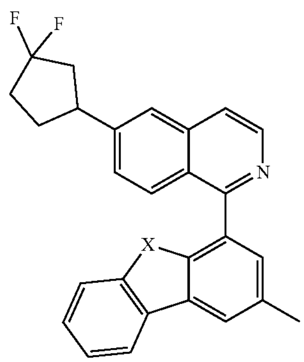

| X = O | La769 |
| --- | --- |
| X = S | La770 |
| X = Se | La771 |
| X = $C(CH_3)_2$ | La772 |
| X = $NCH_3$ | La773 |
| X = N(i-Pr) | La774 |

-continued

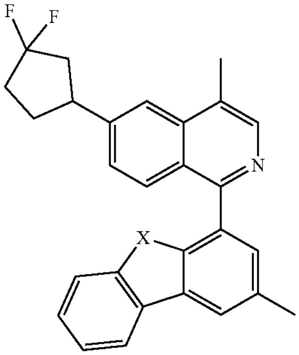

| X = O | La775 |
| --- | --- |
| X = S | La776 |
| X = Se | La777 |
| X = $C(CH_3)_2$ | La778 |
| X = $NCH_3$ | La779 |
| X = N(i-Pr) | La780 |

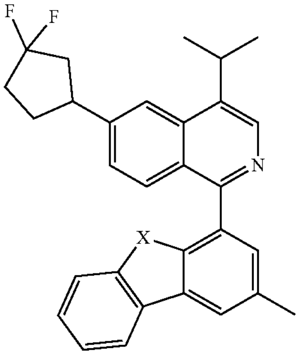

| X = O | La781 |
| --- | --- |
| X = S | La782 |
| X = Se | La783 |
| X = $C(CH_3)_2$ | La784 |
| X = $NCH_3$ | La785 |
| X = N(i-Pr) | La786 |

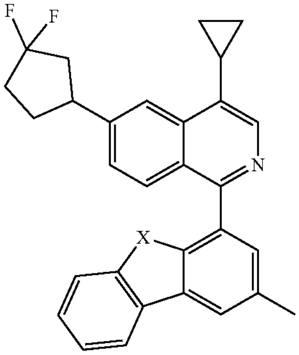

| X = O | La787 |
| --- | --- |
| X = S | La788 |
| X = Se | La789 |
| X = $C(CH_3)_2$ | La790 |
| X = $NCH_3$ | La791 |
| X = N(i-Pr) | La792 |

-continued
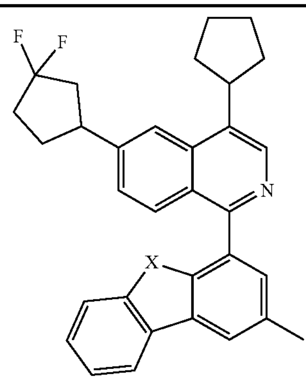
| | |
|---|---|
| X = O | La793 |
| X = S | La794 |
| X = Se | La795 |
| X = $C(CH_3)_2$ | La796 |
| X = $NCH_3$ | La797 |
| X = N(i-Pr) | La798 |
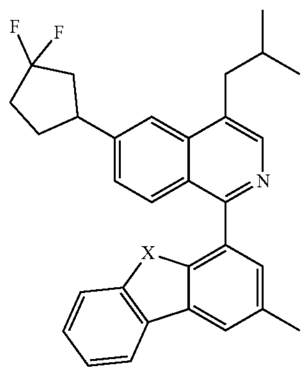
| | |
|---|---|
| X = O | La799 |
| X = S | La800 |
| X = Se | La801 |
| X = $C(CH_3)_2$ | La802 |
| X = $NCH_3$ | La803 |
| X = N(i-Pr) | La804 |
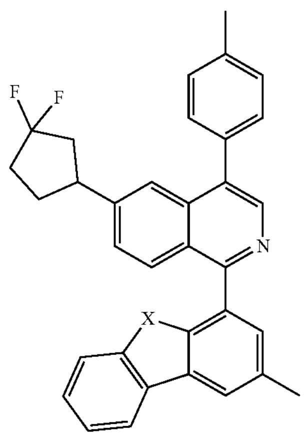
| | |
|---|---|
| X = O | La805 |
| X = S | La806 |
| X = Se | La807 |
| X = $C(CH_3)_2$ | La808 |
| X = $NCH_3$ | La809 |
| X = N(i-Pr) | La810 |
-continued
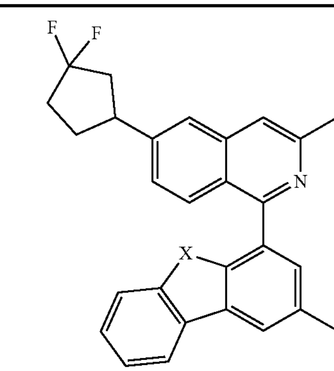
| | |
|---|---|
| X = O | La811 |
| X = S | La812 |
| X = Se | La813 |
| X = $C(CH_3)_2$ | La814 |
| X = $NCH_3$ | La815 |
| X = N(i-Pr) | La816 |
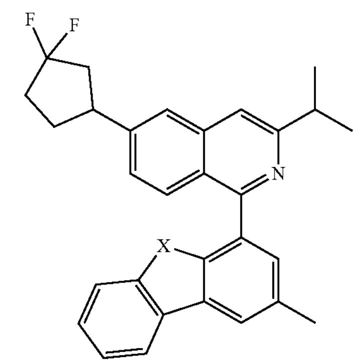
| | |
|---|---|
| X = O | La817 |
| X = S | La818 |
| X = Se | La819 |
| X = $C(CH_3)_2$ | La820 |
| X = $NCH_3$ | La821 |
| X = N(i-Pr) | La822 |
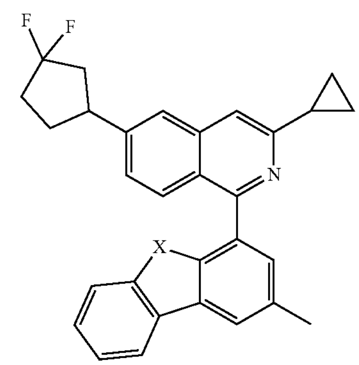
| | |
|---|---|
| X = O | La823 |
| X = S | La824 |
| X = Se | La825 |
| X = $C(CH_3)_2$ | La826 |
| X = $NCH_3$ | La827 |
| X = N(i-Pr) | La828 |

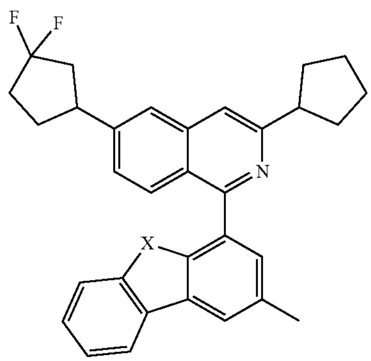
| | |
|---|---|
| X = O | La829 |
| X = S | La830 |
| X = Se | La831 |
| X = $C(CH_3)_2$ | La832 |
| X = $NCH_3$ | La833 |
| X = N(i-Pr) | La834 |
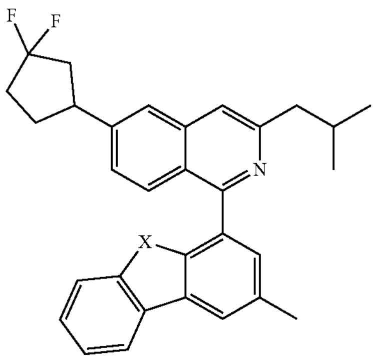
| | |
|---|---|
| X = O | La835 |
| X = S | La836 |
| X = Se | La837 |
| X = $C(CH_3)_2$ | La838 |
| X = $NCH_3$ | La839 |
| X = N(i-Pr) | La840 |
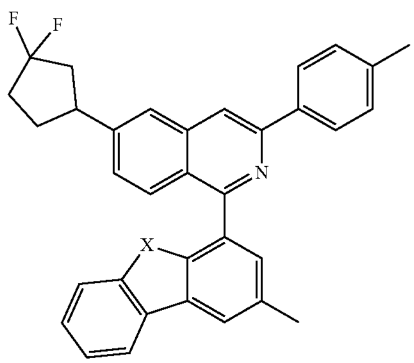
| | |
|---|---|
| X = O | La841 |
| X = S | La842 |
| X = Se | La843 |
| X = $C(CH_3)_2$ | La844 |
| X = $NCH_3$ | La845 |
| X = N(i-Pr) | La846 |
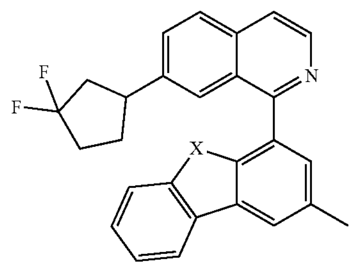
| | |
|---|---|
| X = O | La847 |
| X = S | La848 |
| X = Se | La849 |
| X = $C(CH_3)_2$ | La850 |
| X = $NCH_3$ | La851 |
| X = N(i-Pr) | La852 |
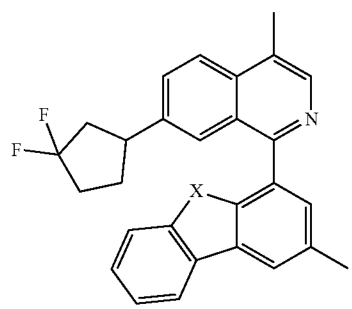
| | |
|---|---|
| X = O | La853 |
| X = S | La854 |
| X = Se | La855 |
| X = $C(CH_3)_2$ | La856 |
| X = $NCH_3$ | La857 |
| X = N(i-Pr) | La858 |
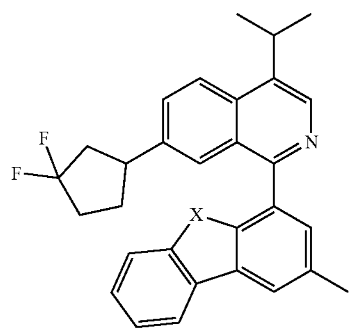
| | |
|---|---|
| X = O | La859 |
| X = S | La860 |
| X = Se | La861 |
| X = $C(CH_3)_2$ | La862 |
| X = $NCH_3$ | La863 |
| X = N(i-Pr) | La864 |

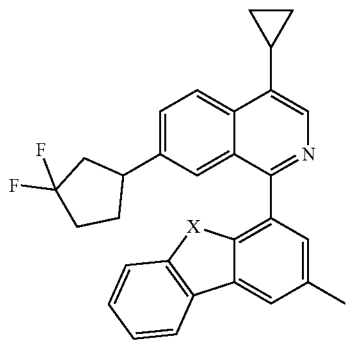
| | |
|---|---|
| X = O | La865 |
| X = S | La866 |
| X = Se | La867 |
| X = $C(CH_3)_2$ | La868 |
| X = $NCH_3$ | La869 |
| X = N(i-Pr) | La870 |
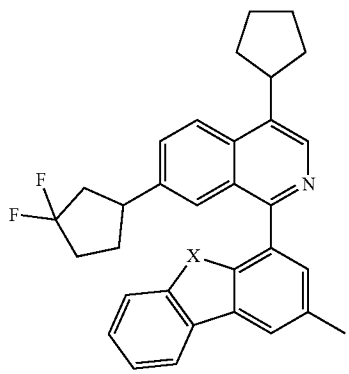
| | |
|---|---|
| X = O | La871 |
| X = S | La872 |
| X = Se | La873 |
| X = $C(CH_3)_2$ | La874 |
| X = $NCH_3$ | La875 |
| X = N(i-Pr) | La876 |
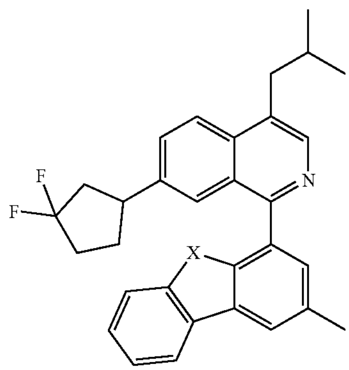
| | |
|---|---|
| X = O | La877 |
| X = S | La878 |
| X = Se | La879 |
| X = $C(CH_3)_2$ | La880 |
| X = $NCH_3$ | La881 |
| X = N(i-Pr) | La882 |
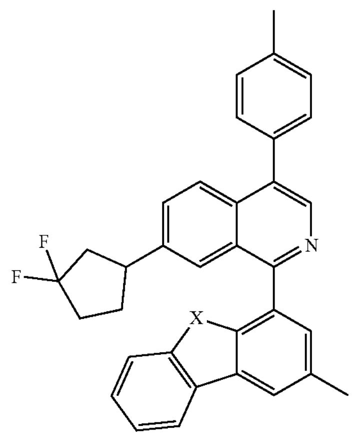
| | |
|---|---|
| X = O | La883 |
| X = S | La884 |
| X = Se | La885 |
| X = $C(CH_3)_2$ | La886 |
| X = $NCH_3$ | La887 |
| X = N(i-Pr) | La888 |
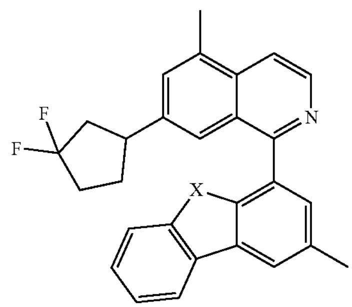
| | |
|---|---|
| X = O | La889 |
| X = S | La890 |
| X = Se | La891 |
| X = $C(CH_3)_2$ | La892 |
| X = $NCH_3$ | La893 |
| X = N(i-Pr) | La894 |
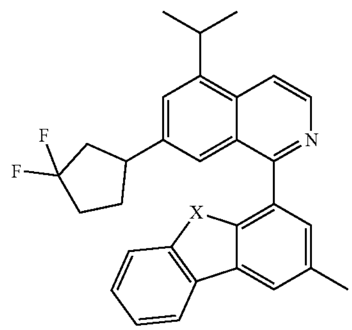
| | |
|---|---|
| X = O | La895 |
| X = S | La896 |
| X = Se | La897 |
| X = $C(CH_3)_2$ | La898 |
| X = $NCH_3$ | La899 |
| X = N(i-Pr) | La900 |

-continued
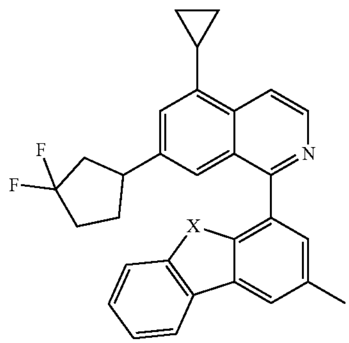
| | |
|---|---|
| X = O | La901 |
| X = S | La902 |
| X = Se | La903 |
| X = $C(CH_3)_2$ | La904 |
| X = $NCH_3$ | La905 |
| X = N(i-Pr) | La906 |
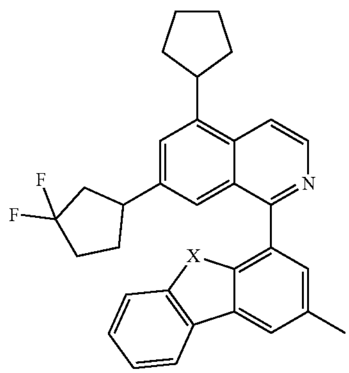
| | |
|---|---|
| X = O | La907 |
| X = S | La908 |
| X = Se | La909 |
| X = $C(CH_3)_2$ | La910 |
| X = $NCH_3$ | La911 |
| X = N(i-Pr) | La912 |
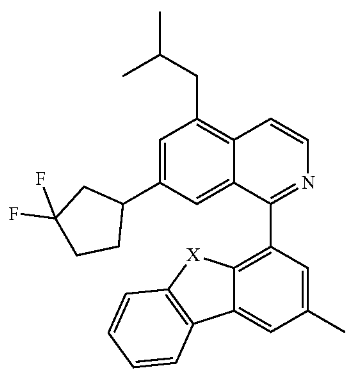
| | |
|---|---|
| X = O | La913 |
| X = S | La914 |
| X = Se | La915 |
| X = $C(CH_3)_2$ | La916 |
| X = $NCH_3$ | La917 |
| X = N(i-Pr) | La918 |
-continued
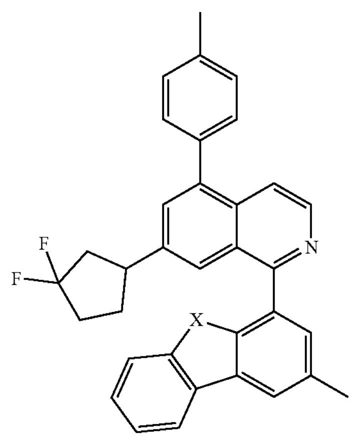
| | |
|---|---|
| X = O | La919 |
| X = S | La920 |
| X = Se | La921 |
| X = $C(CH_3)_2$ | La922 |
| X = $NCH_3$ | La923 |
| X = N(i-Pr) | La924 |
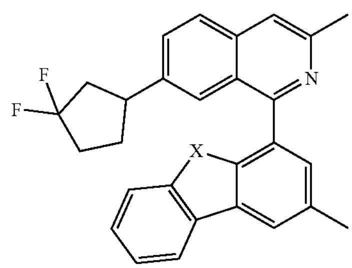
| | |
|---|---|
| X = O | La925 |
| X = S | La926 |
| X = Se | La927 |
| X = $C(CH_3)_2$ | La928 |
| X = $NCH_3$ | La929 |
| X = N(i-Pr) | La930 |
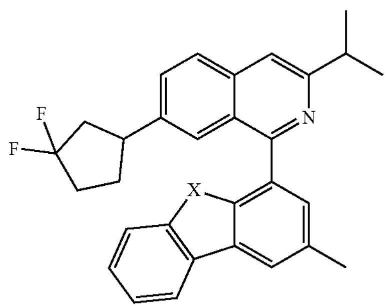
| | |
|---|---|
| X = O | La931 |
| X = S | La932 |
| X = Se | La933 |
| X = $C(CH_3)_2$ | La934 |
| X = $NCH_3$ | La935 |
| X = N(i-Pr) | La936 |

-continued

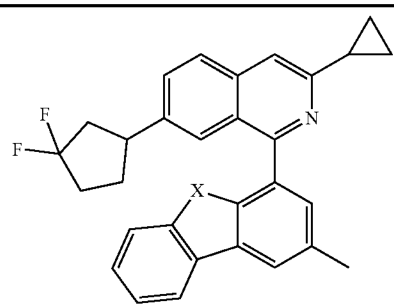

X = O La937
X = S La938
X = Se La939
X = $C(CH_3)_2$ La940
X = $NCH_3$ La941
X = N(i-Pr) La942

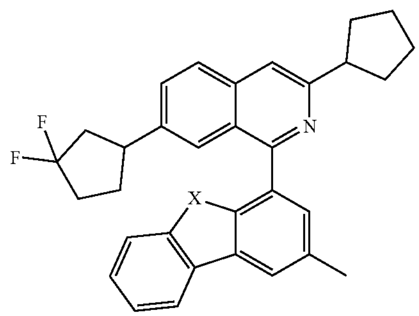

X = O La943
X = S La944
X = Se La945
X = $C(CH_3)_2$ La946
X = $NCH_3$ La947
X = N(i-Pr) La948

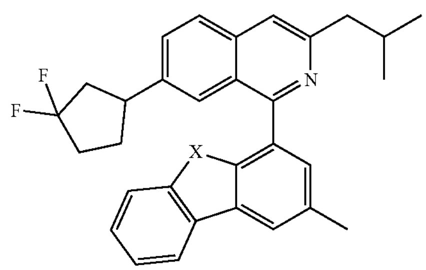

X = O La949
X = S La950
X = Se La951
X = $C(CH_3)_2$ La952
X = $NCH_3$ La953
X = N(i-Pr) La954

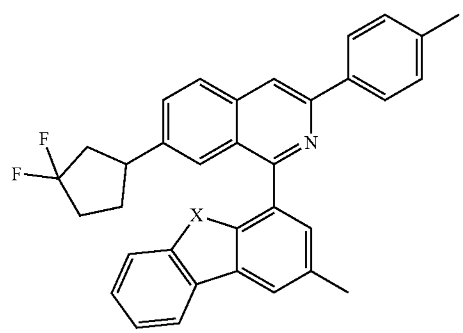

-continued

X = O La955
X = S La956
X = Se La957
X = $C(CH_3)_2$ La958
X = $NCH_3$ La959
X = N(i-Pr) La960

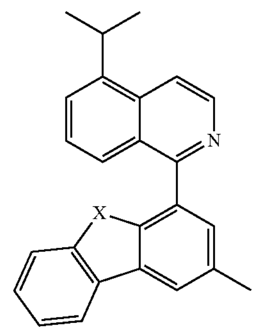

X = O La961
X = S La962
X = Se La963
X = $C(CH_3)_2$ La964
X = $NCH_3$ La965
X = N(i-Pr) La966

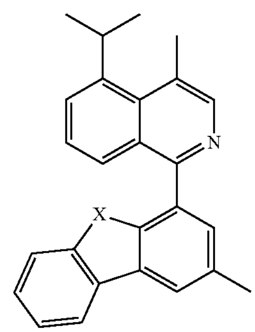

X = O La967
X = S La968
X = Se La969
X = $C(CH_3)_2$ La970
X = $NCH_3$ La971
X = N(i-Pr) La972

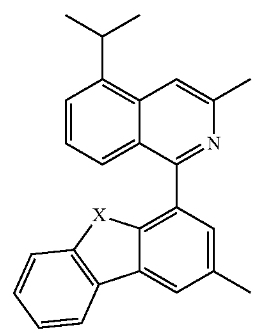

X = O La973
X = S La974
X = Se La975
X = $C(CH_3)_2$ La976
X = $NCH_3$ La977
X = N(i-Pr) La978

-continued
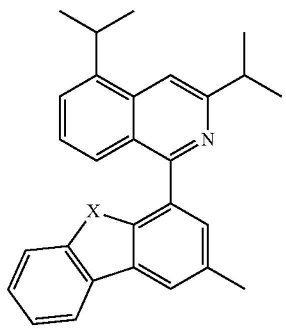
| | |
|---|---|
| X = O | La979 |
| X = S | La980 |
| X = Se | La981 |
| X = $C(CH_3)_2$ | La982 |
| X = $NCH_3$ | La983 |
| X = N(i-Pr) | La984 |
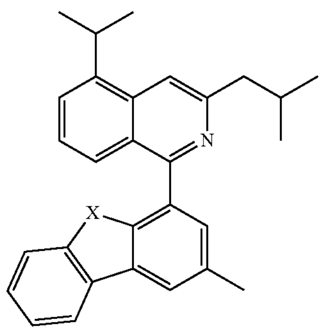
| | |
|---|---|
| X = O | La985 |
| X = S | La986 |
| X = Se | La987 |
| X = $C(CH_3)_2$ | La988 |
| X = $NCH_3$ | La989 |
| X = N(i-Pr) | La990 |
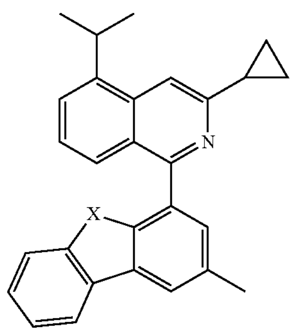
| | |
|---|---|
| X = O | La991 |
| X = S | La992 |
| X = Se | La993 |
| X = $C(CH_3)_2$ | La994 |
| X = $NCH_3$ | La995 |
| X = N(i-Pr) | La996 |
-continued
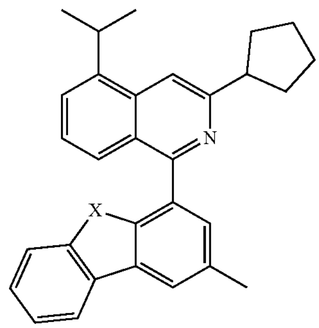
| | |
|---|---|
| X = O | La997 |
| X = S | La998 |
| X = Se | La999 |
| X = $C(CH_3)_2$ | La1000 |
| X = $NCH_3$ | La1001 |
| X = N(i-Pr) | La1002 |
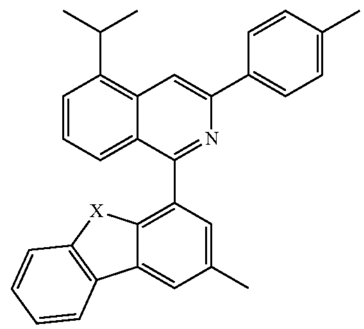
| | |
|---|---|
| X = O | La1003 |
| X = S | La1004 |
| X = Se | La1005 |
| X = $C(CH_3)_2$ | La1006 |
| X = $NCH_3$ | La1007 |
| X = N(i-Pr) | La1008 |
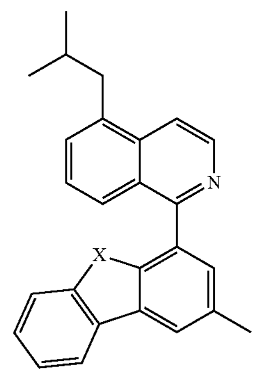
| | |
|---|---|
| X = O | La1009 |
| X = S | La1010 |
| X = Se | La1011 |
| X = $C(CH_3)_2$ | La1012 |
| X = $NCH_3$ | La1013 |
| X = N(i-Pr) | La1014 |

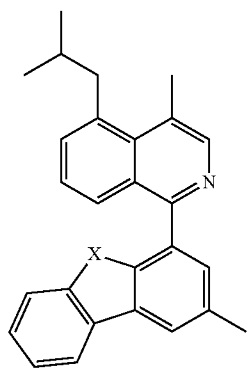
| | |
|---|---|
| X = O | La1015 |
| X = S | La1016 |
| X = Se | La1017 |
| X = $C(CH_3)_2$ | La1018 |
| X = $NCH_3$ | La1019 |
| X = N(i-Pr) | La1020 |
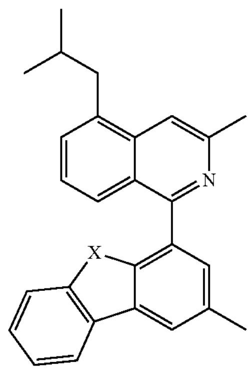
| | |
|---|---|
| X = O | La1021 |
| X = S | La1022 |
| X = Se | La1023 |
| X = $C(CH_3)_2$ | La1024 |
| X = $NCH_3$ | La1025 |
| X = N(i-Pr) | La1026 |
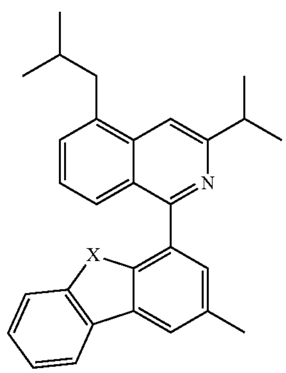
| | |
|---|---|
| X = O | La1027 |
| X = S | La1028 |
| X = Se | La1029 |
| X = $C(CH_3)_2$ | La1030 |
| X = $NCH_3$ | La1031 |
| X = N(i-Pr) | La1032 |
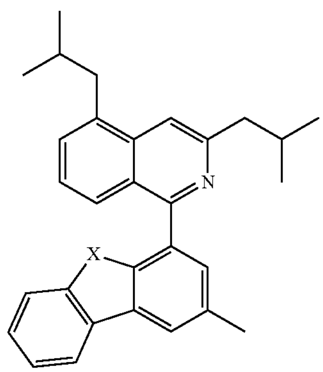
| | |
|---|---|
| X = O | La1033 |
| X = S | La1034 |
| X = Se | La1035 |
| X = $C(CH_3)_2$ | La1036 |
| X = $NCH_3$ | La1037 |
| X = N(i-Pr) | La1038 |
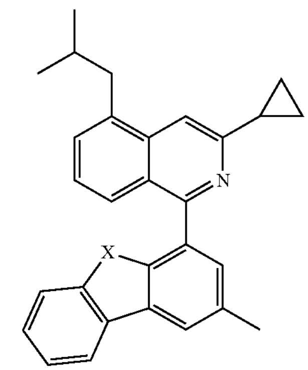
| | |
|---|---|
| X = O | La1039 |
| X = S | La1040 |
| X = Se | La1041 |
| X = $C(CH_3)_2$ | La1042 |
| X = $NCH_3$ | La1043 |
| X = N(i-Pr) | La1044 |
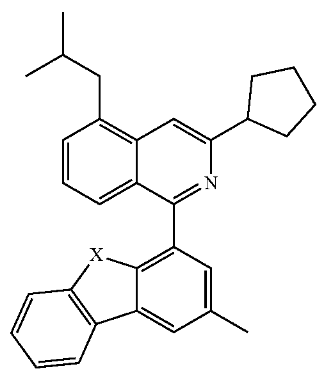
| | |
|---|---|
| X = O | La1045 |
| X = S | La1046 |
| X = Se | La1047 |
| X = $C(CH_3)_2$ | La1048 |
| X = $NCH_3$ | La1049 |
| X = N(i-Pr) | La1050 |

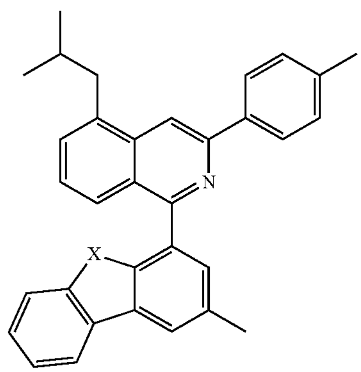
| | |
|---|---|
| X = O | La1051 |
| X = S | La1052 |
| X = Se | La1053 |
| X = $C(CH_3)_2$ | La1054 |
| X = $NCH_3$ | La1055 |
| X = N(i-Pr) | La1056 |
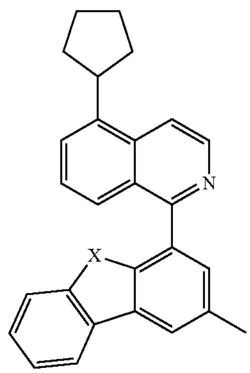
| | |
|---|---|
| X = O | La1057 |
| X = S | La1058 |
| X = Se | La1059 |
| X = $C(CH_3)_2$ | La1060 |
| X = $NCH_3$ | La1061 |
| X = N(i-Pr) | La1062 |
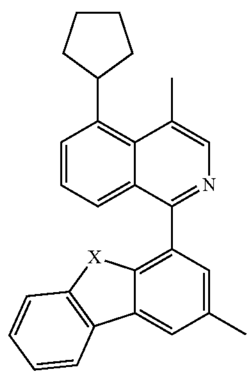
| | |
|---|---|
| X = O | La1063 |
| X = S | La1064 |
| X = Se | La1065 |
| X = $C(CH_3)_2$ | La1066 |
| X = $NCH_3$ | La1067 |
| X = N(i-Pr) | La1068 |
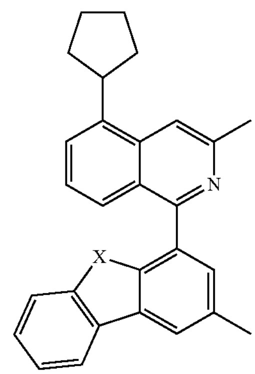
| | |
|---|---|
| X = O | La1069 |
| X = S | La1070 |
| X = Se | La1071 |
| X = $C(CH_3)_2$ | La1072 |
| X = $NCH_3$ | La1073 |
| X = N(i-Pr) | La1074 |
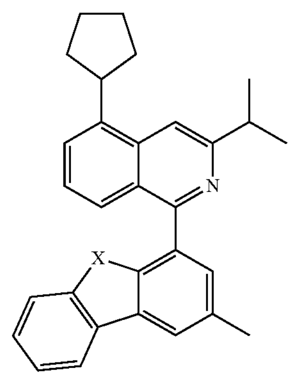
| | |
|---|---|
| X = O | La1075 |
| X = S | La1076 |
| X = Se | La1077 |
| X = $C(CH_3)_2$ | La1078 |
| X = $NCH_3$ | La1079 |
| X = N(i-Pr) | La1080 |
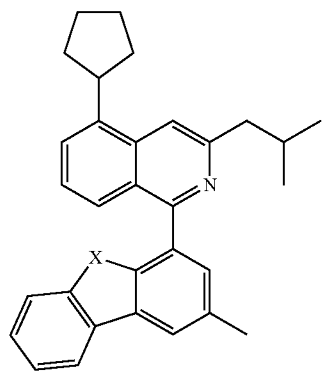
| | |
|---|---|
| X = O | La1081 |
| X = S | La1082 |
| X = Se | La1083 |
| X = $C(CH_3)_2$ | La1084 |
| X = $NCH_3$ | La1085 |
| X = N(i-Pr) | La1086 |

-continued
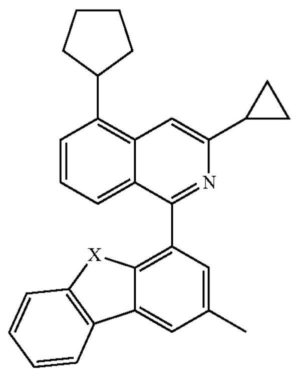
| | |
|---|---|
| X = O | La1087 |
| X = S | La1088 |
| X = Se | La1089 |
| X = $C(CH_3)_2$ | La1090 |
| X = $NCH_3$ | La1091 |
| X = N(i-Pr) | La1092 |
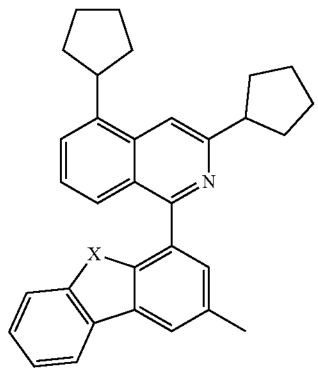
| | |
|---|---|
| X = O | La1093 |
| X = S | La1094 |
| X = Se | La1095 |
| X = $C(CH_3)_2$ | La1096 |
| X = $NCH_3$ | La1097 |
| X = N(i-Pr) | La1098 |
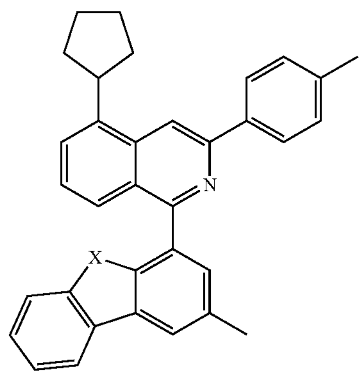
| | |
|---|---|
| X = O | La1099 |
| X = S | La1100 |
| X = Se | La1101 |
| X = $C(CH_3)_2$ | La1102 |
| X = $NCH_3$ | La1103 |
| X = N(i-Pr) | La1104 |
-continued
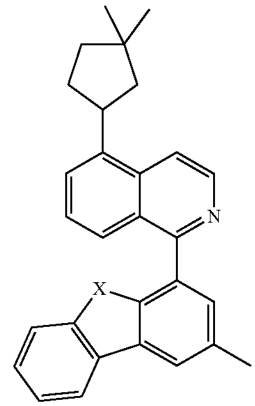
| | |
|---|---|
| X = O | La1105 |
| X = S | La1106 |
| X = Se | La1107 |
| X = $C(CH_3)_2$ | La1108 |
| X = $NCH_3$ | La1109 |
| X = N(i-Pr) | La1110 |
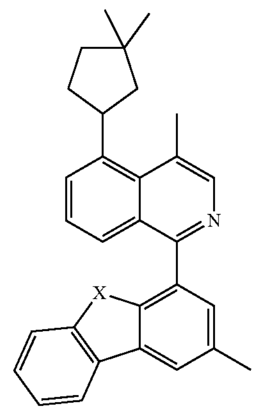
| | |
|---|---|
| X = O | La1111 |
| X = S | La1112 |
| X = Se | La1113 |
| X = $C(CH_3)_2$ | La1114 |
| X = $NCH_3$ | La1115 |
| X = N(i-Pr) | La1116 |
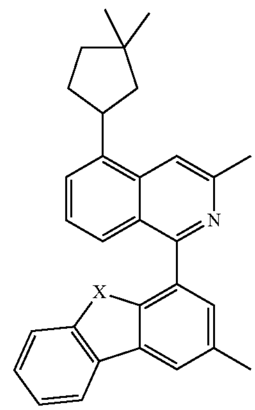
| | |
|---|---|
| X = O | La1117 |
| X = S | La1118 |
| X = Se | La1119 |
| X = $C(CH_3)_2$ | La1120 |
| X = $NCH_3$ | La1121 |
| X = N(i-Pr) | La1122 |

-continued
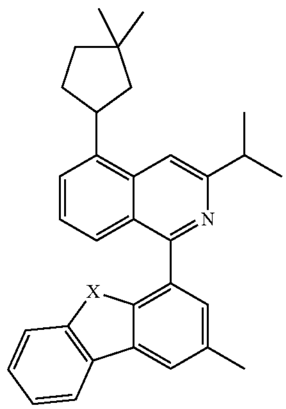
| | |
|---|---|
| X = O | La1123 |
| X = S | La1124 |
| X = Se | La1125 |
| X = $C(CH_3)_2$ | La1126 |
| X = $NCH_3$ | La1127 |
| X = N(i-Pr) | La1128 |
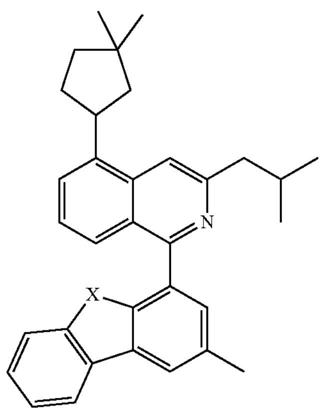
| | |
|---|---|
| X = O | La1129 |
| X = S | La1130 |
| X = Se | La1131 |
| X = $C(CH_3)_2$ | La1132 |
| X = $NCH_3$ | La1133 |
| X = N(i-Pr) | La1134 |
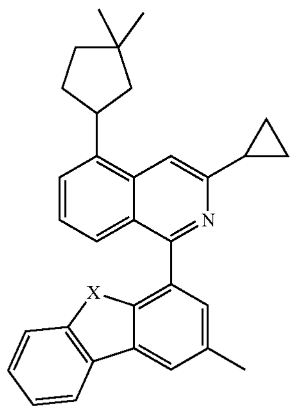
-continued
| | |
|---|---|
| X = O | La1135 |
| X = S | La1136 |
| X = Se | La1137 |
| X = $C(CH_3)_2$ | La1138 |
| X = $NCH_3$ | La1139 |
| X = N(i-Pr) | La1140 |
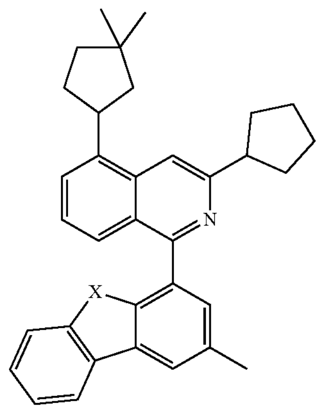
| | |
|---|---|
| X = O | La1141 |
| X = S | La1142 |
| X = Se | La1143 |
| X = $C(CH_3)_2$ | La1144 |
| X = $NCH_3$ | La1145 |
| X = N(i-Pr) | La1146 |
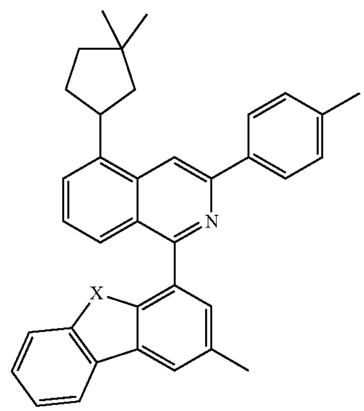
| | |
|---|---|
| X = O | La1147 |
| X = S | La1148 |
| X = Se | La1149 |
| X = $C(CH_3)_2$ | La1150 |
| X = $NCH_3$ | La1151 |
| X = N(i-Pr) | La1152 |

-continued
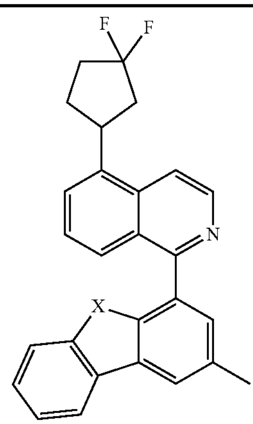
| | |
|---|---|
| X = O | La1153 |
| X = S | La1154 |
| X = Se | La1155 |
| X = $C(CH_3)_2$ | La1156 |
| X = $NCH_3$ | La1157 |
| X = N(i-Pr) | La1158 |
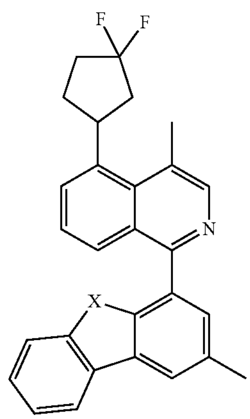
| | |
|---|---|
| X = O | La1159 |
| X = S | La1160 |
| X = Se | La1161 |
| X = $C(CH_3)_2$ | La1162 |
| X = $NCH_3$ | La1163 |
| X = N(i-Pr) | La1164 |
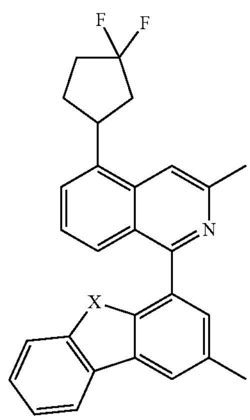
-continued
| | |
|---|---|
| X = O | La1165 |
| X = S | La1166 |
| X = Se | La1167 |
| X = $C(CH_3)_2$ | La1168 |
| X = $NCH_3$ | La1169 |
| X = N(i-Pr) | La1170 |
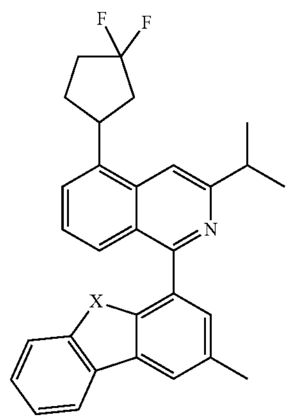
| | |
|---|---|
| X = O | La1171 |
| X = S | La1172 |
| X = Se | La1173 |
| X = $C(CH_3)_2$ | La1174 |
| X = $NCH_3$ | La1175 |
| X = N(i-Pr) | La1176 |
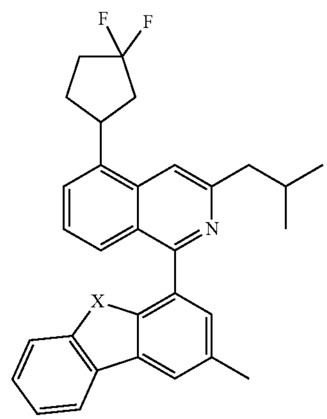
| | |
|---|---|
| X = O | La1177 |
| X = S | La1178 |
| X = Se | La1179 |
| X = $C(CH_3)_2$ | La1180 |
| X = $NCH_3$ | La1181 |
| X = N(i-Pr) | La1182 |

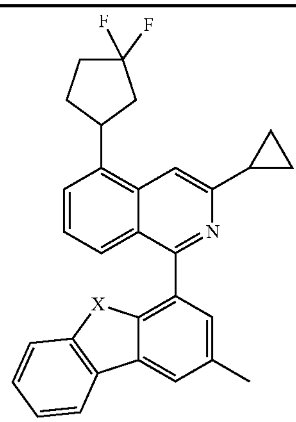
| | |
|---|---|
| X = O | La1183 |
| X = S | La1184 |
| X = Se | La1185 |
| X = $C(CH_3)_2$ | La1186 |
| X = $NCH_3$ | La1187 |
| X = N(i-Pr) | La1188 |
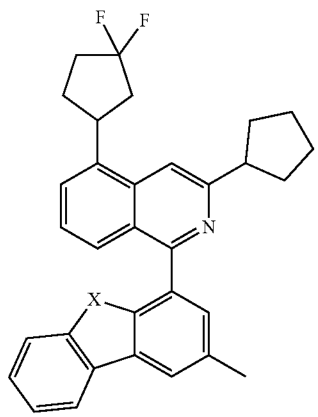
| | |
|---|---|
| X = O | La1189 |
| X = S | La1190 |
| X = Se | La1191 |
| X = $C(CH_3)_2$ | La1192 |
| X = $NCH_3$ | La1193 |
| X = N(i-Pr) | La1194 |
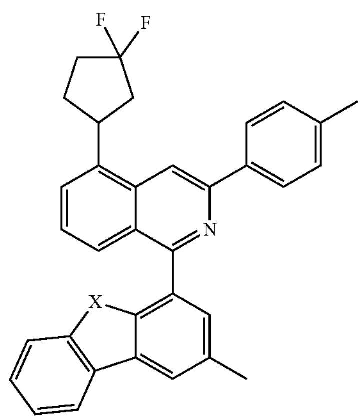
| | |
|---|---|
| X = O | La1195 |
| X = S | La1196 |
| X = Se | La1197 |
| X = $C(CH_3)_2$ | La1198 |
| X = $NCH_3$ | La1199 |
| X = N(i-Pr) | La1200 |
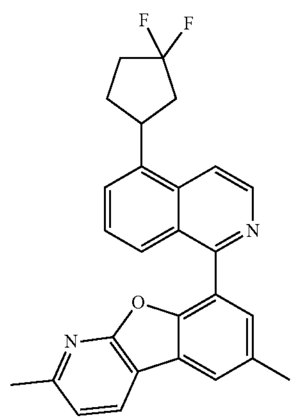
La1201
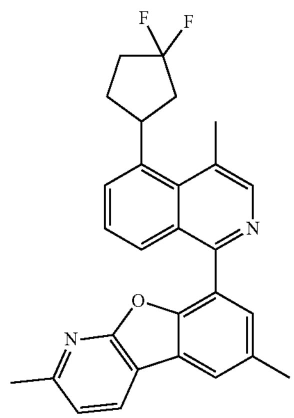
La1202
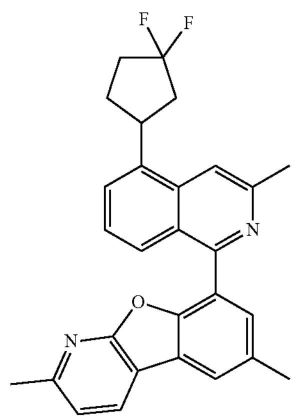
La1203

-continued
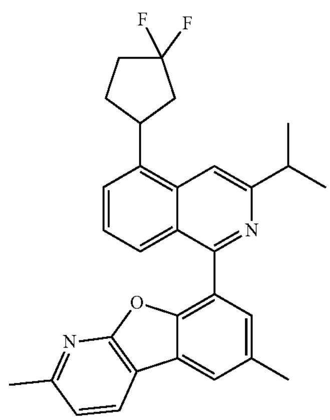 [SMILES: Cc1cc(-c2nc(C(C)C)cc3c(C4CCC(F)(F)C4)cccc23)c2oc3nc(C)ccc3c2c1]
La1204
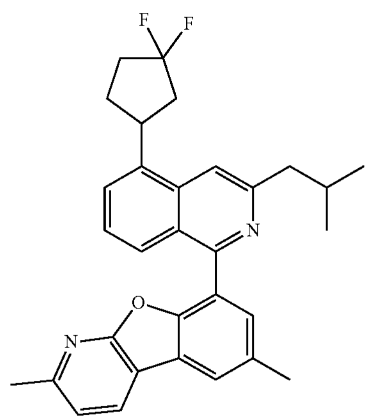 [SMILES: Cc1cc(-c2nc(CC(C)C)cc3c(C4CCC(F)(F)C4)cccc23)c2oc3nc(C)ccc3c2c1]
La1205
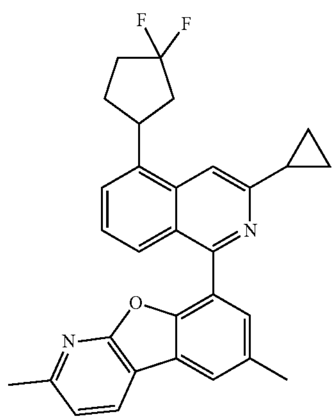 [SMILES: Cc1cc(-c2nc(C3CC3)cc3c(C4CCC(F)(F)C4)cccc23)c2oc3nc(C)ccc3c2c1]
La1206
-continued
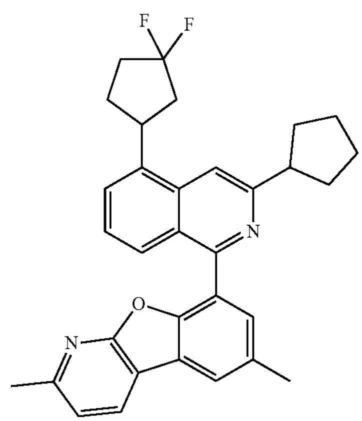 [SMILES: Cc1cc(-c2nc(C3CCCC3)cc3c(C4CCC(F)(F)C4)cccc23)c2oc3nc(C)ccc3c2c1]
La1207
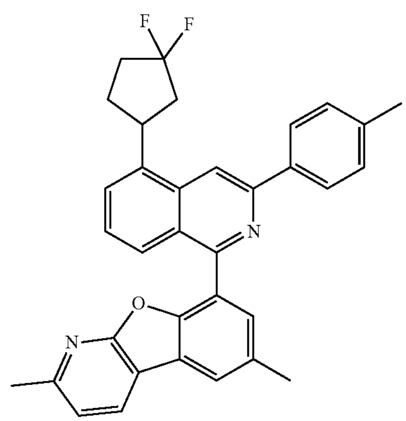
La1208
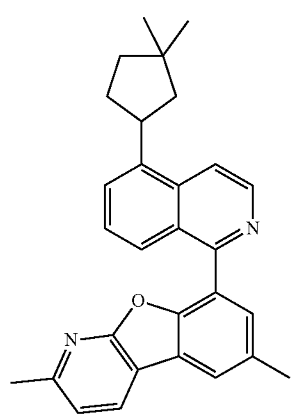
La1209

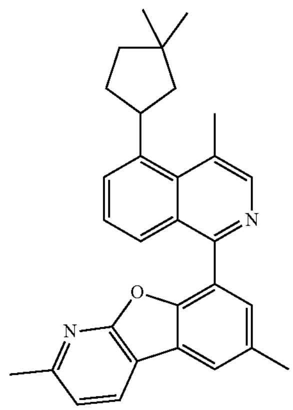
La1210
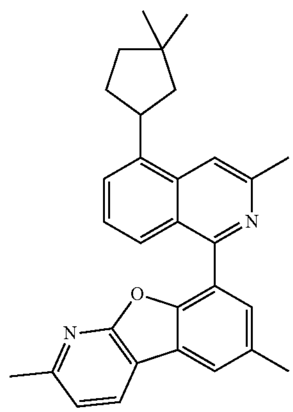
La1211
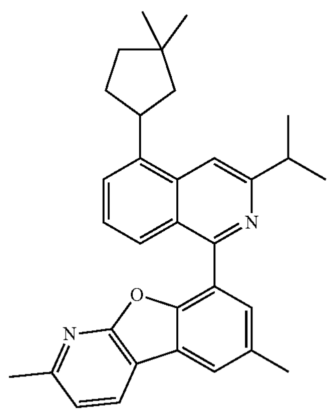 [SMILES: Cc1cc(-c2nc(C(C)C)cc3c(C4CCC(C)(C)C4)cccc23)c2oc3nc(C)ccc3c2c1]
La1212
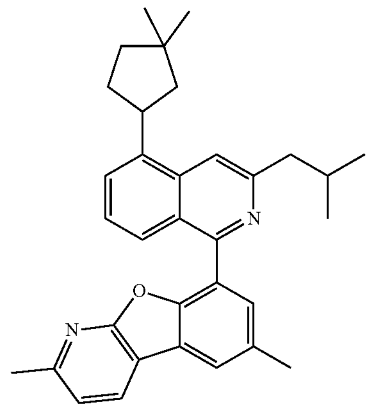 [SMILES: Cc1cc(-c2nc(CC(C)C)cc3c(C4CCC(C)(C)C4)cccc23)c2oc3nc(C)ccc3c2c1]
La1213
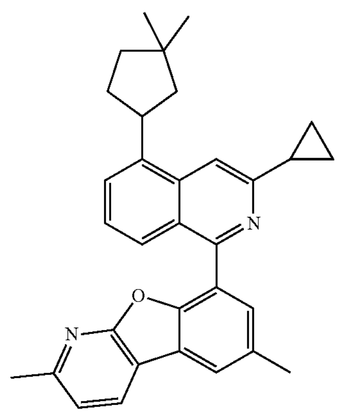 [SMILES: Cc1cc(-c2nc(C3CC3)cc3c(C4CCC(C)(C)C4)cccc23)c2oc3nc(C)ccc3c2c1]
La1214
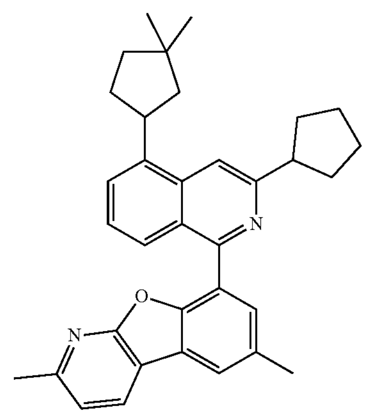 [SMILES: Cc1cc(-c2nc(C3CCCC3)cc3c(C4CCC(C)(C)C4)cccc23)c2oc3nc(C)ccc3c2c1]
La1215

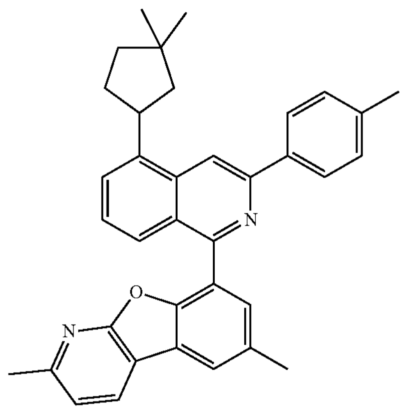
La1216
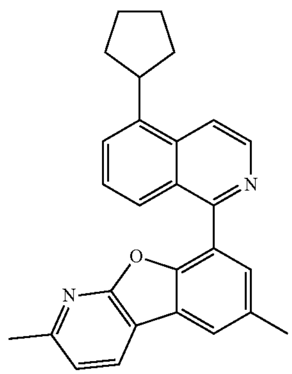
La1217
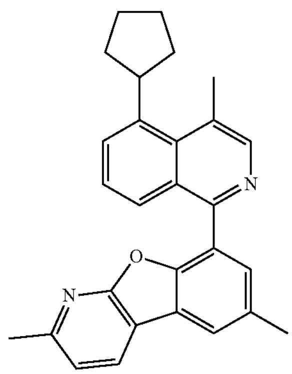
La1218
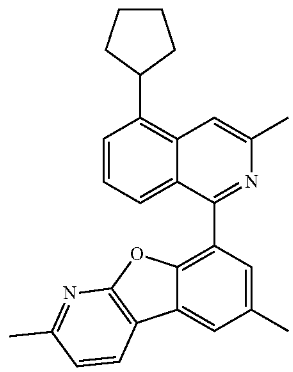
La1219
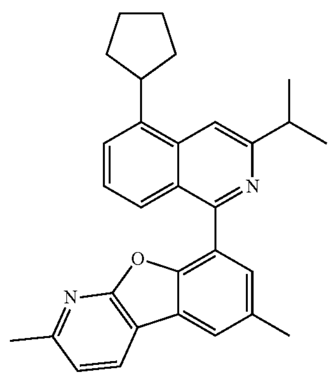 [SMILES: Cc1cc(-c2nc(C(C)C)cc3c(C4CCCC4)cccc23)c2oc3nc(C)ccc3c2c1]
La1220
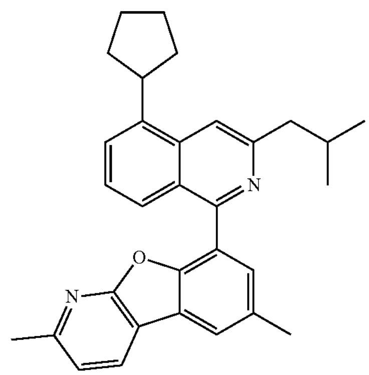 [SMILES: Cc1cc(-c2nc(CC(C)C)cc3c(C4CCCC4)cccc23)c2oc3nc(C)ccc3c2c1]
La1221
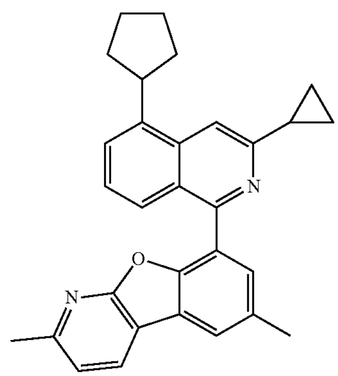 [SMILES: Cc1cc(-c2nc(C3CC3)cc3c(C4CCCC4)cccc23)c2oc3nc(C)ccc3c2c1]
La1222

-continued
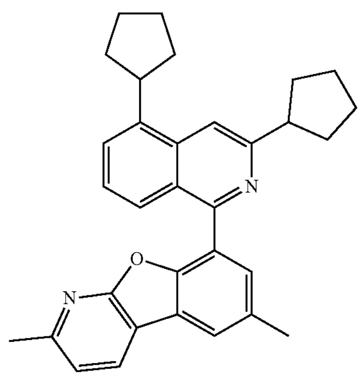 [SMILES: Cc1cc(-c2nc(C3CCCC3)cc3c(C4CCCC4)cccc23)c2oc3nc(C)ccc3c2c1]
La1223
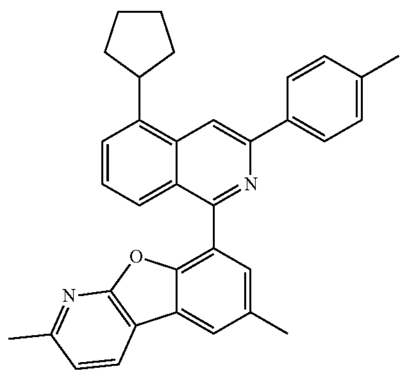
La1224
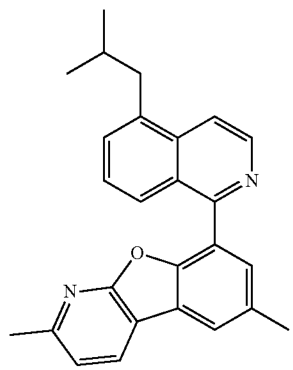
La1225
-continued
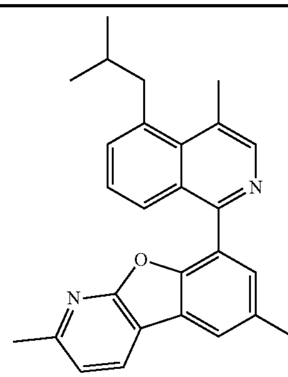
La1226
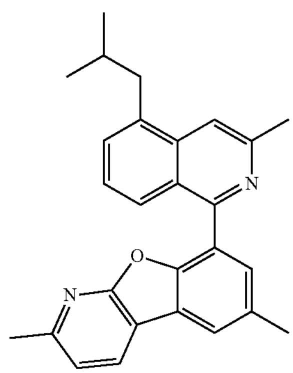
La1227
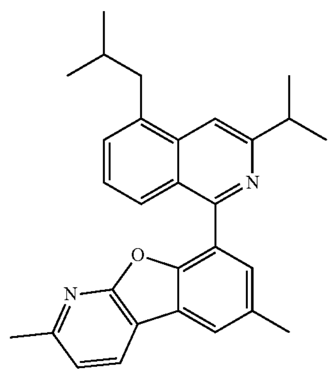 [SMILES: Cc1cc(-c2nc(C(C)C)cc3c(CC(C)C)cccc23)c2oc3nc(C)ccc3c2c1]
La1228
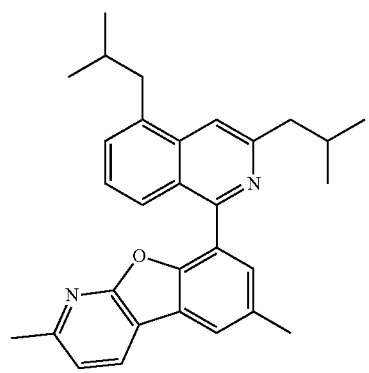 [SMILES: Cc1cc(-c2nc(CC(C)C)cc3c(CC(C)C)cccc23)c2oc3nc(C)ccc3c2c1]
La1229

-continued
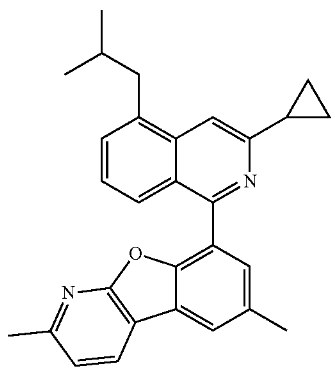 [SMILES: Cc1cc(-c2nc(C3CC3)cc3c(CC(C)C)cccc23)c2oc3nc(C)ccc3c2c1]
La1230
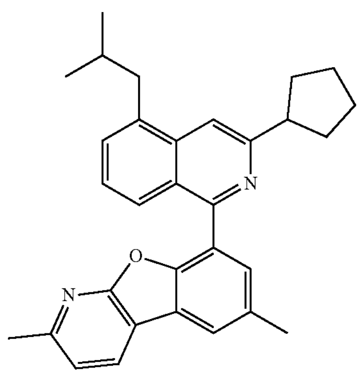 [SMILES: Cc1cc(-c2nc(C3CCCC3)cc3c(CC(C)C)cccc23)c2oc3nc(C)ccc3c2c1]
La1231
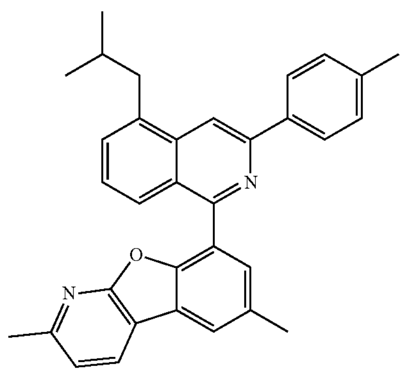
La1232
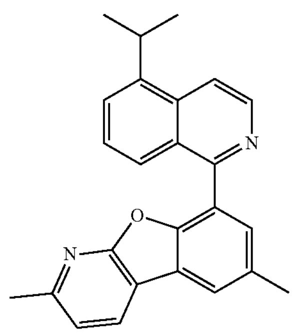
La1233
-continued
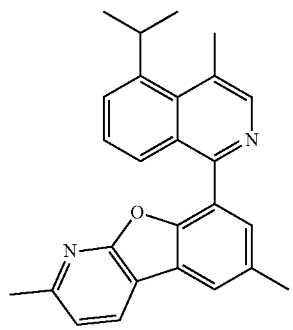
La1234
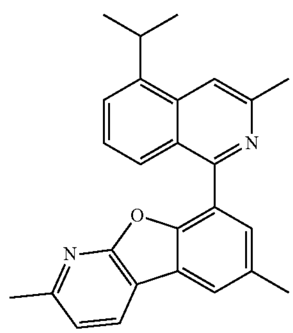
La1235
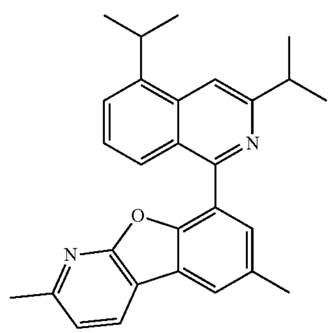 [SMILES: Cc1cc(-c2nc(C(C)C)cc3c(C(C)C)cccc23)c2oc3nc(C)ccc3c2c1]
La1236
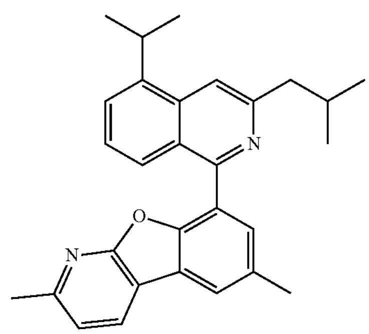 [SMILES: Cc1cc(-c2nc(CC(C)C)cc3c(C(C)C)cccc23)c2oc3nc(C)ccc3c2c1]
La1237

-continued
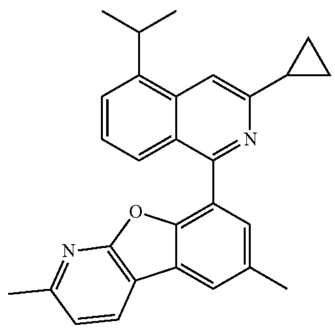 [SMILES: Cc1cc(-c2nc(C3CC3)cc3c(C(C)C)cccc23)c2oc3nc(C)ccc3c2c1]
La1238
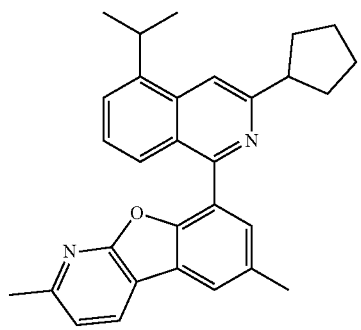 [SMILES: Cc1cc(-c2nc(C3CCCC3)cc3c(C(C)C)cccc23)c2oc3nc(C)ccc3c2c1]
La1239
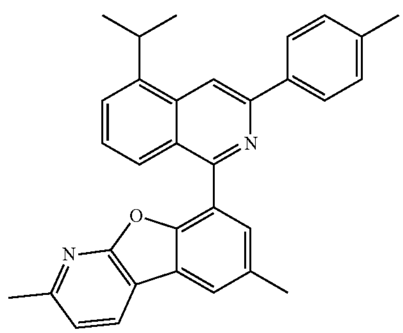
La1240
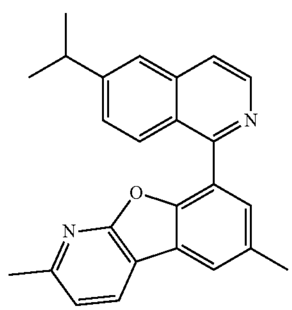
La1241
-continued
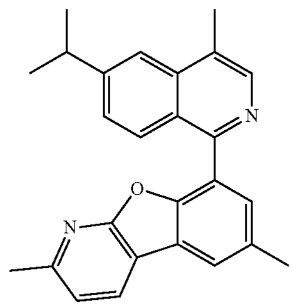
La1242
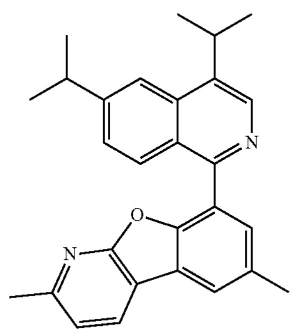
La1243
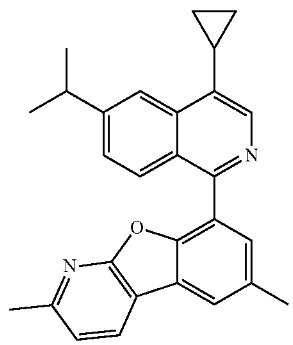
La1244
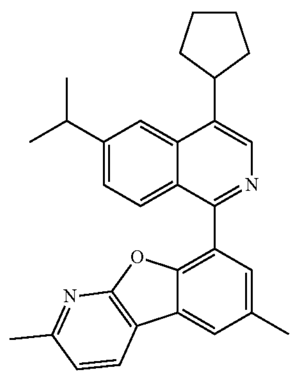
La1245

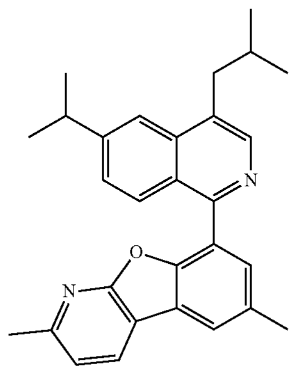 [SMILES: Cc1cc(-c2ncc(CC(C)C)c3cc(C(C)C)ccc23)c2oc3nc(C)ccc3c2c1]
La1246
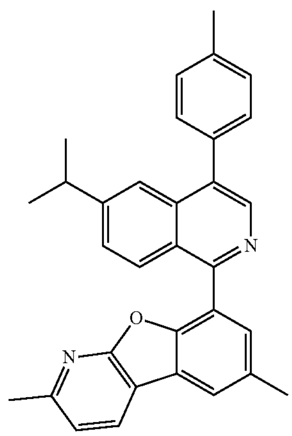
La 1247
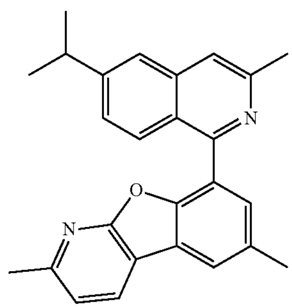
La1248
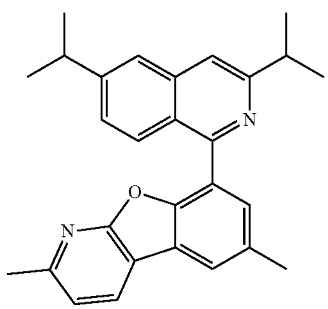 [SMILES: Cc1cc(-c2nc(C(C)C)cc3cc(C(C)C)ccc23)c2oc3nc(C)ccc3c2c1]
La1249
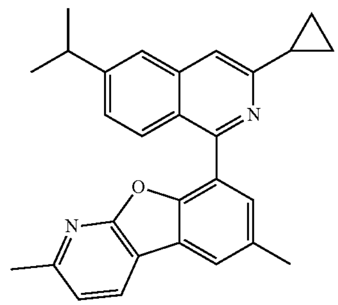 [SMILES: Cc1cc(-c2nc(C3CC3)cc3cc(C(C)C)ccc23)c2oc3nc(C)ccc3c2c1]
La1250
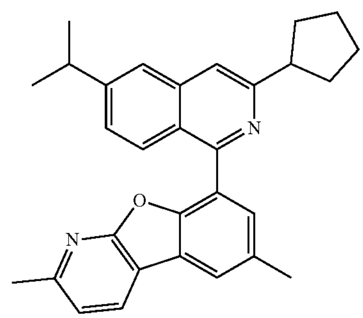 [SMILES: Cc1cc(-c2nc(C3CCCC3)cc3cc(C(C)C)ccc23)c2oc3nc(C)ccc3c2c1]
La1251
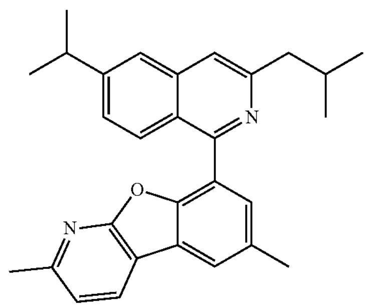 [SMILES: Cc1cc(-c2nc(CC(C)C)cc3cc(C(C)C)ccc23)c2oc3nc(C)ccc3c2c1]
La1252
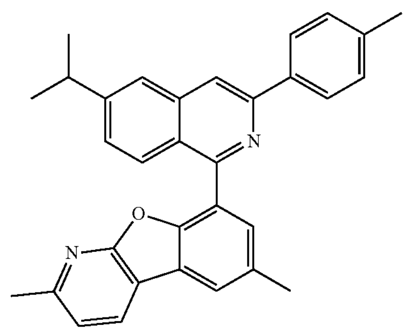
La1253

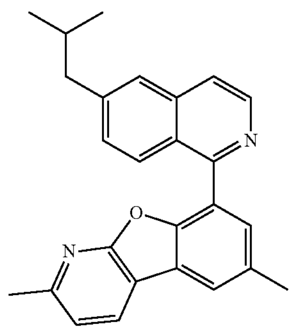
La1254
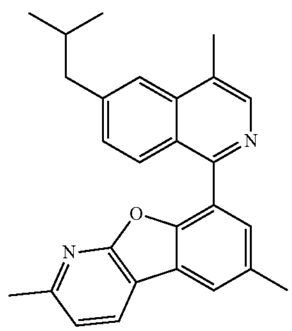
La1255
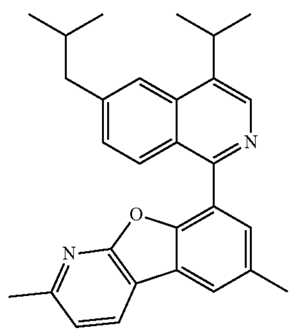
La1256
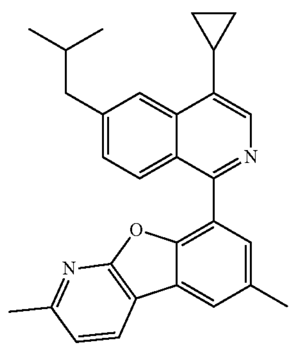
La1257
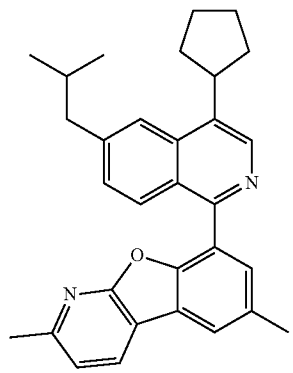
La1258
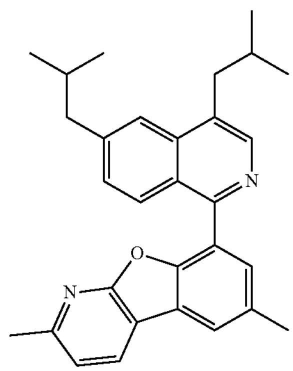 [SMILES: Cc1cc(-c2ncc(CC(C)C)c3cc(CC(C)C)ccc23)c2oc3nc(C)ccc3c2c1]
La1259
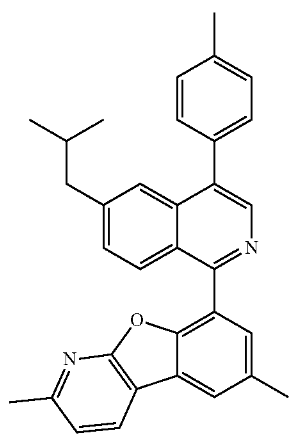
La1260

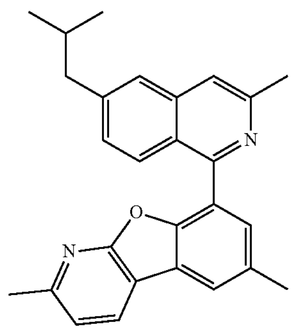
La1261
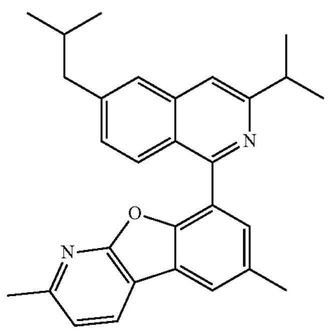 [SMILES: Cc1cc(-c2nc(C(C)C)cc3cc(CC(C)C)ccc23)c2oc3nc(C)ccc3c2c1]
La1262
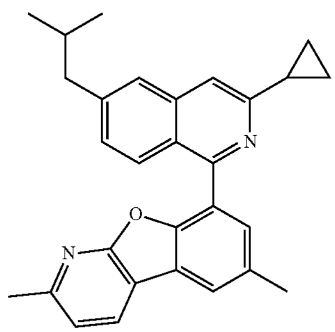 [SMILES: Cc1cc(-c2nc(C3CC3)cc3cc(CC(C)C)ccc23)c2oc3nc(C)ccc3c2c1]
La1263
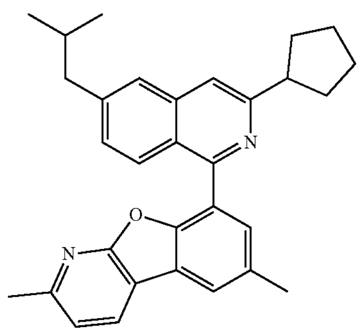 [SMILES: Cc1cc(-c2nc(C3CCCC3)cc3cc(CC(C)C)ccc23)c2oc3nc(C)ccc3c2c1]
La1264
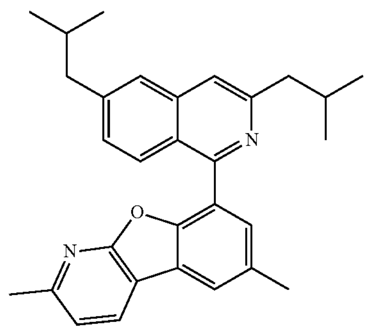 [SMILES: Cc1cc(-c2nc(CC(C)C)cc3cc(CC(C)C)ccc23)c2oc3nc(C)ccc3c2c1]
La1265
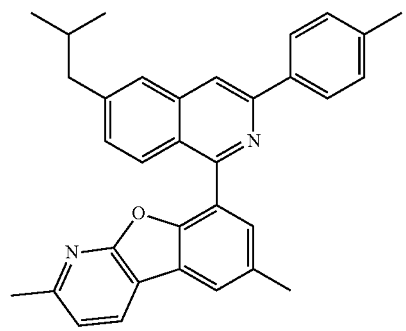
La1266
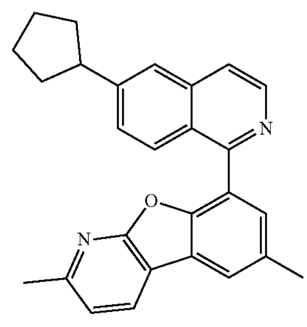 [SMILES: Cc1cc(-c2nccc3cc(C4CCCC4)ccc23)c2oc3nc(C)ccc3c2c1]
La1267
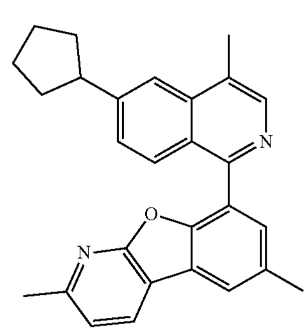 [SMILES: Cc1cc(-c2ncc(C)c3cc(C4CCCC4)ccc23)c2oc3nc(C)ccc3c2c1]
La1268

-continued
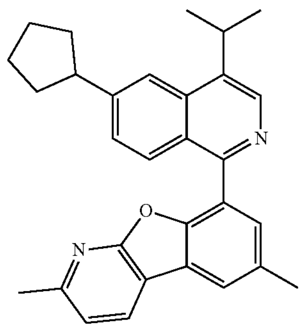 [SMILES: Cc1cc(-c2ncc(C(C)C)c3cc(C4CCCC4)ccc23)c2oc3nc(C)ccc3c2c1]
La1269
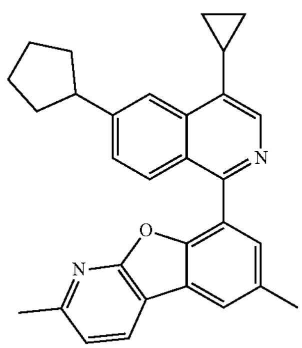 [SMILES: Cc1cc(-c2ncc(C3CC3)c3cc(C4CCCC4)ccc23)c2oc3nc(C)ccc3c2c1]
La1270
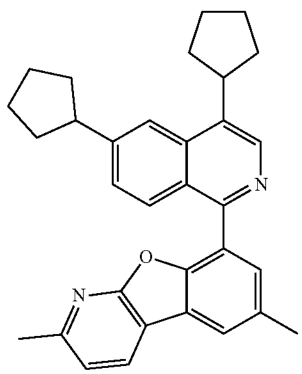 [SMILES: Cc1cc(-c2ncc(C3CCCC3)c3cc(C4CCCC4)ccc23)c2oc3nc(C)ccc3c2c1]
La1271
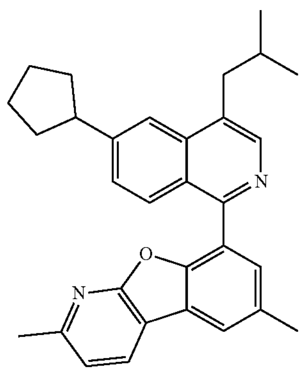 [SMILES: Cc1cc(-c2ncc(CC(C)C)c3cc(C4CCCC4)ccc23)c2oc3nc(C)ccc3c2c1]
La1272
-continued
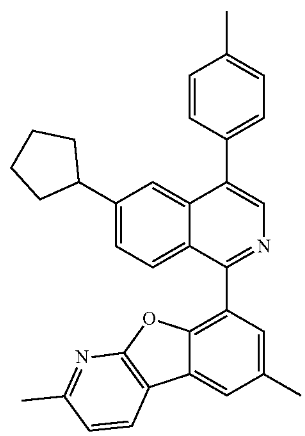 [SMILES: Cc1ccc(-c2cnc(-c3cc(C)cc4c3oc3nc(C)ccc34)c3ccc(C4CCCC4)cc23)cc1]
La1273
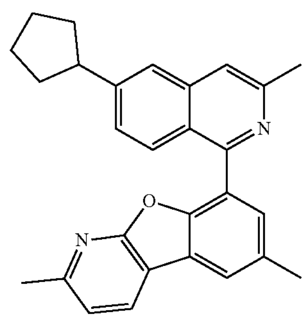 [SMILES: Cc1cc(-c2nc(C)cc3cc(C4CCCC4)ccc23)c2oc3nc(C)ccc3c2c1]
La1274
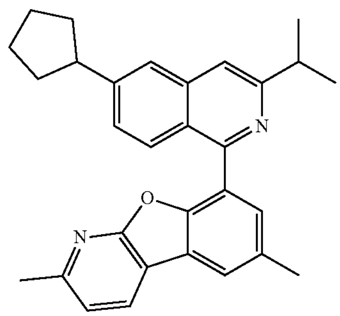 [SMILES: Cc1cc(-c2nc(C(C)C)cc3cc(C4CCCC4)ccc23)c2oc3nc(C)ccc3c2c1]
La1275
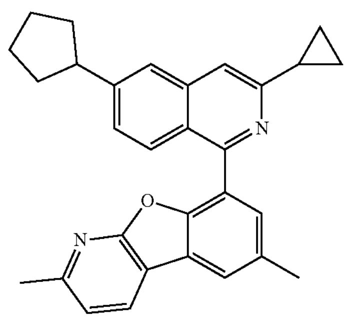 [SMILES: Cc1cc(-c2nc(C3CC3)cc3cc(C4CCCC4)ccc23)c2oc3nc(C)ccc3c2c1]
La1276

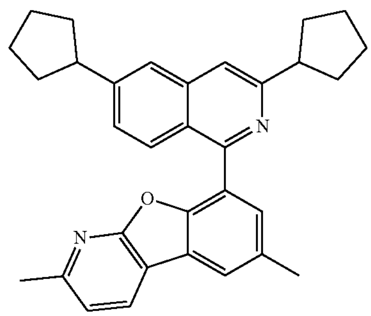 [SMILES: Cc1cc(-c2nc(C3CCCC3)cc3cc(C4CCCC4)ccc23)c2oc3nc(C)ccc3c2c1]
La1277
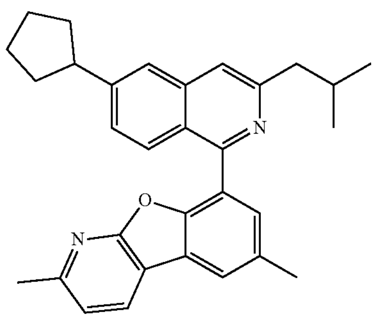 [SMILES: Cc1cc(-c2nc(CC(C)C)cc3cc(C4CCCC4)ccc23)c2oc3nc(C)ccc3c2c1]
La1278
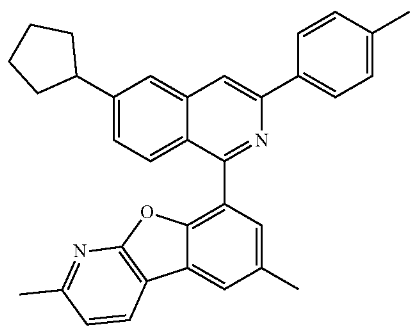 [SMILES: Cc1ccc(-c2cc3cc(C4CCCC4)ccc3c(-c3cc(C)cc4c3oc3nc(C)ccc34)n2)cc1]
La1279
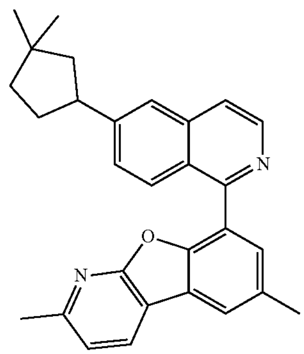 [SMILES: Cc1cc(-c2nccc3cc(C4CCC(C)(C)C4)ccc23)c2oc3nc(C)ccc3c2c1]
La1280
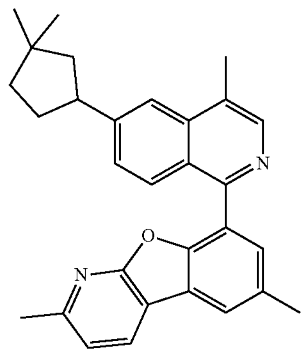 [SMILES: Cc1cc(-c2ncc(C)c3cc(C4CCC(C)(C)C4)ccc23)c2oc3nc(C)ccc3c2c1]
La1281
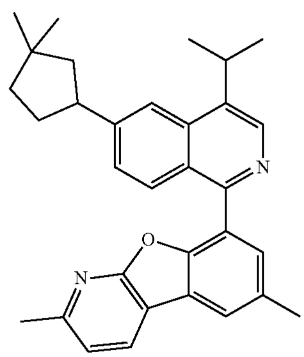 [SMILES: Cc1cc(-c2ncc(C(C)C)c3cc(C4CCC(C)(C)C4)ccc23)c2oc3nc(C)ccc3c2c1]
La1282
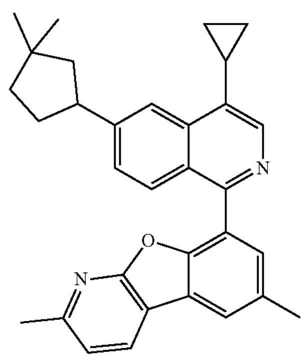 [SMILES: Cc1cc(-c2ncc(C3CC3)c3cc(C4CCC(C)(C)C4)ccc23)c2oc3nc(C)ccc3c2c1]
La1283
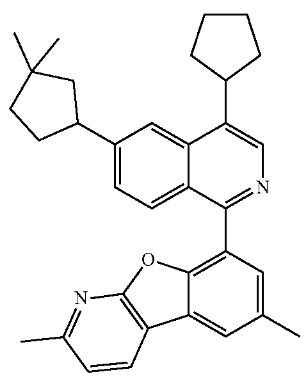 [SMILES: Cc1cc(-c2ncc(C3CCCC3)c3cc(C4CCC(C)(C)C4)ccc23)c2oc3nc(C)ccc3c2c1]
La 1284

-continued
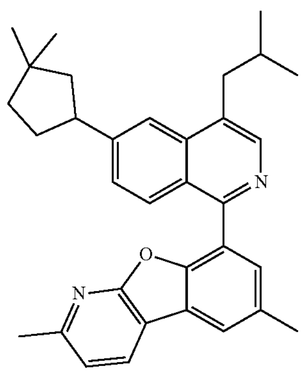 [SMILES: Cc1cc(-c2ncc(CC(C)C)c3cc(C4CCC(C)(C)C4)ccc23)c2oc3nc(C)ccc3c2c1]
La1285
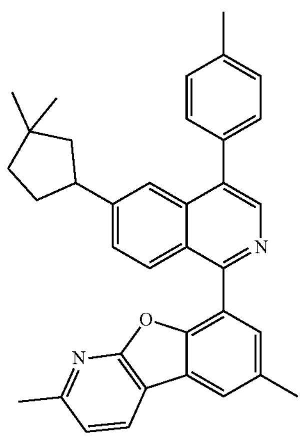 [SMILES: Cc1ccc(-c2cnc(-c3cc(C)cc4c3oc3nc(C)ccc34)c3ccc(C4CCC(C)(C)C4)cc23)cc1]
La1286
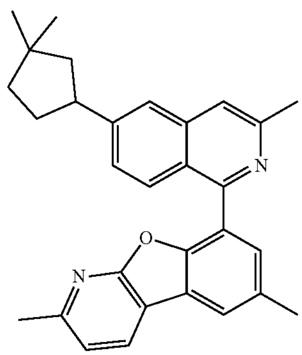 [SMILES: Cc1cc(-c2nc(C)cc3cc(C4CCC(C)(C)C4)ccc23)c2oc3nc(C)ccc3c2c1]
La1287
-continued
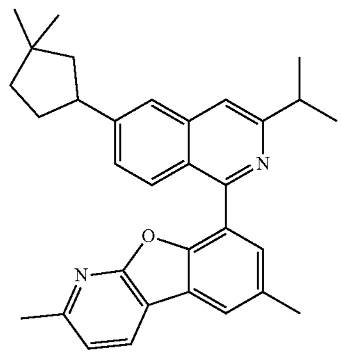 [SMILES: Cc1cc(-c2nc(C(C)C)cc3cc(C4CCC(C)(C)C4)ccc23)c2oc3nc(C)ccc3c2c1]
La1288
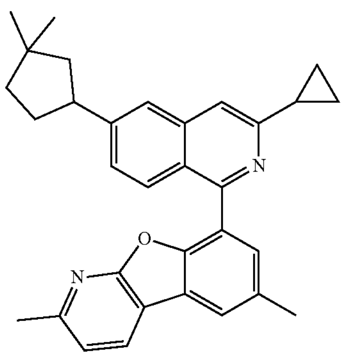 [SMILES: Cc1cc(-c2nc(C3CC3)cc3cc(C4CCC(C)(C)C4)ccc23)c2oc3nc(C)ccc3c2c1]
La1289
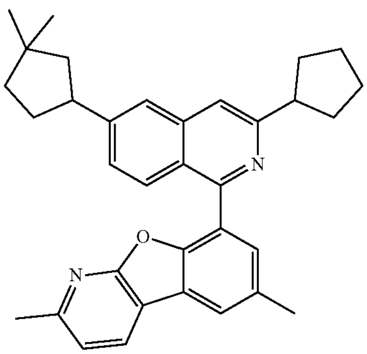 [SMILES: Cc1cc(-c2nc(C3CCCC3)cc3cc(C4CCC(C)(C)C4)ccc23)c2oc3nc(C)ccc3c2c1]
La1290
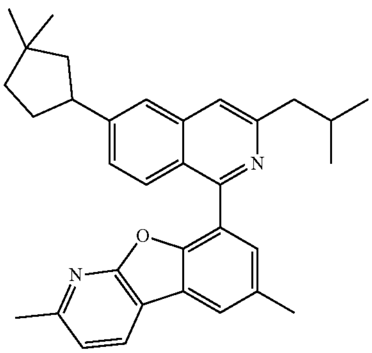 [SMILES: Cc1cc(-c2nc(CC(C)C)cc3cc(C4CCC(C)(C)C4)ccc23)c2oc3nc(C)ccc3c2c1]
La1291

-continued
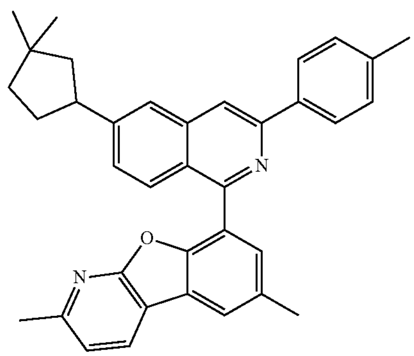 [SMILES: Cc1ccc(-c2cc3cc(C4CCC(C)(C)C4)ccc3c(-c3cc(C)cc4c3oc3nc(C)ccc34)n2)cc1]
La1292
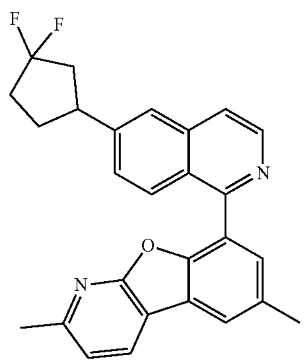 [SMILES: Cc1cc(-c2nccc3cc(C4CCC(F)(F)C4)ccc23)c2oc3nc(C)ccc3c2c1]
La1293
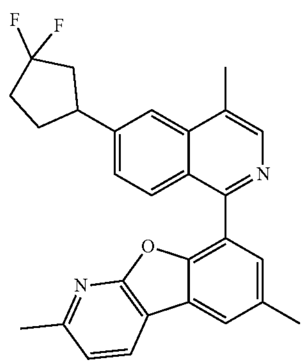 [SMILES: Cc1cc(-c2ncc(C)c3cc(C4CCC(F)(F)C4)ccc23)c2oc3nc(C)ccc3c2c1]
La1294
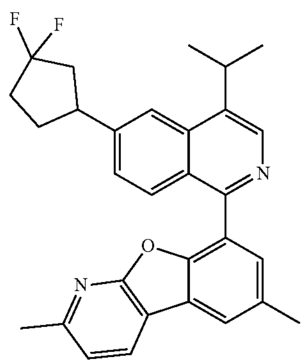 [SMILES: Cc1cc(-c2ncc(C(C)C)c3cc(C4CCC(F)(F)C4)ccc23)c2oc3nc(C)ccc3c2c1]
La1295
-continued
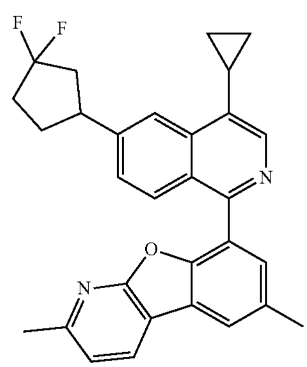 [SMILES: Cc1cc(-c2ncc(C3CC3)c3cc(C4CCC(F)(F)C4)ccc23)c2oc3nc(C)ccc3c2c1]
La1296
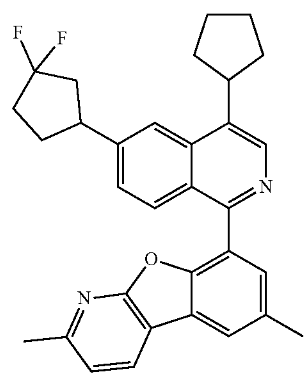 [SMILES: Cc1cc(-c2ncc(C3CCCC3)c3cc(C4CCC(F)(F)C4)ccc23)c2oc3nc(C)ccc3c2c1]
La1297
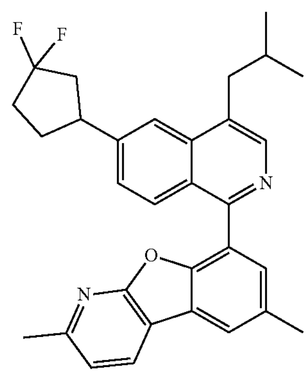 [SMILES: Cc1cc(-c2ncc(CC(C)C)c3cc(C4CCC(F)(F)C4)ccc23)c2oc3nc(C)ccc3c2c1]
La1298

-continued
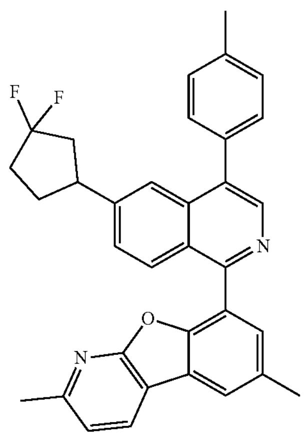
La1299
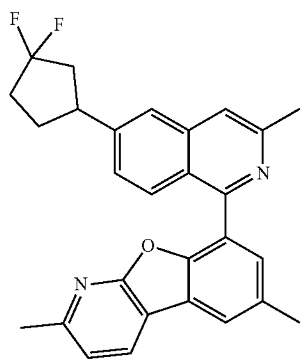 [SMILES: Cc1cc(-c2nc(C)cc3cc(C4CCC(F)(F)C4)ccc23)c2oc3nc(C)ccc3c2c1]
La1300
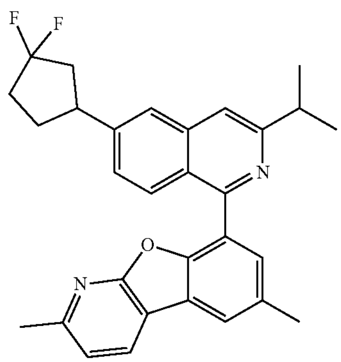 [SMILES: Cc1cc(-c2nc(C(C)C)cc3cc(C4CCC(F)(F)C4)ccc23)c2oc3nc(C)ccc3c2c1]
La1301
-continued
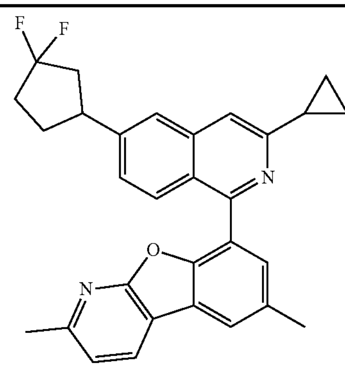
La1302
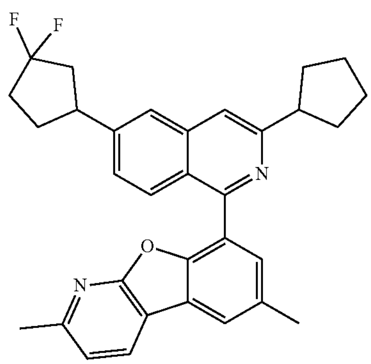 [SMILES: Cc1cc(-c2nc(C3CCCC3)cc3cc(C4CCC(F)(F)C4)ccc23)c2oc3nc(C)ccc3c2c1]
La1303
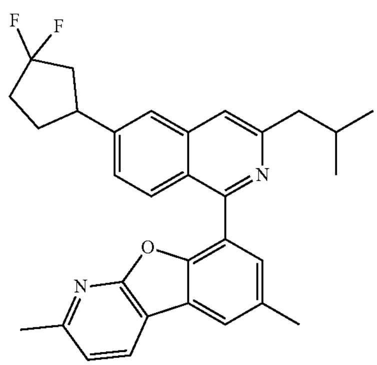 [SMILES: Cc1cc(-c2nc(CC(C)C)cc3cc(C4CCC(F)(F)C4)ccc23)c2oc3nc(C)ccc3c2c1]
La1304
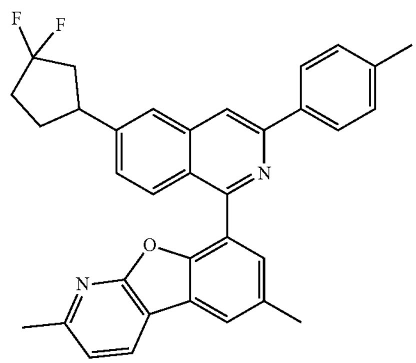 [SMILES: Cc1ccc(-c2cc3cc(C4CCC(F)(F)C4)ccc3c(-c3cc(C)cc4c3oc3nc(C)ccc34)n2)cc1]
La1305

-continued

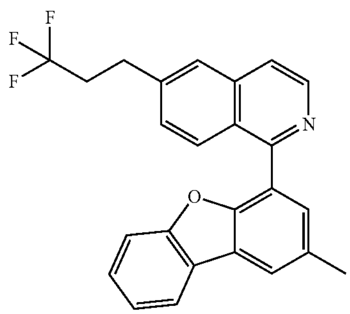 [SMILES: Cc1cc(-c2nccc3cc(CCC(F)(F)F)ccc23)c2oc3ccccc3c2c1]

La1306

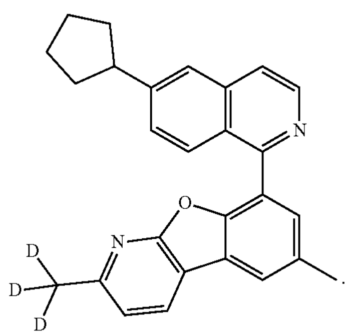 [SMILES: [2H]C([2H])([2H])c1ccc2c(n1)oc1c(-c3nccc4cc(C5CCCC5)ccc34)cc(C)cc12]

La1307 the Lb and the Lc are independently selected from any one of La1 to La1307 according to claim 10, corresponding parts or complete deuterides thereof, or corresponding parts or complete fluorides thereof; and the La, the Lb, and the Lc do not have a structure of the same number.

The Lb and the Lc are independently selected from one of the following structural formulas (a) to (k):

Formula (a)

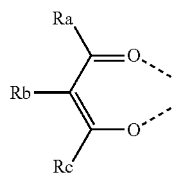

Formula (b)

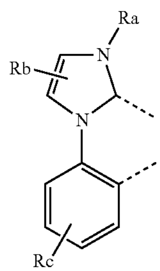

-continued

Formula (c)

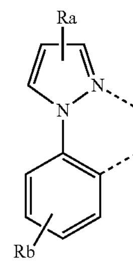

Formula (d)

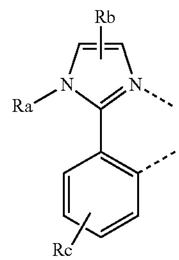

Formula (e)

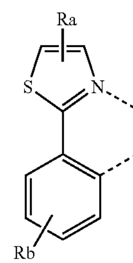

Formula (f)

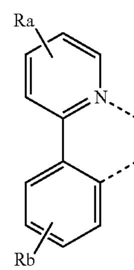

Formula (g)

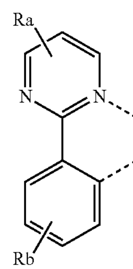

Formula (h)

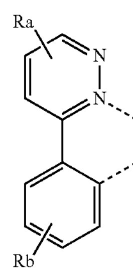

-continued

Formula (i)

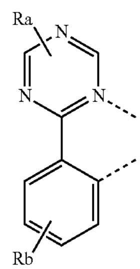

Formula (j)

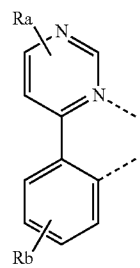

Formula (k)

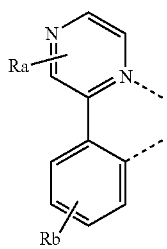

where a dotted line refers to a bond connected to metal iridium;

the number of Ra, Rb, and Rc is a maximum substitution number;

the Ra, the Rb, and the Rc are independently selected from hydrogen, deuterium, halogen, substituted or unsubstituted $C_1$-$C_{20}$ alkyl, substituted or unsubstituted $C_3$-$C_{30}$ cycloalkyl, substituted or unsubstituted $C_1$-$C_{30}$ heteroalkyl, substituted or unsubstituted $C_7$-$C_{30}$ aralkyl, substituted or unsubstituted $C_1$-$C_{20}$ alkoxy, substituted or unsubstituted $C_6$-$C_{30}$ aryloxy, substituted or unsubstituted $C_2$-$C_{20}$ alkenyl, substituted or unsubstituted $C_3$-$C_{30}$ silyl, substituted or unsubstituted $C_6$-$C_{30}$ aryl, substituted or unsubstituted $C_3$-$C_{30}$ heteroaryl, substituted or unsubstituted $C_3$-$C_{30}$ arylsilyl, substituted or unsubstituted $C_0$-$C_{20}$ amino, cyano, nitrile, isonitrile, and phosphino; or two adjacent substituents are optionally connected into a ring or fused structure;

the "substituted" refers to substitution with deuterium, F, Cl, Br, $C_1$-$C_{10}$ alkyl, $C_1$-$C_{10}$ alkoxy, $C_3$-$C_{10}$ cycloalkyl, amino substituted with $C_1$-$C_{10}$ alkyl, $C_6$-$C_{30}$ aryl, $C_7$-$C_{30}$ aralkyl, cyano, nitrile, isonitrile, and phosphino;

and a heteroatom in the heteroalkyl or heteroaryl is at least one of S, O, and N.

Preferably, the Lb and the Lc are independently selected from the following structural formulas, corresponding parts or complete deuterides thereof, or corresponding parts or complete fluorides thereof; and the Lb and the Lc are not a ligand of the same number.

L1

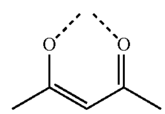

L2

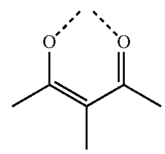

L3

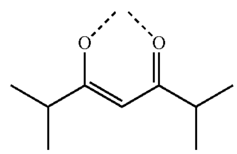

L4

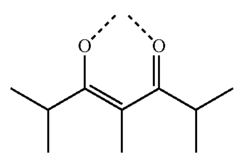

L5

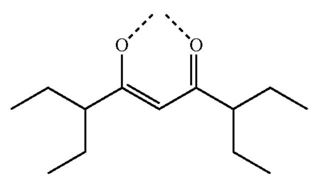

L6

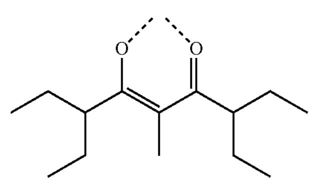

L7

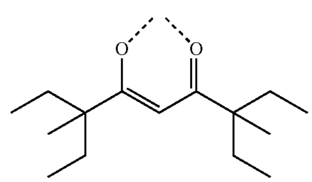

L8

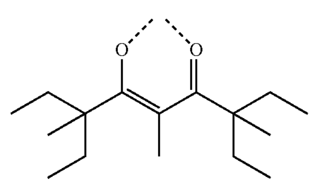

L9

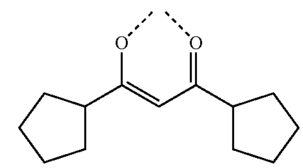

L10
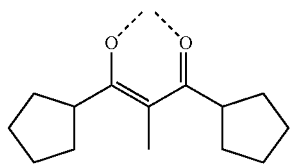
L11
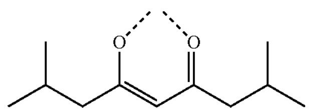
L12
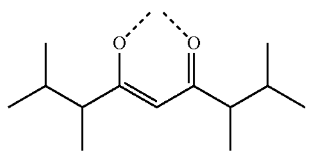
L13
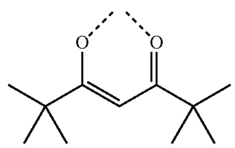
L14
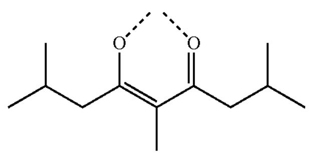
L15
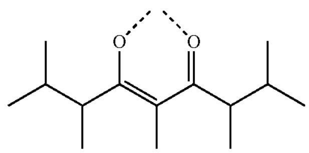
L16
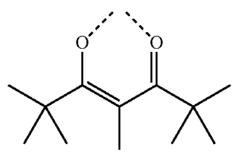
L17
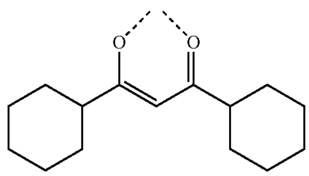
L18
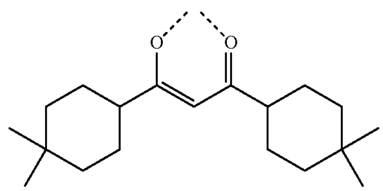
L19
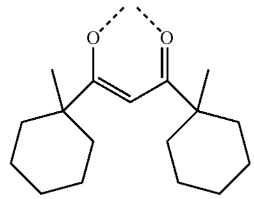
L20
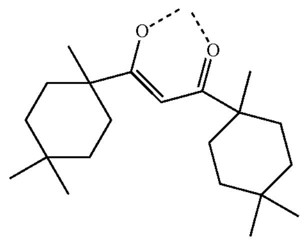
L21
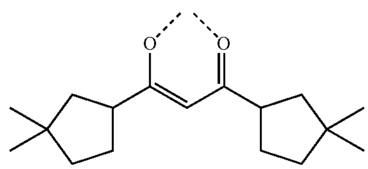
L22
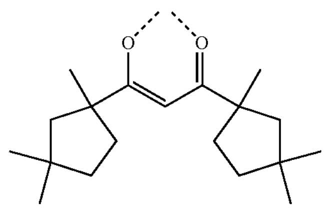
L23
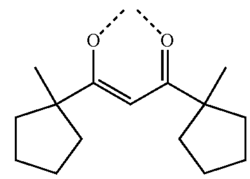
L24
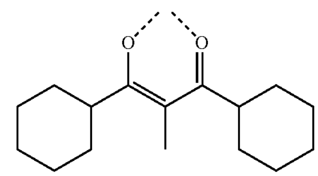
L25
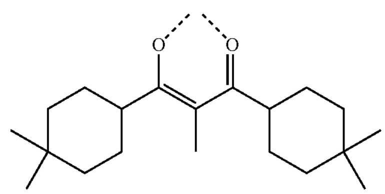
L26
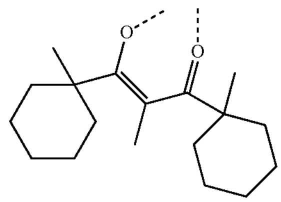

-continued
L27
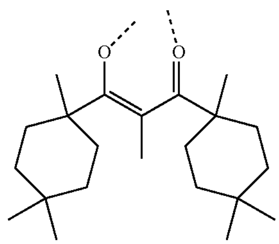
L28
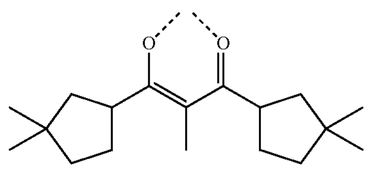
L29
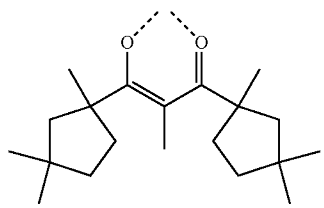
L30
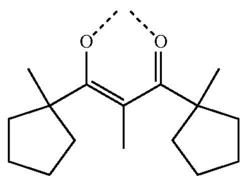
L31
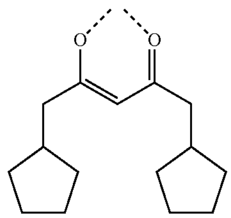
L32
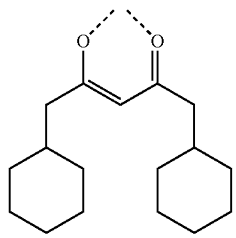
L33
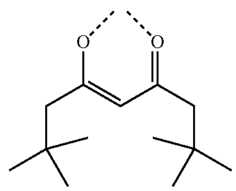
-continued
L34
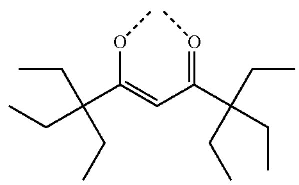
L35
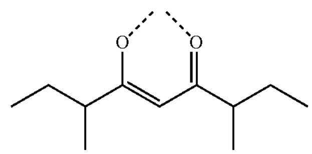
L36
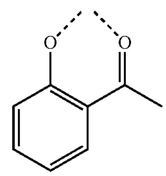
L37
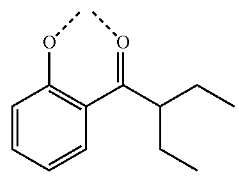
L38
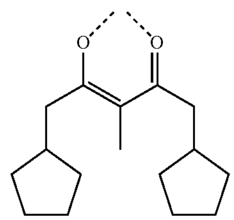
L39
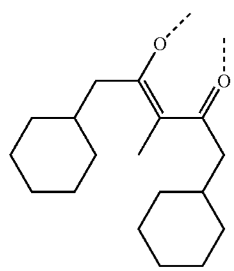
L40
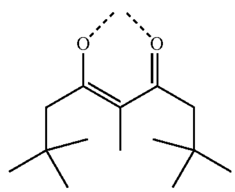
L41
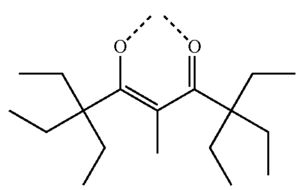

-continued
L42
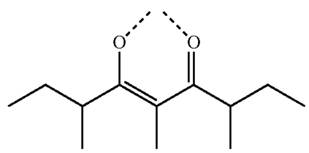
L43
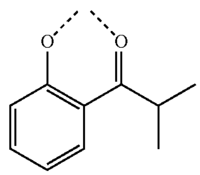
L44
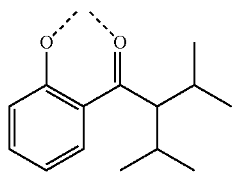
L45
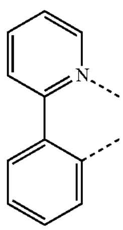
L46
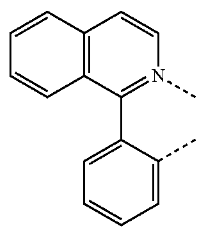
L47
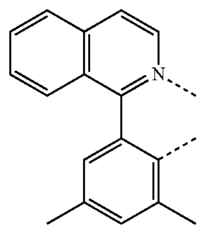
L48
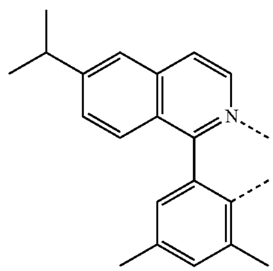
-continued
L49
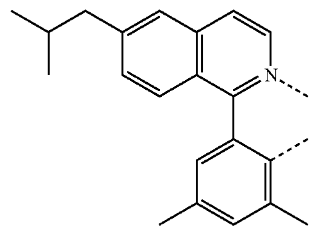
L50
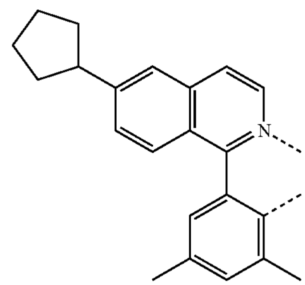
L51
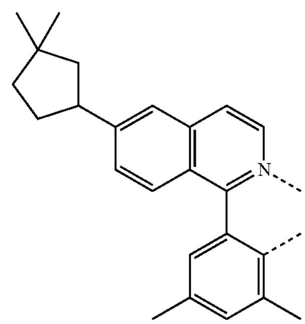
L52
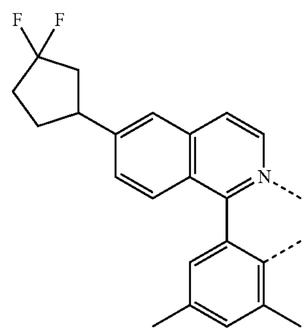
L53
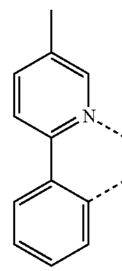

-continued
L54
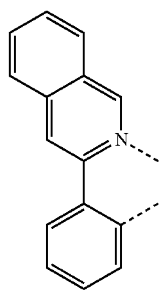
L55
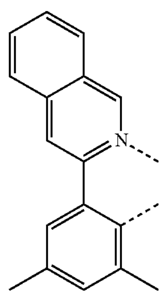
L56
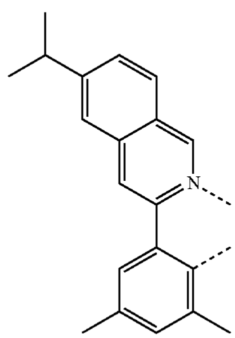
L57
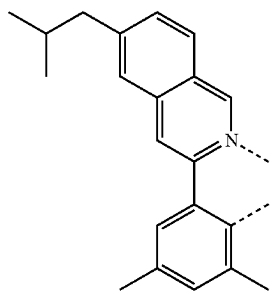
L58
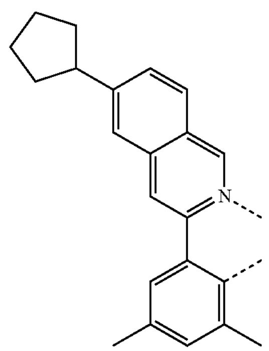
-continued
L59
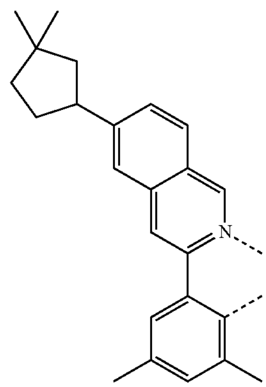
L60
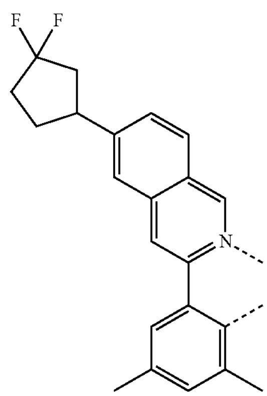
L61
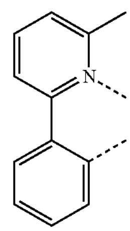
L62
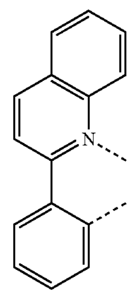
L63
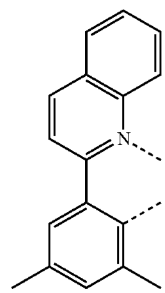

-continued
L64
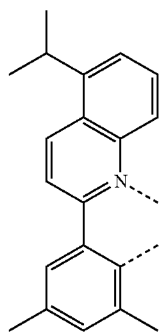
L65
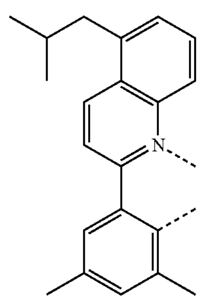
L66
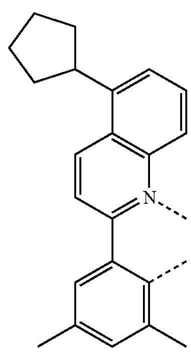
L67
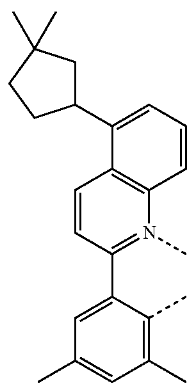
-continued
L68
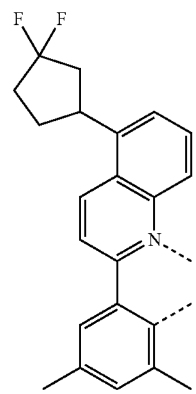
L69
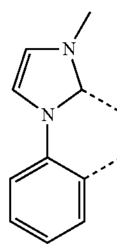
L70
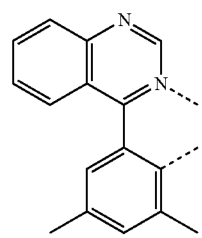
L71
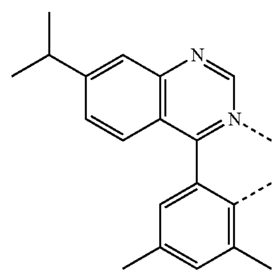
L72
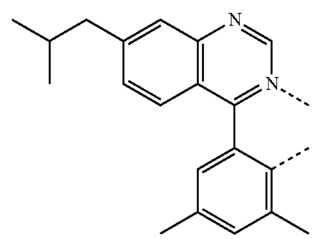

-continued
L73
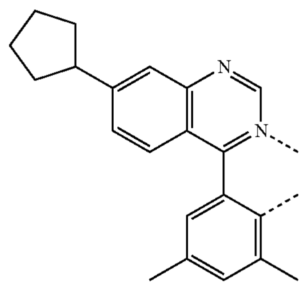
L74
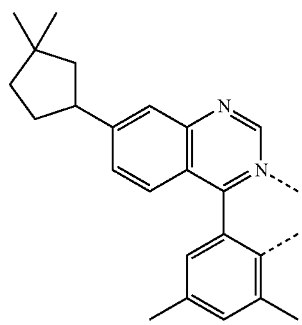
L75
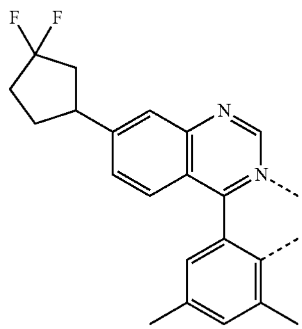
L76
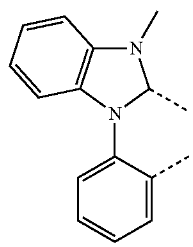
L77
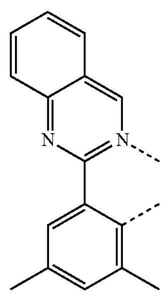
-continued
L78
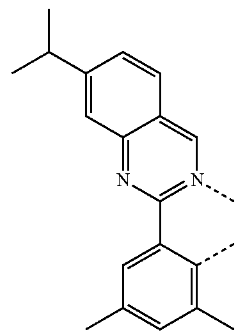
L79
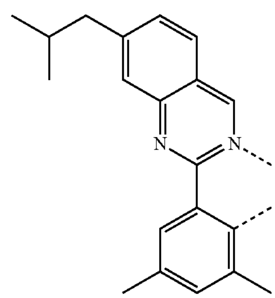
L80
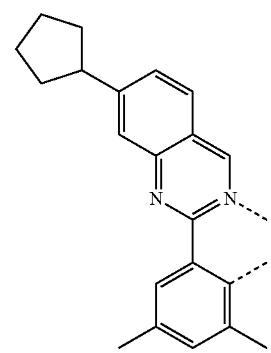
L81
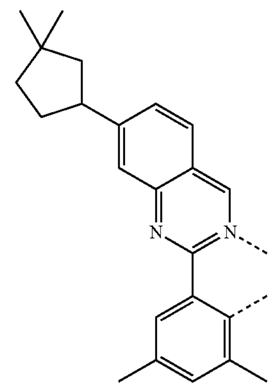

L82
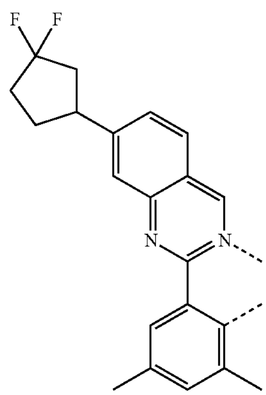
L83
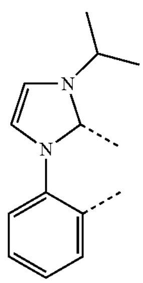
L84
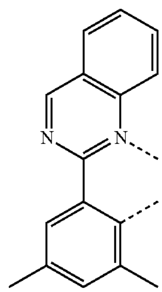
L85
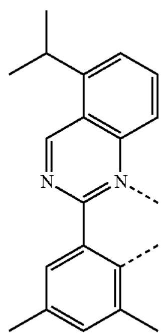
L86
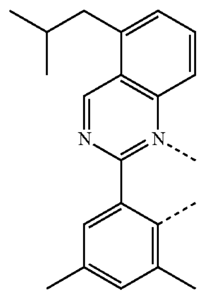
L87
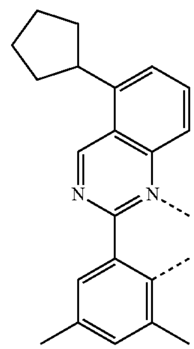
L88
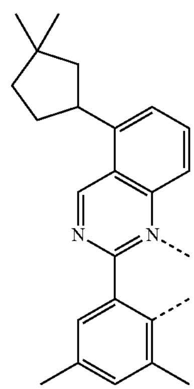
L89
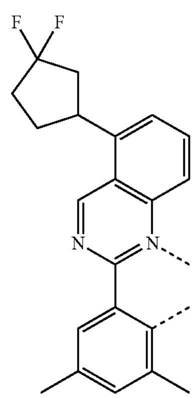
L90
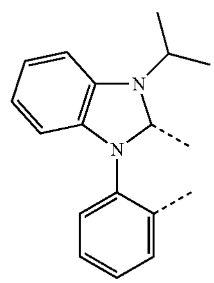

-continued
L91
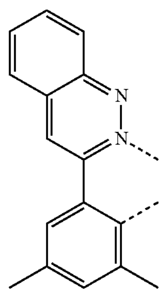
L92
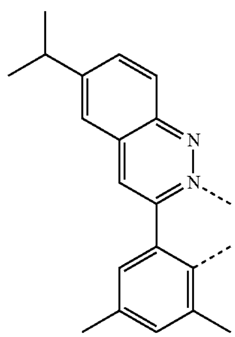
L93
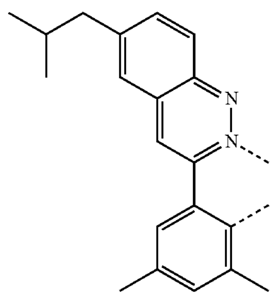
L94
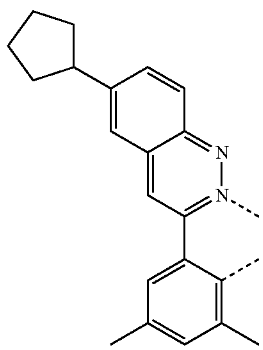
-continued
L95
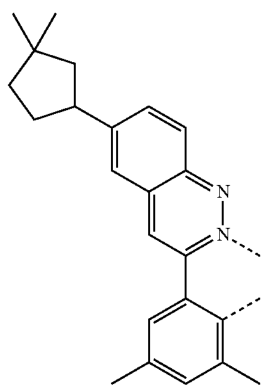
L96
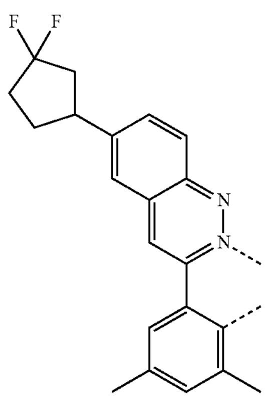
L97
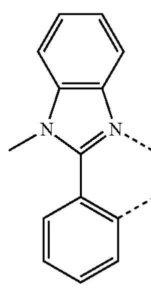
L98
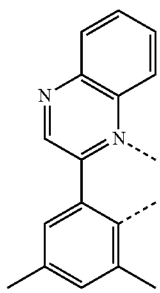

-continued
L99
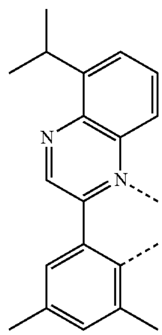
L100
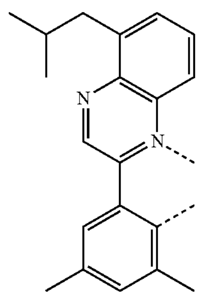
L101
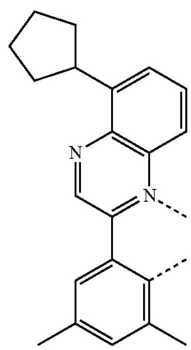
L102
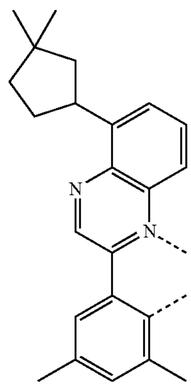
-continued
L103
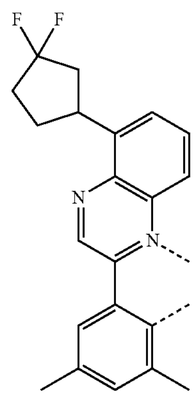
L104
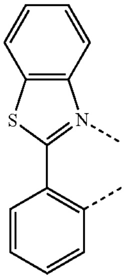
L105
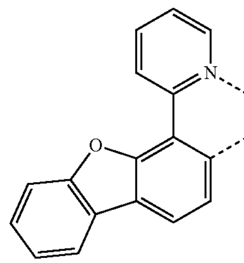
L106
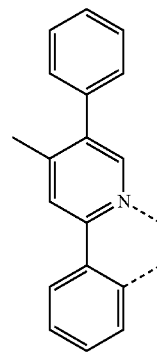
L107
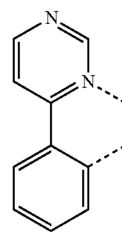

-continued
L108
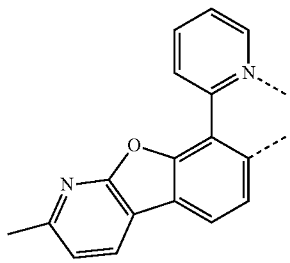
L109
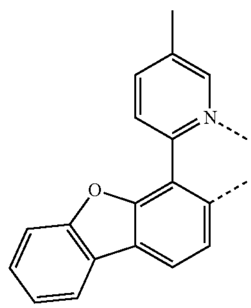
L110
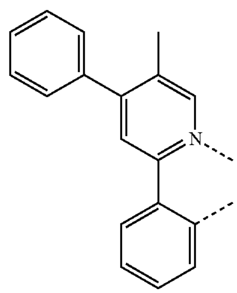
L111
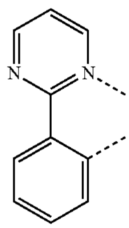
L112
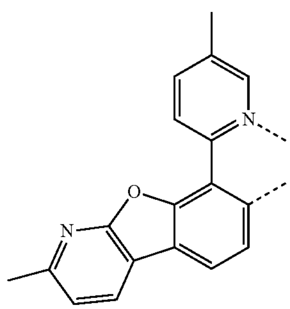
-continued
L113
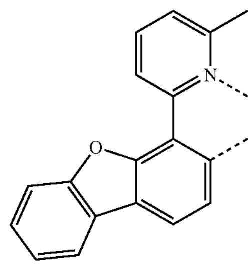
L114
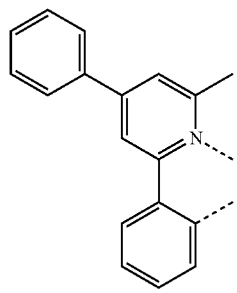
L115
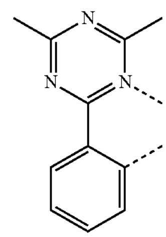
L116
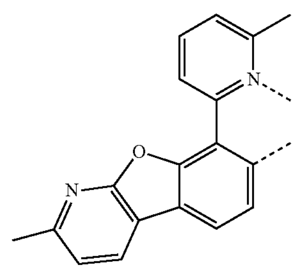
L117
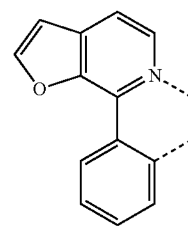
L118
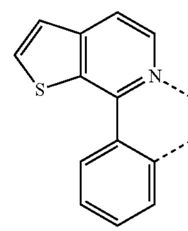

-continued
L119
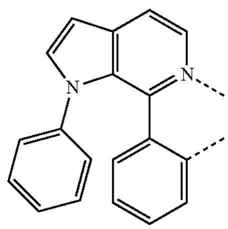
L120
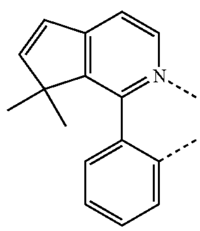
L121
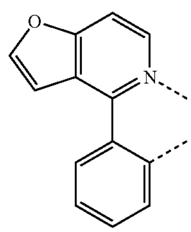
L122
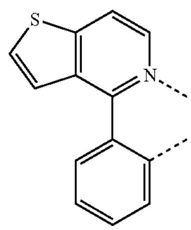
L123
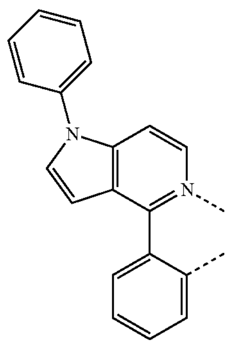
L124
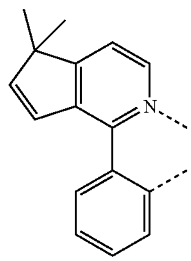
-continued
L125
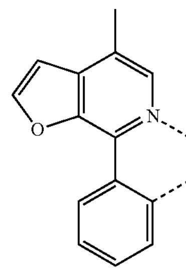
L126
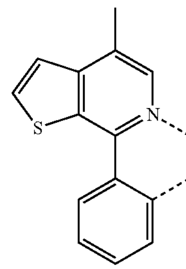
L127
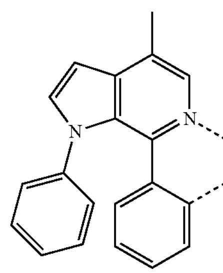
L128
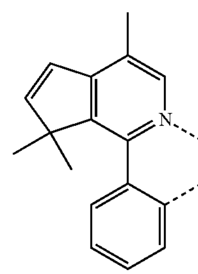
L129
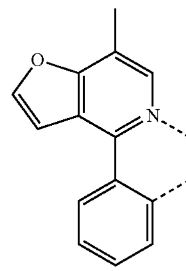
L130
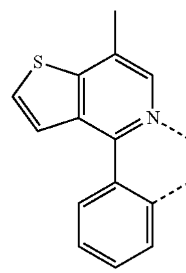

-continued
L131
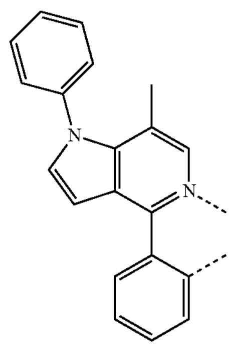
L132
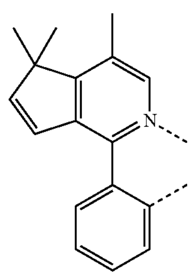
L133
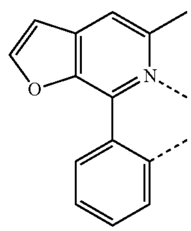
L134
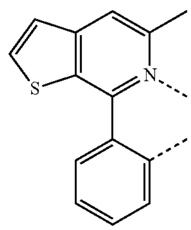
L135
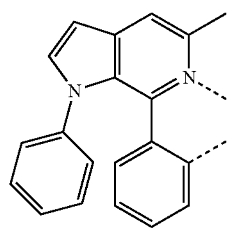
L136
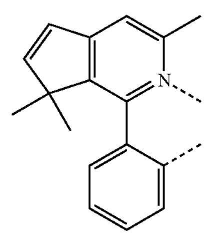
-continued
L137
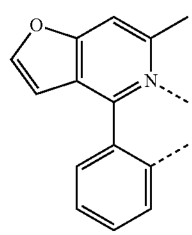
L138
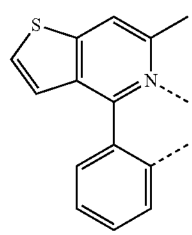
L139
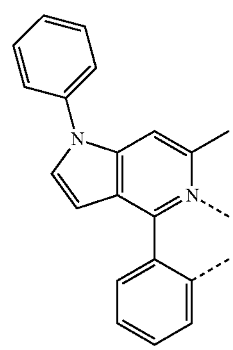
L140
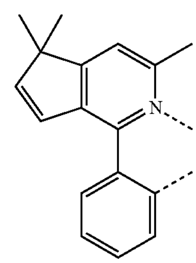
L141
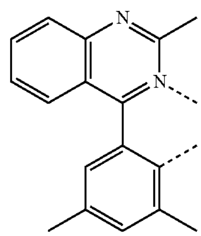
L142
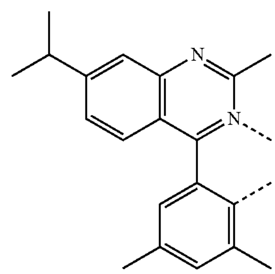

-continued
L143
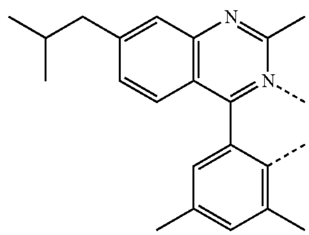
L144
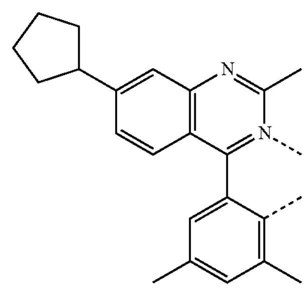
L145
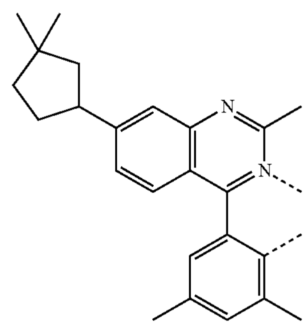
L146
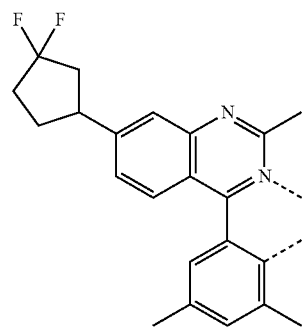
L147
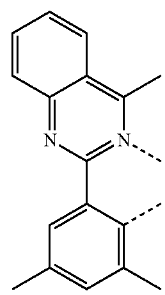
-continued
L148
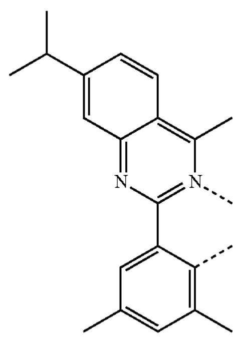
L149
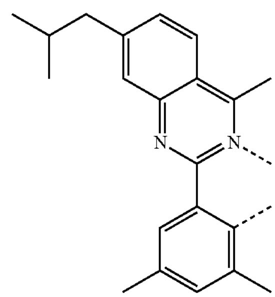
L150
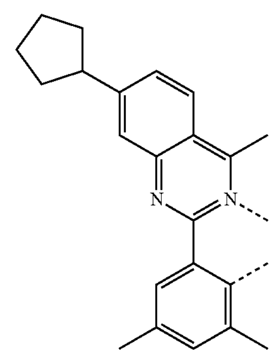
L151
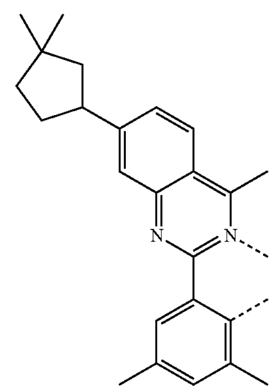

L152
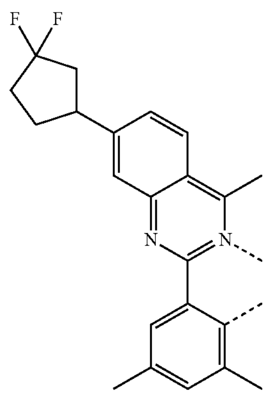
L153
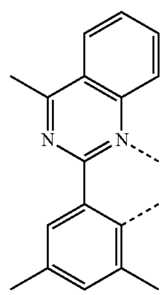
L154
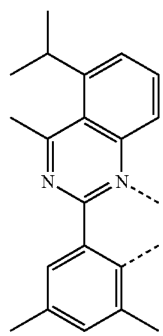
L155
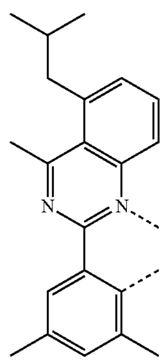
L156
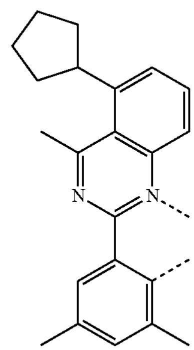
L157
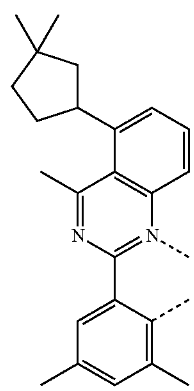
L158
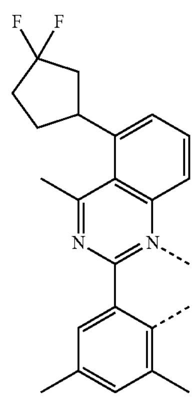
L159
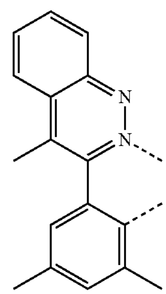

-continued
L160
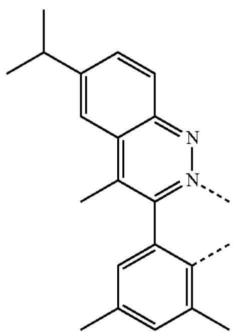
L161
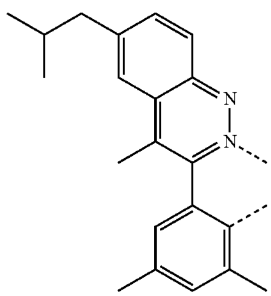
L162
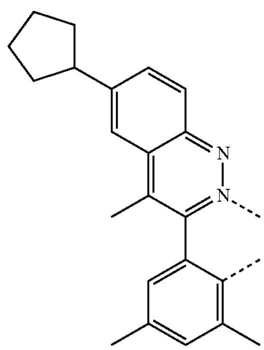
L163
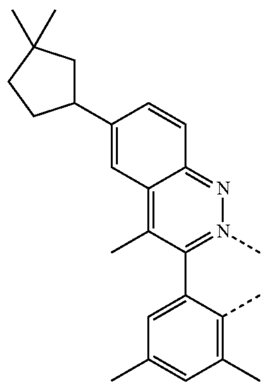
-continued
L164
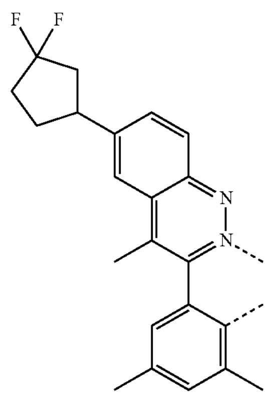
L165
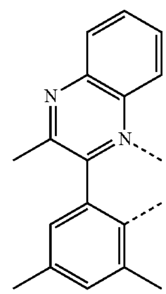
L166
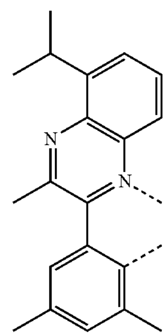
L167
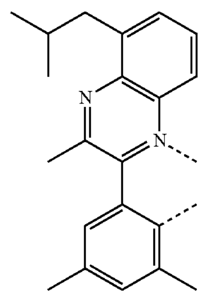

-continued
L168
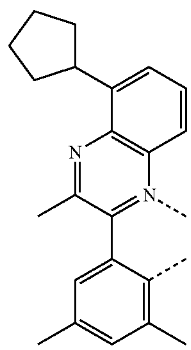
L169
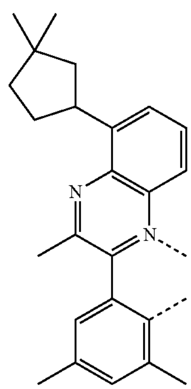
L170
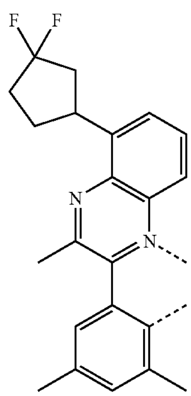
L171
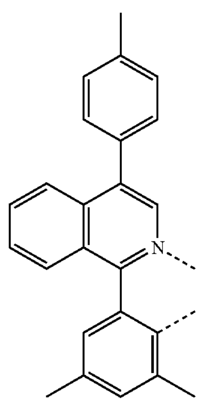
-continued
L172
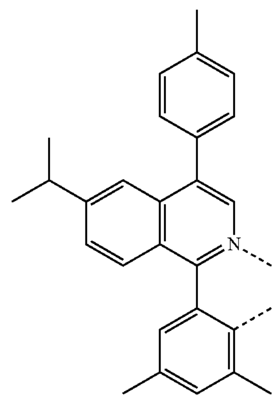
L173
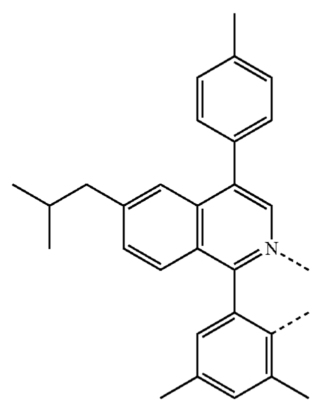
L174
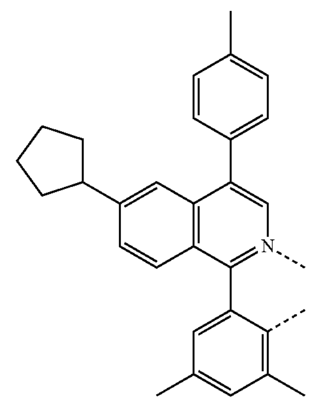
L175
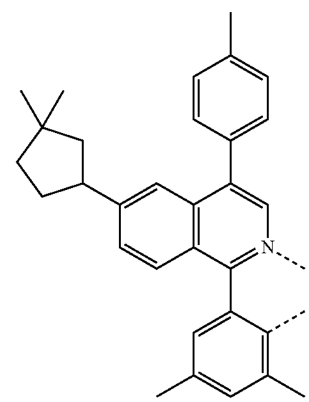

-continued
L176
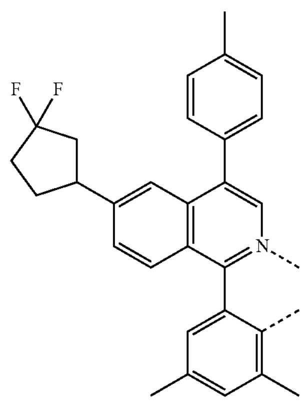
L177
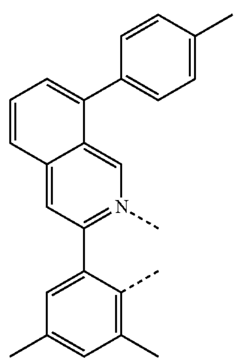
L178
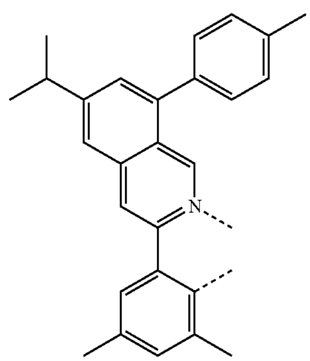
L179
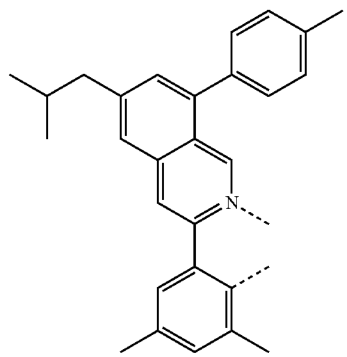
-continued
L180
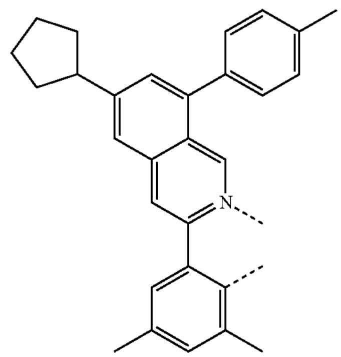
L181
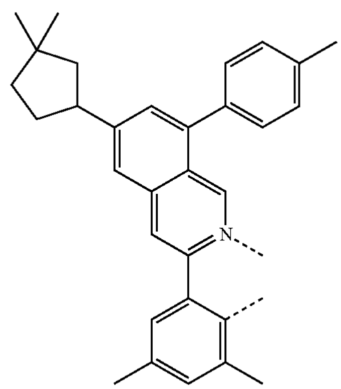
L182
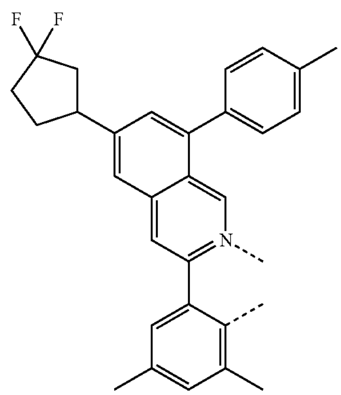
L183
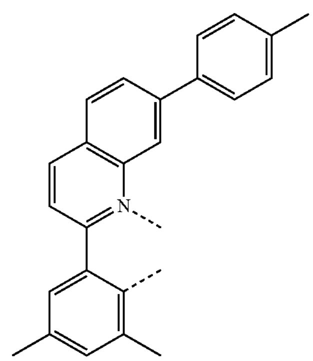

-continued
L184
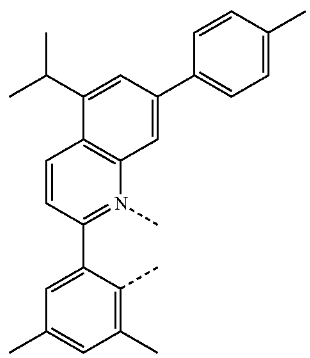
L185
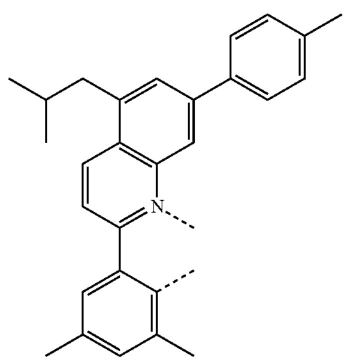
L186
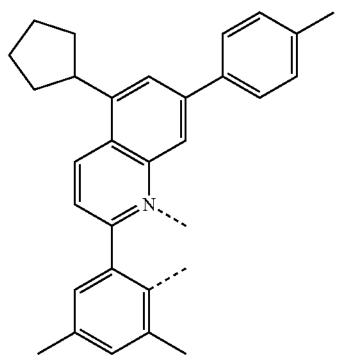
L187
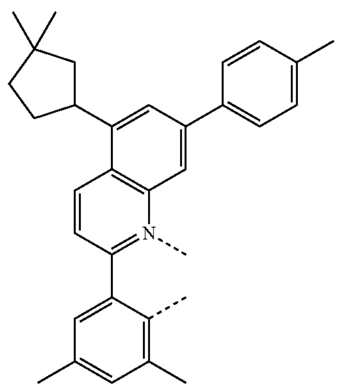
-continued
L188
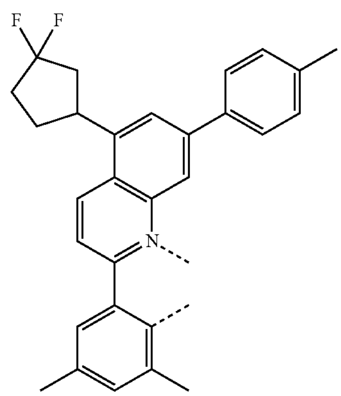
L189
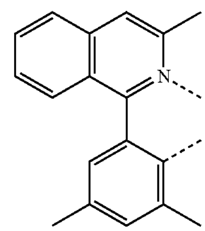
L190
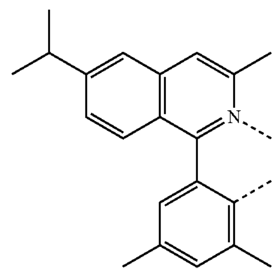
L191
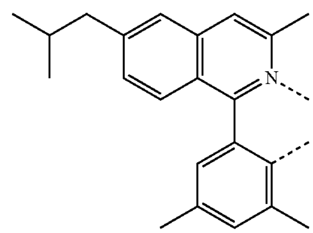
L192
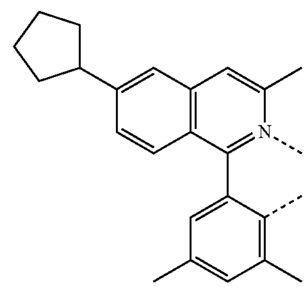

-continued
L193
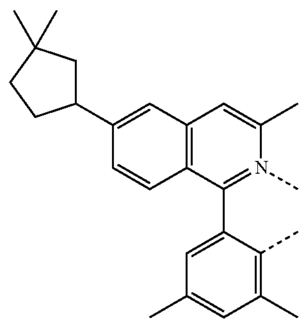
L194
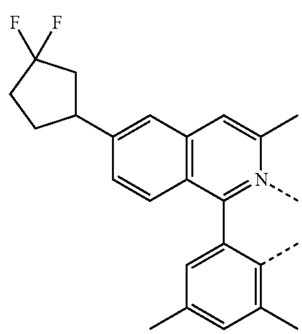
L195
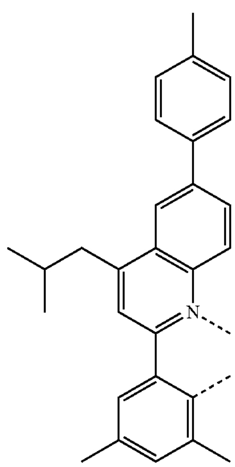
L196
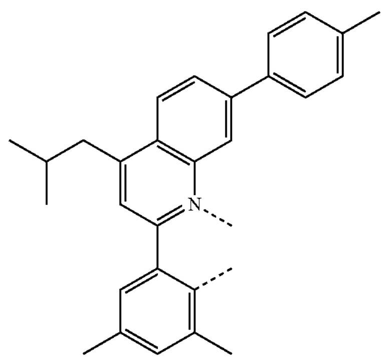
-continued
L197
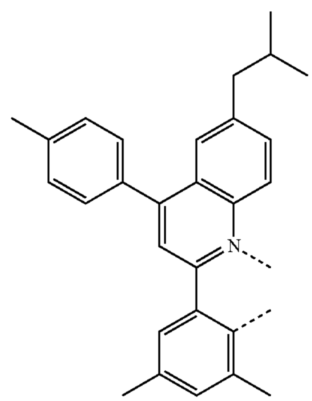
L198
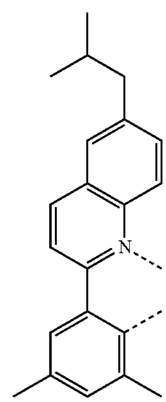
L199
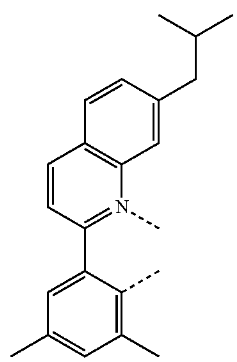
L200
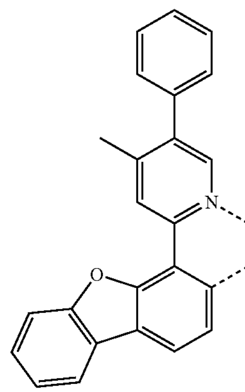

-continued
L201
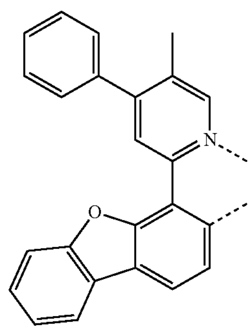
L202
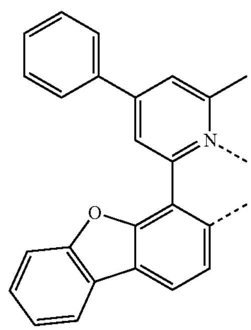
L203
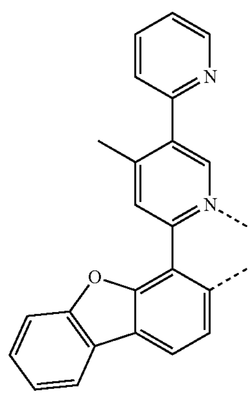
L204
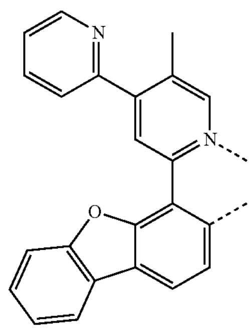
-continued
L205
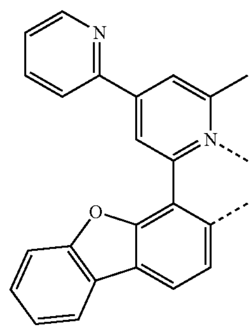
L206
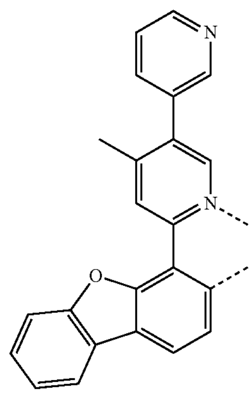
L207
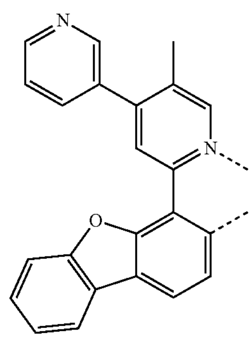
L208
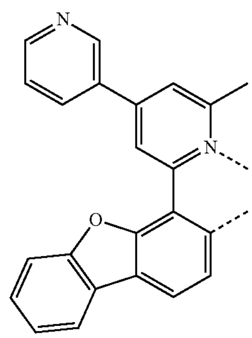

-continued
L209
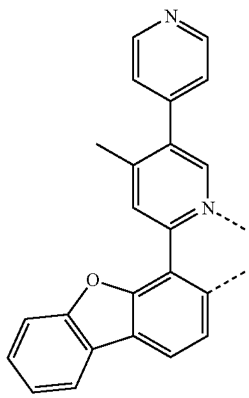
L210
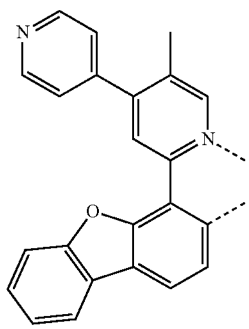
L211
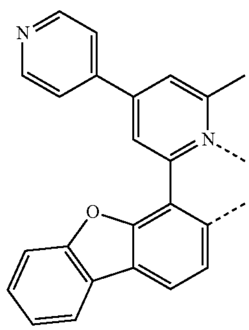
L212
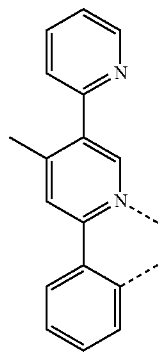
-continued
L213
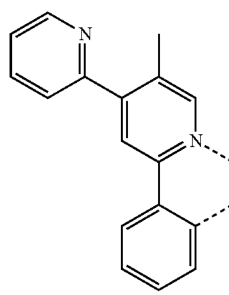
L214
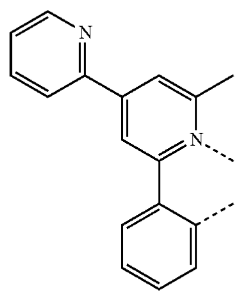
L215
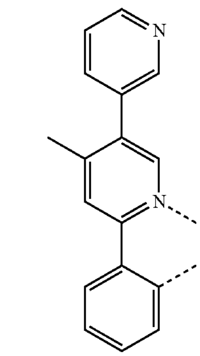
L216
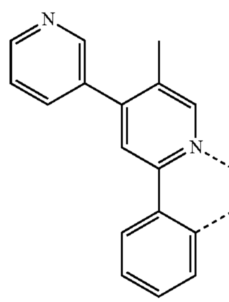
L217
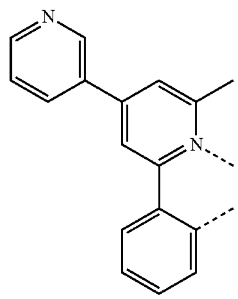

-continued

L218

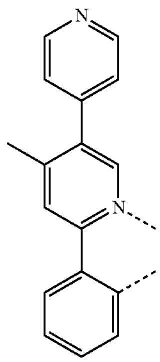

L219

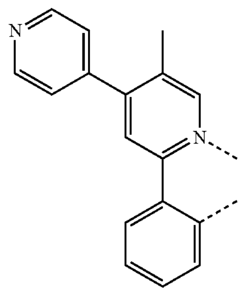

L220

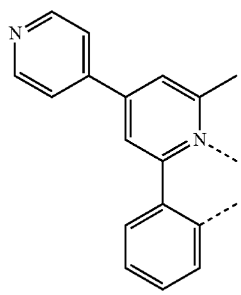

L221

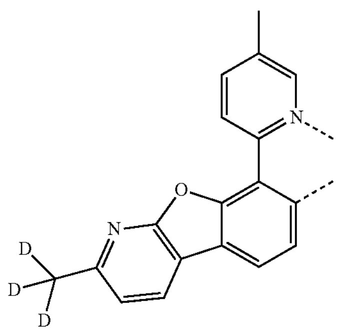

L222

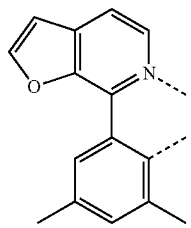

An electroluminescent device includes a cathode, an anode, and organic layers arranged between the cathode and the anode. At least one of the organic layers includes the metal complex according to any one of claims 1 to 12.

Another one of the objectives of the present invention is to provide an electroluminescent device, in which the organic layers include a light-emitting layer, and the metal complex is used as a light-emitting material, especially a red light-emitting material.

Another one of the objectives of the present invention is to provide an electroluminescent device, in which the organic layers include a hole injection layer, and the metal complex is used as a hole injection material.

The material of the present invention has the advantages of low sublimation temperature, high optical and electrochemical stability, high color saturation, high luminescence efficiency, and long device service life. As a phosphorescent material, the material of the present invention can convert a triplet state into light, so that the luminescence efficiency of an organic electroluminescent device can be improved, and the energy consumption is reduced.

DETAILED DESCRIPTION OF EMBODIMENTS

The following embodiments are merely described to facilitate the understanding of the technical invention, and should not be considered as specific limitations of the present invention.

All raw materials, solvents and the like involved in the synthesis of compounds in the present invention were purchased from Alfa, Acros, and other suppliers known to persons skilled in the art.

Example 1 Synthesis of a Compound A1

Synthesis of Ligands L50 and La385

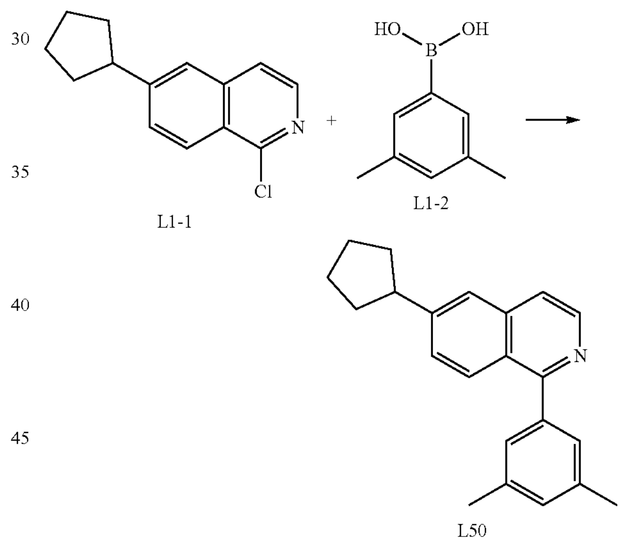

L1-1 L1-2 L50

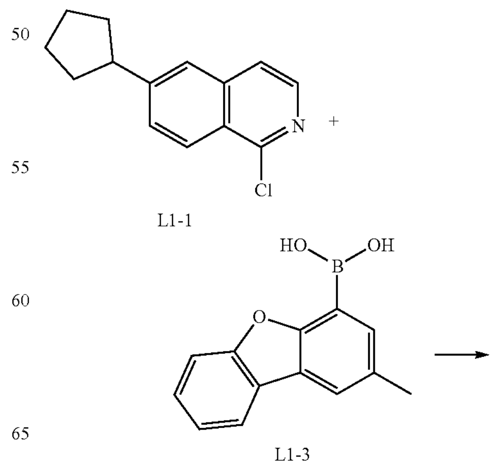

L1-1 L1-3

-continued

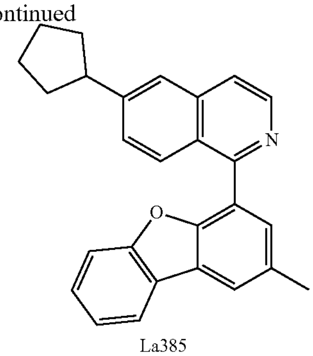

La385

Synthesis of a Compound L50

A compound L1-1 (36.0 g, 155.3 mmol, 1.0 eq), a compound L1-2 (23.3 g, 155.3 mmol, 1.0 eq), potassium carbonate (42.9 g, 310.7 mmol, 2.0 eq), and bis(di-tert-butyl (4-dimethylaminophenyl)phosphine)dichloropalladium (II) (1.02 g, 1.5 mmol, 0.01 eq) were put into a 1 L three-mouth flask, and toluene (360 ml), ethanol (96 ml), and deionized water (96 ml) were added under the replacement of vacuum and nitrogen for 3 times. A mixture obtained was heated to 80° C., and stirred for a reaction for 6 hours under the protection of nitrogen. According to monitoring by TLC (with a mixture of ethyl acetate and n-hexane at a ratio of 1:10 as a developing agent), the raw material L1-1 was almost consumed completely. Cooling was conducted to room temperature, and liquid separation was conducted. An organic phase was washed with water (3*180 ml). An aqueous phase was extracted with ethyl acetate (150 ml) for 1 time. Suction filtration was conducted with silica gel. Washing was conducted with ethyl acetate until no obvious product residue existed. Concentration was conducted to obtain a yellow viscous liquid. The liquid was separated by column chromatography (with a mixture of ethyl acetate and n-hexane at a ratio of 1:20 as an eluent), and then concentration and drying were conducted to obtain 41.2 g of a white sugar-like solid compound L50 with a yield of 87.8%. Mass spectrometry was as follows: 302.4 (M+H)

Synthesis of a Compound La385

A compound L1-1 (28.7 g, 123.8 mmol, 1.0 eq), a compound L1-3 (28.5 g, 126.3 mmol, 1.02 eq), $K_2CO_3$ (34.2 g, 247.7 mmol, 2.0 eq), and bis(di-tert-butyl(4-dimethylaminophenyl)phosphine)dichloropalladium (II) (0.81 g, 1.24 mmol, 0.01 eq) were put into a 1 L three-mouth flask, and toluene (290 ml), ethanol (90 ml), and $H_2O$ (90 ml) were added under the replacement of vacuum and nitrogen for 3 times. A mixture obtained was heated to 80° C., and stirred for a reaction for 3 hours under the protection of nitrogen. According to monitoring by TLC (with a mixture of ethyl acetate and n-hexane at a ratio of 1:8 as a developing agent), the raw material L1-1 was almost consumed completely. Cooling was conducted to room temperature, and liquid separation was conducted. An organic phase was washed with water (3*180 ml). An aqueous phase was extracted with ethyl acetate (150 ml) for 1 time. Suction filtration was conducted with silica gel. Washing was conducted with ethyl acetate until no obvious product residue existed. Concentration was conducted to obtain a yellow viscous liquid. The liquid was separated by column chromatography (with a mixture of ethyl acetate and n-hexane at a ratio of 1:20 as an eluent), and then concentration and drying were conducted to obtain 36.8 g of a white sugar-like solid compound La385 with a yield of 78.9%. Mass spectrometry was as follows: 378.4 (M+H)

Synthesis of a Compound A1

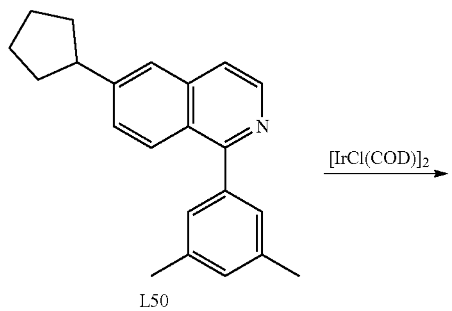

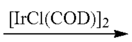

L50

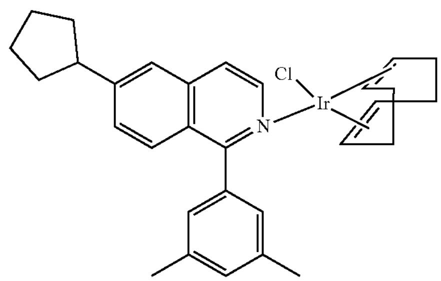

A1-1

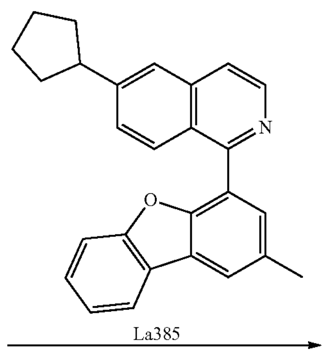

La385

-continued

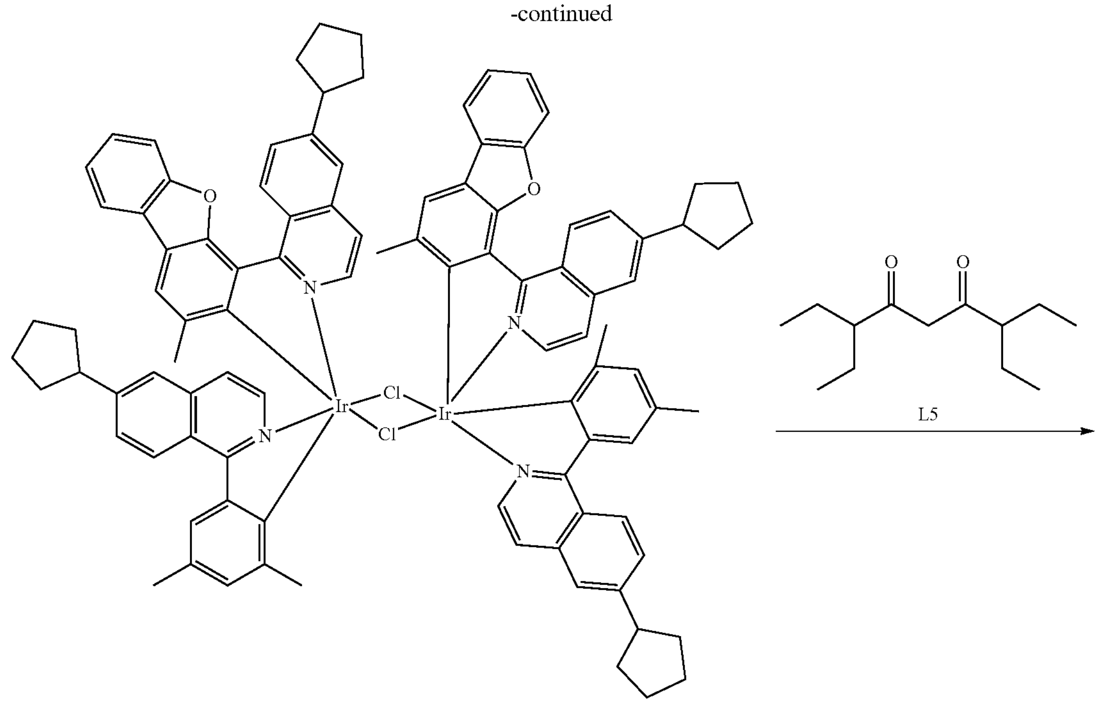

A1-2

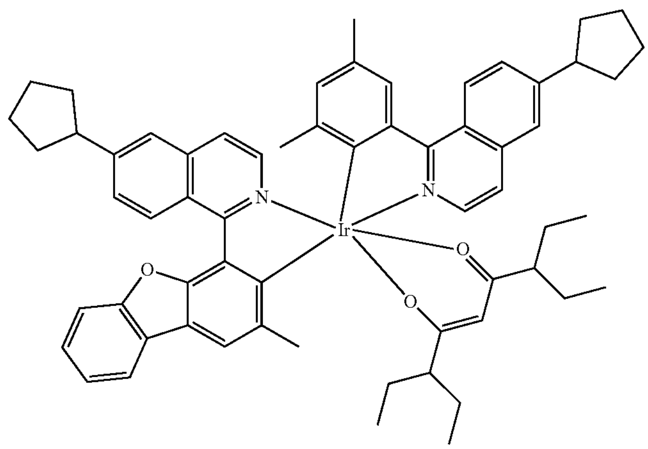

A1

Synthesis of a Compound A1-1

The compound L50 (6.7 g, 22.2 mmol, 2.0 eq) and silver oxide (2.58 g, 11.1 mmol, 1.0 eq) were added into a 250 ml three-mouth flask, and then a 4 A molecular sieve (2.5 g) and dichloromethane (130 ml) were added, and stirred at room temperature for 2 hours under the replacement of vacuum and nitrogen for 3 times until a solution became a brownish black suspension. According to monitoring by TLC (with a mixture of ethyl acetate and n-hexane at a ratio of 1:8 as a developing agent), the raw material L50 was almost consumed completely. Then, chloro(1,5-cyclooctadiene)iridium dimer (7.47 g, 11.1 mmol, 1.0 eq) was added into the reaction solution, and continuously stirred at room temperature for 8 hours until the solution became brownish red. According to monitoring by TLC (with a mixture of ethyl acetate and n-hexane at a ratio of 1:3 as a developing agent), a reaction was stopped until a product with high polarity was produced. After filtration was conducted, a filter cake was washed with a small amount of dichloromethane, and a filtrate was collected, and concentrated to about 60 ml. N-hexane (100 ml) was added, and stirred for 1 hour until a solid was precipitated out. The solid was rinsed with a small amount of n-hexane, filtered, and then dried to obtain 12.9 g of an orange red solid compound A1-1 with a yield of 91.8%. Mass spectrometry was as follows: 635.2 (M+H)

Synthesis of a Compound A1-2

The compound A1-1 (4.2 g, 6.61 mmol, 1.0 eq), the compound La385 (7.48 g, 19.8 mmol, 3.0 eq), and 2-ethoxyethanol (63 ml) were added into a 250 ml three-mouth flask, heated to 120° C., and stirred for 16 hours under the replacement of vacuum and nitrogen for 3 times. According to monitoring by TLC (with a mixture of ethyl acetate and n-hexane at a ratio of 1:3 as a developing agent), the raw material A-1 was almost consumed completely. A reaction solution was cooled to room temperature, and methanol (63 ml) was added into the reaction solution, and continuously stirred for 2 hours. After filtration was conducted, a filter cake was washed with a small amount of methanol, and then dried to obtain 3.8 g of an orange red solid compound A1-2 with a yield of 53.2%. The obtained compound was directly used in the next step without purification.

Synthesis of a Compound A1

The compound A1-2 (5.18 g), a compound L5 (4.91 g, 23.1 mmol, 3.5 eq), sodium carbonate (3.5 g, 33.0 mmol, 5.0 eq), and 2-ethoxyethanol (103 ml) were added into a 250 ml three-mouth flask, heated to 40° C., and stirred for 16 hours under the replacement of vacuum and nitrogen for 3 times. According to monitoring by TLC (with a mixture of ethyl acetate and n-hexane at a ratio of 1:5 as a developing agent), the raw material A1-2 was almost consumed completely. Then, methanol (103 ml) was added into a reaction solution, and continuously stirred at room temperature for 1 hour. After filtration was conducted, a filter cake was rinsed with a small amount of methanol. A solid obtained was stirred in dichloromethane (150 ml) for dissolved clarification. After filtration was conducted with silica gel, a filter cake was rinsed with a small amount of dichloromethane. Deionized water was added into a filtrate obtained for washing for 3 times (80 ml/time). Liquid separation was conducted, and an organic phase was collected, and spin-dried. A crude product was recrystallized with tetrahydrofuran/methanol (1 g/7 v/10 v) for 3 times, and then dried to obtain 3.8 g of a red solid compound A1 with a yield of 53.2%. 3.8 g of the crude product A1 was sublimated and purified to obtain 2.78 g of a sublimated pure product A1 with a yield of 73.1%. Mass spectrometry was as follows: 1081.4 (M+H). 1H NMR (400 MHz, $CDCl_3$) δ 8.36 (d, J=15.0 Hz, 2H), 8.07 (d, J=2.9 Hz, 2H), 7.98 (dd, J=14.6, 3.4 Hz, 1H), 7.77 (d, J=15.0 Hz, 2H), 7.54 (dd, J=14.7, 3.4 Hz, 1H), 7.47 (dd, J=14.9, 3.0 Hz, 2H), 7.38 (tt, J=9.2, 4.5 Hz, 3H), 7.31 (td, J=14.8, 3.4 Hz, 2H), 6.92 (d, J=3.1 Hz, 2H), 2.32 (d, J=15.0 Hz, 9H), 2.02-1.82 (m, 4H), 1.81-1.55 (m, 12H), 1.42-1.15 (m, 8H), 1.11-0.97 (m, 5H), 0.94 (t, J=13.2 Hz, 12H).

Example 2 Synthesis of a Compound A2

Synthesis of ligands La193 and La769

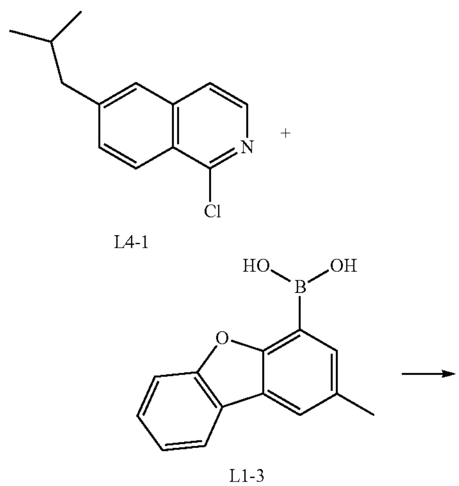

L4-1

L1-3

-continued

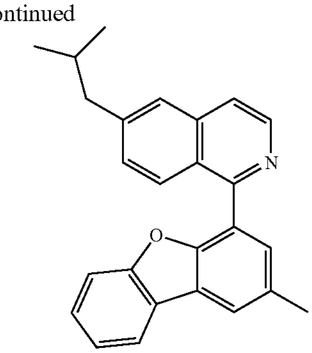

La193

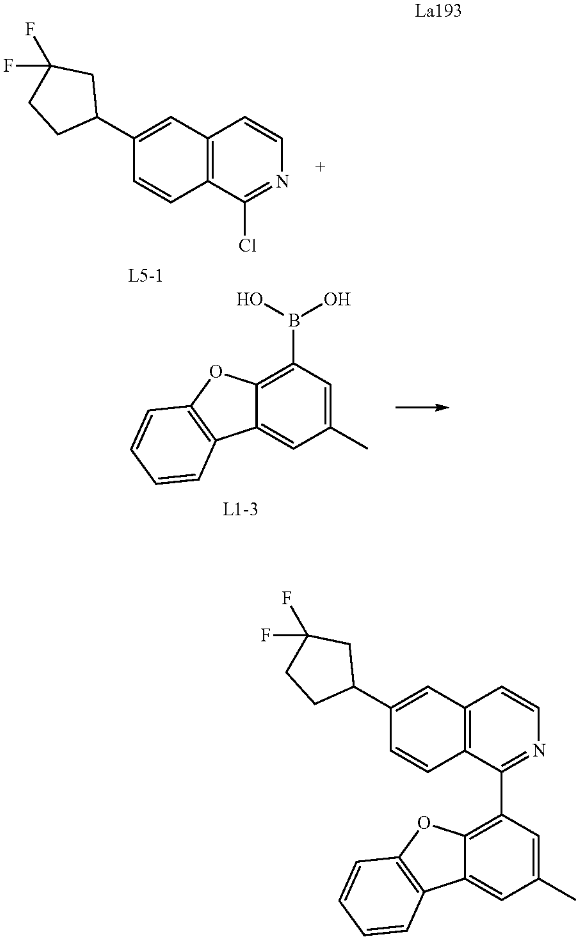

L5-1

L1-3

La769

Synthesis of a Compound La193

With reference to the synthesis process and post-treatment and purification methods of the compound La385, only the corresponding raw materials were required to be changed. Mass spectrometry was as follows: 366.2 (M+H).

Synthesis of a Compound La769

With reference to the synthesis process and post-treatment and purification methods of the compound La385, only the corresponding raw materials were required to be changed. Mass spectrometry was as follows: 414.5 (M+H).

Synthesis of a Compound A2
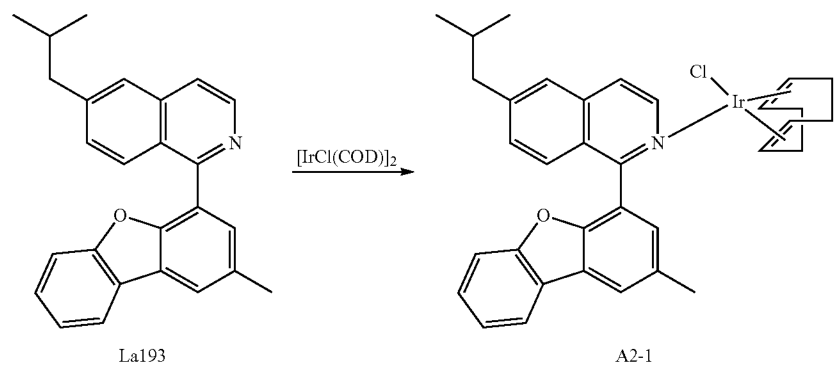
La193
A2-1
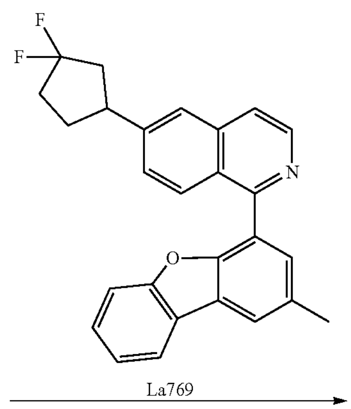
La769
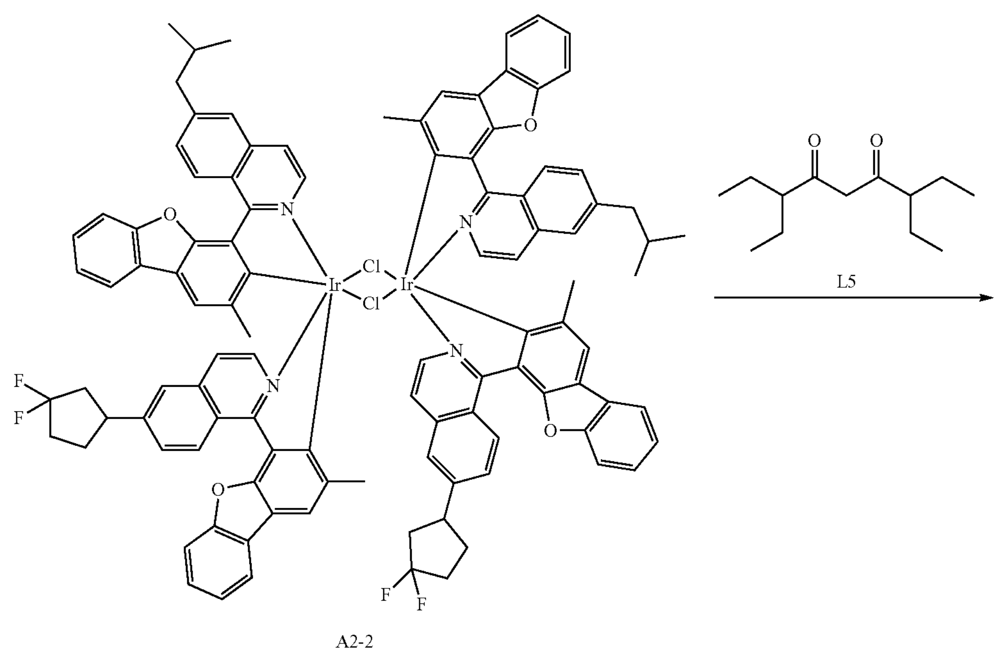
L5
A2-2

-continued

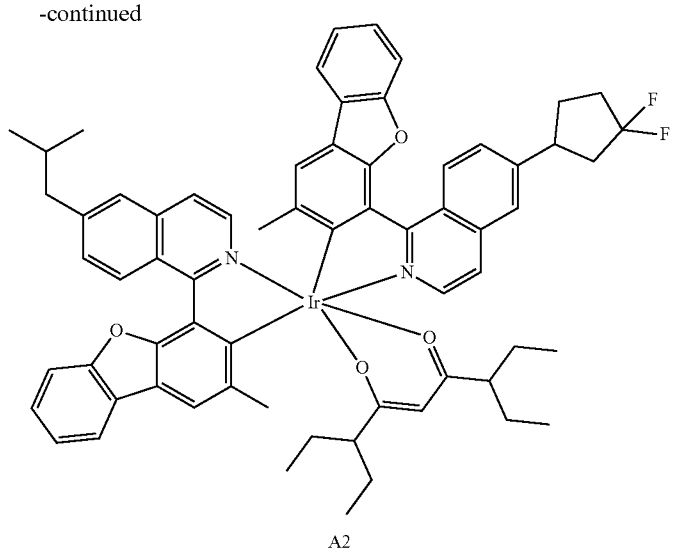

A2

Synthesis of a Compound A2-1

With reference to the synthesis process and post-treatment and purification methods of the compound A1-1, only the corresponding raw materials were required to be changed. Mass spectrometry was as follows: 712.3 (M+H).

Synthesis of a Compound A2-2

With reference to the synthesis process and post-treatment and purification methods of the compound A1-2, only the corresponding raw materials were required to be changed. The obtained compound was directly used in the next step without purification.

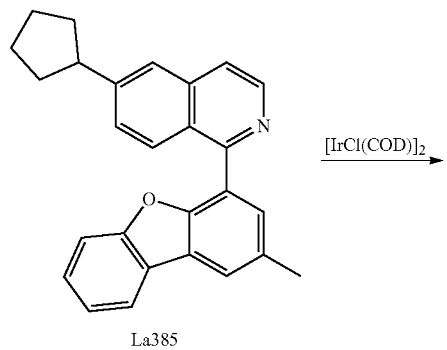

La385

Synthesis of a Compound A2

With reference to the synthesis process and post-treatment and purification methods of the compound A1, only the corresponding raw materials were required to be changed, and 2.95 g of a target compound A2 with a yield of 48.9% was obtained. 2.95 g of the crude product A2 was sublimated and purified to obtain 2.08 g of a sublimated pure product A2 with a yield of 70.5%. Mass spectrometry was as follows: 1181.4 (M+H). $^1$H NMR (400 MHz, $CDCl_3$) δ 8.38 (d, J=20.0 Hz, 2H), 7.98 (dd, 2H), 7.78 (m, J=5.0 Hz, 2H), 7.53 (d, J=15.0 Hz, 4H), 7.47 (m, 2H), 7.39 (m, 4H), 7.31 (m, 4H), 2.43 (d, 2H), 2.34 (s, 6H), 1.88 (m, 1H), 1.81 (m, J=7.2 Hz, 2H), 1.69 (m, J=37.5 Hz, 2H), 1.31 (m, 4H), 1.24 (m, 4H), 1.01 (m, J=5.7 Hz, 7H), 0.94 (m, 12H), 0.87 (d, 5H).

Example 3 Synthesis of a Compound A3

-continued
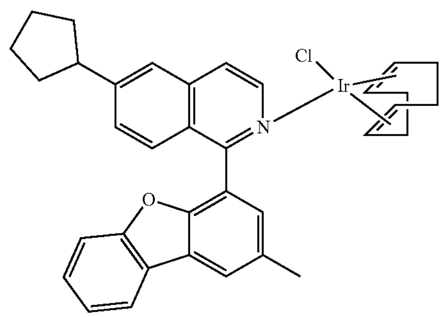
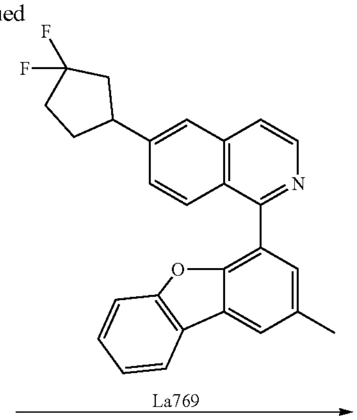
A3-1
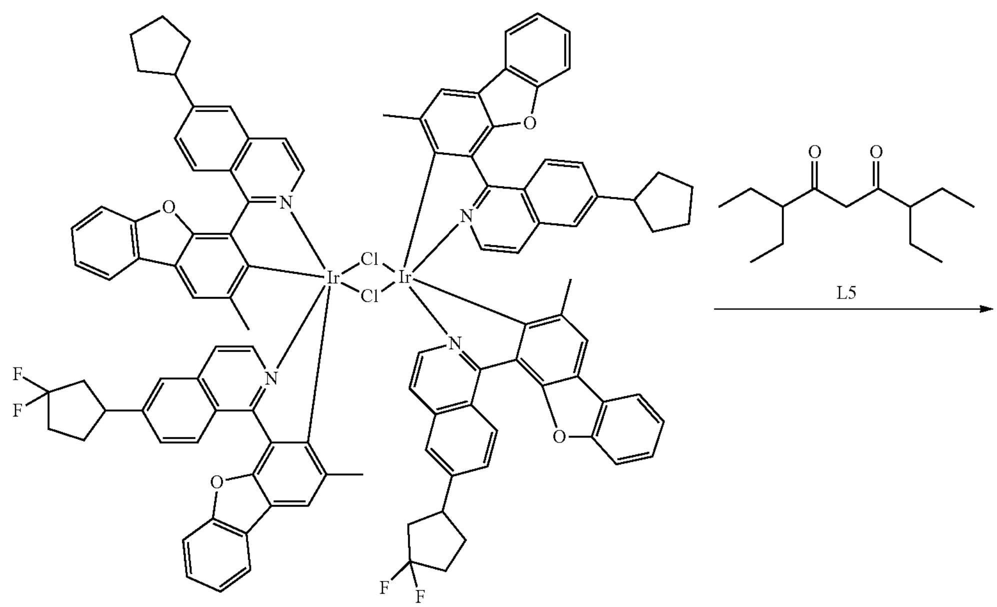
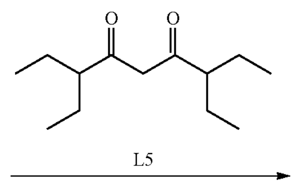
A3-2

-continued

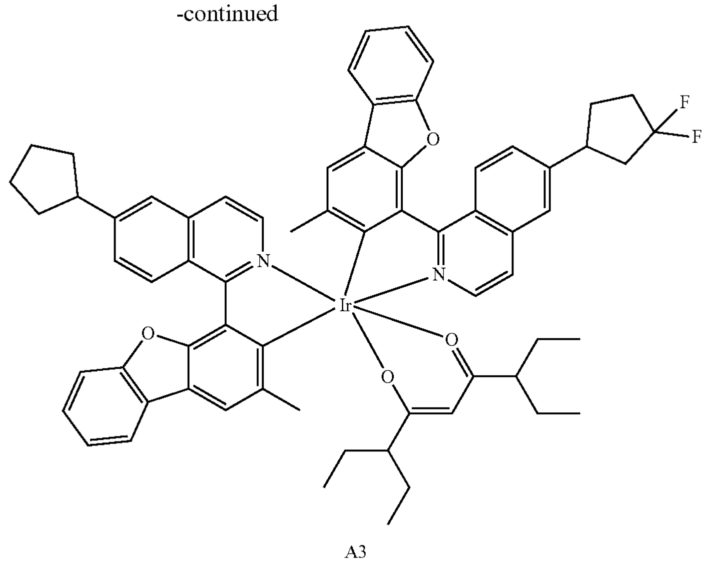

A3

Synthesis of a Compound A3

With reference to the synthesis process and post-treatment and purification methods of the compound A1, only the corresponding raw materials were required to be changed, and 3.11 g of a target compound A3 with a yield of 50.2% was obtained. 3.11 g of the crude product A3 was sublimated and purified to obtain 2.17 g of a sublimated pure product A3 with a yield of 69.7%. Mass spectrometry was as follows: 1193.5 (M+H). $^{1}$H NMR (400 MHz, $CDCl_3$) δ 8.38 (d, J=20.0 Hz, 2H), 7.94 (dd, 2H), 7.72 (m, J=5.0 Hz, 2H), 7.55 (d, J=15.0 Hz, 4H), 7.46 (m, 2H), 7.39 (m, 4H), 7.31 (m, 4H), 2.34 (s, 6H), 1.88 (m, 3H), 1.77 (t, J=18.8 Hz, 3H), 1.66 (m, J=2.2 Hz, 5H), 1.31 (m, 4H), 1.24 (m, 4H), 1.01 (m, J=5.7 Hz, 8H), 0.94 (m, 12H).

Example 4 Synthesis of a Compound A4

Synthesis of a Ligand La1306

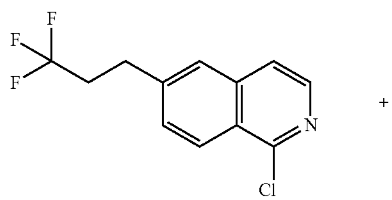

L6-1

+

-continued

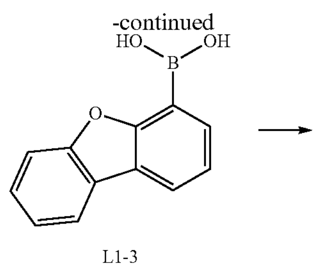

L1-3

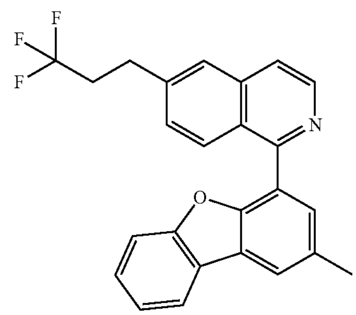

La1306

Synthesis of a Compound La1306

With reference to the synthesis process and post-treatment and purification methods of the compound La385, only the corresponding raw materials were required to be changed. Mass spectrometry was as follows: 406.4 (M+H).

Synthesis of a Compound A4
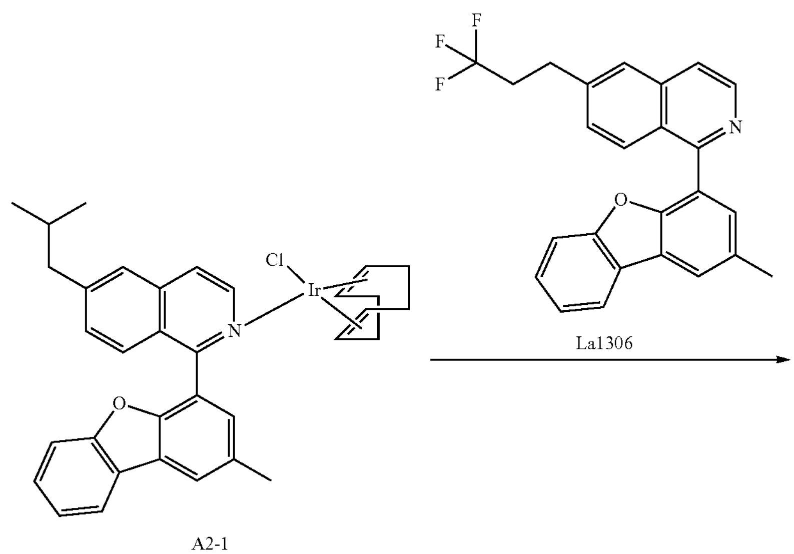
A2-1
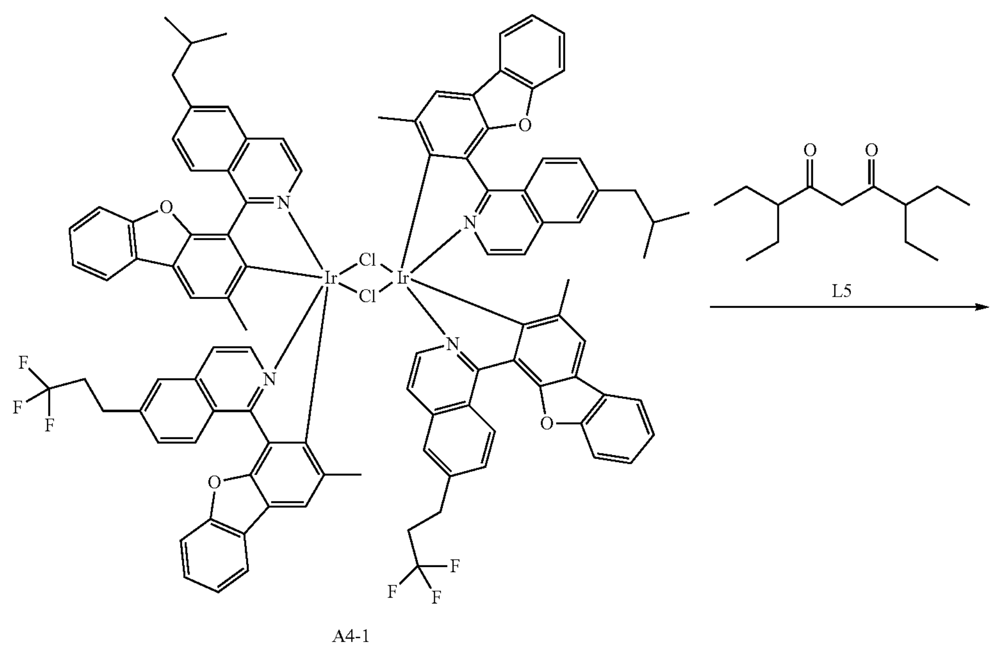
A4-1

-continued

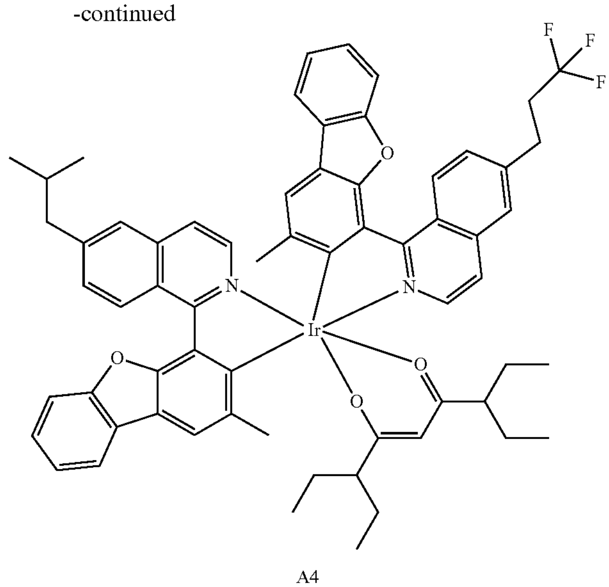

A4

Synthesis of a Compound A4-1

With reference to the synthesis process and post-treatment and purification methods of the compound A1-2, only the corresponding raw materials were required to be changed. The obtained compound was directly used in the next step without purification.

Synthesis of a Compound A4

With reference to the synthesis process and post-treatment and purification methods of the compound A1, only the corresponding raw materials were required to be changed, and 2.71 g of a target compound A4 with a yield of 47.7% was obtained. 2.71 g of the crude product A4 was sublimated and purified to obtain 1.95 g of a sublimated pure product A4 with a yield of 71.9%. Mass spectrometry was as follows: 1173.4 (M+H). $^1$H NMR (400 MHz, $CDCl_3$) δ 8.41 (d, J=20.0 Hz, 2H), 7.96 (dd, 2H), 7.75 (m, J=5.0 Hz, 2H), 7.56 (d, J=15.0 Hz, 4H), 7.47 (m, 2H), 7.40 (m, 4H), 7.33 (m, 4H), 2.63 (t, 2H), 2.43 (d, 1H), 2.34 (s, 6H), 1.85 (m, J=32.9 Hz, 2H), 1.31 (m, 4H), 1.24 (m, 4H), 1.01 (m, J=5.7 Hz, 5H), 0.94 (m, 12H), 0.87 (m, 6H).

Example 5 Synthesis of a Compound A5

Synthesis of a Ligand La1

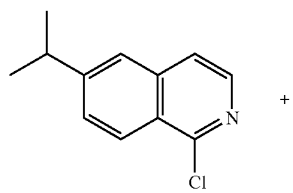

+

L7-1

-continued

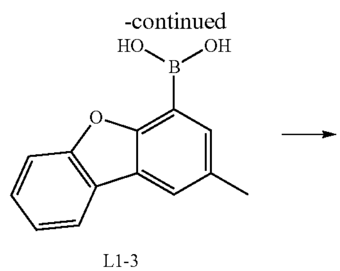

L1-3

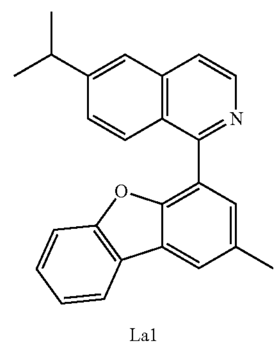

La1

Synthesis of a Compound La1

With reference to the synthesis process and post-treatment and purification methods of the compound La385, only the corresponding raw materials were required to be changed. Mass spectrometry was as follows: 352.4 (M+H).

Synthesis of a Compound A5
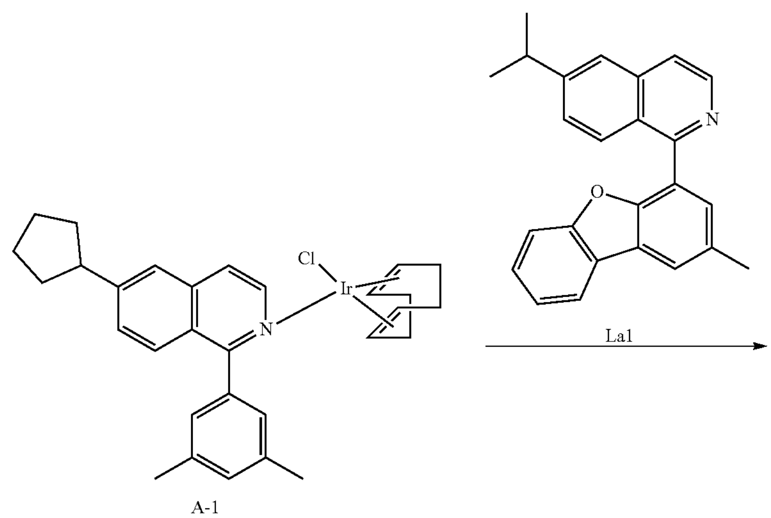
A-1
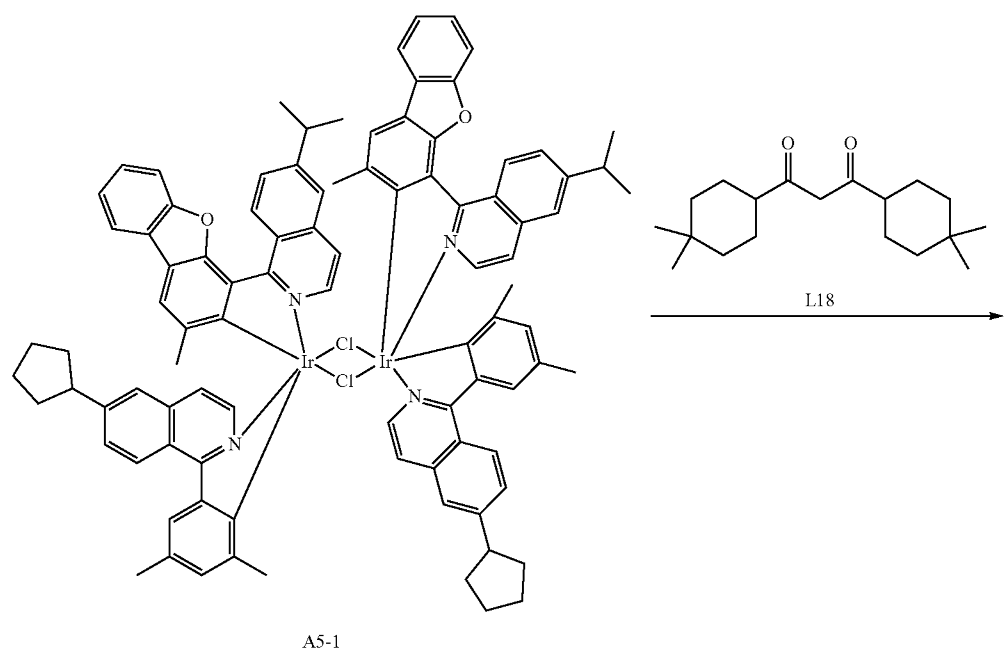
A5-1

-continued

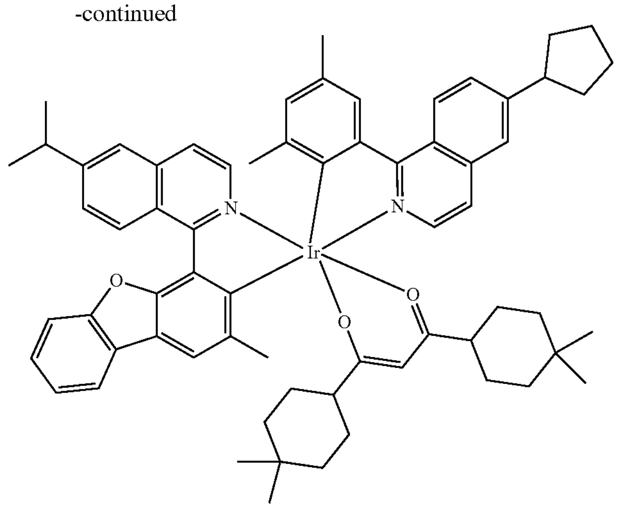

A5

Synthesis of a Compound A5-1

With reference to the synthesis process and post-treatment and purification methods of the compound A1-2, only the corresponding raw materials were required to be changed. The obtained compound was directly used in the next step without purification.

Synthesis of a Compound A5

With reference to the synthesis process and post-treatment and purification methods of the compound A1, only the corresponding raw materials were required to be changed, and 2.88 g of a target compound A5 with a yield of 49.2% was obtained. 2.88 g of the crude product A5 was sublimated and purified to obtain 2.03 g of a sublimated pure product A5 with a yield of 70.4%. Mass spectrometry was as follows: 1135.5 (M+H). $^{1}$H NMR (400 MHz, $CDCl_3$) δ 8.36 (d, J=15.0 Hz, 2H), 8.07 (d, J=2.9 Hz, 2H), 7.98 (dd, J=14.6, 3.4 Hz, 1H), 7.77 (d, J=15.0 Hz, 2H), 7.54 (dd, J=14.7, 3.4 Hz, 1H), 7.47 (dd, J=14.9, 3.0 Hz, 2H), 7.38 (tt, J=9.2, 4.5 Hz, 3H), 7.31 (td, J=14.8, 3.4 Hz, 2H), 6.92 (d, J=3.1 Hz, 2H), 2.87 (m, J=6.5 Hz, 1H), 2.32 (d, J=15.0 Hz, 9H), 1.88 (m, 2H), 1.76 (m, 2H), 1.66 (m, J=2.2 Hz, 4H), 1.52 (m, J=30.0 Hz, 8H), 1.39 (m, 4H), 1.27 (d, J=30.0 Hz, 3H), 1.20 (m, 6H), 1.00 (m, 5H), 0.87 (s, 12H).

Example 6 Synthesis of a Compound A6

Synthesis of a Compound A6

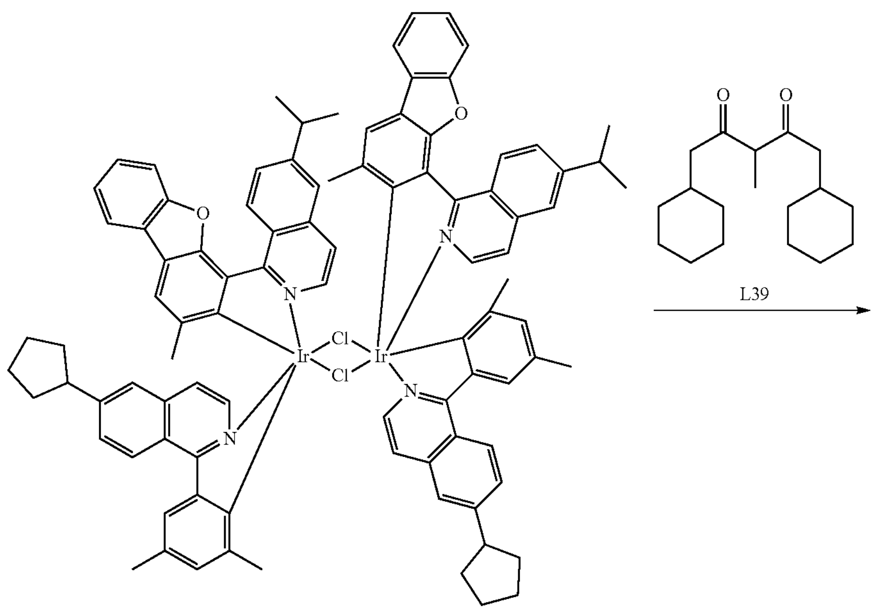

A5-1

-continued

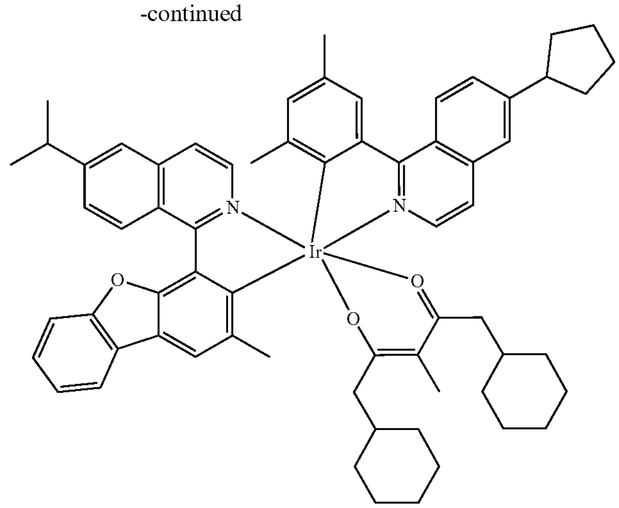

A6

With reference to the synthesis process and post-treatment and purification methods of the compound A1, only the corresponding raw materials were required to be changed, and 3.61 g of a target compound A6 with a yield of 54.2% was obtained. 3.61 g of the crude product A6 was sublimated and purified to obtain 2.61 g of a sublimated pure product A6 with a yield of 72.0%. Mass spectrometry was as follows: 1121.5 (M+H). $^1$H NMR (400 MHz, $CDCl_3$) δ 8.36 (d, J=15.0 Hz, 2H), 8.07 (d, J=2.9 Hz, 2H), 7.98 (dd, J=14.6, 3.4 Hz, 1H), 7.77 (d, J=15.0 Hz, 2H), 7.54 (dd, J=14.7, 3.4 Hz, 1H), 7.47 (dd, J=14.9, 3.0 Hz, 2H), 7.38 (tt, J=9.2, 4.5 Hz, 3H), 7.31 (td, J=14.8, 3.4 Hz, 2H), 6.92 (d, J=3.1 Hz, 2H), 2.87 (m, 1H), 2.54 (d, 2H), 2.32 (d, J=15.0 Hz, 9H), 1.88 (d, J=5.4 Hz, 4H), 1.83-1.73 (m, 8H), 1.67 (m, J=16.1, 6.1 Hz, 10H), 1.31 (m, 4H), 1.20 (m, J=2.6 Hz, 8H), 1.11 (m, 2H), 1.01 (m, J=15.0 Hz, 6H).

Example 7 Synthesis of a Compound A7

Synthesis of a Ligand L221

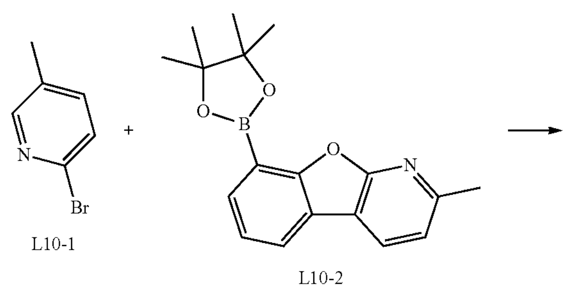

L10-1

L10-2

-continued

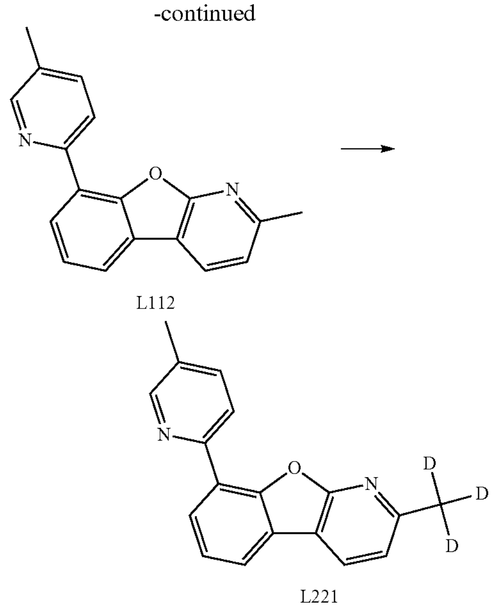

L112

L221

Synthesis of a Compound L112

A compound L10-1 (14.2 g, 82.5 mmol, 1.0 eq), a compound L10-2 (25.5 g, 82.5 mmol, 1.0 eq), tripotassium phosphate (35.0 g, 165.0 mmol, 2.0 eq), tris(dibenzylideneacetone)dipalladium (1.51 g, 1.65 mmol, 0.02 eq), and 2-dicyclohexylphosphino-2',6'-dimethoxybiphenyl (1.36 g, 3.3 mmol, 0.04 eq) were put into a 500 ml three-mouth flask, and toluene (150 ml) and deionized water (30 ml) were added under the replacement of vacuum and nitrogen for 3 times. A mixture obtained was heated to reflux, and stirred for a reaction overnight under the protection of nitrogen. According to monitoring by TLC (with a mixture of ethyl acetate and n-hexane at a ratio of 1:5 as a developing agent), the raw material L10-2 was almost consumed completely. The mixture was cooled to room temperature. Liquid separation was conducted, and an organic phase was collected. An aqueous phase was extracted with ethyl acetate (60 ml)

for 1 time. Organic phases were combined, and concentrated to obtain a yellow viscous liquid. The liquid was separated by column chromatography (with a mixture of ethyl acetate and n-hexane at a ratio of 1:15 as an eluent), and then concentration and drying were conducted to obtain 16.1 g of a white-like solid compound L112 with a yield of 71.5%. Mass spectrometry was as follows: 275.3 (M+H)

Synthesis of a Compound L221

The compound L112 (16.1 g, 58.6 mmol, 1.0 eq), sodium hydride (4.23 g, 176.0 mmol, 3.0 eq), and deuterated ethanol (160 ml) were added into a 500 ml three-mouth flask under the replacement of vacuum and nitrogen for 3 times. A mixture obtained was heated to reflux, and stirred for a reaction for 48 hours under the protection of nitrogen. Cooling was conducted to room temperature. Heavy water (100 ml) was added, and stirred for 0.5 hour. Dichloromethane (250 ml) was added for extraction twice. An organic phase in the lower layer was collected, and spin-dried. An aqueous phase was extracted with ethyl acetate (60 ml) for 1 time. Organic phases were combined, and concentrated to obtain a yellow viscous liquid. The liquid was separated by column chromatography (with a mixture of ethyl acetate and n-hexane at a ratio of 1:15 as an eluent), and then concentration and drying were conducted to obtain 10.1 g of a white-like solid compound L221 with a yield of 62.1%. Mass spectrometry was as follows: 278.3 (M+H)

Synthesis of a Compound A7

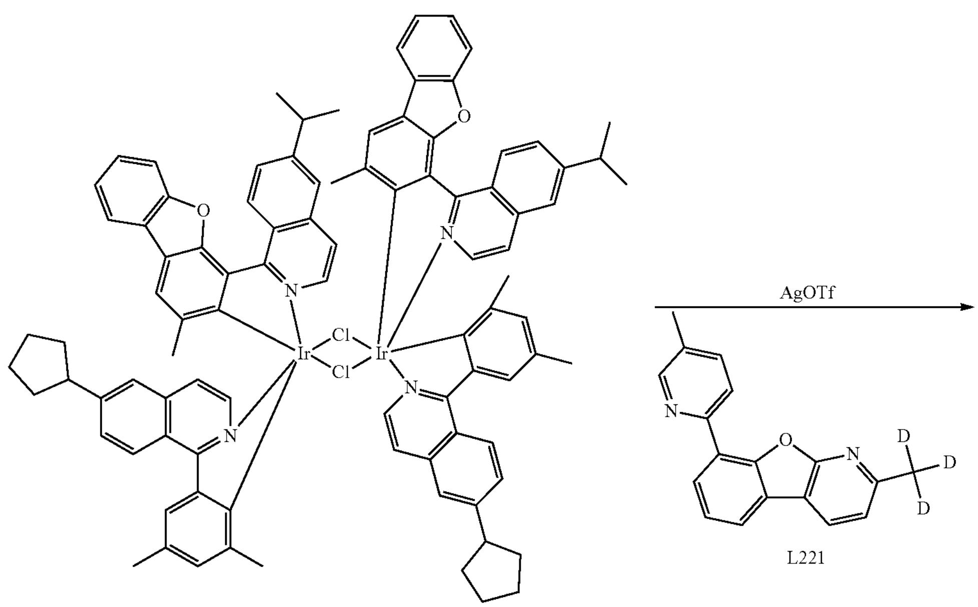

A5-1

L221

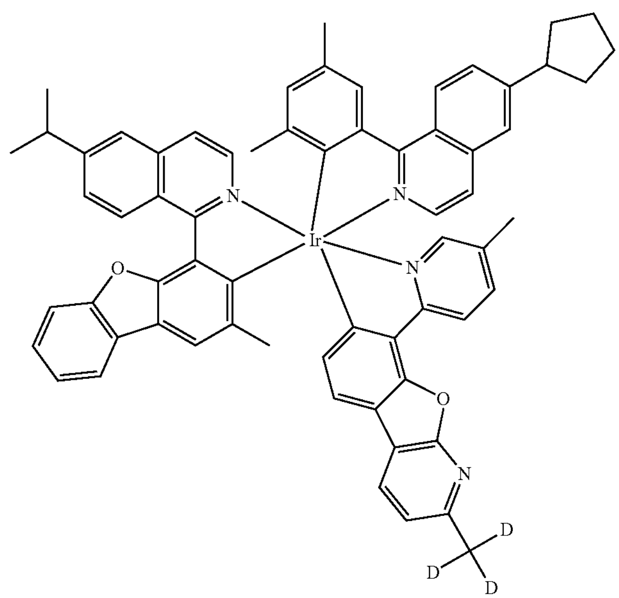

A7

The compound A5-1 (8.2 g, 4.7 mmol, 1.0 eq) and dichloromethane (205 ml) were added into a 250 ml three-mouth flask for stirring and dissolution, and silver trifluoromethanesulfonate (2.66 g, 10.3 mmol, 2.2 eq) was dissolved in isopropanol (66.5 ml), and then dropped into the three-mouth flask under the atmosphere of nitrogen. A mixture obtained was stirred at room temperature for a reaction for 18 hours. A reaction suspension was filtered with diatomite to remove a silver salt. A filtrate was spin-dried to obtain an orange red solid, which was directly used in a reaction in the next step without purification. The solid obtained, the compound L221 (3.91 g, 14.1 mmol, 3.0 eq), and ethanol (117 ml) were added into a 250 ml clean three-mouth flask under the replacement of vacuum and nitrogen for 3 times. A mixture obtained was heated to reflux, and stirred overnight. According to monitoring by TLC (with a mixture of ethyl acetate and n-hexane at a ratio of 1:5 as a developing agent), a new product was produced. A reaction solution was cooled to room temperature. After filtration was conducted, a filter cake was rinsed with a small amount of ethanol. A solid obtained was stirred in dichloromethane (160 ml) for dissolved clarification. After filtration was conducted with silica gel, a filter cake was rinsed with a small amount of DCM. Deionized water was added into a filtrate obtained for washing for 3 times (80 ml/time). Liquid separation was conducted, and an organic phase was collected, and spin-dried. A crude product was recrystallized with tetrahydrofuran/methanol (1 g/8 v/15 v) for 4 times, and then dried to obtain 2.54 g of a red solid compound A7 with a yield of 48.3%. 2.54 g of the crude product A7 was sublimated and purified to obtain 1.49 g of a sublimated pure product A7 with a yield of 58.6%. Mass spectrometry was as follows: 1195.4 (M+H). $^1$H NMR (400 MHz, $CDCl_3$) δ 8.36 (d, 2H), 8.30 (d, J=0.6 Hz, 2H), 8.23 (s, 1H), 8.07 (d, 1H), 7.98 (dd, 1H), 7.84-7.67 (m, 4H), 7.56 (m, J=23.7 Hz, 2H), 7.46 (m, J=5.2 Hz, 3H), 7.39 (m, 2H), 7.35-7.23 (m, 4H), 7.01 (d, 1H), 6.92 (d, 1H), 2.87 (m, 1H), 2.34 (m, J=27.4, 17.4 Hz, 13H), 1.97 (m, J=6.9 Hz, 2H), 1.72 (m, J=28.4, 21.6 Hz, 6H), 1.20 (d, 3H).

Example 8 Synthesis of a compound A8

Synthesis of a Ligand La199

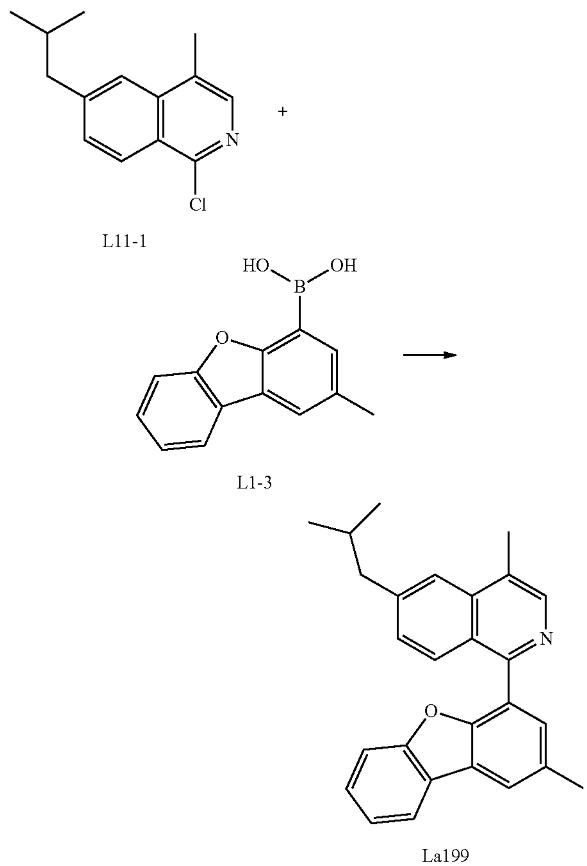

L11-1

L1-3

La199

Synthesis of a Compound La199

With reference to the synthesis process and post-treatment and purification methods of the compound La385, only the corresponding raw materials were required to be changed. Mass spectrometry was as follows: 380.5 (M+H).

Synthesis of a Compound A8

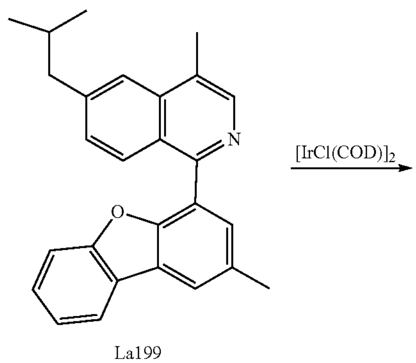

La199

-continued
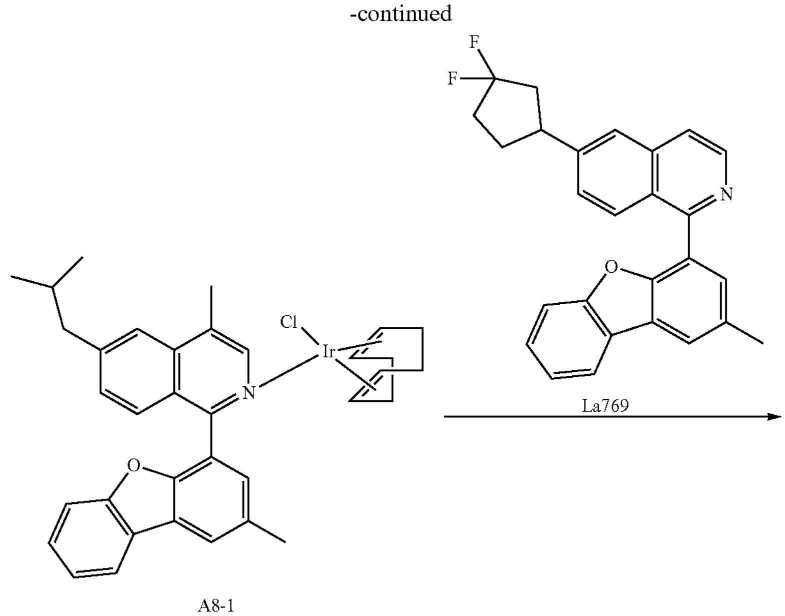
A8-1
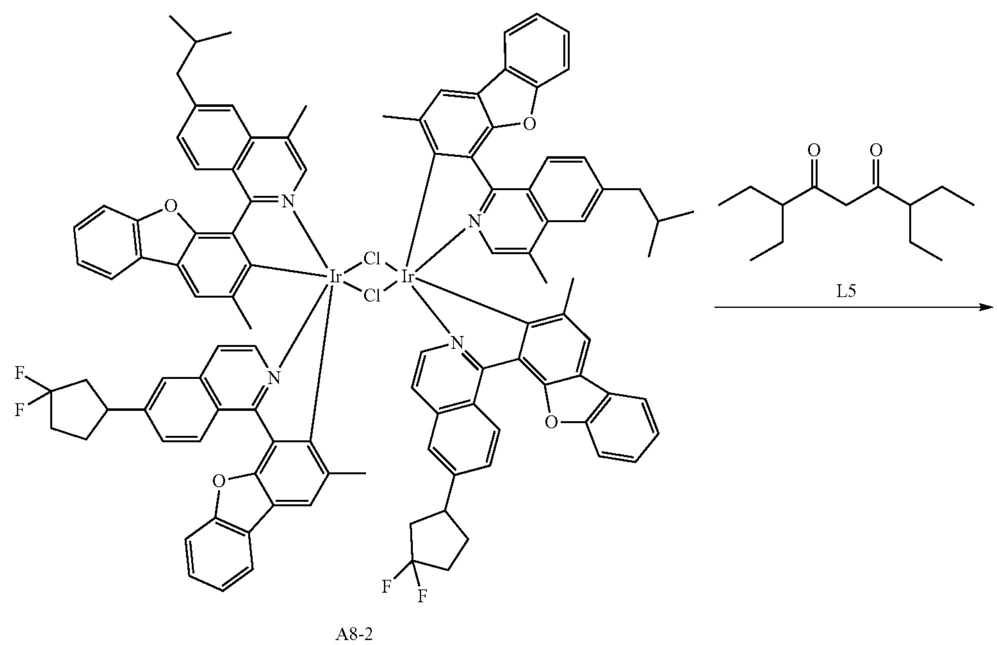
A8-2

-continued

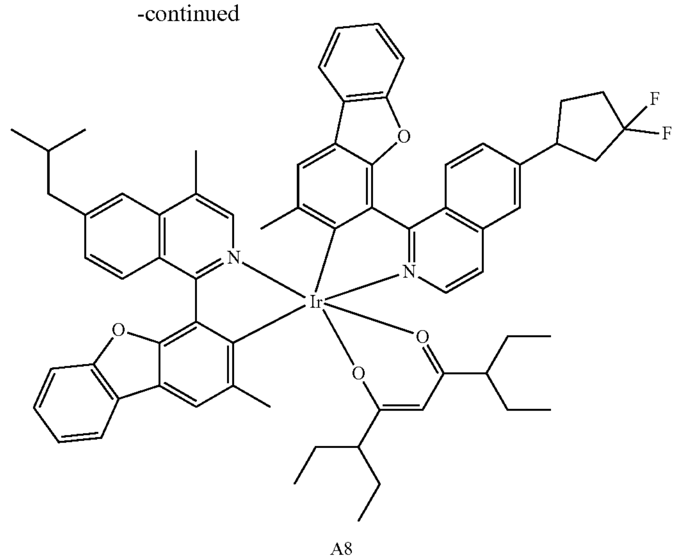

A8

Synthesis of a Compound A8-1

With reference to the synthesis process and post-treatment and purification methods of the compound A1-1, only the corresponding raw materials were required to be changed. Mass spectrometry was as follows: 714.2 (M+H).

Synthesis of a compound A8-2

With reference to the synthesis process and post-treatment and purification methods of the compound A1-2, only the corresponding raw materials were required to be changed. The obtained compound was directly used in the next step without purification.

Synthesis of a compound A8

With reference to the synthesis process and post-treatment and purification methods of the compound A1, only the corresponding raw materials were required to be changed, and 3.77 g of a target compound A8 with a yield of 56.2% was obtained. 3.77 g of the crude product A8 was sublimated and purified to obtain 2.41 g of a sublimated pure product A8 with a yield of 63.9%. Mass spectrometry was as follows: 1195.5 (M+H). $^{1}H$ NMR (400 MHz, $CDCl_3$) δ 8.37 (d, J=20.0 Hz, 2H), 7.95 (dd, 2H), 7.77 (m, J=5.0 Hz, 2H), 7.54 (d, J=15.0 Hz, 4H), 7.46 (m, 2H), 7.37 (m, 3H), 7.30 (m, 4H), 2.43 (d, 2H), 2.35 (d, J=10.0 Hz, 9H), 1.88 (m, 1H), 1.86-1.68 (m, 3H), 1.66 (m, 1H), 1.31 (m, 4H), 1.24 (m, 4H), 1.01 (m, J=5.7 Hz, 6H), 0.94 (m, 12H), 0.87 (d, 6H).

Example 9 Synthesis of a Compound A9

Synthesis of a Ligand La235

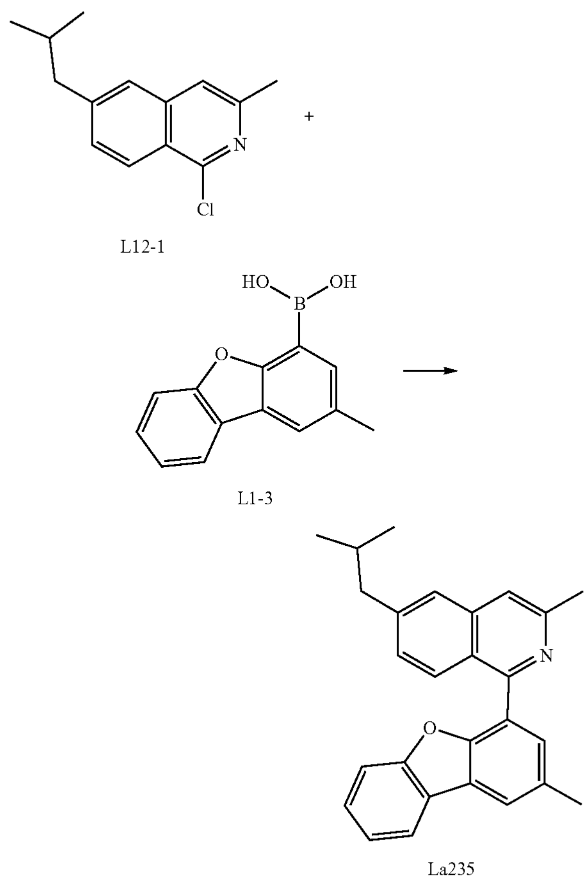

L12-1

L1-3

La235

Synthesis of a Compound La235
With reference to the synthesis process and post-treatment and purification methods of the compound La385, only the corresponding raw materials were required to be changed. Mass spectrometry was as follows: 380.5 (M+H).
Synthesis of a compound A9
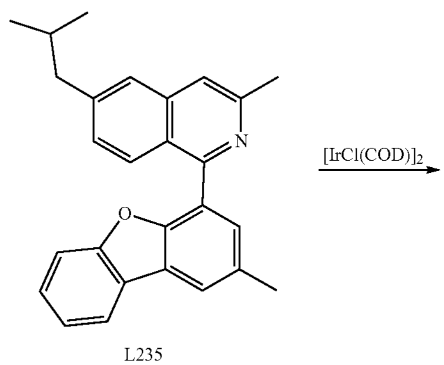
L235
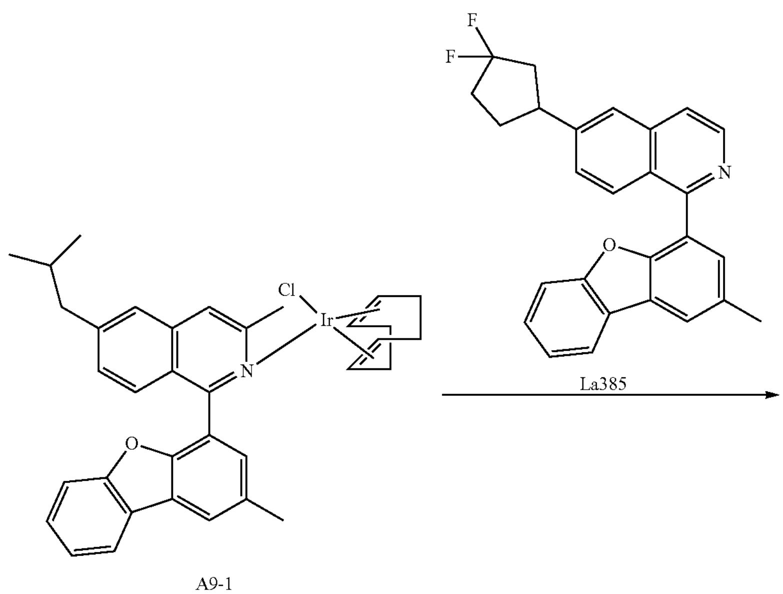
A9-1

-continued

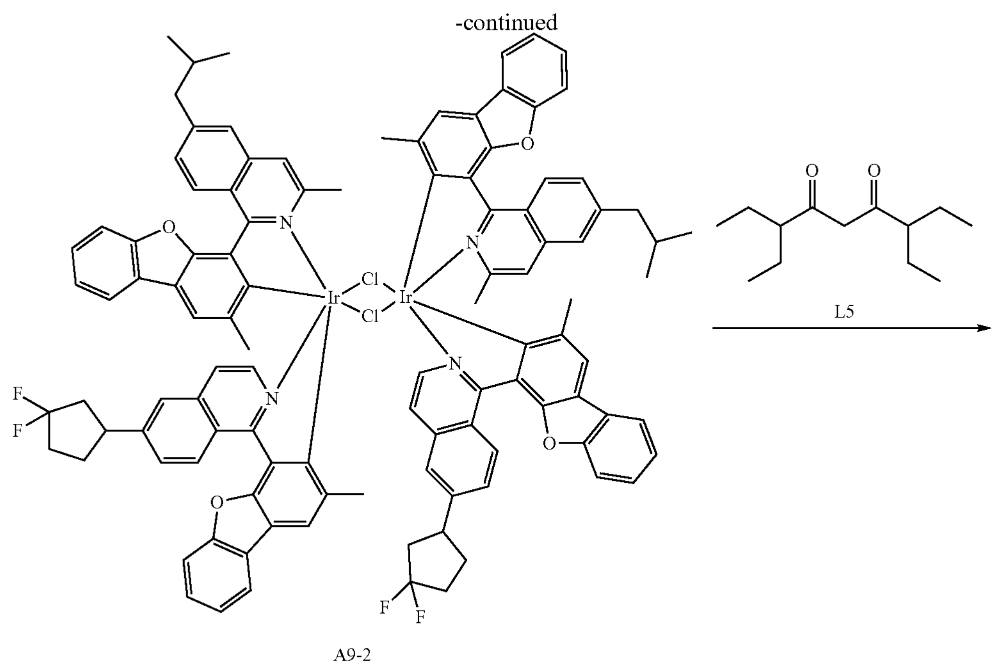

A9-2

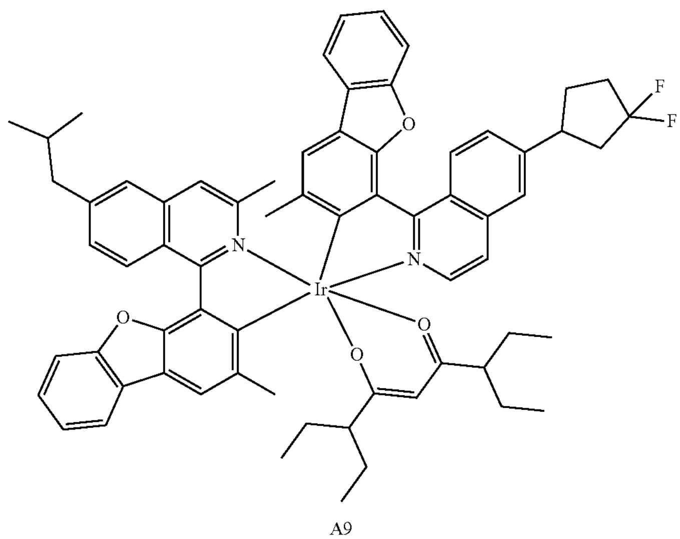

A9

Synthesis of a Compound A9-1

With reference to the synthesis process and post-treatment and purification methods of the compound A1-1, only the corresponding raw materials were required to be changed. Mass spectrometry was as follows: 714.2 (M+H).

Synthesis of a Compound A9-2

With reference to the synthesis process and post-treatment and purification methods of the compound A1-2, only the corresponding raw materials were required to be changed. The obtained compound was directly used in the next step without purification.

Synthesis of a Compound A9

With reference to the synthesis process and post-treatment and purification methods of the compound A1, only the corresponding raw materials were required to be changed, and 3.02 g of a target compound A9 with a yield of 49.7% was obtained. 3.02 g of the crude product A9 was sublimated and purified to obtain 2.15 g of a sublimated pure product A9 with a yield of 71.1%. Mass spectrometry was as follows: 1195.5 (M+H). $^1$H NMR (400 MHz, $CDCl_3$) δ 8.39 (d, J=20.0 Hz, 2H), 7.94 (dd, 2H), 7.75 (m, J=5.0 Hz, 2H), 7.53 (d, J=15.0 Hz, 4H), 7.45 (m, 2H), 7.36 (m, 4H), 7.32 (m, 3H), 2.69 (s, 3H), 2.43 (s, 2H), 2.34 (s, 6H), 1.88 (m, 1H), 1.86-1.68 (m, 3H), 1.66 (m, 1H), 1.31 (m, 4H), 1.24 (m, 4H), 1.01 (m, J=5.7 Hz, 6H), 0.94 (m, 12H), 0.87 (d, 6H).

Example 10 Synthesis of a Compound A10
Synthesis of a Ligand La457
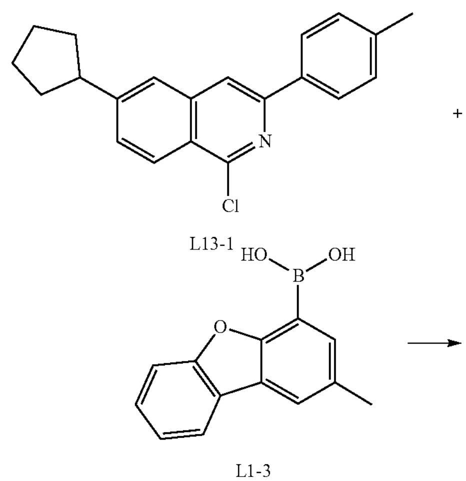
L13-1
L1-3
-continued
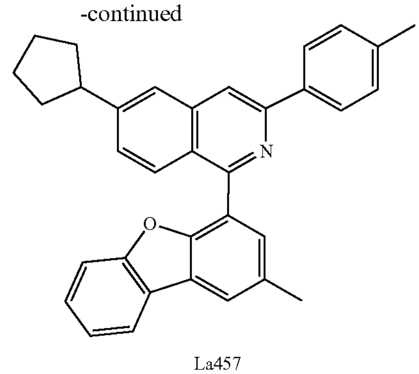
La457
With reference to the synthesis process and post-treatment and purification methods of the compound La385, only the corresponding raw materials were required to be changed. Mass spectrometry was as follows: 468.6 (M+H).
Synthesis of a compound A10
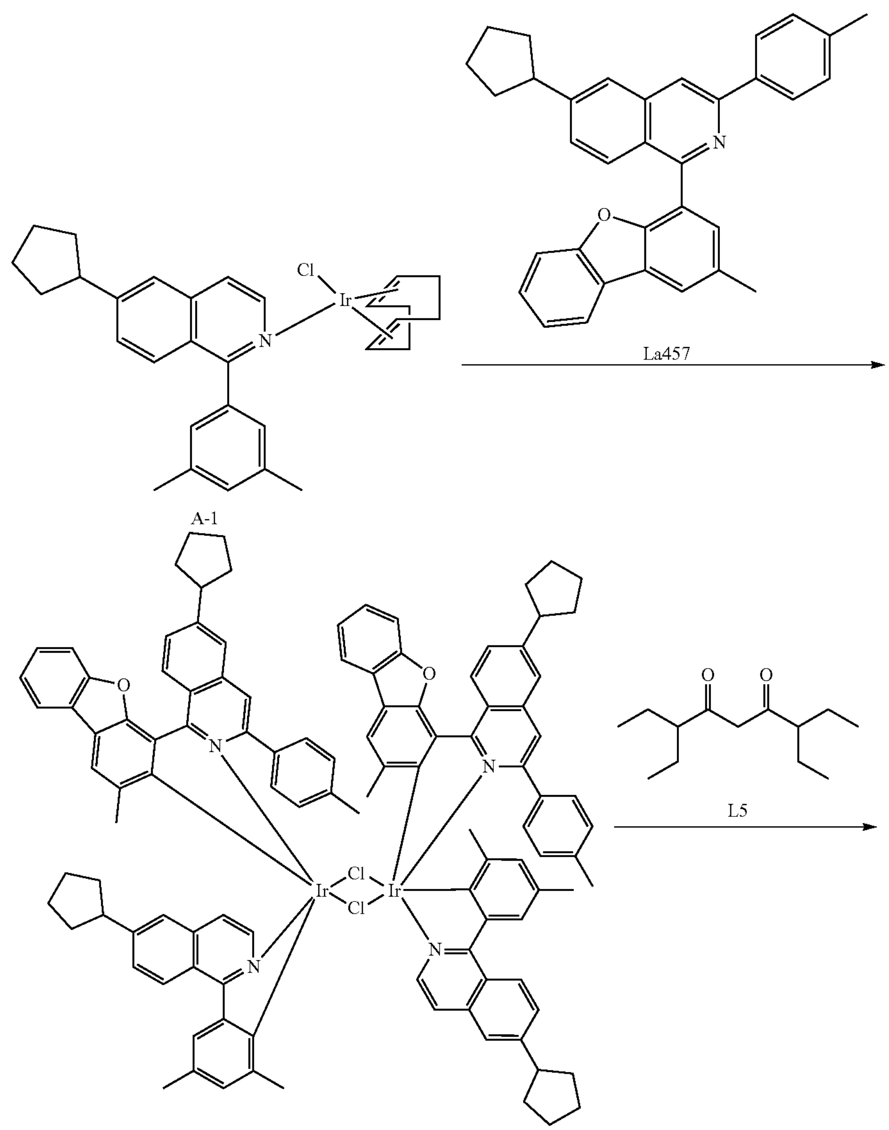
A-1
A10-1

-continued

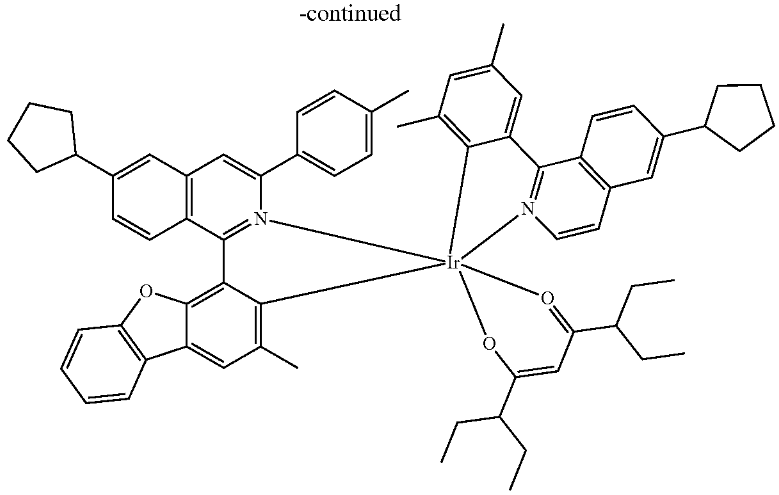

A10

Synthesis of a compound A10-1

With reference to the synthesis process and post-treatment and purification methods of the compound A1-2, only the corresponding raw materials were required to be changed. The obtained compound was directly used in the next step without purification.

Synthesis of a Compound A10

With reference to the synthesis process and post-treatment and purification methods of the compound A1, only the corresponding raw materials were required to be changed, and 2.88 g of a target compound A10 with a yield of 42.1% was obtained. 2.88 g of the crude product A10 was sublimated and purified to obtain 1.77 g of a sublimated pure product A10 with a yield of 61.4%. Mass spectrometry was as follows: 1171.5 (M+H). $^1$H NMR (400 MHz, $CDCl_3$) δ 8.36 (d, 2H), 8.07 (d, 2H), 7.98 (dd, 3H), 7.83 (d, 1H), 7.77 (m, 1H), 7.54 (m, 2H), 7.47 (d, 2H), 7.39 (m, 2H), 7.31 (m, 2H), 7.15 (d, 2H), 6.92 (d, 2H), 2.32 (d, J=15.0 Hz, 12H), 1.88 (m, 4H), 1.76 (m, 4H), 1.66 (m, J=2.2 Hz, 7H), 1.31 (m, 4H), 1.24 (m, 4H), 1.01 (m, J=5.7 Hz, 5H), 0.94 (m, 12H).

Example 11 Synthesis of a Compound A11

Synthesis of a Ligand La397

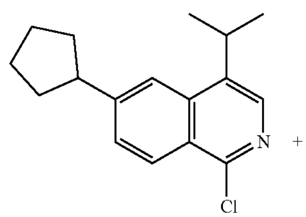

L14-1

-continued

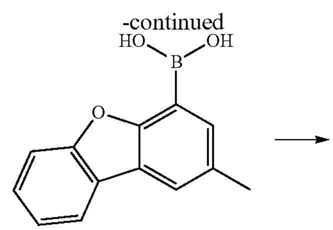

L1-3

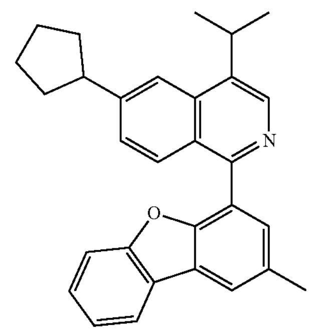

La397

With reference to the synthesis process and post-treatment and purification methods of the compound La385, only the corresponding raw materials were required to be changed. Mass spectrometry was as follows: 420.6 (M+H).

Synthesis of a Compound A11

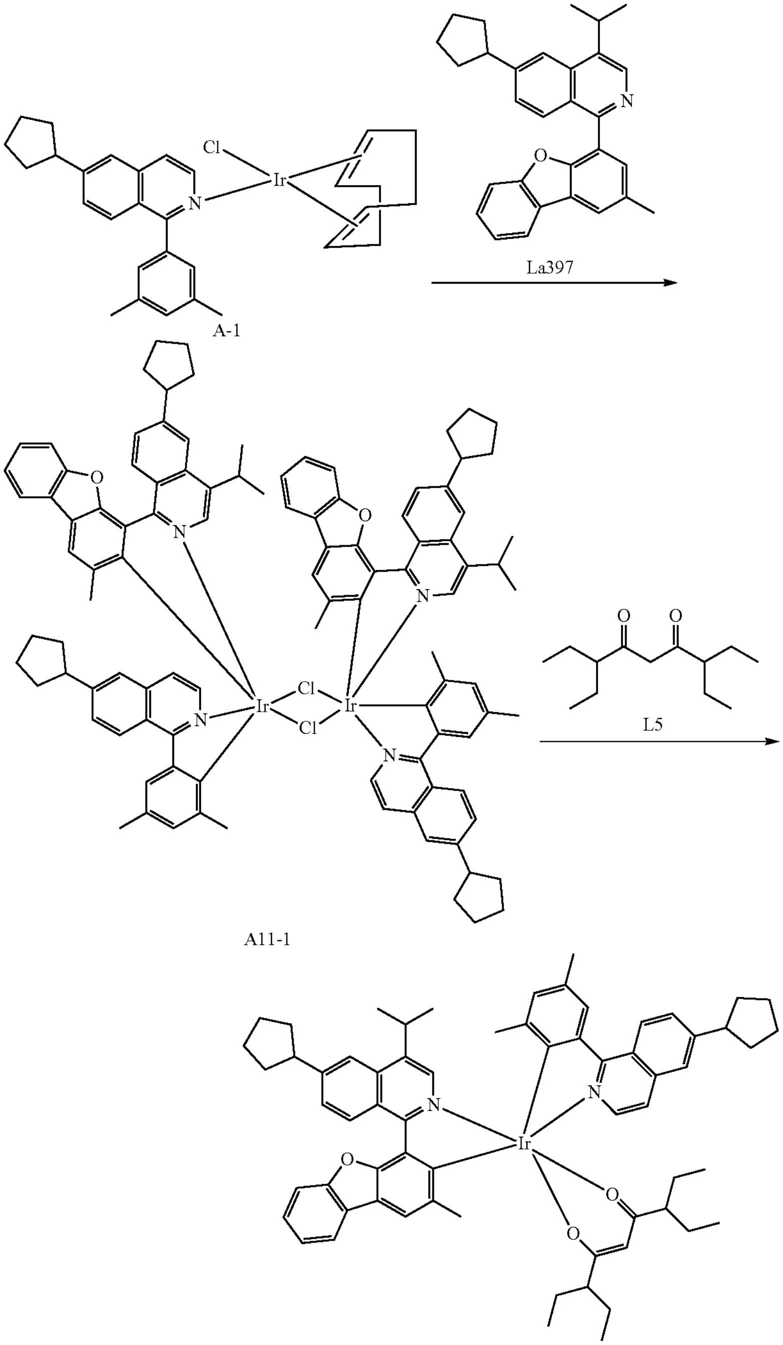

A-1

A11-1

A11

Synthesis of a Compound A11-1

With reference to the synthesis process and post-treatment and purification methods of the compound A1-2, only the corresponding raw materials were required to be changed. The obtained compound was directly used in the next step without purification.

Synthesis of a Compound A11

With reference to the synthesis process and post-treatment and purification methods of the compound A1, only the corresponding raw materials were required to be changed, and 2.57 g of a target compound A11 with a yield of 40.6% was obtained. 2.57 g of the crude product A11 was sublimated and purified to obtain 1.65 g of a sublimated pure product A11 with a yield of 64.2%. Mass spectrometry was as follows: 1123.5 (M+H). $^1$H NMR (400 MHz, $CDCl_3$) δ 8.36 (d, 2H), 8.07 (d, 2H), 7.98 (dd, 2H), 7.77 (m, 2H), 7.50 (m, J=35.0 Hz, 2H), 7.35 (m, J=40.0 Hz, 4H), 6.92 (d, 2H), 2.87 (m, 1H), 2.32 (d, J=15.0 Hz, 9H), 1.88 (m, 4H), 1.82-1.55 (m, 12H), 1.27 (m, J=35.0 Hz, 7H), 1.17 (m, 6H), 1.08-1.02 (m, 2H), 1.01-0.89 (m, 16H).

Example 12 Synthesis of a Compound A12
Synthesis of a Ligand L144
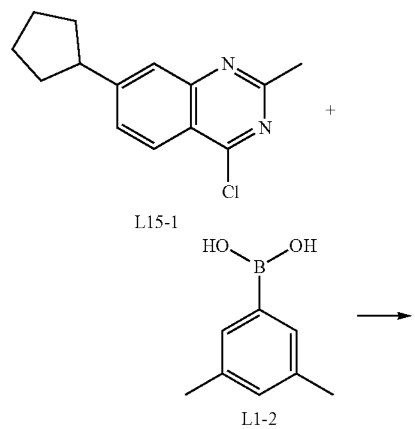
L15-1
L1-2
-continued
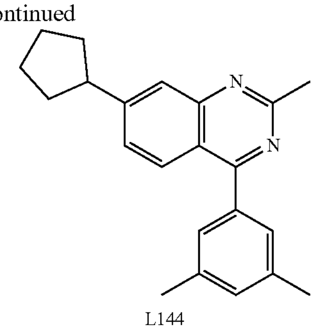
L144
With reference to the synthesis process and post-treatment and purification methods of the compound L50, only the corresponding raw materials were required to be changed. Mass spectrometry was as follows: 317.4 (M+H).
Synthesis of a Compound A12
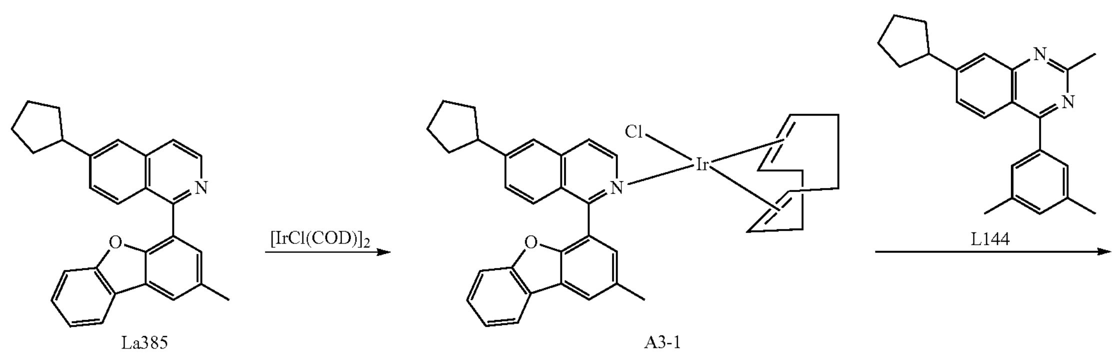
La385
A3-1
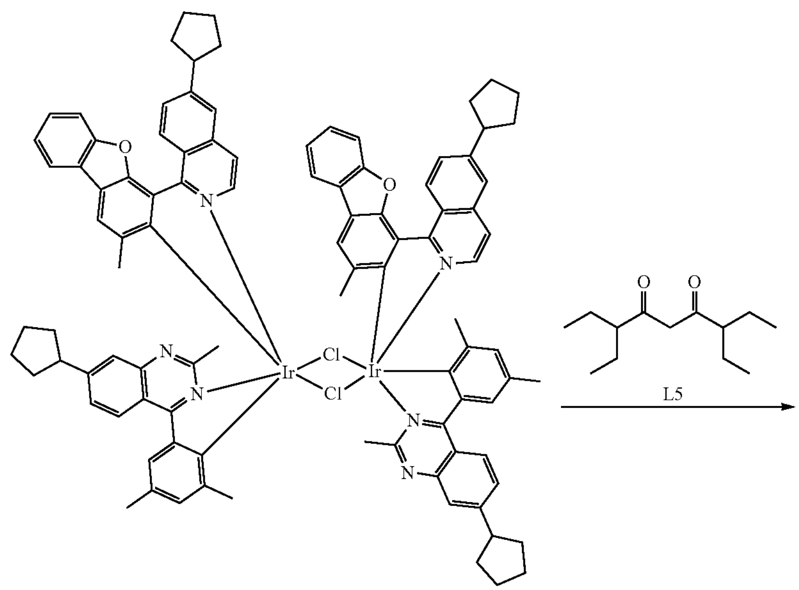
A12-1

-continued

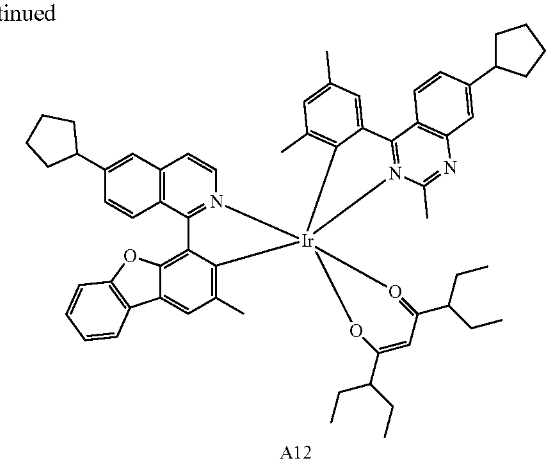

A12

Synthesis of a Compound A3-1

With reference to the synthesis process and post-treatment and purification methods of the compound A1-1, only the corresponding raw materials were required to be changed. Mass spectrometry was as follows: 714.2 (M+H).

Synthesis of a Compound A12-1

With reference to the synthesis process and post-treatment and purification methods of the compound A1-2, only the corresponding raw materials were required to be changed. The obtained compound was directly used in the next step without purification.

Synthesis of a Compound A12

With reference to the synthesis process and post-treatment and purification methods of the compound A1, only the corresponding raw materials were required to be changed, and 2.93 g of a target compound A12 with a yield of 51.3% was obtained. 2.93 g of the crude product A12 was sublimated and purified to obtain 1.86 g of a sublimated pure product A12 with a yield of 63.4%. Mass spectrometry was as follows: 1196.4 (M+H). $^{1}$H NMR (400 MHz, $CDCl_3$) δ 8.36 (d, 2H), 7.98 (d, 2H), 7.77 (d, 2H), 7.65 (m, J=25.0 Hz, 3H), 7.50 (m, J=35.0 Hz, 3H), 7.35 (m, J=40.0 Hz, 1H), 6.92 (s, 2H), 2.44 (s, 9H), 2.32 (d, J=15.0 Hz, 9H), 1.88 (m, 4H), 1.69 (t, J=26.1 Hz, 12H), 1.27 (m, J=35.0 Hz, 8H), 1.10-0.86 (m, 17H).

Example 13 Synthesis of a Compound A13

Synthesis of a Ligand L222

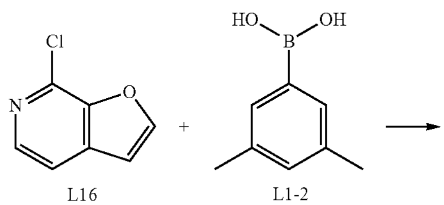

L16 L1-2

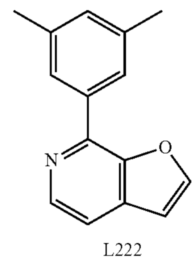

L222

With reference to the synthesis process and post-treatment and purification methods of the compound L50, only the corresponding raw materials were required to be changed. Mass spectrometry was as follows: 224.3 (M+H).

Synthesis of a compound A13

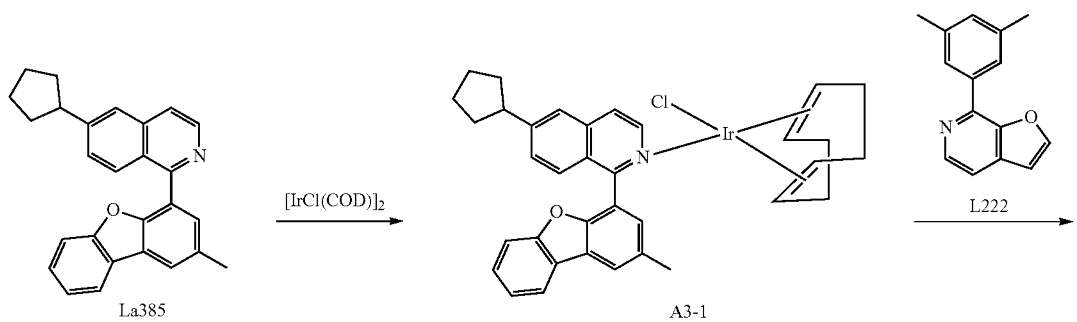

La385 A3-1

-continued

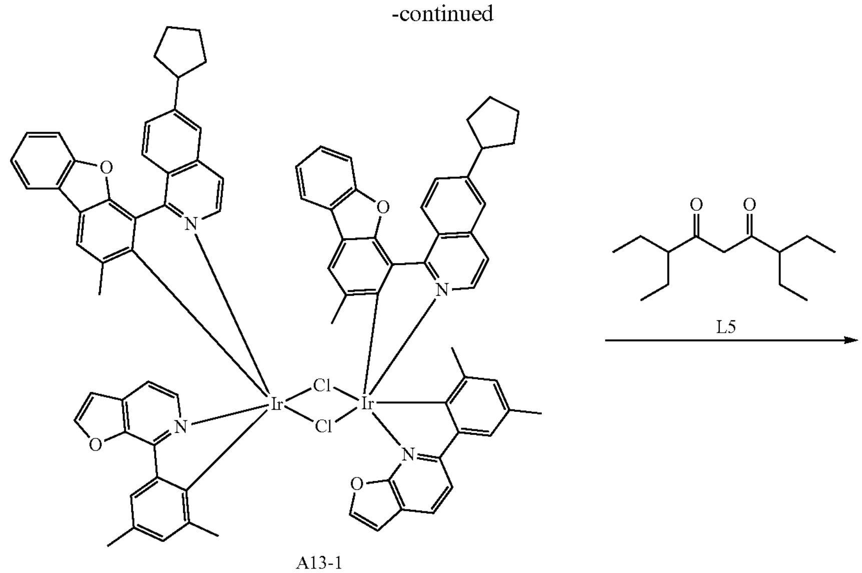

A13-1

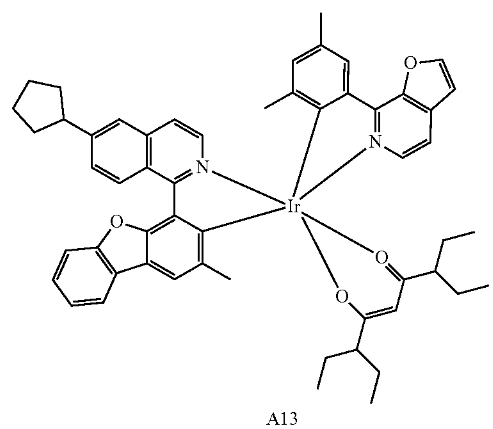

A13

Synthesis of a Compound A13-1

With reference to the synthesis process and post-treatment and purification methods of the compound A1-2, only the corresponding raw materials were required to be changed. The obtained compound was directly used in the next step without purification.

Synthesis of a Compound A13

With reference to the synthesis process and post-treatment and purification methods of the compound A1, only the corresponding raw materials were required to be changed, and 2.76 g of a target compound A13 with a yield of 41.2% was obtained. 2.76 g of the crude product A13 was sublimated and purified to obtain 1.79 g of a sublimated pure product A13 with a yield of 64.8%. Mass spectrometry was as follows: 1003.3 (M+H). $^1$H NMR (400 MHz, $CDCl_3$) δ 8.13 (d, 2H), 8.07 (d, 2H), 7.98 (dd, 1H), 7.77 (d, 1H), 7.66 (m, 1H), 7.50 (m, J=35.0 Hz, 2H), 7.40 (m, J=15.0 Hz, 4H), 7.31 (m, 1H), 6.92 (d, 2H), 2.32 (d, J=15.0 Hz, 9H), 1.88 (m, 2H), 1.76 (m, 2H), 1.66 (m, J=2.2 Hz, 4H), 1.31 (m, 4H), 1.24 (m, 4H), 1.01 (m, J=5.7 Hz, 4H), 0.94 (m, 12H).

Example 14 Synthesis of a Compound A14
Synthesis of a Ligand L174
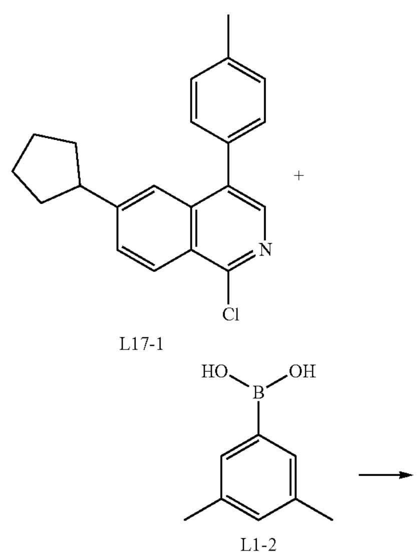
L17-1
L1-2
-continued
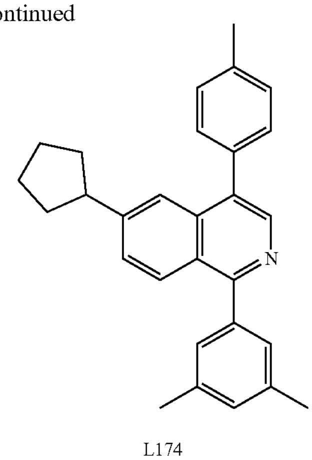
L174
With reference to the synthesis process and post-treatment and purification methods of the compound L50, only the corresponding raw materials were required to be changed. Mass spectrometry was as follows: 392.5 (M+H).
Synthesis of a compound A14
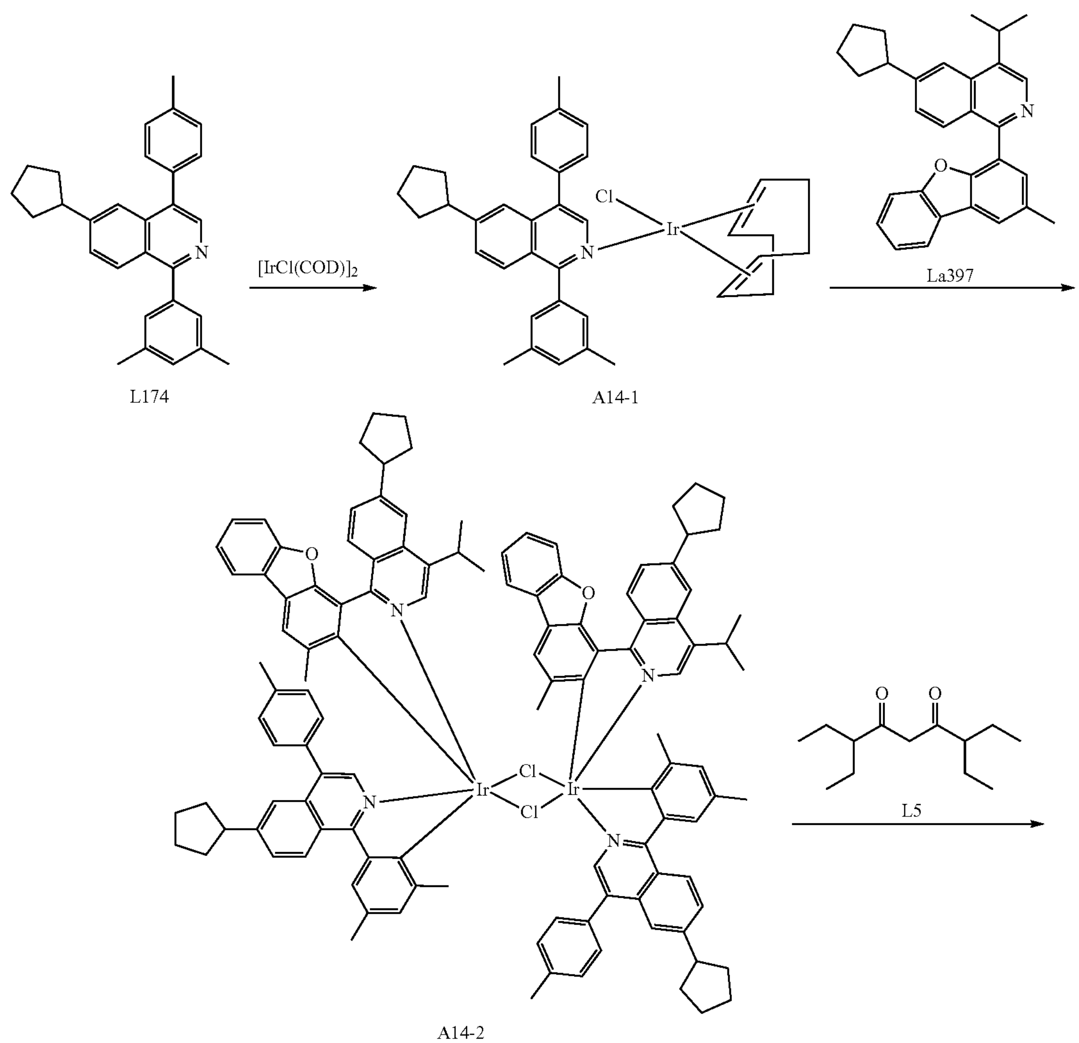
L174
A14-1
A14-2

-continued

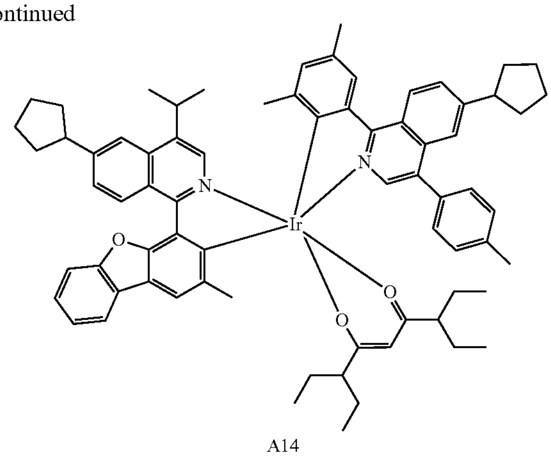

A14

Synthesis of a Compound A14-1

With reference to the synthesis process and post-treatment and purification methods of the compound A1-1, only the corresponding raw materials were required to be changed. Mass spectrometry was as follows: 741.4 (M+H).

Synthesis of a compound A14-2

With reference to the synthesis process and post-treatment and purification methods of the compound A1-2, only the corresponding raw materials were required to be changed. The obtained compound was directly used in the next step without purification.

Synthesis of a compound A14

With reference to the synthesis process and post-treatment and purification methods of the compound A1, only the corresponding raw materials were required to be changed, and 2.67 g of a target compound A14 with a yield of 43.1% was obtained. 2.67 g of the crude product A14 was sublimated and purified to obtain 1.68 g of a sublimated pure product A14 with a yield of 62.9%. Mass spectrometry was as follows: 1213.6 (M+H). $^1$H NMR (400 MHz, $CDCl_3$) δ 8.32 (d, 2H), 8.07 (d, 2H), 7.98 (dd, 2H), 7.80 (dd, J=25.0 Hz, 2H), 7.51 (m, J=25.0 Hz, 4H), 7.35 (m, J=40.0 Hz, 3H), 7.16 (d, 2H), 6.92 (d, 2H), 2.87 (m, 1H), 2.32 (d, J=15.0 Hz, 12H), 1.88 (m, 4H), 1.76 (m, 4H), 1.66 (m, J=2.2 Hz, 8H), 1.27 (m, J=35.0 Hz, 8H), 1.17 (d, 6H), 1.01 (m, J=5.7 Hz, 5H), 0.94 (m, 12H).

Example 15 Synthesis of a Compound A15

Synthesis of a Compound A15

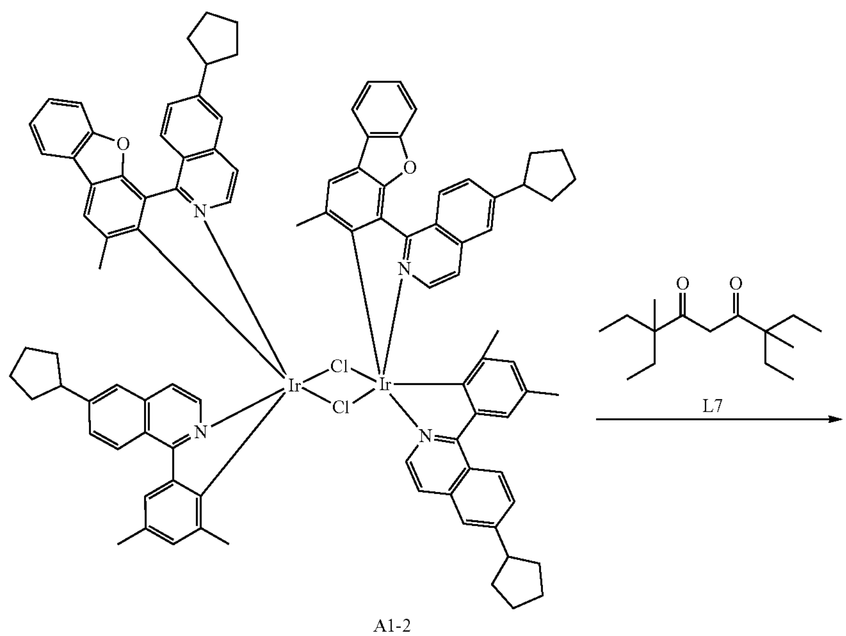

A1-2

-continued

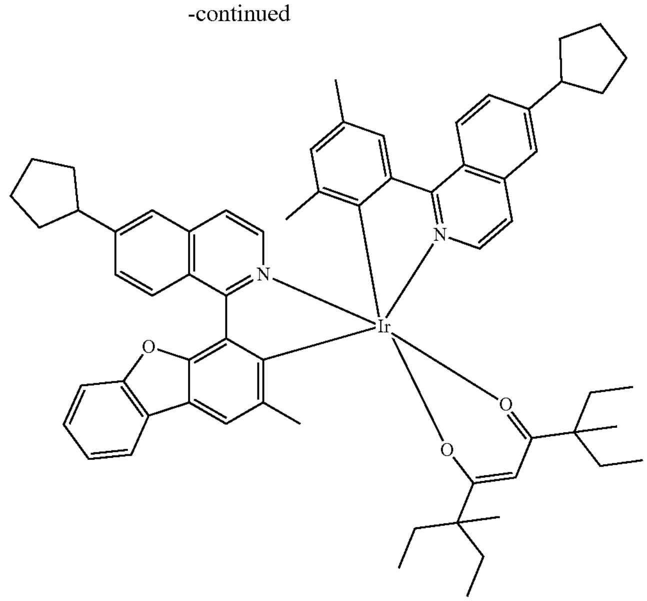

A15

Synthesis of a Compound A15

With reference to the synthesis process and post-treatment and purification methods of the compound A1, only the corresponding raw materials were required to be changed, and 2.71 g of a target compound A15 with a yield of 44.2% was obtained. 2.71 g of the crude product A15 was sublimated and purified to obtain 1.62 g of a sublimated pure product A15 with a yield of 59.7%. Mass spectrometry was as follows: 1109.5 (M+H). $^{1}H$ NMR (400 MHz, $CDCl_3$) δ 8.36 (d, J=15.0 Hz, 2H), 8.07 (d, J=2.9 Hz, 2H), 7.98 (dd, J=14.6, 3.4 Hz, 1H), 7.77 (d, J=15.0 Hz, 2H), 7.54 (dd, J=14.7, 3.4 Hz, 1H), 7.47 (dd, J=14.9, 3.0 Hz, 2H), 7.38 (tt, J=9.2, 4.5 Hz, 3H), 7.31 (td, J=14.8, 3.4 Hz, 2H), 6.92 (d, J=3.1 Hz, 2H), 2.32 (d, J=15.0 Hz, 9H), 1.88 (m, 4H), 1.81-1.59 (m, 12H), 1.00 (m, J=5.0 Hz, 18H), 0.89 (m, 9H), 0.86 (t, J=3.5 Hz, 2H).

Example 16 Synthesis of a Compound A16

Synthesis of a Compound A16

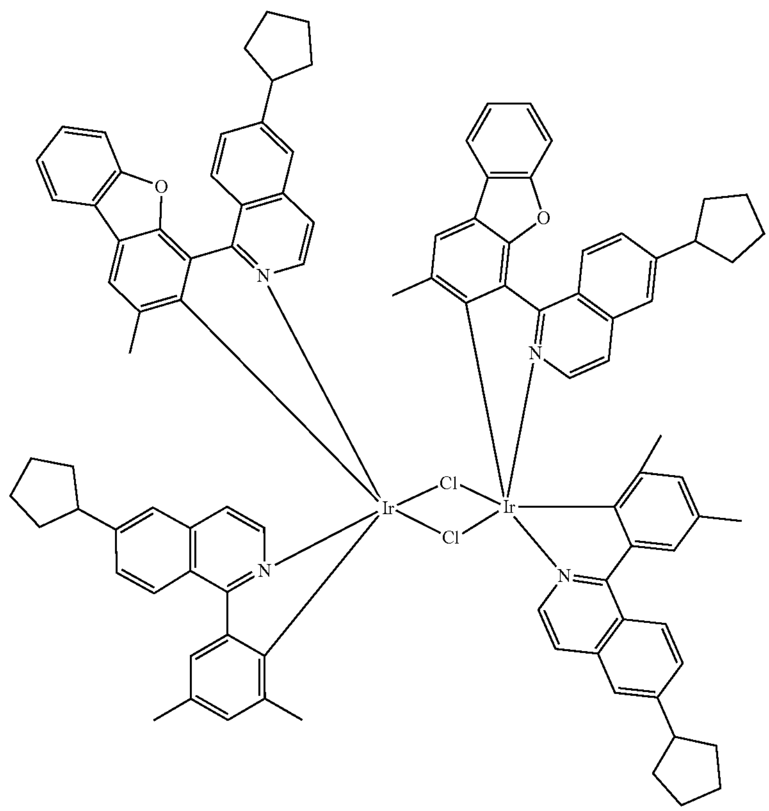

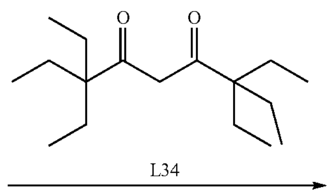

A1-2

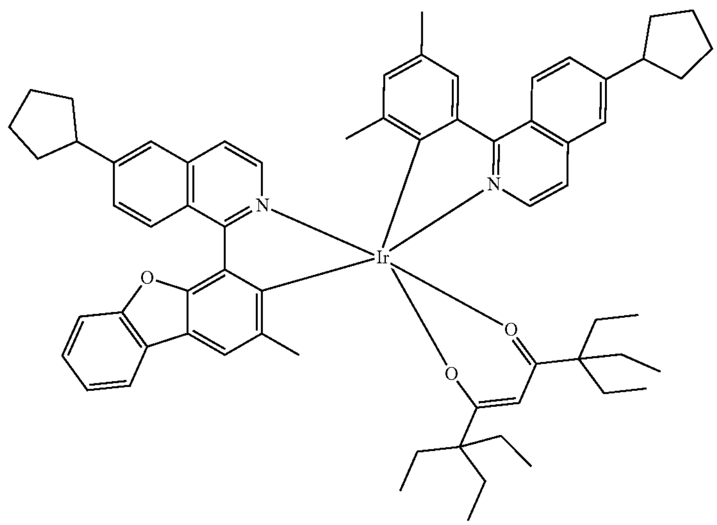

A16

Synthesis of a Compound A16

With reference to the synthesis process and post-treatment and purification methods of the compound A1, only the corresponding raw materials were required to be changed, and 2.83 g of a target compound A16 with a yield of 43.9% was obtained. 2.83 g of the crude product A16 was sublimated and purified to obtain 1.82 g of a sublimated pure product A16 with a yield of 64.3%. Mass spectrometry was as follows: 1137.5 (M+H). $^1$H NMR (400 MHz, $CDCl_3$) δ 8.36 (d, J=15.0 Hz, 2H), 8.07 (d, J=2.9 Hz, 2H), 7.98 (dd, J=14.6, 3.4 Hz, 1H), 7.77 (d, J=15.0 Hz, 2H), 7.54 (dd, J=14.7, 3.4 Hz, 1H), 7.47 (dd, J=14.9, 3.0 Hz, 2H), 7.38 (tt, J=9.2, 4.5 Hz, 3H), 7.31 (td, J=14.8, 3.4 Hz, 2H), 6.92 (d, J=3.1 Hz, 2H), 2.32 (d, J=15.0 Hz, 9H), 1.88 (m, 4H), 1.76 (m, 4H), 1.66 (m, J=2.2 Hz, 8H), 1.00 (m, 15H), 0.89 (m, 18H).

Example 17 Synthesis of a Compound A17
Synthesis of a Ligand L65
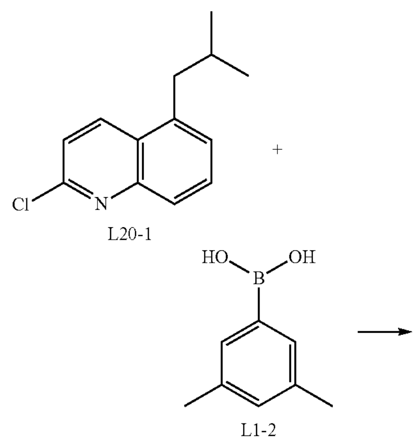
-continued
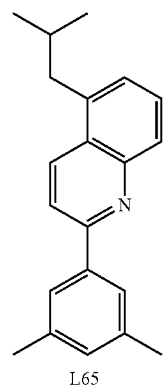
With reference to the synthesis process and post-treatment and purification methods of the compound L50, only the corresponding raw materials were required to be changed. Mass spectrometry was as follows: 290.4 (M+H).
Synthesis of a compound A17
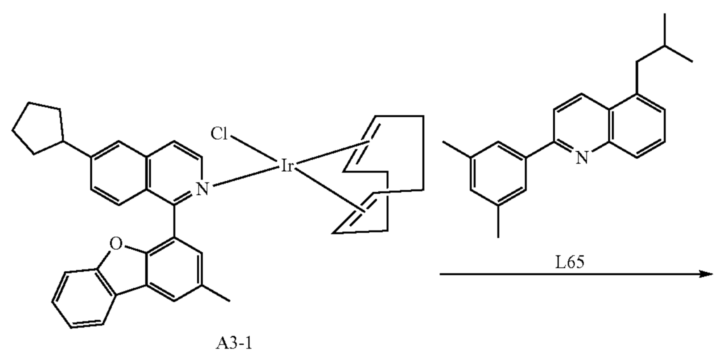
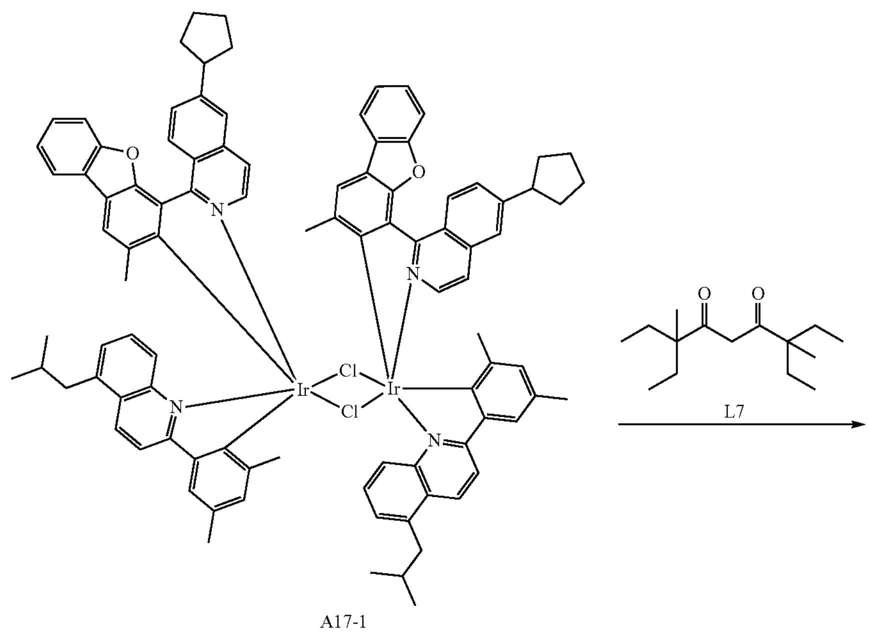

-continued

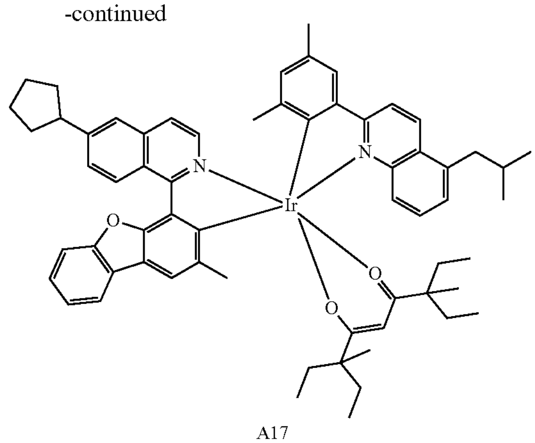

A17

Synthesis of a Compound A17-1

With reference to the synthesis process and post-treatment and purification methods of the compound A1-2, only the corresponding raw materials were required to be changed. The obtained compound was directly used in the next step without purification.

Synthesis of a compound A17

With reference to the synthesis process and post-treatment and purification methods of the compound A1, only the corresponding raw materials were required to be changed, and 3.16 g of a target compound A17 with a yield of 46.1% was obtained. 3.16 g of the crude product A17 was sublimated and purified to obtain 2.23 g of a sublimated pure product A17 with a yield of 70.5%. Mass spectrometry was as follows: 1097.5 (M+H). $^1$H NMR (400 MHz, $CDCl_3$) δ 8.60 (d, 1H), 8.36 (d, 1H), 8.07 (d, 1H), 7.96 (m, J=15.0 Hz, 2H), 7.77 (dd, 2H), 7.66 (m, 2H), 7.50 (dd, J=35.0 Hz, 2H), 7.44-7.26 (m, 3H), 7.19 (dd, 2H), 6.92 (s, 1H), 2.47 (d, 2H), 2.32 (d, J=15.0 Hz, 9H), 1.88 (m, 2H), 1.78 (m, J=20.0 Hz, 3H), 1.66 (m, J=2.2 Hz, 4H), 1.00 (m, J=5.0 Hz, 16H), 0.88 (m, J=15.0 Hz, 18H).

Example 18 Synthesis of a Compound A18

Synthesis of a Ligand La493

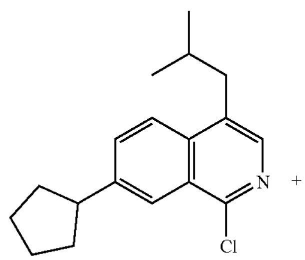

L21-1

-continued

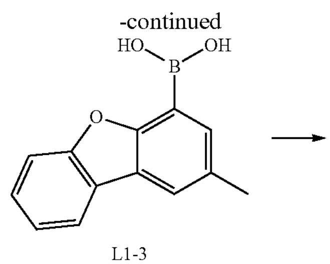

L1-3

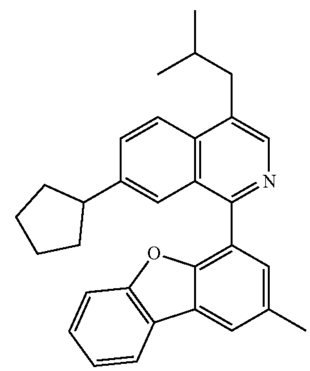

La493

With reference to the synthesis process and post-treatment and purification methods of the compound La385, only the corresponding raw materials were required to be changed. Mass spectrometry was as follows: 434.6 (M+H).

Synthesis of a compound A18
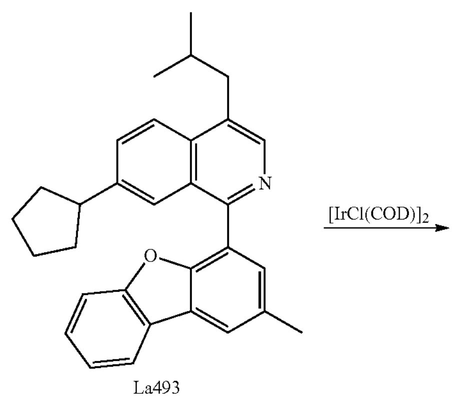
La493
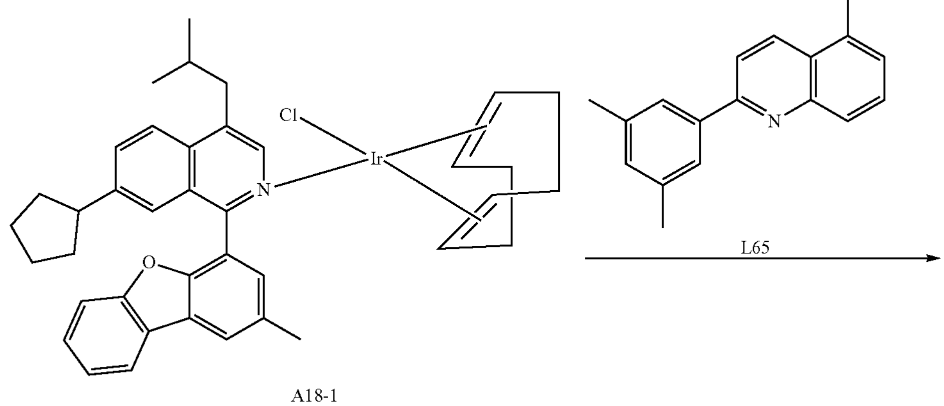
A18-1
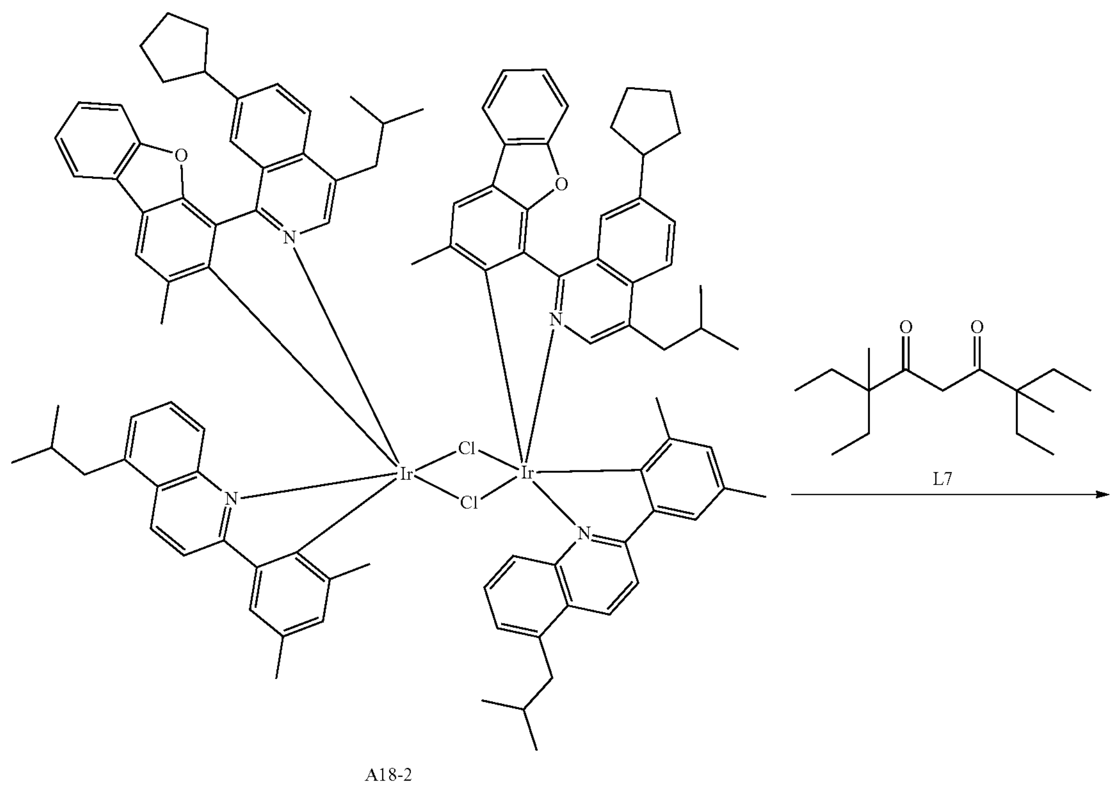
A18-2

-continued

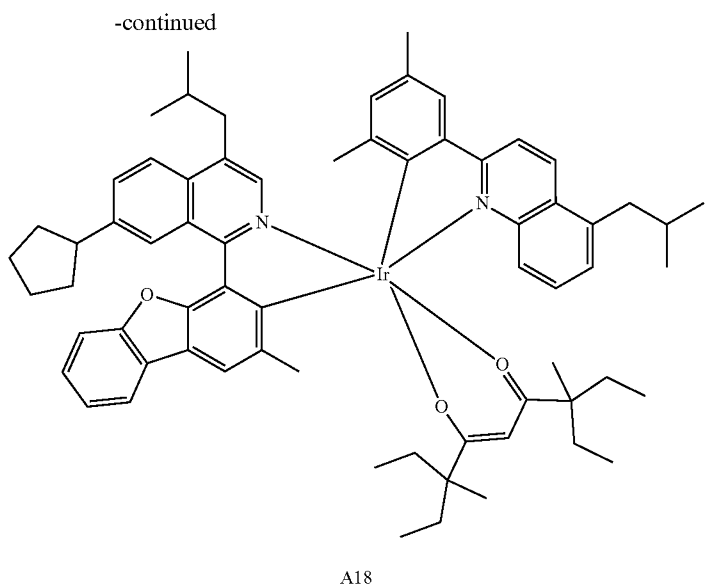

A18

Synthesis of a compound A18-1

With reference to the synthesis process and post-treatment and purification methods of the compound A1-1, only the corresponding raw materials were required to be changed. Mass spectrometry was as follows: 768.4 (M+H).

Synthesis of a compound A18-2

With reference to the synthesis process and post-treatment and purification methods of the compound A1-2, only the corresponding raw materials were required to be changed. The obtained compound was directly used in the next step without purification.

Synthesis of a compound A18

With reference to the synthesis process and post-treatment and purification methods of the compound A1, only the corresponding raw materials were required to be changed, and 3.41 g of a target compound A18 with a yield of 43.8% was obtained. 3.41 g of the crude product A18 was sublimated and purified to obtain 2.33 g of a sublimated pure product A18 with a yield of 68.3%. Mass spectrometry was as follows: 1153.6 (M+H). $^1$H NMR (400 MHz, $CDCl_3$) δ 8.60 (d, 1H), 8.07 (d, 1H), 7.96 (m, J=15.0 Hz, 2H), 7.89 (dd, 2H), 7.66 (t, 1H), 7.54 (dd, 2H), 7.42-7.27 (m, 4H), 7.19 (dd, 2H), 6.92 (d, 1H), 2.47 (d, 4H), 2.32 (d, J=15.0 Hz, 9H), 1.88 (m, 2H), 1.78 (m, J=20.0 Hz, 4H), 1.66 (m, J=2.2 Hz, 4H), 1.00 (m, J=5.0 Hz, 16H), 0.88 (m, J=15.0 Hz, 24H).

Example 19 Synthesis of a Compound A19

Synthesis of a Ligand La529

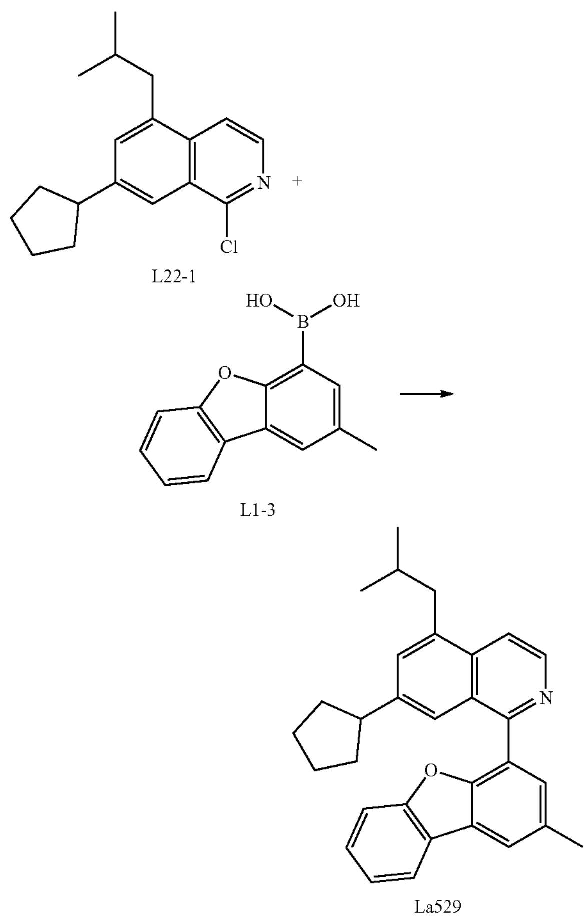

L22-1 + L1-3 → La529

With reference to the synthesis process and post-treatment and purification methods of the compound La385, only the corresponding raw materials were required to be changed. Mass spectrometry was as follows: 434.6 (M+H).
Synthesis of a compound A19
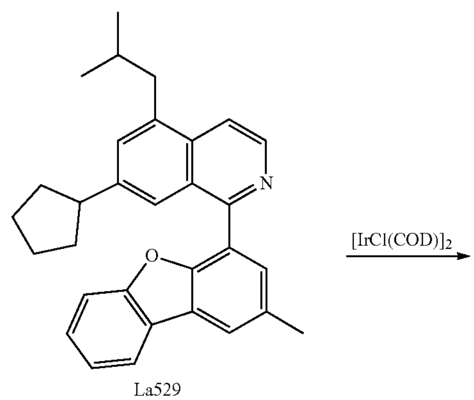
La529
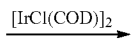
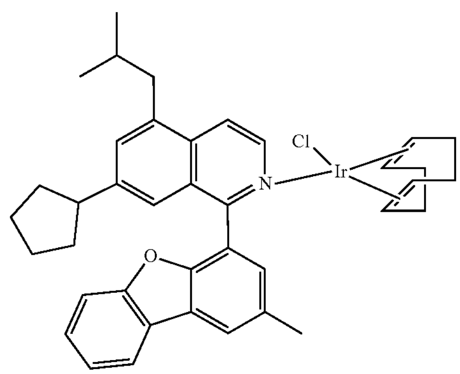
A19-1
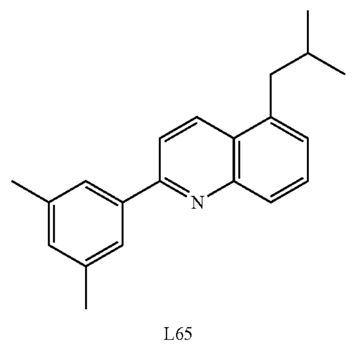
L65
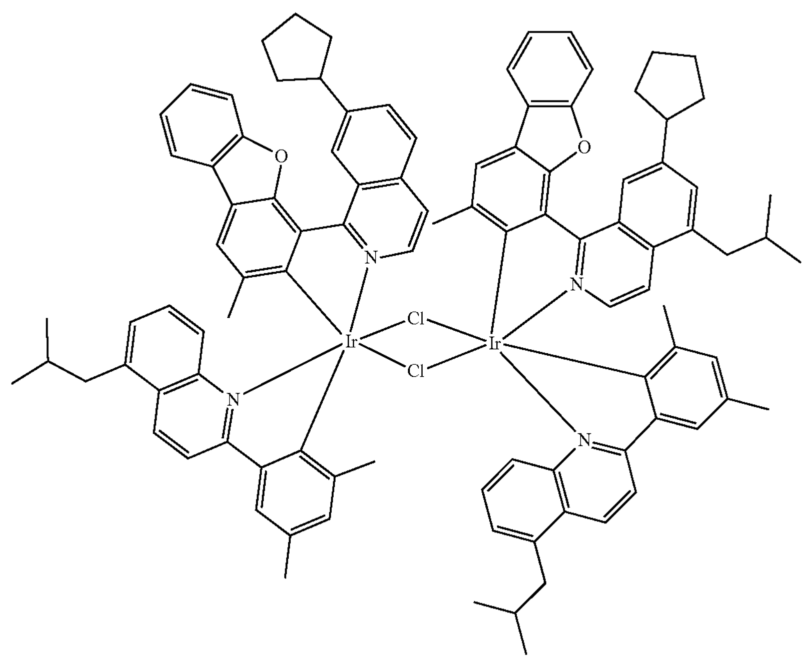
A19-2
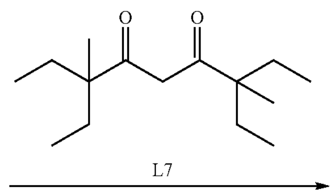
L7

-continued

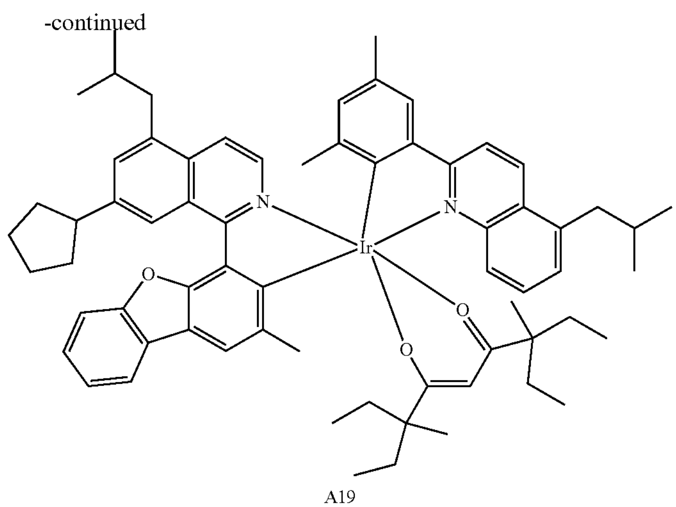

A19

Synthesis of a compound A19

With reference to the synthesis process and post-treatment and purification methods of the compound A1, only the corresponding raw materials were required to be changed, and 3.03 g of a target compound A19 with a yield of 41.4% was obtained. 3.03 g of the crude product A19 was sublimated and purified to obtain 1.83 g of a sublimated pure product A19 with a yield of 60.3%. Mass spectrometry was as follows: 1153.6 (M+H). $^1$H NMR (400 MHz, $CDCl_3$) δ 8.60 (d, 1H), 8.39 (d, 1H), 8.07 (d, 1H), 7.96 (m, J=15.0 Hz, 2H), 7.66 (m, 4H), 7.54 (dd, 2H), 7.44-7.24 (m, 3H), 7.21 (dd, 1H), 6.91 (d, 1H), 2.43 (d, 4H), 2.35 (d, J=15.0 Hz, 9H), 2.06-1.55 (m, 10H), 1.03 (m, J=5.0 Hz, 16H), 0.86 (m, J=15.0 Hz, 24H).

Example 20 Synthesis of a Compound A20

Synthesis of a Ligand La1267

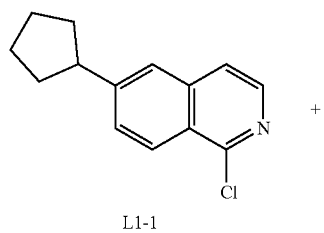

L1-1

-continued

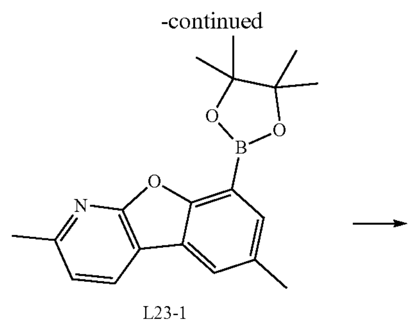

L23-1

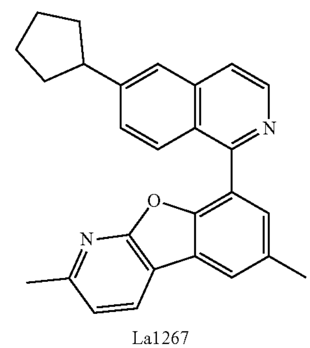

La1267

With reference to the synthesis process and post-treatment and purification methods of the compound L112, only the corresponding raw materials were required to be changed. Mass spectrometry was as follows: 393.5 (M+H).

Synthesis of a compound A20
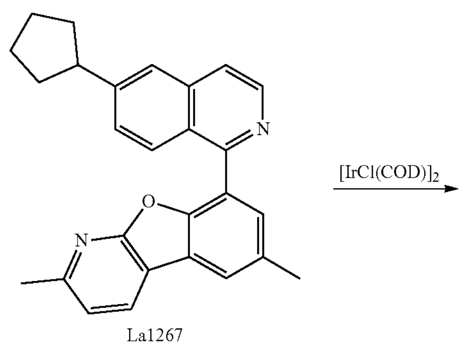
La1267
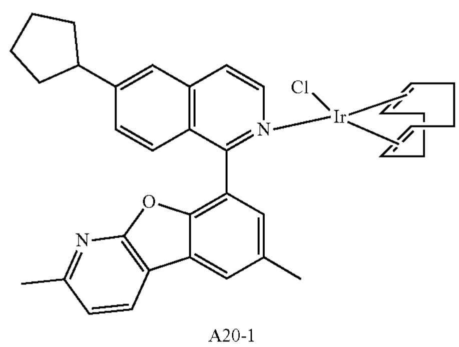
A20-1
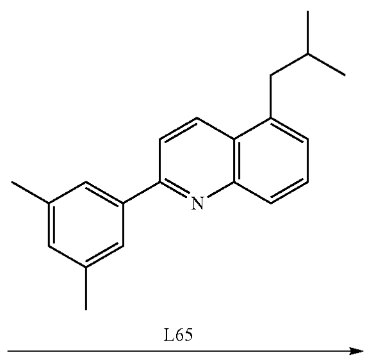
L65
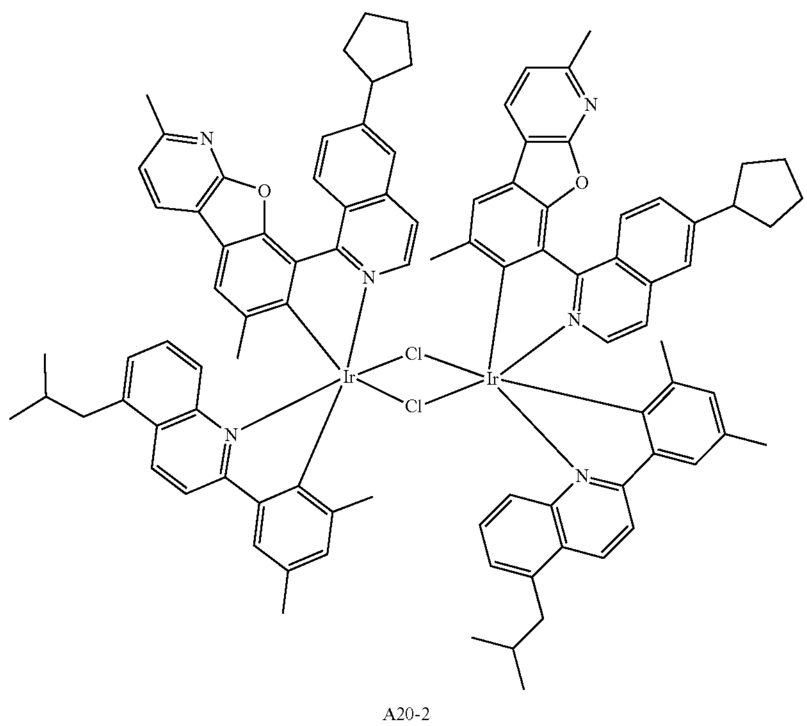
A20-2
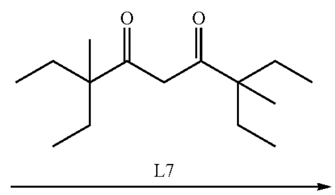
L7

-continued

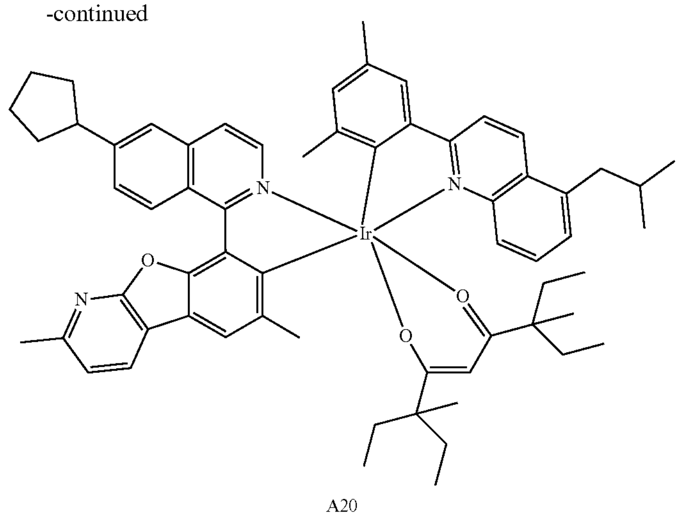

A20

Synthesis of a Compound A20-1

With reference to the synthesis process and post-treatment and purification methods of the compound A1-1, only the corresponding raw materials were required to be changed. Mass spectrometry was as follows: 727.3 (M+H).

Synthesis of a Compound A20-2

With reference to the synthesis process and post-treatment and purification methods of the compound A1-2, only the corresponding raw materials were required to be changed. The obtained compound was directly used in the next step without purification.

Synthesis of a compound A20

With reference to the synthesis process and post-treatment and purification methods of the compound A1, only the corresponding raw materials were required to be changed, and 2.96 g of a target compound A20 with a yield of 39.8% was obtained. 2.96 g of the crude product A20 was sublimated and purified to obtain 1.84 g of a sublimated pure product A20 with a yield of 62.1%. Mass spectrometry was as follows: 1112.5 (M+H). $^1$H NMR (400 MHz, $CDCl_3$) δ 8.60 (d, 2H), 8.36 (d, 2H), 8.07 (d, 2H), 7.95 (dd, 1H), 7.71 (m, J=55.0 Hz, 2H), 7.41 (m, J=60.0 Hz, 2H), 7.19 (dd, 2H), 7.01 (d, 1H), 6.92 (d, 1H), 2.68 (s, 3H), 2.47 (d, 2H), 2.32 (d, J=15.0 Hz, 9H), 1.99-1.56 (m, 9H), 1.00 (m, J=5.0 Hz, 16H), 0.94-0.80 (m, 18H).

Example 21 Synthesis of a Compound A21

Synthesis of a Ligand La1307

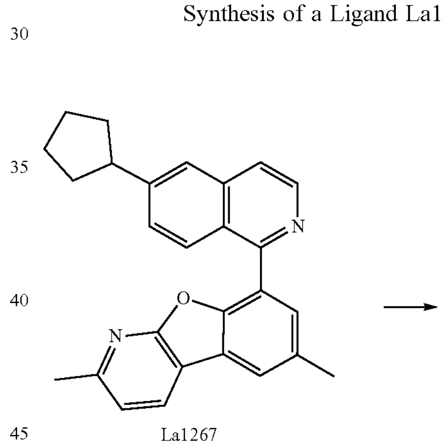

La1267

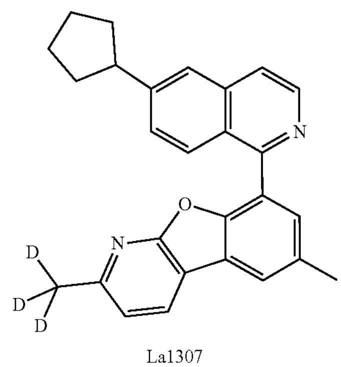

La1307

With reference to the synthesis process and post-treatment and purification methods of the compound L221, only the corresponding raw materials were required to be changed. Mass spectrometry was as follows: 396.5 (M+H).

Synthesis of a compound A21
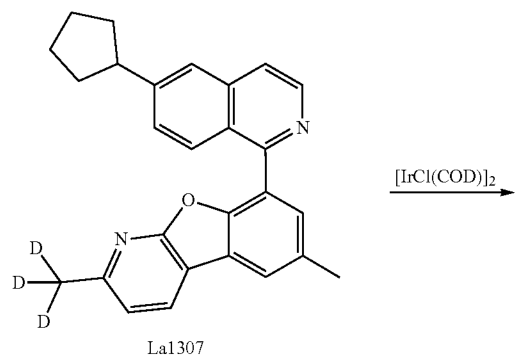
La1307
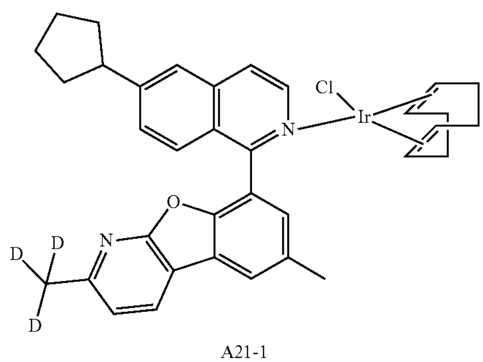
A21-1
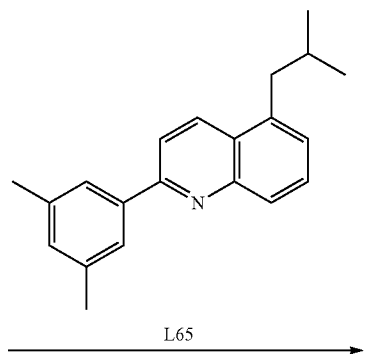
L65
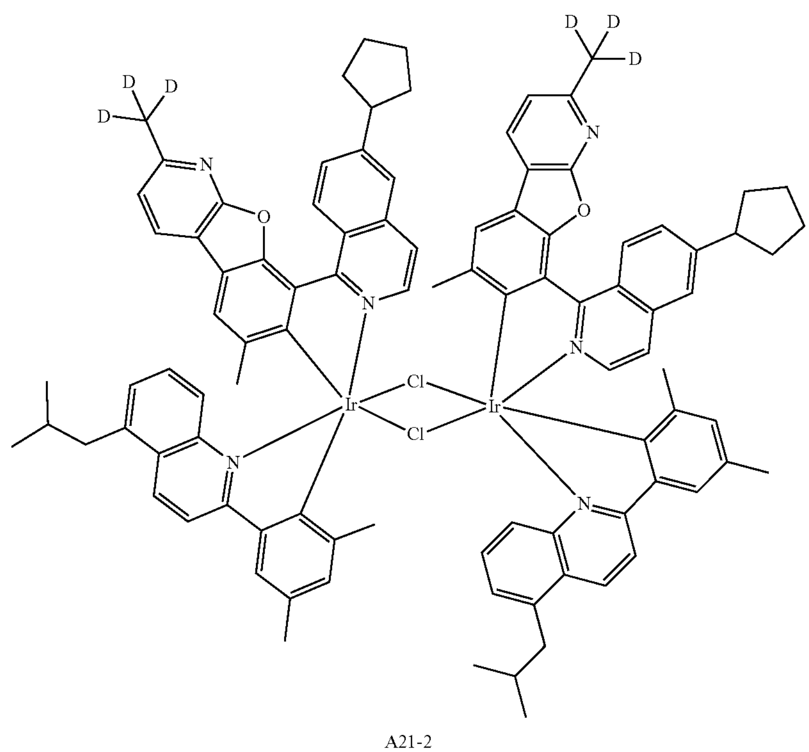
A21-2
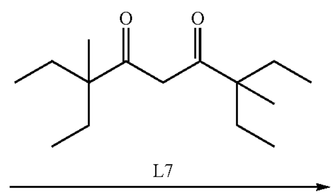
L7

-continued

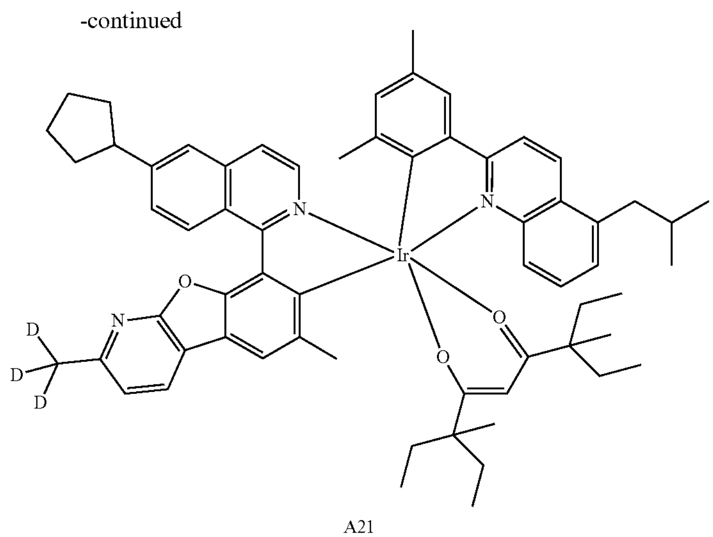

A21

Synthesis of a Compound A21-1

With reference to the synthesis process and post-treatment and purification methods of the compound A1-1, only the corresponding raw materials were required to be changed. Mass spectrometry was as follows: 730.3 (M+H).

Synthesis of a compound A21-2

With reference to the synthesis process and post-treatment and purification methods of the compound A1-2, only the corresponding raw materials were required to be changed. The obtained compound was directly used in the next step without purification.

Synthesis of a compound A21

With reference to the synthesis process and post-treatment and purification methods of the compound A1, only the corresponding raw materials were required to be changed, and 2.53 g of a target compound A21 with a yield of 38.1% was obtained. 2.53 g of the crude product A21 was sublimated and purified to obtain 1.62 g of a sublimated pure product A21 with a yield of 64.0%. Mass spectrometry was as follows: 1115.5 (M+H). $^1$H NMR (400 MHz, $CDCl_3$) δ 8.62 (d, 2H), 8.35 (d, 2H), 8.10 (d, 2H), 7.94 (dd, 1H), 7.72 (m, J=55.0 Hz, 2H), 7.41 (m, J=60.0 Hz, 2H), 7.19 (dd, 2H), 7.01 (d, 1H), 6.92 (d, 1H), 2.47 (d, 2H), 2.32 (d, J=15.0 Hz, 9H), 1.99-1.56 (m, 9H), 1.00 (m, J=5.0 Hz, 16H), 0.94-0.80 (m, 18H).

Example 22 Synthesis of a Compound A22

Synthesis of a Ligand La386

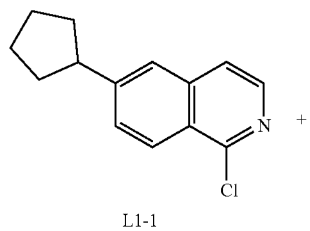

L1-1

-continued

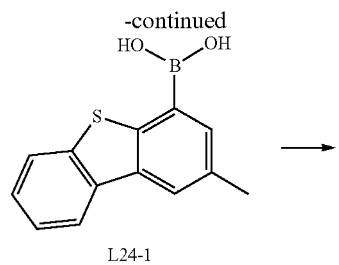

L24-1

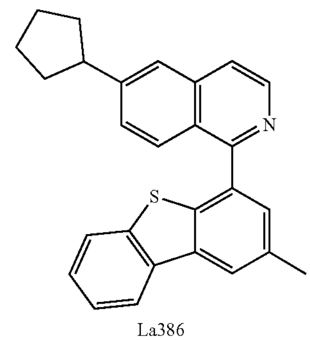

La386

With reference to the synthesis process and post-treatment and purification methods of the compound La385, only the corresponding raw materials were required to be changed. Mass spectrometry was as follows: 394.5 (M+H).

Synthesis of a compound A22
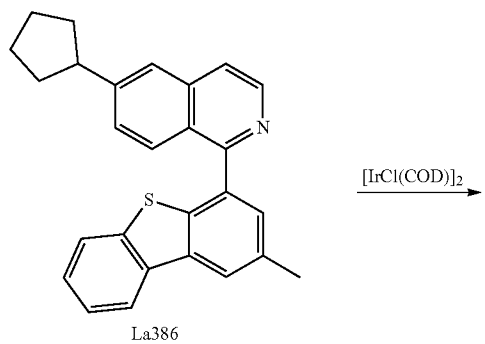
La386
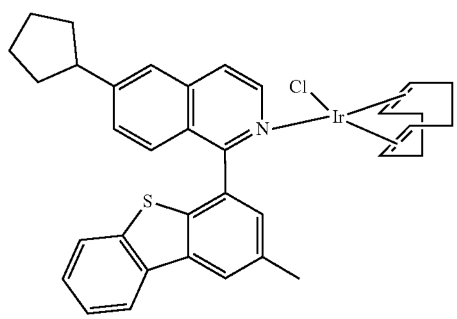
A22-1
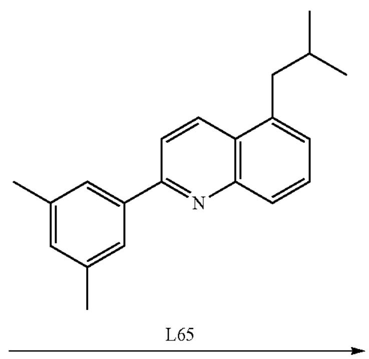
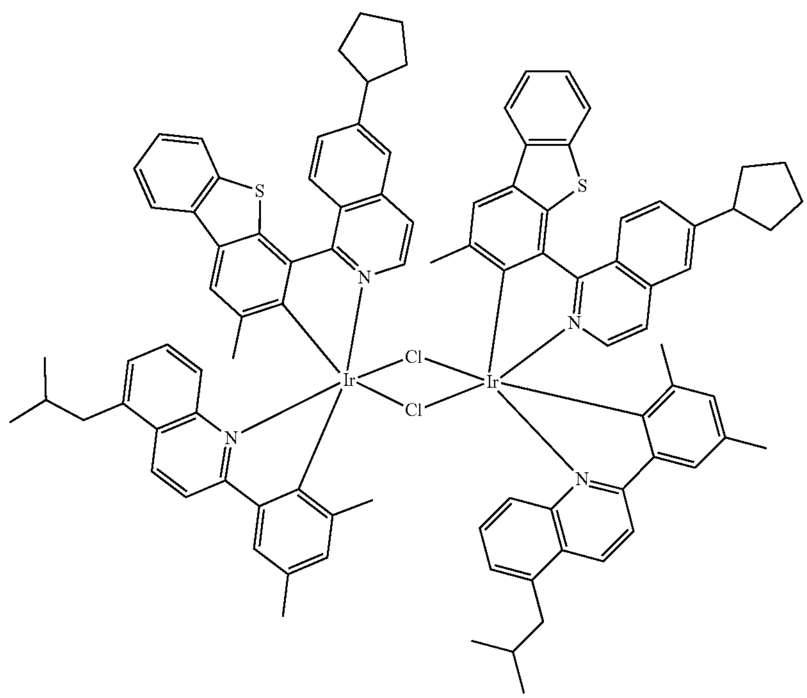
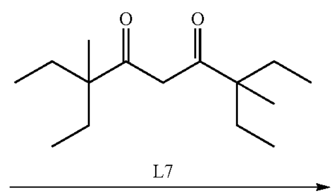
A22-2

-continued

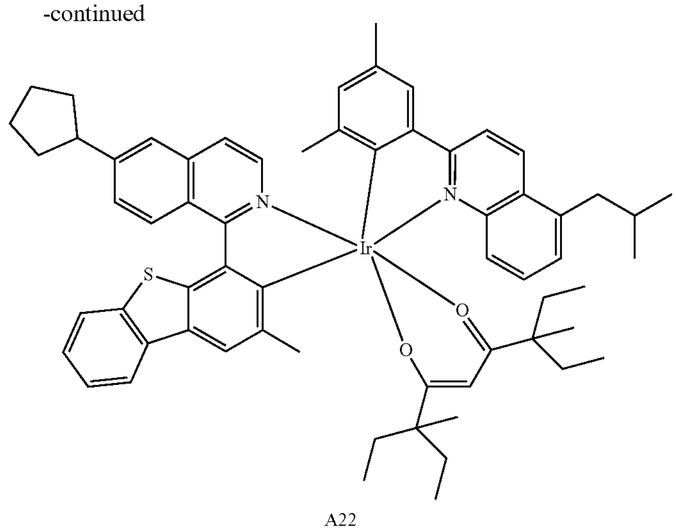

A22

Synthesis of a Compound A22-1

With reference to the synthesis process and post-treatment and purification methods of the compound A1-1, only the corresponding raw materials were required to be changed. Mass spectrometry was as follows: 728.4 (M+H).

Synthesis of a compound A22-2

With reference to the synthesis process and post-treatment and purification methods of the compound A1-2, only the corresponding raw materials were required to be changed. The obtained compound was directly used in the next step without purification.

Synthesis of a Compound A22

With reference to the synthesis process and post-treatment and purification methods of the compound A1, only the corresponding raw materials were required to be changed, and 2.66 g of a target compound A22 with a yield of 40.1% was obtained. 2.66 g of the crude product A22 was sublimated and purified to obtain 1.84 g of a sublimated pure product A22 with a yield of 69.1%. Mass spectrometry was as follows: 1113.5 (M+H). $^1$H NMR (400 MHz, $CDCl_3$) δ 8.60 (d, 1H), 8.45 (dd, 1H), 8.36 (dd, 1H), 8.07 (d, 1H), 7.95 (dd, 1H), 7.86 (dd, 1H), 7.77 (dd, 1H), 7.66 (m, 2H), 7.56 (m, 2H), 7.47 (m, 2H), 7.33 (m, J=20.0 Hz, 2H), 7.19 (dd, 1H), 6.92 (d, 1H), 2.47 (d, 2H), 2.32 (d, J=15.0 Hz, 9H), 1.88 (m, 2H), 1.78 (m, J=20.0 Hz, 3H), 1.66 (m, J=2.2 Hz, 4H), 1.00 (m, J=5.0 Hz, 16H), 0.88 (m, J=15.0 Hz, 18H).

Example 23 Synthesis of a Compound A23

Synthesis of a Ligand La387

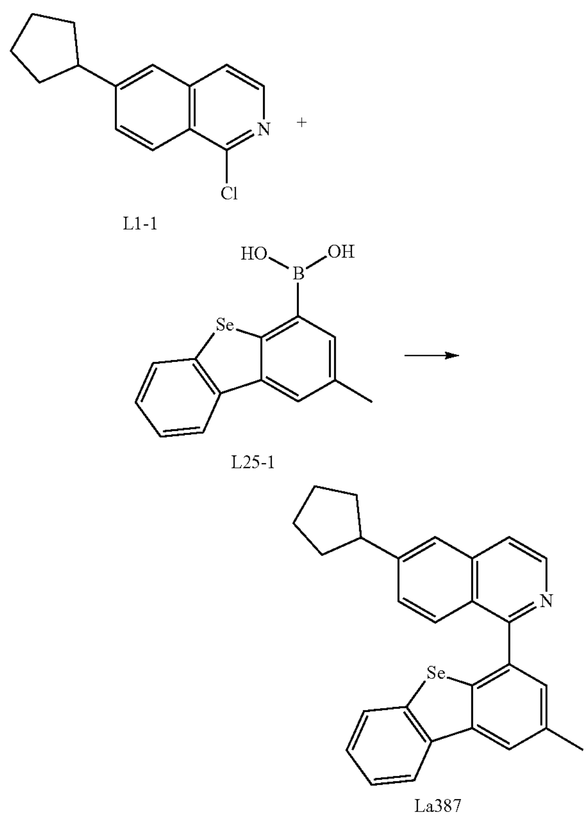

L1-1

L25-1

La387

With reference to the synthesis process and post-treatment and purification methods of the compound La385, only the corresponding raw materials were required to be changed. Mass spectrometry was as follows: 441.4 (M+H).

Synthesis of a compound A23
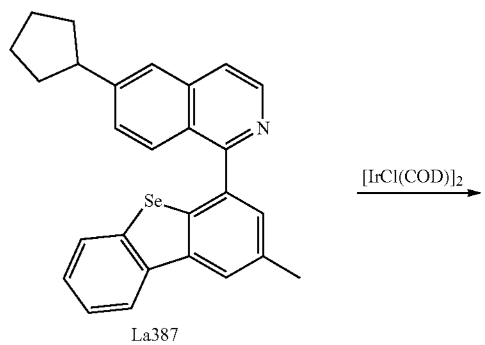
La387
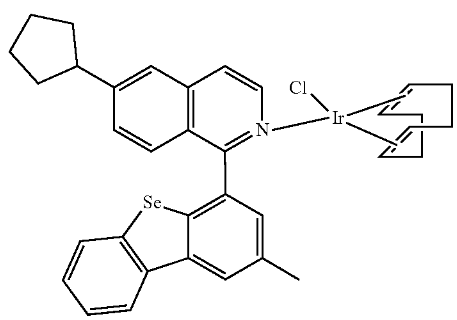
A 23-1
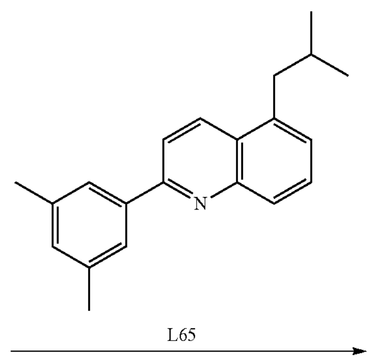
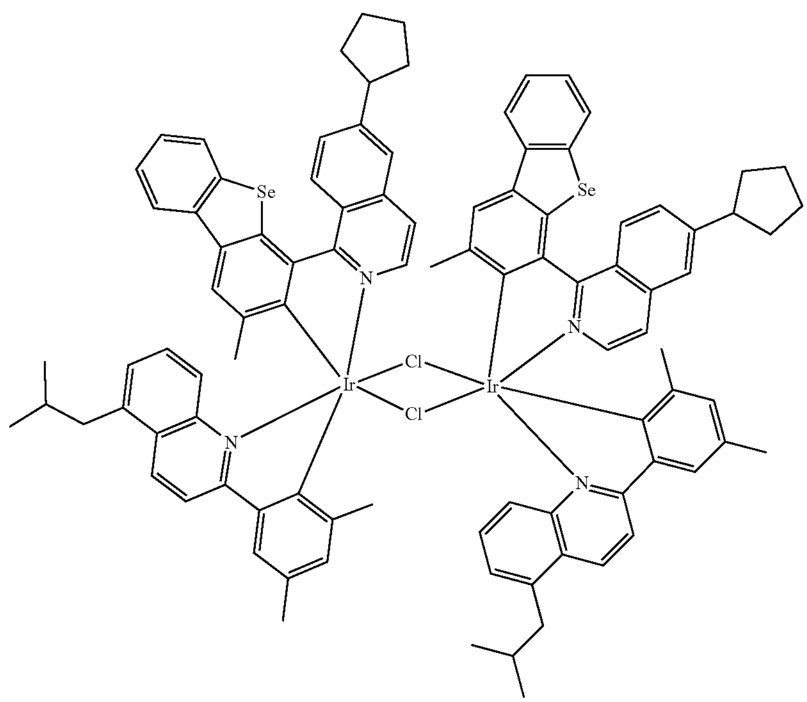
A 23-2
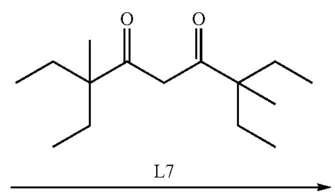

-continued

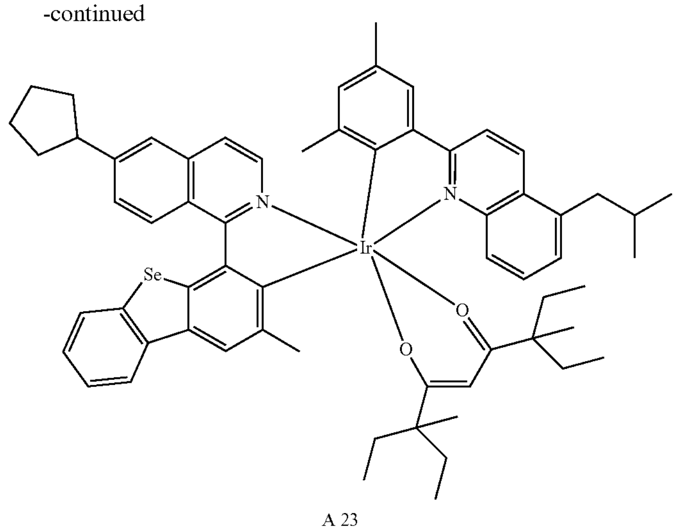

A 23

Synthesis of a Compound A23-1

With reference to the synthesis process and post-treatment and purification methods of the compound A1-1, only the corresponding raw materials were required to be changed. Mass spectrometry was as follows: 775.3 (M+H).

Synthesis of a compound A23-2

With reference to the synthesis process and post-treatment and purification methods of the compound A1-2, only the corresponding raw materials were required to be changed. The obtained compound was directly used in the next step without purification.

Synthesis of a compound A23

With reference to the synthesis process and post-treatment and purification methods of the compound A1, only the corresponding raw materials were required to be changed, and 2.31 g of a target compound A23 with a yield of 36.1% was obtained. 2.31 g of the crude product A23 was sublimated and purified to obtain 1.38 g of a sublimated pure product A23 with a yield of 59.7%. Mass spectrometry was as follows: 1160.4 (M+H). $^1$H NMR (400 MHz, $CDCl_3$) δ 8.60 (d, 1H), 8.45 (dd, 1H), 8.36 (dd, 1H), 8.07 (d, 1H), 7.95 (dd, 1H), 7.86 (dd, 1H), 7.77 (dd, 2H), 7.66 (m, 2H), 7.58-7.38 (m, 3H), 7.35 (d, 2H), 7.19 (d, 1H), 6.92 (d, 1H), 2.47 (d, 2H), 2.32 (d, J=15.0 Hz, 9H), 1.88 (m, 2H), 1.78 (m, J=20.0 Hz, 3H), 1.66 (m, J=2.2 Hz, 4H), 1.00 (m, J=5.0 Hz, 16H), 0.88 (m, J=15.0 Hz, 18H).

Example 24 Synthesis of a Compound A24

Synthesis of a Ligand La388

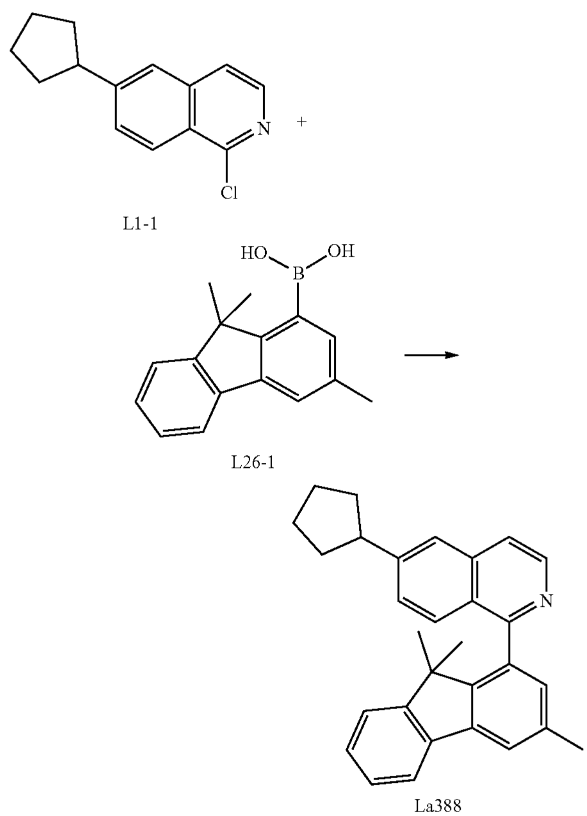

L1-1

L26-1

La388

With reference to the synthesis process and post-treatment and purification methods of the compound La385, only the corresponding raw materials were required to be changed. Mass spectrometry was as follows: 441.4 (M+H).

Synthesis of a compound A24
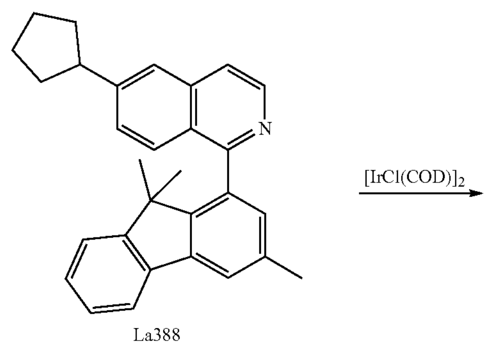
La388
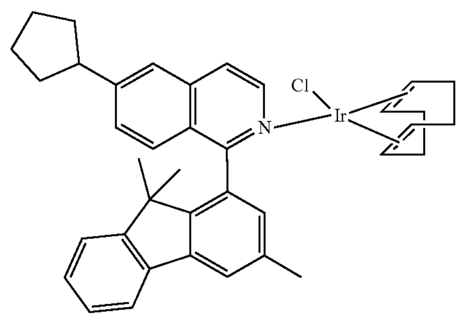
A24-1
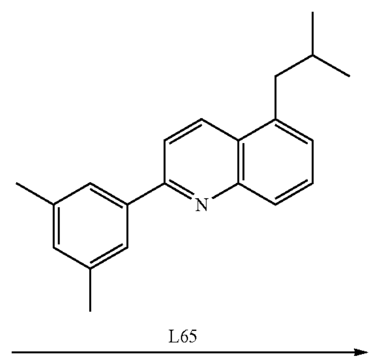
L65
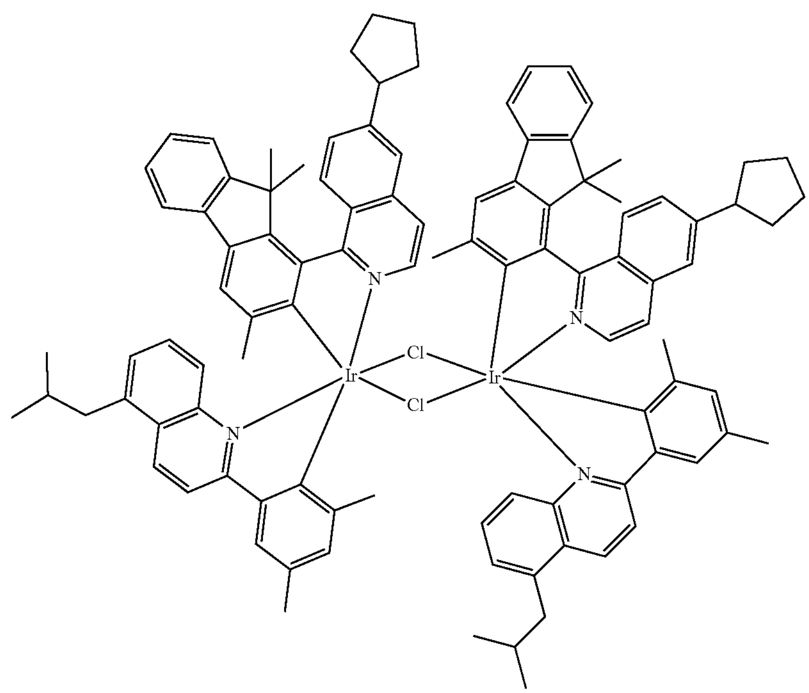
A24-2
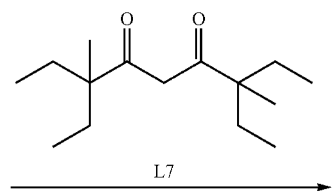
L7

-continued

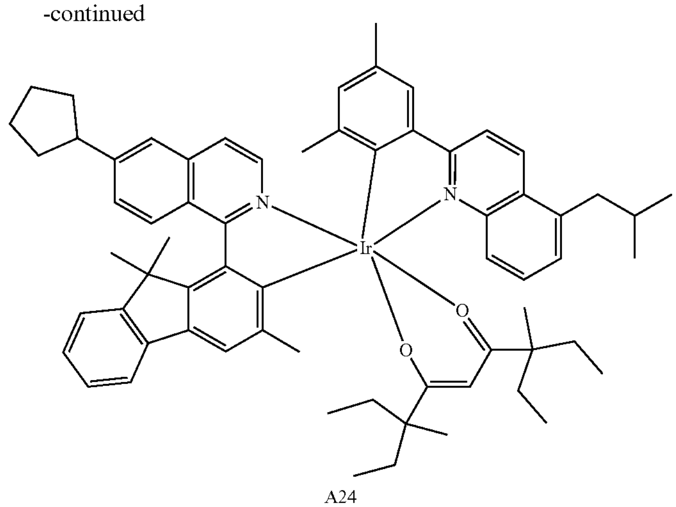

A24

Synthesis of a compound A24-1

With reference to the synthesis process and post-treatment and purification methods of the compound A1-1, only the corresponding raw materials were required to be changed. Mass spectrometry was as follows: 738.4 (M+H).

Synthesis of a compound A24-2

With reference to the synthesis process and post-treatment and purification methods of the compound A1-2, only the corresponding raw materials were required to be changed. The obtained compound was directly used in the next step without purification.

Synthesis of a compound A24

With reference to the synthesis process and post-treatment and purification methods of the compound A1, only the corresponding raw materials were required to be changed, and 2.41 g of a target compound A24 with a yield of 40.3% was obtained. 2.41 g of the crude product A24 was sublimated and purified to obtain 1.55 g of a sublimated pure product A24 with a yield of 64.3%. Mass spectrometry was as follows: 1123.5 (M+H). $^{1}$H NMR (400 MHz, $CDCl_3$) δ 8.60 (d, 1H), 8.36 (d, 1H), 8.07 (d, 1H), 7.92 (m, J=25.0 Hz, 3H), 7.77 (d, 2H), 7.66 (m, 3H), 7.47 (d, 2H), 7.35 (d, 2H), 7.19 (dd, 1H), 6.92 (d, 1H), 2.47 (d, 2H), 2.32 (d, J=15.0 Hz, 9H), 1.88 (m, 2H), 1.78 (m, J=20.0 Hz, 3H), 1.72-1.57 (m, 10H), 1.00 (m, J=5.0 Hz, 16H), 0.88 (m, J=15.0 Hz, 18H).

Example 25 Synthesis of a compound A25

Synthesis of a Ligand La389

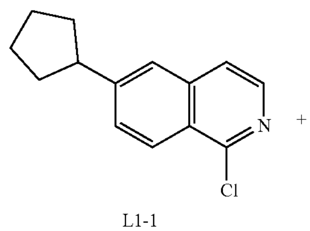

+

L1-1

-continued

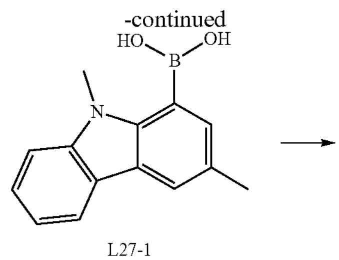

L27-1

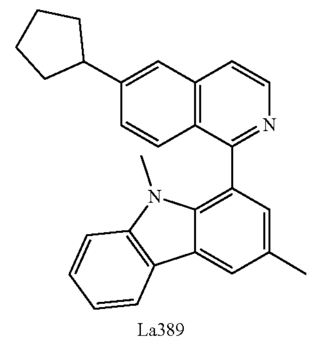

La389

With reference to the synthesis process and post-treatment and purification methods of the compound La385, only the corresponding raw materials were required to be changed. Mass spectrometry was as follows: 391.5 (M+H).

Synthesis of a compound A25
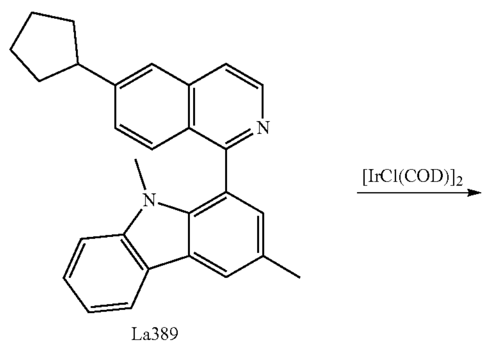
La389
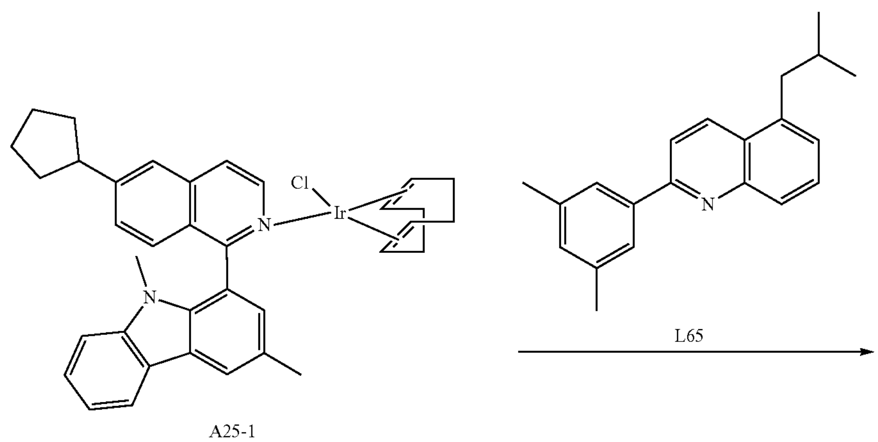
A25-1
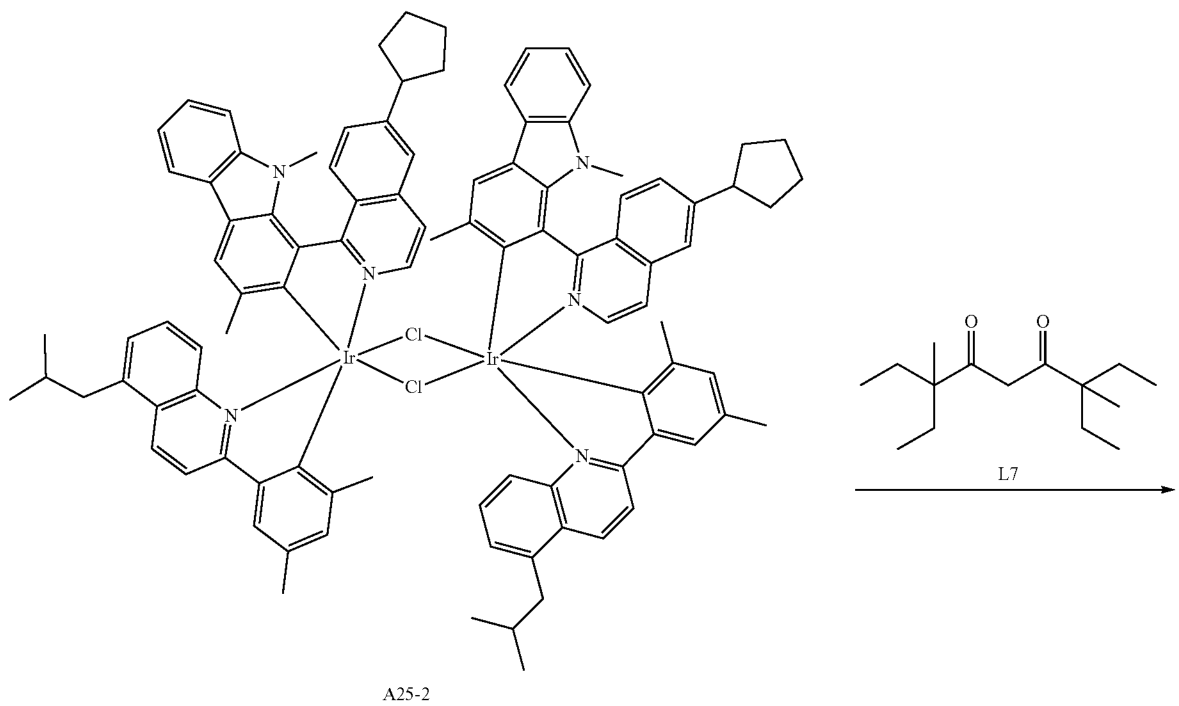
A25-2

-continued

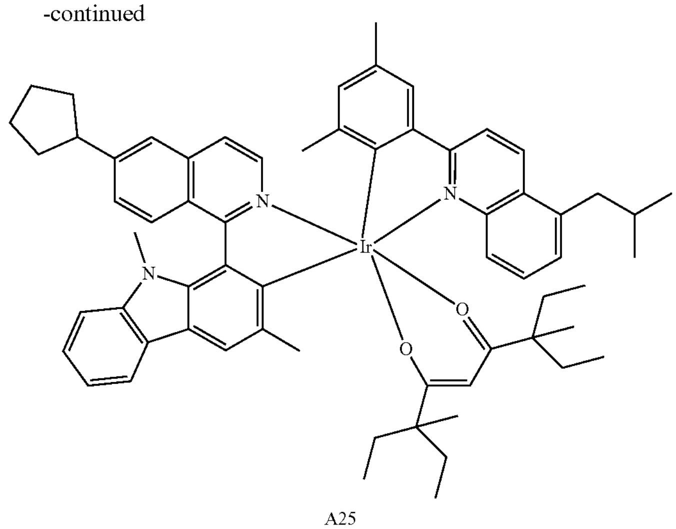

A25

Synthesis of a Compound A25-1

With reference to the synthesis process and post-treatment and purification methods of the compound A1-1, only the corresponding raw materials were required to be changed. Mass spectrometry was as follows: 725.5 (M+H).

Synthesis of a compound A25-2

With reference to the synthesis process and post-treatment and purification methods of the compound A1-2, only the corresponding raw materials were required to be changed. The obtained compound was directly used in the next step without purification.

Synthesis of a compound A25

With reference to the synthesis process and post-treatment and purification methods of the compound A1, only the corresponding raw materials were required to be changed, and 2.53 g of a target compound A25 with a yield of 38.1% was obtained. 2.53 g of the crude product A25 was sublimated and purified to obtain 1.72 g of a sublimated pure product A25 with a yield of 65.9%. Mass spectrometry was as follows: 1110.5 (M+H). $^1$H NMR (400 MHz, $CDCl_3$) δ 8.60 (d, 1H), 8.52 (d, 1H), 8.35 (m, J=10.0 Hz, 2H), 8.07 (d, 1H), 7.95 (dd, 2H), 7.77 (d, 2H), 7.66 (m, 2H), 7.52-7.31 (m, 3H), 7.16 (m, J=25.0 Hz, 2H), 6.92 (d, 1H), 3.82 (s, 3H), 2.47 (d, 2H), 2.32 (d, J=15.0 Hz, 9H), 1.88 (m, 2H), 1.78 (m, J=20.0 Hz, 3H), 1.66 (m, J=2.2 Hz, 4H), 1.00 (m, J=5.0 Hz, 15H), 0.88 (m, J=15.0 Hz, 18H).

Other compounds can be synthesized and sublimated by using corresponding materials according to same or similar methods.

Application Example: Manufacture of an organic electroluminescent device

A glass substrate with a size of 50 mm*50 mm*1.0 mm including an ITO (100 nm) transparent electrode was ultrasonically cleaned in ethanol for 10 minutes, dried at 150° C., and then treated with $N_2$ plasma for 30 minutes. The washed glass substrate was installed on a substrate support of a vacuum evaporation device. At first, a compound HATCN for covering the transparent electrode was evaporated on the surface of the side having a transparent electrode line to form a thin film with a thickness of 5 nm. Next, a layer of HTM1 was evaporated to form a thin film with a thickness of 60 nm. Then, a layer of HTM2 was evaporated on the HTM1 thin film to form a thin film with a thickness of 10 nm. After that, a main material CBP and a doping compound (including a reference compound X and a compound AX of the present invention) were co-evaporated on the HTM2 film layer to obtain a film with a thickness of 30 nm, where a ratio of the main material to the doping material was 90%:10%. An electron transport layer (ETL) film layer (25 nm) and a LiQ film layer (1 nm) was evaporated on a light-emitting layer in sequence. At last, a layer of A1 (100 nm) was evaporated to serve as an electrode.

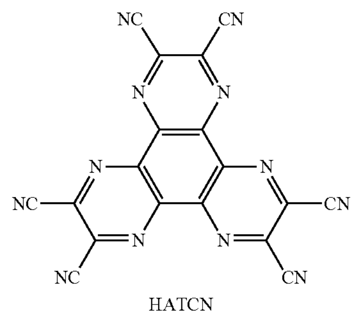

HATCN

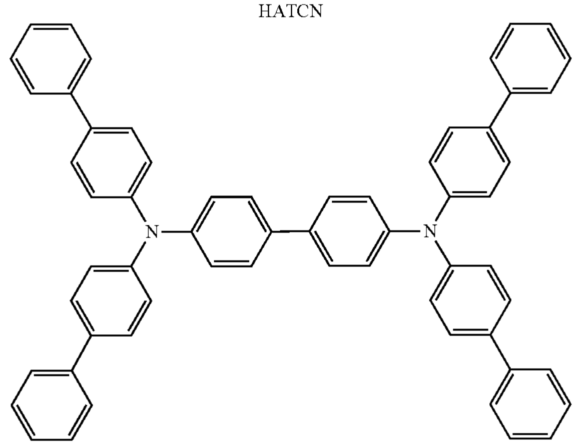

HTM 1

-continued

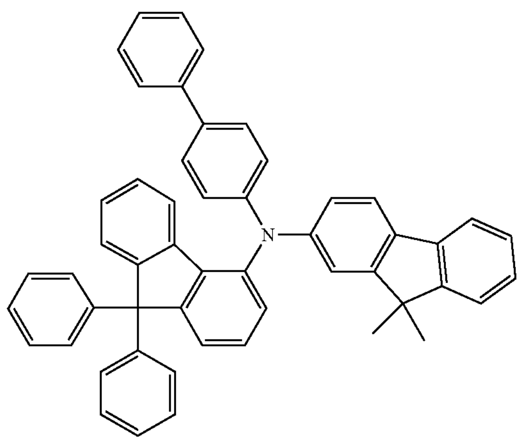

HTM 2

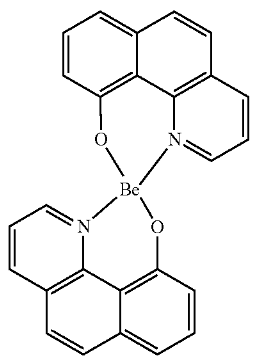

Main material

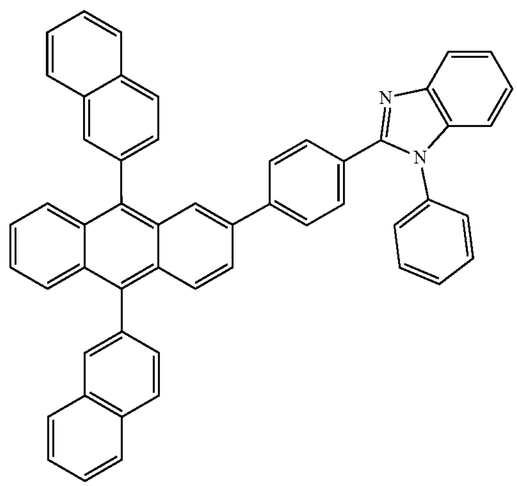

ETL

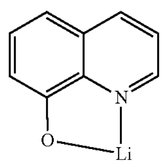

EIL

-continued

Reference compound 1

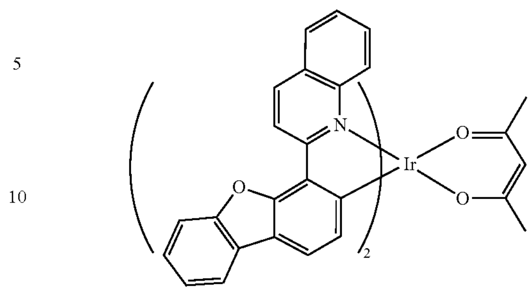

Reference compound 2

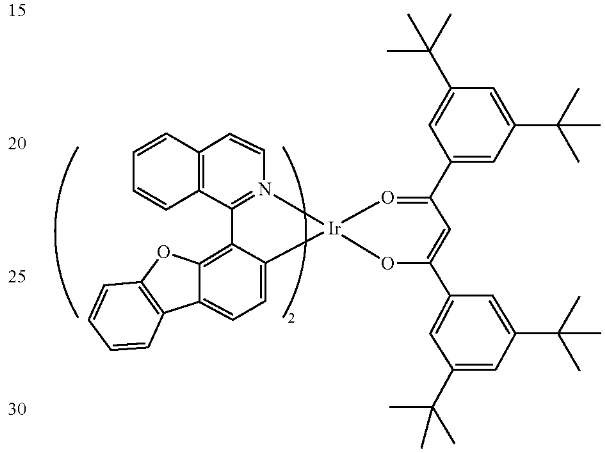

Reference compound 3

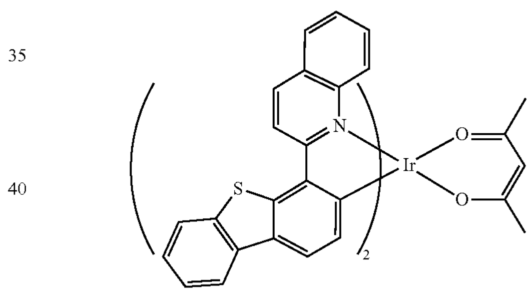

Reference compound 4

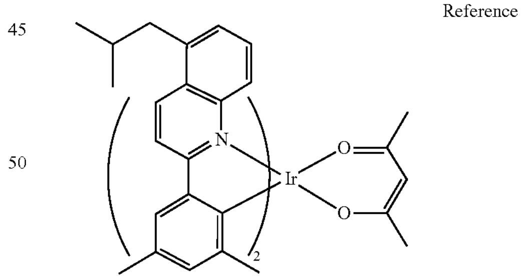

Evaluation

Properties of a device obtained above were tested. In various examples and comparative examples, a constant-current power supply (Keithley 2400) was used, a current at a fixed density was used for flowing through light-emitting elements, and a spectroradiometer (CS 2000) was used for testing the light-emitting spectrum. Meanwhile, the voltage value was measured, and the time (LT90) when the brightness was reduced to 90% of an initial brightness was tested. Results are shown as follows.

| | Doping material | Starting voltage V | Current efficiency Cd/A | Peak wavelength nm | LT90@ 3000 nits |
|---|---|---|---|---|---|
| Example 1 | A1 | 4.11 | 28 | 614 | 221 |
| Example 2 | A2 | 4.13 | 30 | 615 | 244 |
| Example 3 | A3 | 4.09 | 35 | 615 | 246 |
| Example 4 | A4 | 4.08 | 32 | 616 | 228 |
| Example 5 | A5 | 4.10 | 31 | 615 | 249 |
| Example 6 | A6 | 4.11 | 29 | 614 | 238 |
| Example 7 | A7 | 4.13 | 28 | 615 | 332 |
| Example 8 | A8 | 4.10 | 34 | 616 | 301 |
| Example 9 | A9 | 4.09 | 35 | 616 | 355 |
| Example 10 | A10 | 4.12 | 31 | 615 | 281 |
| Example 11 | A11 | 4.10 | 29 | 615 | 279 |
| Example 12 | A12 | 4.08 | 31 | 615 | 211 |
| Example 13 | A13 | 4.08 | 27 | 614 | 184 |
| Example 14 | A14 | 4.07 | 29 | 615 | 209 |
| Example 15 | A15 | 4.09 | 29 | 615 | 239 |
| Example 16 | A16 | 4.10 | 29 | 615 | 268 |
| Example 17 | A17 | 4.11 | 30 | 615 | 298 |
| Example 18 | A18 | 4.12 | 31 | 615 | 288 |
| Example 19 | A19 | 4.13 | 30 | 615 | 264 |
| Example 20 | A20 | 4.10 | 31 | 615 | 269 |
| Example 21 | A21 | 4.09 | 31 | 615 | 333 |
| Example 22 | A22 | 4.10 | 31 | 615 | 268 |
| Example 23 | A23 | 4.12 | 30 | 616 | 256 |
| Example 24 | A24 | 4.10 | 30 | 615 | 262 |
| Example 25 | A25 | 4.09 | 31 | 615 | 228 |
| Comparative Example 1 | Reference compound 1 | 4.21 | 21 | 610 | 108 |
| Comparative Example 2 | Reference compound 2 | 4.18 | 20 | 612 | 120 |
| Comparative Example 3 | Reference compound 3 | 4.25 | 21 | 611 | 98 |
| Comparative Example 4 | Reference compound 4 | 4.28 | 19 | 608 | 86 |

Through comparison of the data in the above table, it can be seen that compared with reference compounds, the compound of the present invention used as a dopant in an organic electroluminescent device has the advantages that more excellent properties, such as driving voltage, luminescence efficiency, and device service life, are achieved.

According to the above results, it is indicated that the compound of the present invention has the advantages of high optical and electrochemical stability, high color saturation, high luminescence efficiency, and long service life, and can be used in organic electroluminescent devices. In particular, the metal complex has the potential for application in the OLED industry as a red light-emitting dopant.

The invention claimed is:

1. A metal complex, having a general formula of Ir(La)(Lb)(Lc), wherein the La is independently selected from one of the following structural formulas, corresponding parts or complete deuterides thereof, or corresponding parts or complete fluorides thereof;

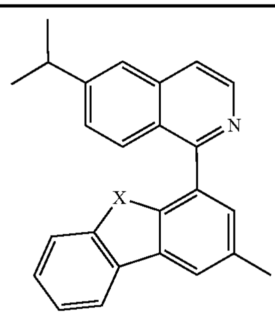

-continued

| | |
|---|---|
| X = O | La1 |
| X = S | La2 |
| X = Se | La3 |
| X = $C(CH_3)_2$ | La4 |
| X = $NCH_3$ | La5 |
| X = N(i-Pr) | La6 |

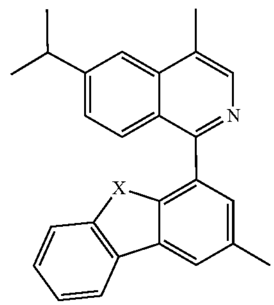

| | |
|---|---|
| X = O | La7 |
| X = S | La8 |
| X = Se | La9 |
| X = $C(CH_3)_2$ | La10 |
| X = $NCH_3$ | La11 |
| X = N(i-Pr) | La12 |

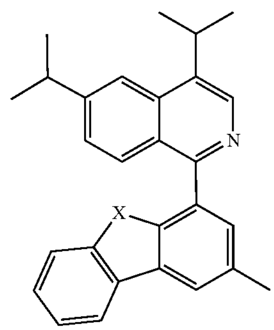

| | |
|---|---|
| X = O | La13 |
| X = S | La14 |
| X = Se | La15 |
| X = $C(CH_3)_2$ | La16 |
| X = $NCH_3$ | La17 |
| X = N(i-Pr) | La18 |

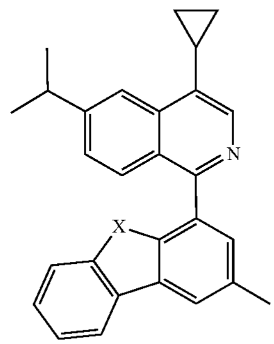

| | |
|---|---|
| X = O | La19 |
| X = S | La20 |
| X = Se | La21 |
| X = $C(CH_3)_2$ | La22 |
| X = $NCH_3$ | La23 |
| X = N-(i-Pr) | La24 |

-continued
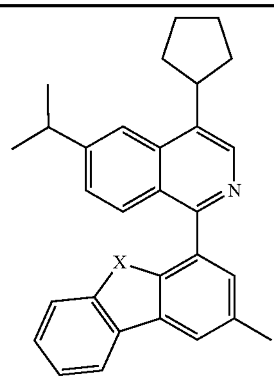
| | |
|---|---|
| X = O | La25 |
| X = S | La26 |
| X = Se | La27 |
| X = $C(CH_3)_2$ | La28 |
| X = $NCH_3$ | La29 |
| X = N(i-Pr) | La30 |
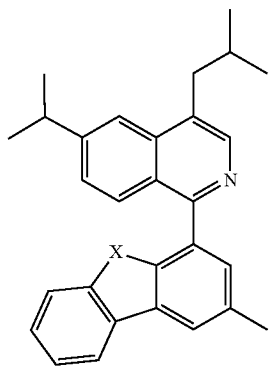
| | |
|---|---|
| X = O | La31 |
| X = S | La32 |
| X = Se | La33 |
| X = $C(CH_3)_2$ | La34 |
| X = $NCH_3$ | La35 |
| X = N(i-Pr) | La36 |
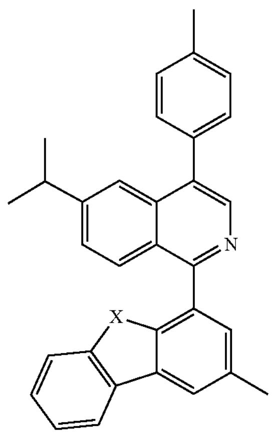
| | |
|---|---|
| X = O | La37 |
| X = S | La38 |
| X = Se | La39 |
| X = $C(CH_3)_2$ | La40 |
| X = $NCH_3$ | La41 |
| X = N(i-Pr) | La42 |
-continued
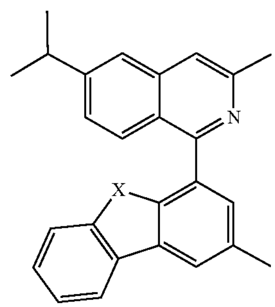
| | |
|---|---|
| X = O | La43 |
| X = S | La44 |
| X = Se | La45 |
| X = $C(CH_3)_2$ | La46 |
| X = $NCH_3$ | La47 |
| X = N(i-Pr) | La48 |
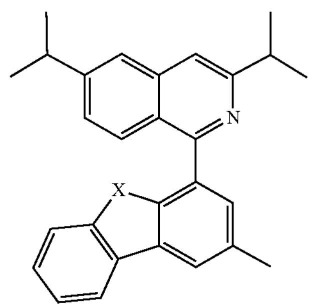
| | |
|---|---|
| X = O | La49 |
| X = S | La50 |
| X = Se | La51 |
| X = $C(CH_3)_2$ | La52 |
| X = $NCH_3$ | La53 |
| X = N(i-Pr) | La54 |
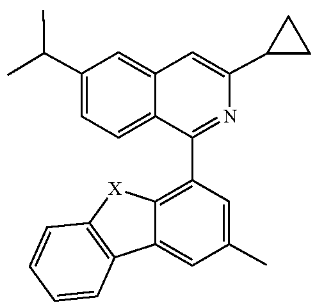
| | |
|---|---|
| X = O | La55 |
| X = S | La56 |
| X = Se | La57 |
| X = $C(CH_3)_2$ | La58 |
| X = $NCH_3$ | La59 |
| X = N(i-Pr) | La60 |

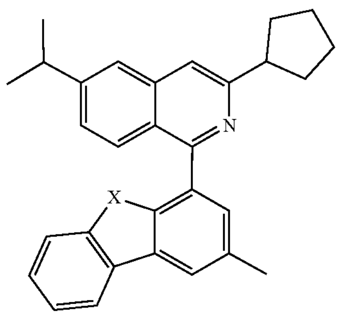
| | |
|---|---|
| X = O | La61 |
| X = S | La62 |
| X = Se | La63 |
| X = $C(CH_3)_2$ | La64 |
| X = $NCH_3$ | La65 |
| X = N(i-Pr) | La66 |
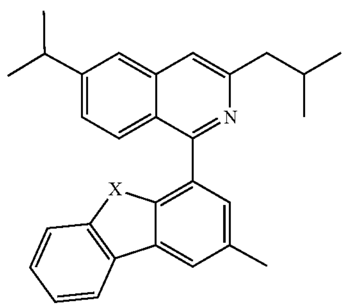
| | |
|---|---|
| X = O | La67 |
| X = S | La68 |
| X = Se | La69 |
| X = $C(CH_3)_2$ | La70 |
| X = $NCH_3$ | La71 |
| X = N(i-Pr) | La72 |
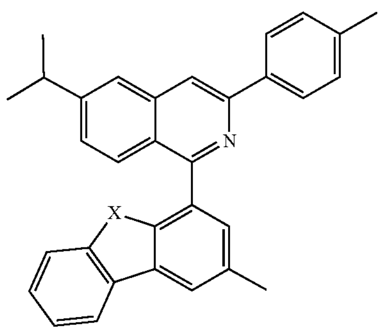
| | |
|---|---|
| X = O | La73 |
| X = S | La74 |
| X = Se | La75 |
| X = $C(CH_3)_2$ | La76 |
| X = $NCH_3$ | La77 |
| X = N(i-Pr) | La78 |
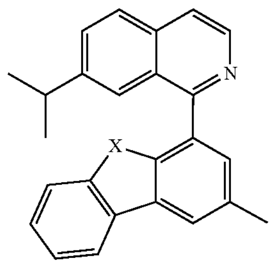
| | |
|---|---|
| X = O | La79 |
| X = S | La80 |
| X = Se | La81 |
| X = $C(CH_3)_2$ | La82 |
| X = $NCH_3$ | La83 |
| X = N(i-Pr) | La84 |
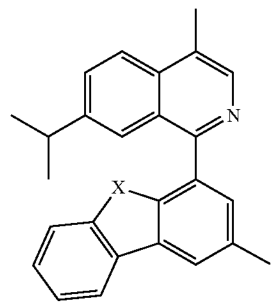
| | |
|---|---|
| X = O | La85 |
| X = S | La86 |
| X = Se | La87 |
| X = $C(CH_3)_2$ | La88 |
| X = $NCH_3$ | La89 |
| X = N(i-Pr) | La90 |
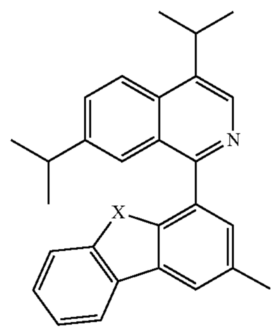
| | |
|---|---|
| X = O | La91 |
| X = S | La92 |
| X = Se | La93 |
| X = $C(CH_3)_2$ | La94 |
| X = $NCH_3$ | La95 |
| X = N(i-Pr) | La96 |
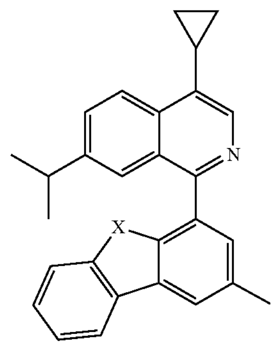
| | |
|---|---|
| X = O | La97 |
| X = S | La98 |
| X = Se | La99 |
| X = $C(CH_3)_2$ | La100 |
| X = $NCH_3$ | La101 |
| X = N(i-Pr) | La102 |

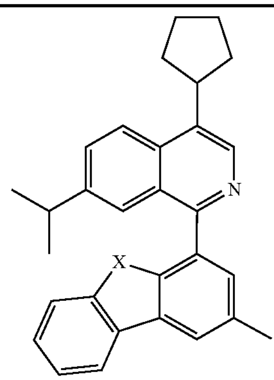
| | |
|---|---|
| X = O | La103 |
| X = S | La104 |
| X = Se | La105 |
| X = $C(CH_3)_2$ | La106 |
| X = $NCH_3$ | La107 |
| X = N(i-Pr) | La108 |
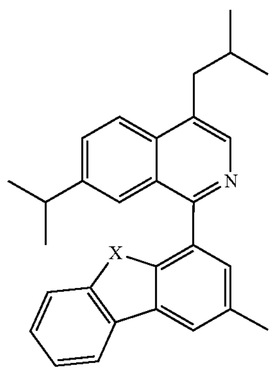
| | |
|---|---|
| X = O | La109 |
| X = S | La110 |
| X = Se | La111 |
| X = $C(CH_3)_2$ | La112 |
| X = $NCH_3$ | La113 |
| X = N(i-Pr) | La114 |
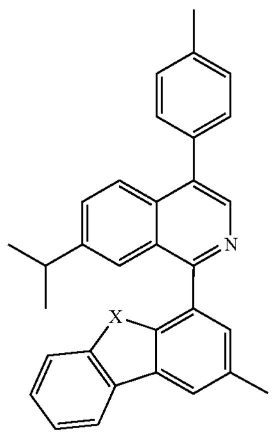
| | |
|---|---|
| X = O | La115 |
| X = S | La116 |
| X = Se | La117 |
| X = $C(CH_3)_2$ | La118 |
| X = $NCH_3$ | La119 |
| X = N(i-Pr) | La120 |
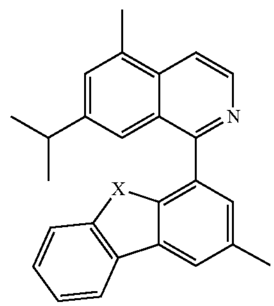
| | |
|---|---|
| X = O | La121 |
| X = S | La122 |
| X = Se | La123 |
| X = $C(CH_3)_2$ | La124 |
| X = $NCH_3$ | La125 |
| X = N(i-Pr) | La126 |
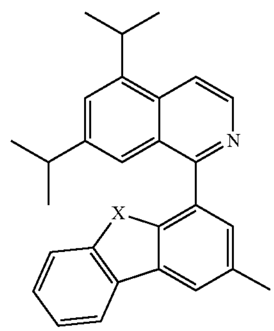
| | |
|---|---|
| X = O | La127 |
| X = S | La128 |
| X = Se | La129 |
| X = $C(CH_3)_2$ | La130 |
| X = $NCH_3$ | La131 |
| X = N(i-Pr) | La132 |
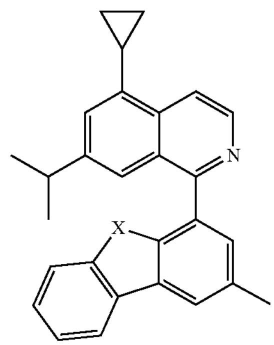
| | |
|---|---|
| X = O | La133 |
| X = S | La134 |
| X = Se | La135 |
| X = $C(CH_3)_2$ | La136 |
| X = $NCH_3$ | La137 |
| X = N(i-Pr) | La138 |

-continued
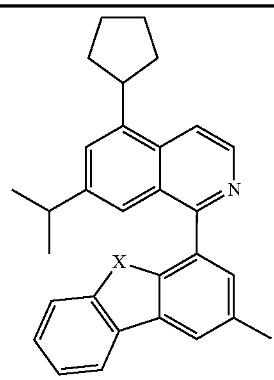
| | |
|---|---|
| X = O | La139 |
| X = S | La140 |
| X = Se | La141 |
| X = $C(CH_3)_2$ | La142 |
| X = $NCH_3$ | La143 |
| X = N(i-Pr) | La144 |
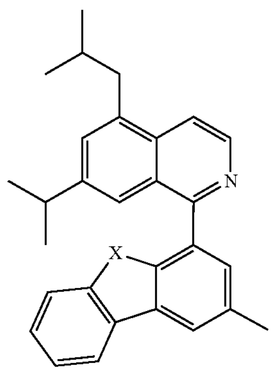
| | |
|---|---|
| X = O | La145 |
| X = S | La146 |
| X = Se | La147 |
| X = $C(CH_3)_2$ | La148 |
| X = $NCH_3$ | La149 |
| X = N(i-Pr) | La150 |
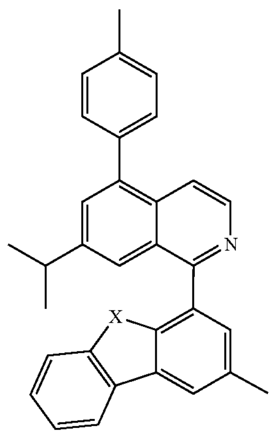
| | |
|---|---|
| X = O | La151 |
| X = S | La152 |
| X = Se | La153 |
| X = $C(CH_3)_2$ | La154 |
| X = $NCH_3$ | La155 |
| X = N(i-Pr) | La156 |
-continued
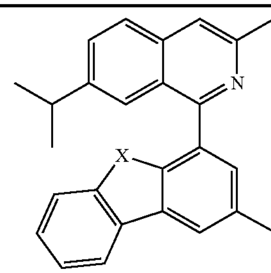
| | |
|---|---|
| X = O | La157 |
| X = S | La158 |
| X = Se | La159 |
| X = $C(CH_3)_2$ | La160 |
| X = $NCH_3$ | La161 |
| X = N(i-Pr) | La162 |
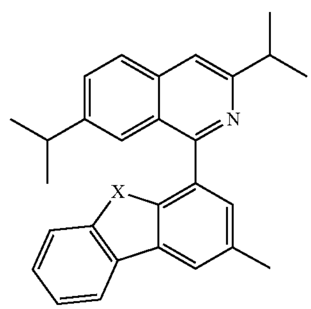
| | |
|---|---|
| X = O | La163 |
| X = S | La164 |
| X = Se | La165 |
| X = $C(CH_3)_2$ | La166 |
| X = $NCH_3$ | La167 |
| X = N(i-Pr) | La168 |
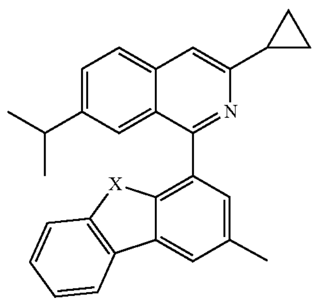
| | |
|---|---|
| X = O | La169 |
| X = S | La170 |
| X = Se | La171 |
| X = $C(CH_3)_2$ | La172 |
| X = $NCH_3$ | La173 |
| X = N(i-Pr) | La174 |
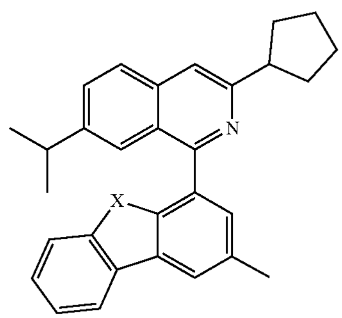

-continued

| | |
|---|---|
| X = O | La175 |
| X = S | La176 |
| X = Se | La177 |
| X = $C(CH_3)_2$ | La178 |
| X = $NCH_3$ | La179 |
| X = N(i-Pr) | La180 |

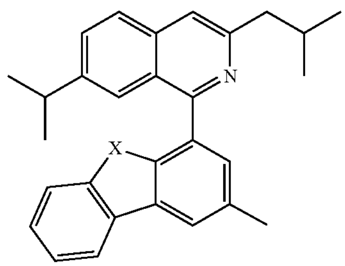

| | |
|---|---|
| X = O | La181 |
| X = S | La182 |
| X = Se | La183 |
| X = $C(CH_3)_2$ | La184 |
| X = $NCH_3$ | La185 |
| X = N(i-Pr) | La186 |

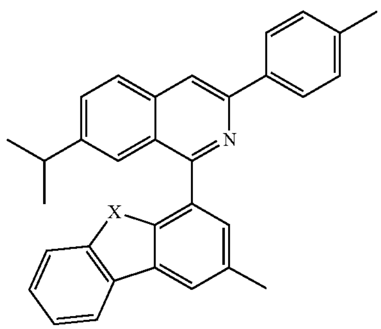

| | |
|---|---|
| X = O | La187 |
| X = S | La188 |
| X = Se | La189 |
| X = $C(CH_3)_2$ | La190 |
| X = $NCH_3$ | La191 |
| X = N(i-Pr) | La192 |

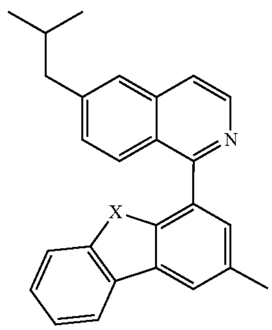

| | |
|---|---|
| X = O | La193 |
| X = S | La194 |
| X = Se | La195 |
| X = $C(CH_3)_2$ | La196 |
| X = $NCH_3$ | La197 |
| X = N(i-Pr) | La198 |

-continued

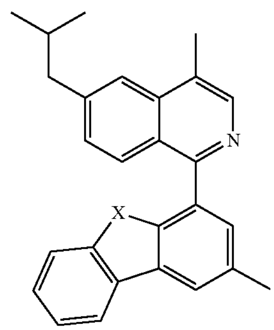

| | |
|---|---|
| X = O | La199 |
| X = S | La200 |
| X = Se | La201 |
| X = $C(CH_3)_2$ | La202 |
| X = $NCH_3$ | La203 |
| X = N(i-Pr) | La204 |

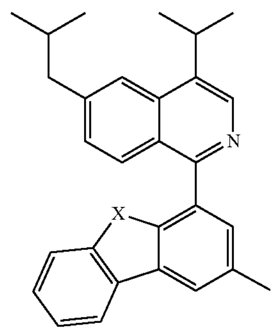

| | |
|---|---|
| X = O | La205 |
| X = S | La206 |
| X = Se | La207 |
| X = $C(CH_3)_2$ | La208 |
| X = $NCH_3$ | La209 |
| X = N(i-Pr) | La210 |

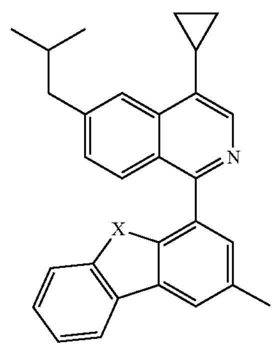

| | |
|---|---|
| X = O | La211 |
| X = S | La212 |
| X = Se | La213 |
| X = $C(CH_3)_2$ | La214 |
| X = $NCH_3$ | La215 |
| X = N(i-Pr) | La216 |

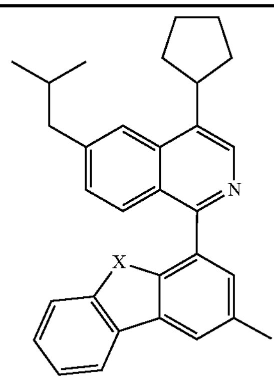
| | |
|---|---|
| X = O | La217 |
| X = S | La218 |
| X = Se | La219 |
| X = $C(CH_3)_2$ | La220 |
| X = $NCH_3$ | La221 |
| X = N(i-Pr) | La222 |
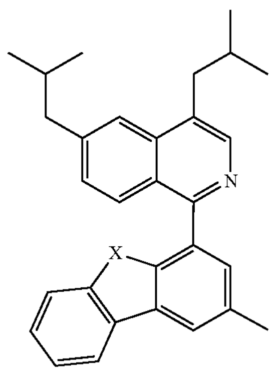
| | |
|---|---|
| X = O | La223 |
| X = S | La224 |
| X = Se | La225 |
| X = $C(CH_3)_2$ | La226 |
| X = $NCH_3$ | La227 |
| X = N(i-Pr) | La228 |
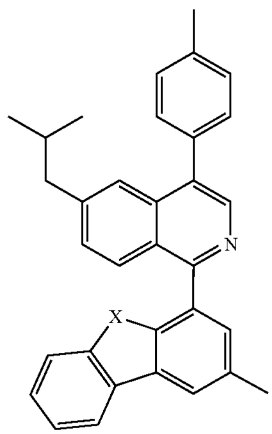
| | |
|---|---|
| X = O | La229 |
| X = S | La230 |
| X = Se | La231 |
| X = $C(CH_3)_2$ | La232 |
| X = $NCH_3$ | La233 |
| X = N(i-Pr) | La234 |
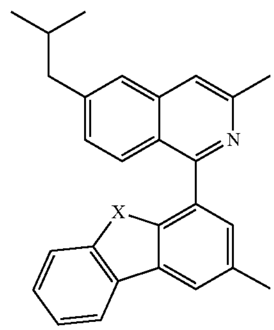
| | |
|---|---|
| X = O | La235 |
| X = S | La236 |
| X = Se | La237 |
| X = $C(CH_3)_2$ | La238 |
| X = $NCH_3$ | La239 |
| X = N(i-Pr) | La240 |
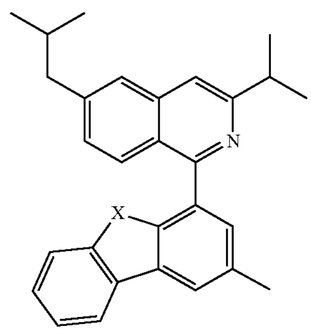
| | |
|---|---|
| X = O | La241 |
| X = S | La242 |
| X = Se | La243 |
| X = $C(CH_3)_2$ | La244 |
| X = $NCH_3$ | La245 |
| X = N(i-Pr) | La246 |
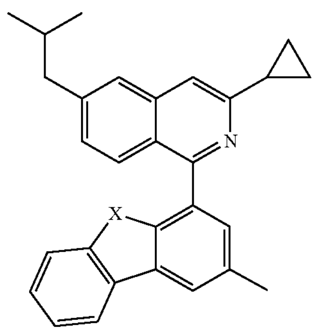
| | |
|---|---|
| X = O | La247 |
| X = S | La248 |
| X = Se | La249 |
| X = $C(CH_3)_2$ | La250 |
| X = $NCH_3$ | La251 |
| X = N(i-Pr) | La252 |

-continued
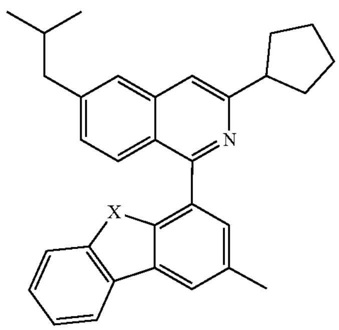
| | |
|---|---|
| X = O | La253 |
| X = S | La254 |
| X = Se | La255 |
| X = $C(CH_3)_2$ | La256 |
| X = $NCH_3$ | La257 |
| X = N(i-Pr) | La258 |
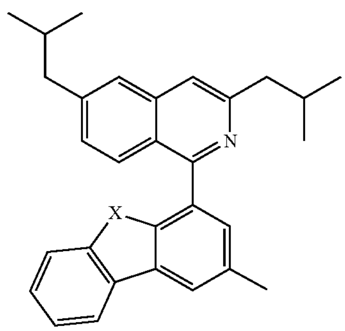
| | |
|---|---|
| X = O | La259 |
| X = S | La260 |
| X = Se | La261 |
| X = $C(CH_3)_2$ | La262 |
| X = $NCH_3$ | La263 |
| X = N(i-Pr) | La264 |
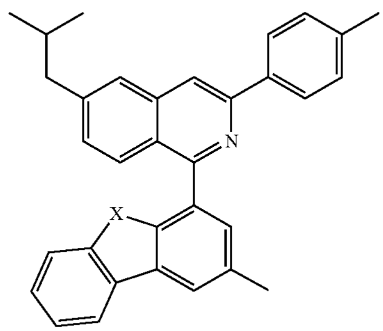
| | |
|---|---|
| X = O | La265 |
| X = S | La266 |
| X = Se | La267 |
| X = $C(CH_3)_2$ | La268 |
| X = $NCH_3$ | La269 |
| X = N(i-Pr) | La270 |
-continued
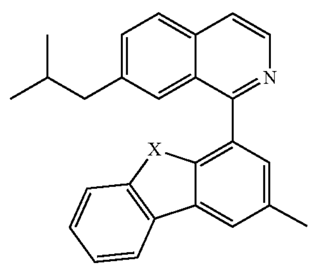
| | |
|---|---|
| X = O | La271 |
| X = S | La272 |
| X = Se | La273 |
| X = $C(CH_3)_2$ | La274 |
| X = $NCH_3$ | La275 |
| X = N(i-Pr) | La276 |
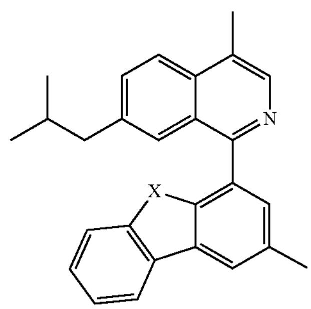
| | |
|---|---|
| X = O | La277 |
| X = S | La278 |
| X = Se | La279 |
| X = $C(CH_3)_2$ | La280 |
| X = $NCH_3$ | La281 |
| X = N(i-Pr) | La282 |
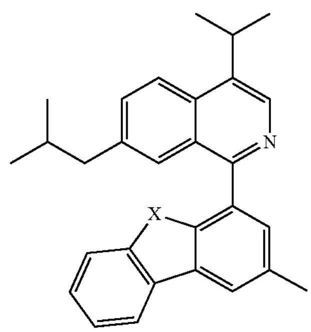
| | |
|---|---|
| X = O | La283 |
| X = S | La284 |
| X = Se | La285 |
| X = $C(CH_3)_2$ | La286 |
| X = $NCH_3$ | La287 |
| X = N(i-Pr) | La288 |

-continued
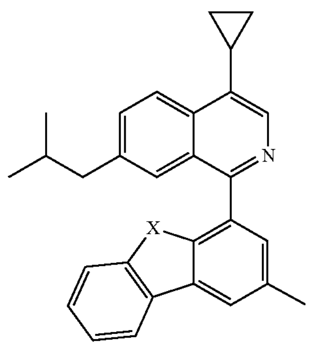
| | |
|---|---|
| X = O | La289 |
| X = S | La290 |
| X = Se | La291 |
| X = $C(CH_3)_2$ | La292 |
| X = $NCH_3$ | La293 |
| X = N(i-Pr) | La294 |
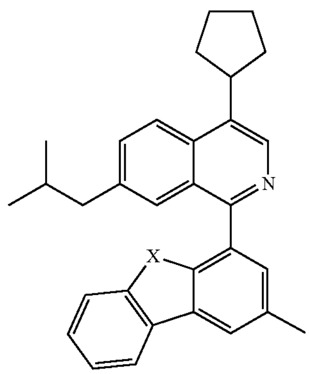
| | |
|---|---|
| X = O | La295 |
| X = S | La296 |
| X = Se | La297 |
| X = $C(CH_3)_2$ | La298 |
| X = $NCH_3$ | La299 |
| X = N(i-Pr) | La300 |
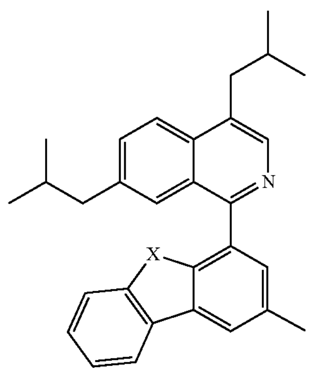
| | |
|---|---|
| X = O | La301 |
| X = S | La302 |
| X = Se | La303 |
| X = $C(CH_3)_2$ | La304 |
| X = $NCH_3$ | La305 |
| X = N(i-Pr) | La306 |
-continued
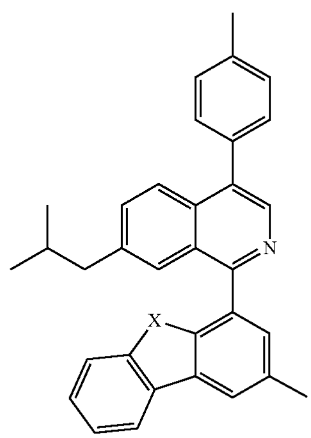
| | |
|---|---|
| X = O | La307 |
| X = S | La308 |
| X = Se | La309 |
| X = $C(CH_3)_2$ | La310 |
| X = $NCH_3$ | La311 |
| X = N(i-Pr) | La312 |
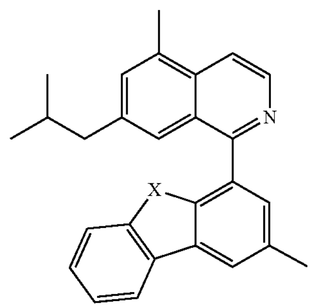
| | |
|---|---|
| X = O | La313 |
| X = S | La314 |
| X = Se | La315 |
| X = $C(CH_3)_2$ | La316 |
| X = $NCH_3$ | La317 |
| X = N(i-Pr) | La318 |
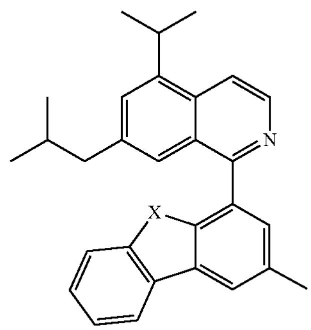
| | |
|---|---|
| X = O | La319 |
| X = S | La320 |
| X = Se | La321 |
| X = $C(CH_3)_2$ | La322 |
| X = $NCH_3$ | La323 |
| X = N(i-Pr) | La324 |

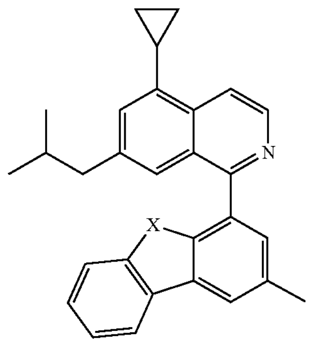
| | |
|---|---|
| X = O | La325 |
| X = S | La326 |
| X = Se | La327 |
| X = $C(CH_3)_2$ | La328 |
| X = $NCH_3$ | La329 |
| X = N(i-Pr) | La330 |
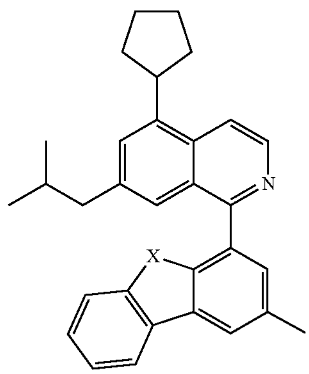
| | |
|---|---|
| X = O | La331 |
| X = S | La332 |
| X = Se | La333 |
| X = $C(CH_3)_2$ | La334 |
| X = $NCH_3$ | La335 |
| X = N(i-Pr) | La336 |
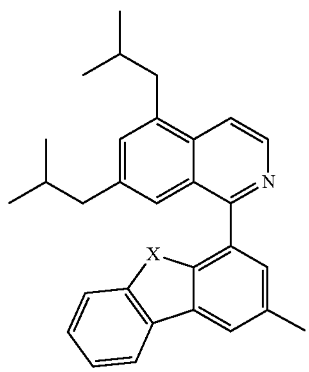
| | |
|---|---|
| X = O | La337 |
| X = S | La338 |
| X = Se | La339 |
| X = $C(CH_3)_2$ | La340 |
| X = $NCH_3$ | La341 |
| X = N(i-Pr) | La342 |
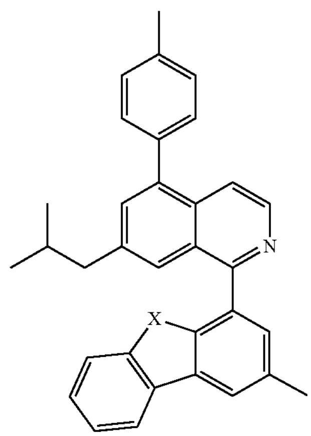
| | |
|---|---|
| X = O | La343 |
| X = S | La344 |
| X = Se | La345 |
| X = $C(CH_3)_2$ | La346 |
| X = $NCH_3$ | La347 |
| X = N(i-Pr) | La348 |
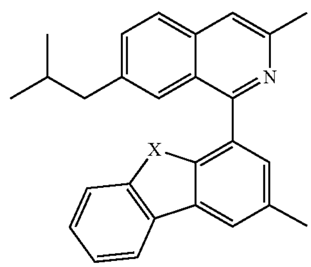
| | |
|---|---|
| X = O | La349 |
| X = S | La350 |
| X = Se | La351 |
| X = $C(CH_3)_2$ | La352 |
| X = $NCH_3$ | La353 |
| X = N(i-Pr) | La354 |
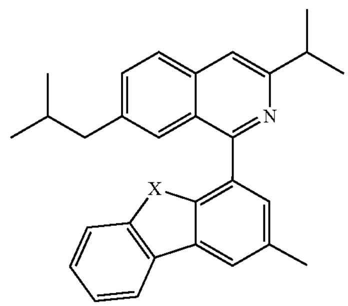
| | |
|---|---|
| X = O | La355 |
| X = S | La356 |
| X = Se | La357 |
| X = $C(CH_3)_2$ | La358 |
| X = $NCH_3$ | La359 |
| X = N(i-Pr) | La360 |

-continued

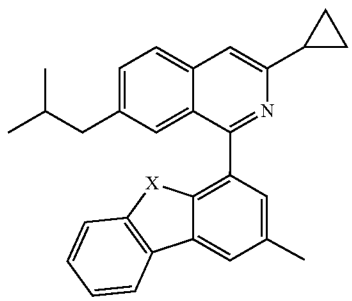

| | |
|---|---|
| X = O | La361 |
| X = S | La362 |
| X = Se | La363 |
| X = $C(CH_3)_2$ | La364 |
| X = $NCH_3$ | La365 |
| X = N(i-Pr) | La366 |

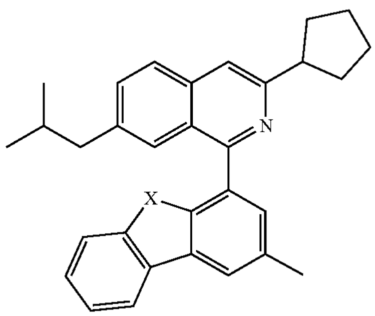

| | |
|---|---|
| X = O | La367 |
| X = S | La368 |
| X = Se | La369 |
| X = $C(CH_3)_2$ | La370 |
| X = $NCH_3$ | La371 |
| X = N(i-Pr) | La372 |

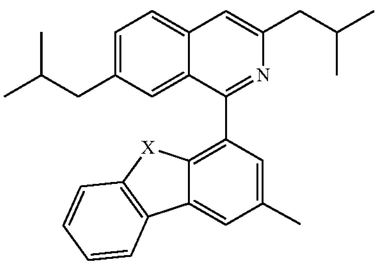

| | |
|---|---|
| X = O | La73 |
| X = S | La374 |
| X = Se | La375 |
| X = $C(CH_3)_2$ | La376 |
| X = $NCH_3$ | La377 |
| X = N(i-Pr) | La378 |

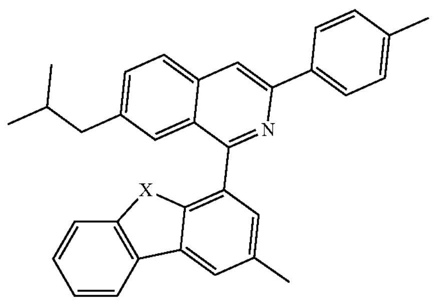

-continued

| | |
|---|---|
| X = O | La379 |
| X = S | La380 |
| X = Se | La381 |
| X = $C(CH_3)_2$ | La382 |
| X = $NCH_3$ | La383 |
| X = N(i-Pr) | La384 |

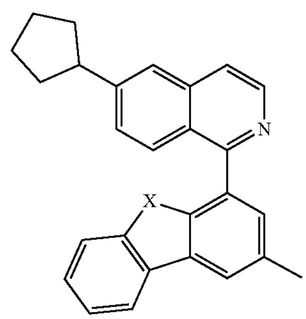

| | |
|---|---|
| X = O | La385 |
| X = S | La386 |
| X = Se | La387 |
| X = $C(CH_3)_2$ | La388 |
| X = $NCH_3$ | La389 |
| X = N(i-Pr) | La390 |

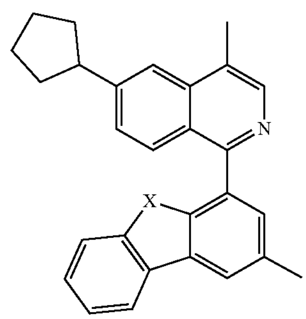

| | |
|---|---|
| X = O | La391 |
| X = S | La392 |
| X = Se | La393 |
| X = $C(CH_3)_2$ | La394 |
| X = $NCH_3$ | La395 |
| X = N(i-Pr) | La396 |

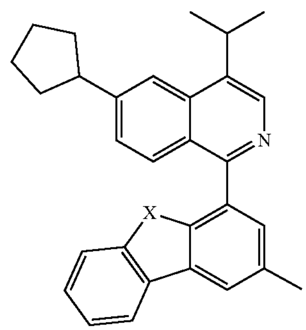

| | |
|---|---|
| X = O | La397 |
| X = S | La398 |
| X = Se | La399 |
| X = $C(CH_3)_2$ | La400 |
| X = $NCH_3$ | La401 |
| X = N(i-Pr) | La402 |

-continued
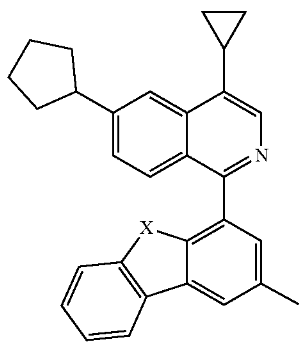
| | |
|---|---|
| X = O | La403 |
| X = S | La404 |
| X = Se | La405 |
| X = $C(CH_3)_2$ | La406 |
| X = $NCH_3$ | La407 |
| X = N(i-Pr) | La408 |
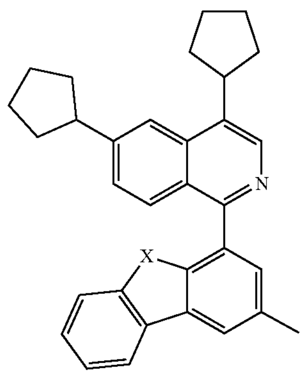
| | |
|---|---|
| X = O | La409 |
| X = S | La410 |
| X = Se | La411 |
| X = $C(CH_3)_2$ | La412 |
| X = $NCH_3$ | La413 |
| X = N(i-Pr) | La414 |
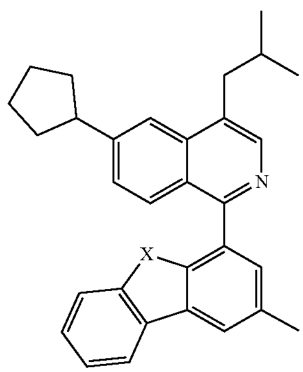
| | |
|---|---|
| X = O | La415 |
| X = S | La416 |
| X = Se | La417 |
| X = $C(CH_3)_2$ | La418 |
| X = $NCH_3$ | La419 |
| X = N(i-Pr) | La420 |
-continued
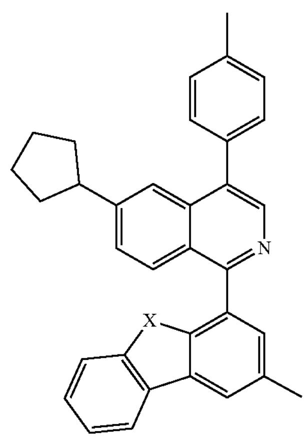
| | |
|---|---|
| X = O | La421 |
| X = S | La422 |
| X = Se | La423 |
| X = $C(CH_3)_2$ | La424 |
| X = $NCH_3$ | La425 |
| X = N(i-Pr) | La426 |
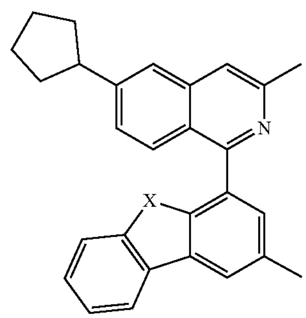
| | |
|---|---|
| X = O | La427 |
| X = S | La428 |
| X = Se | La429 |
| X = $C(CH_3)_2$ | La430 |
| X = $NCH_3$ | La431 |
| X = N(i-Pr) | La432 |
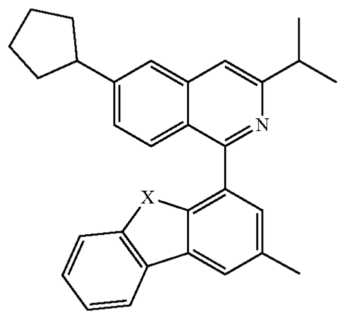
| | |
|---|---|
| X = O | La433 |
| X = S | La434 |
| X = Se | La435 |
| X = $C(CH_3)_2$ | La436 |
| X = $NCH_3$ | La437 |
| X = N(i-Pr) | La438 |

-continued
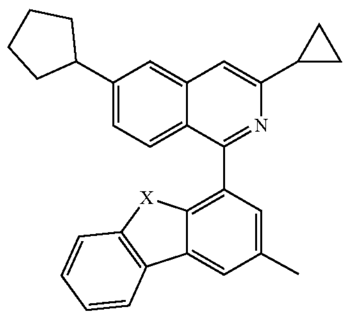
| | |
|---|---|
| X = O | La439 |
| X = S | La440 |
| X = Se | La441 |
| X = $C(CH_3)_2$ | La442 |
| X = $NCH_3$ | La443 |
| X = N(i-Pr) | La444 |
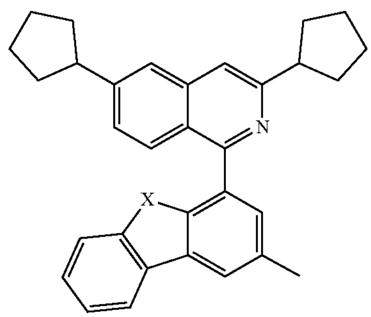
| | |
|---|---|
| X = O | La445 |
| X = S | La446 |
| X = Se | La447 |
| X = $C(CH_3)_2$ | La448 |
| X = $NCH_3$ | La449 |
| X = N(i-Pr) | La450 |
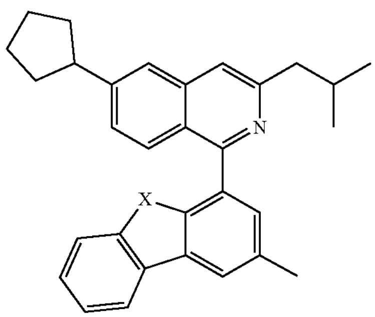
| | |
|---|---|
| X = O | La451 |
| X = S | La452 |
| X = Se | La453 |
| X = $C(CH_3)_2$ | La454 |
| X = $NCH_3$ | La455 |
| X = N(i-Pr) | La456 |
-continued
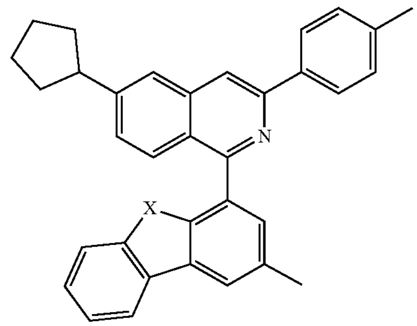
| | |
|---|---|
| X = O | La457 |
| X = S | La458 |
| X = Se | La459 |
| X = $C(CH_3)_2$ | La460 |
| X = $NCH_3$ | La461 |
| X = N(i-Pr) | La462 |
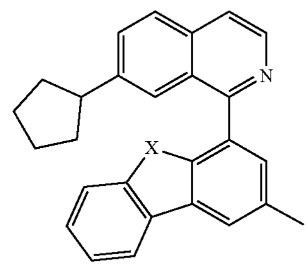
| | |
|---|---|
| X = O | La463 |
| X = S | La464 |
| X = Se | La465 |
| X = $C(CH_3)_2$ | La466 |
| X = $NCH_3$ | La467 |
| X = N(i-Pr) | La468 |
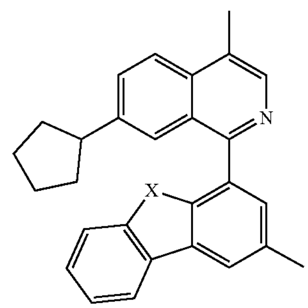
| | |
|---|---|
| X = O | La469 |
| X = S | La470 |
| X = Se | La471 |
| X = $C(CH_3)_2$ | La472 |
| X = $NCH_3$ | La473 |
| X = N(i-Pr) | La474 |

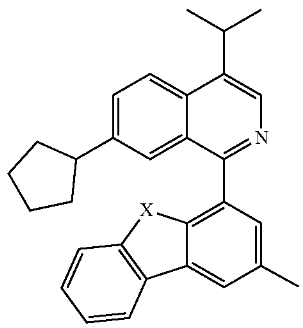
| | |
|---|---|
| X = O | La475 |
| X = S | La476 |
| X = Se | La477 |
| X = $C(CH_3)_2$ | La478 |
| X = $NCH_3$ | La479 |
| X = N(i-Pr) | La480 |
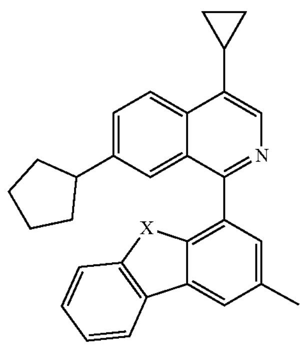
| | |
|---|---|
| X = O | La481 |
| X = S | La482 |
| X = Se | La483 |
| X = $C(CH_3)_2$ | La484 |
| X = $NCH_3$ | La485 |
| X = N(i-Pr) | La486 |
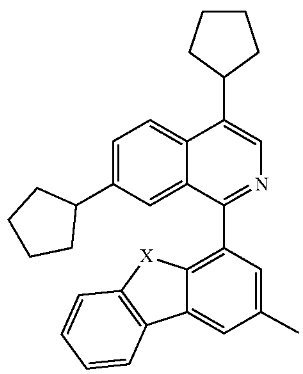
| | |
|---|---|
| X = O | La487 |
| X = S | La488 |
| X = Se | La489 |
| X = $C(CH_3)_2$ | La490 |
| X = $NCH_3$ | La491 |
| X = N(i-Pr) | La492 |
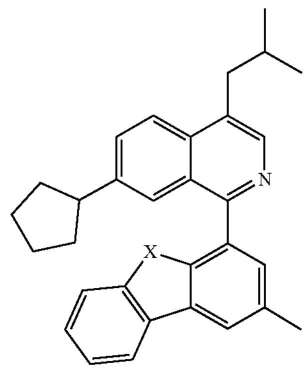
| | |
|---|---|
| X = O | La493 |
| X = S | La494 |
| X = Se | La495 |
| X = $C(CH_3)_2$ | La496 |
| X = $NCH_3$ | La497 |
| X = N(i-Pr) | La498 |
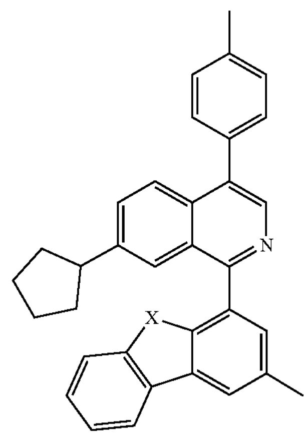
| | |
|---|---|
| X = O | La499 |
| X = S | La500 |
| X = Se | La501 |
| X = $C(CH_3)_2$ | La502 |
| X = $NCH_3$ | La503 |
| X = N(i-Pr) | La504 |
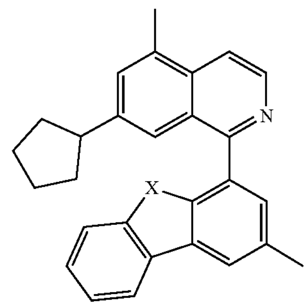
| | |
|---|---|
| X = O | La505 |
| X = S | La506 |
| X = Se | La507 |
| X = $C(CH_3)_2$ | La508 |
| X = $NCH_3$ | La509 |
| X = N(i-Pr) | La510 |

-continued
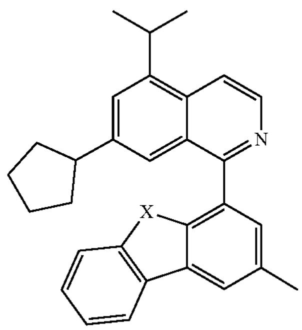
| | |
|---|---|
| X = O | La511 |
| X = S | La512 |
| X = Se | La513 |
| X = $C(CH_3)_2$ | La514 |
| X = $NCH_3$ | La515 |
| X = N(i-Pr) | La516 |
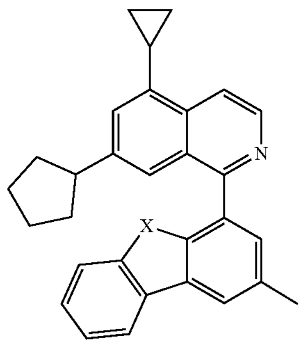
| | |
|---|---|
| X = O | La517 |
| X = S | La518 |
| X = Se | La519 |
| X = $C(CH_3)_2$ | La520 |
| X = $NCH_3$ | La521 |
| X = N(i-Pr) | La522 |
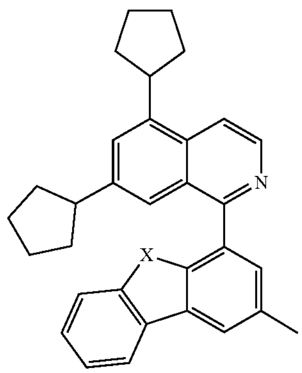
| | |
|---|---|
| X = O | La523 |
| X = S | La524 |
| X = Se | La525 |
| X = $C(CH_3)_2$ | La526 |
| X = $NCH_3$ | La527 |
| X = N(i-Pr) | La528 |
-continued
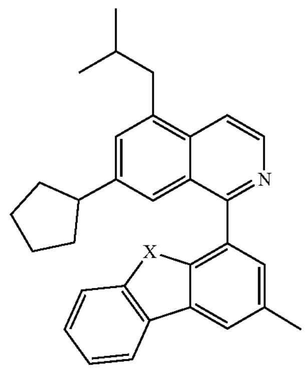
| | |
|---|---|
| X = O | La529 |
| X = S | La530 |
| X = Se | La531 |
| X = $C(CH_3)_2$ | La532 |
| X = $NCH_3$ | La533 |
| X = N(i-Pr) | La534 |
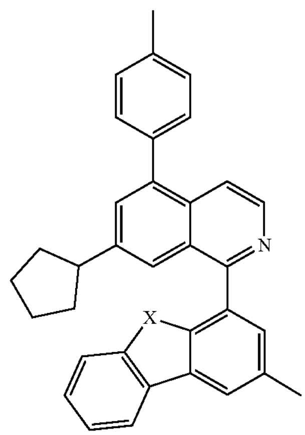
| | |
|---|---|
| X = O | La535 |
| X = S | La536 |
| X = Se | La537 |
| X = $C(CH_3)_2$ | La538 |
| X = $NCH_3$ | La539 |
| X = N(i-Pr) | La540 |
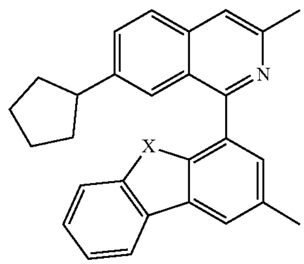
| | |
|---|---|
| X = O | La541 |
| X = S | La542 |
| X = Se | La543 |
| X = $C(CH_3)_2$ | La544 |
| X = $NCH_3$ | La545 |
| X = N(i-Pr) | La546 |

-continued

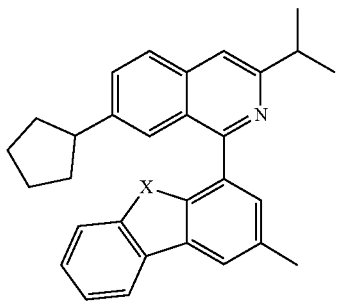

X = O La547
X = S La548
X = Se La549
X = $C(CH_3)_2$ La550
X = $NCH_3$ La551
X = N(i-Pr) La552

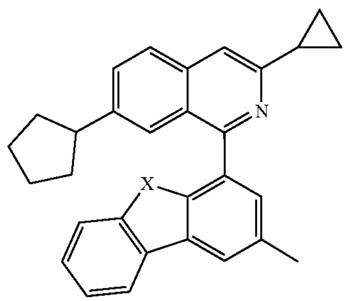

X = O La553
X = S La554
X = Se La555
X = $C(CH_3)_2$ La556
X = $NCH_3$ La557
X = N(i-Pr) La558

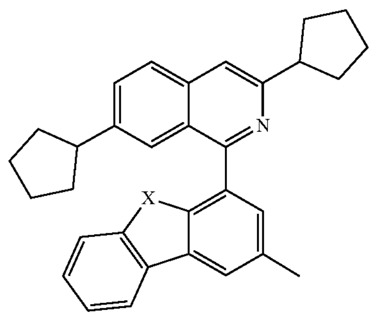

X = O La559
X = S La560
X = Se La561
X = $C(CH_3)_2$ La562
X = $NCH_3$ La563
X = N(i-Pr) La564

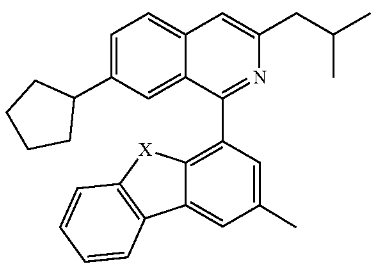

-continued

X = O La565
X = S La566
X = Se La567
X = $C(CH_3)_2$ La568
X = $NCH_3$ La569
X = N(i-Pr) La570

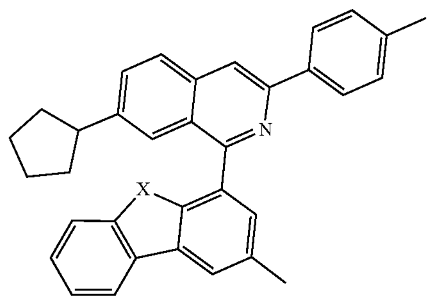

X = O La571
X = S La572
X = Se La573
X = $C(CH_3)_2$ La574
X = $NCH_3$ La575
X = N(i-Pr) La576

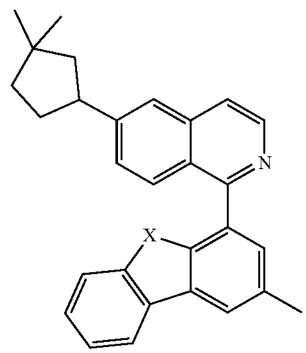

X = O La577
X = S La578
X = Se La579
X = $C(CH_3)_2$ La580
X = $NCH_3$ La581
X = N(i-Pr) La582

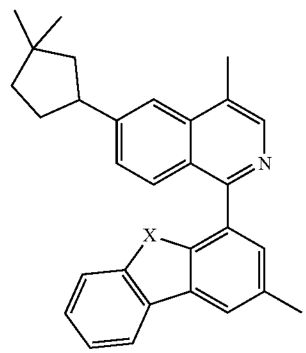

X = O La583
X = S La584
X = Se La585
X = $C(CH_3)_2$ La586
X = $NCH_3$ La587
X = N(i-Pr) La588

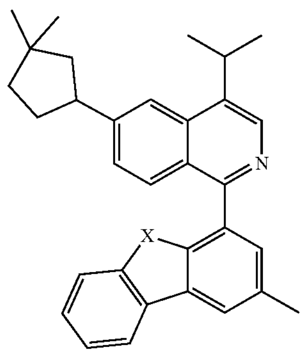
| | |
|---|---|
| X = O | La589 |
| X = S | La590 |
| X = Se | La591 |
| X = $C(CH_3)_2$ | La592 |
| X = $NCH_3$ | La593 |
| X = N(i-Pr) | La594 |
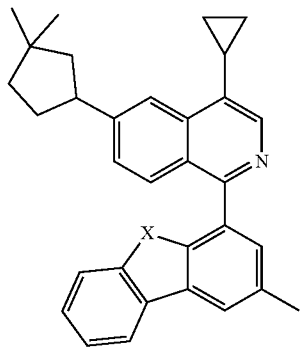
| | |
|---|---|
| X = O | La595 |
| X = S | La596 |
| X = Se | La597 |
| X = $C(CH_3)_2$ | La598 |
| X = $NCH_3$ | La599 |
| X = N(i-Pr) | La600 |
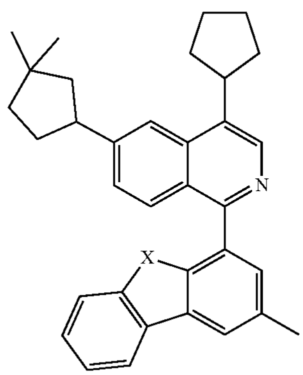
| | |
|---|---|
| X = O | La601 |
| X = S | La602 |
| X = Se | La603 |
| X = $C(CH_3)_2$ | La604 |
| X = $NCH_3$ | La605 |
| X = N(i-Pr) | La606 |
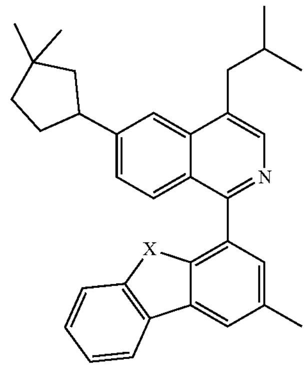
| | |
|---|---|
| X = O | La607 |
| X = S | La608 |
| X = Se | La609 |
| X = $C(CH_3)_2$ | La610 |
| X = $NCH_3$ | La611 |
| X = N(i-Pr) | La612 |
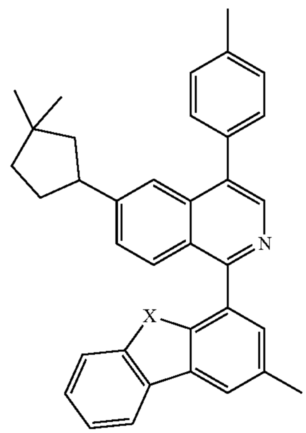
| | |
|---|---|
| X = O | La613 |
| X = S | La614 |
| X = Se | La615 |
| X = $C(CH_3)_2$ | La616 |
| X = $NCH_3$ | La617 |
| X = N(i-Pr) | La618 |
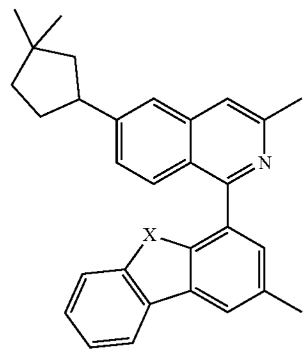
| | |
|---|---|
| X = O | La619 |
| X = S | La620 |
| X = Se | La621 |
| X = $C(CH_3)_2$ | La622 |
| X = $NCH_3$ | La623 |
| X = N(i-Pr) | La624 |

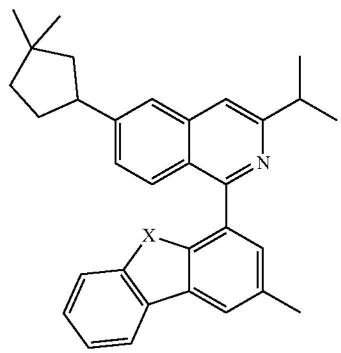
| | |
|---|---|
| X = O | La625 |
| X = S | La626 |
| X = Se | La627 |
| X = $C(CH_3)_2$ | La628 |
| X = $NCH_3$ | La629 |
| X = N(i-Pr) | La630 |
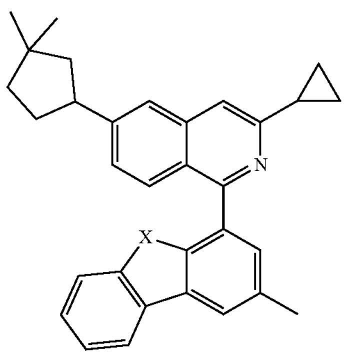
| | |
|---|---|
| X = O | La631 |
| X = S | La632 |
| X = Se | La633 |
| X = $C(CH_3)_2$ | La634 |
| X = $NCH_3$ | La635 |
| X = N(i-Pr) | La636 |
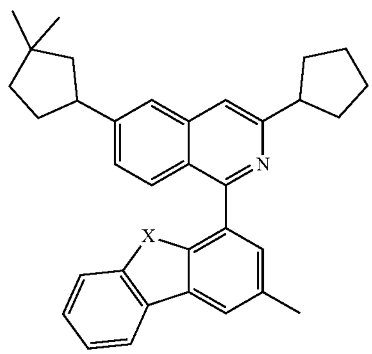
| | |
|---|---|
| X = O | La637 |
| X = S | La638 |
| X = Se | La639 |
| X = $C(CH_3)_2$ | La640 |
| X = $NCH_3$ | La641 |
| X = N(i-Pr) | La642 |
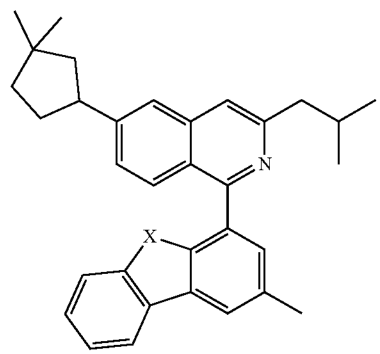
| | |
|---|---|
| X = O | La643 |
| X = S | La644 |
| X = Se | La645 |
| X = $C(CH_3)_2$ | La646 |
| X = $NCH_3$ | La647 |
| X = N(i-Pr) | La648 |
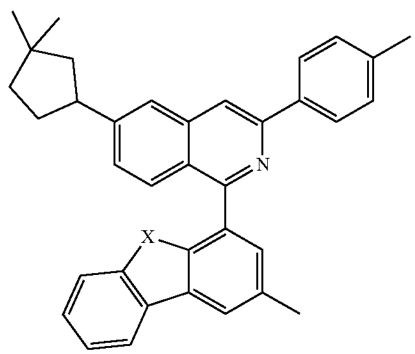
| | |
|---|---|
| X = O | La649 |
| X = S | La650 |
| X = Se | La651 |
| X = $C(CH_3)_2$ | La652 |
| X = $NCH_3$ | La653 |
| X = N(i-Pr) | La654 |
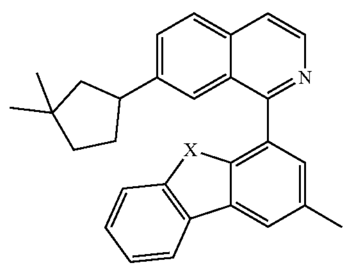
| | |
|---|---|
| X = O | La655 |
| X = S | La656 |
| X = Se | La657 |
| X = $C(CH_3)_2$ | La658 |
| X = $NCH_3$ | La659 |
| X = N(i-Pr) | La660 |

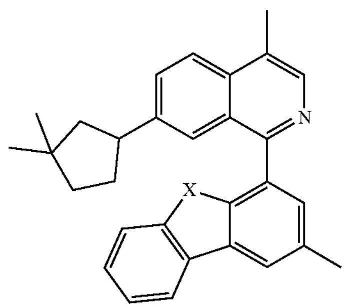
| | |
|---|---|
| X = O | La661 |
| X = S | La662 |
| X = Se | La663 |
| X = $C(CH_3)_2$ | La664 |
| X = $NCH_3$ | La665 |
| X = N(i-Pr) | La666 |
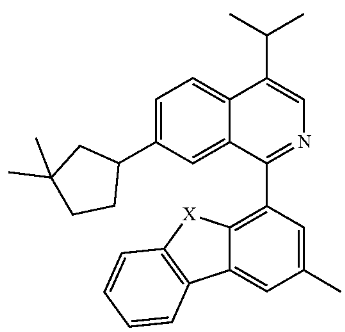
| | |
|---|---|
| X = O | La667 |
| X = S | La668 |
| X = Se | La669 |
| X = $C(CH_3)_2$ | La670 |
| X = $NCH_3$ | La671 |
| X = N(i-Pr) | La672 |
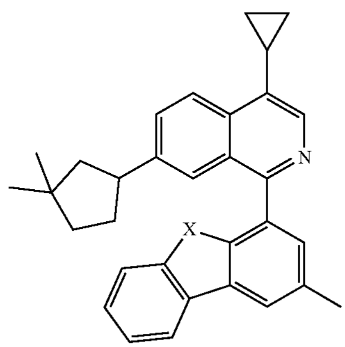
| | |
|---|---|
| X = O | La673 |
| X = S | La674 |
| X = Se | La675 |
| X = $C(CH_3)_2$ | La676 |
| X = $NCH_3$ | La677 |
| X = N(i-Pr) | La678 |
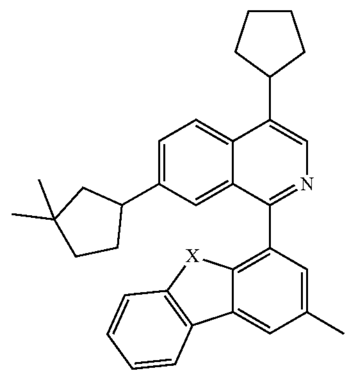
| | |
|---|---|
| X = O | La679 |
| X = S | La680 |
| X = Se | La681 |
| X = $C(CH_3)_2$ | La682 |
| X = $NCH_3$ | La683 |
| X = N(i-Pr) | La684 |
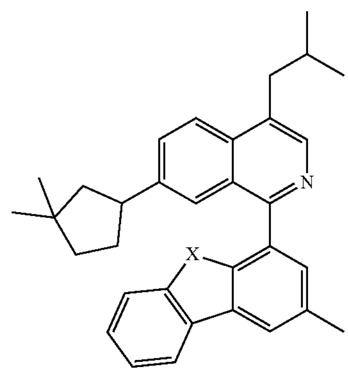
| | |
|---|---|
| X = O | La685 |
| X = S | La686 |
| X = Se | La687 |
| X = $C(CH_3)_2$ | La688 |
| X = $NCH_3$ | La689 |
| X = N(i-Pr) | La690 |
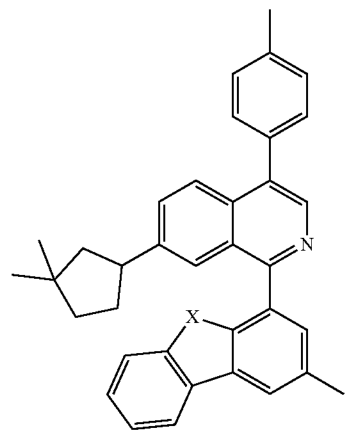
| | |
|---|---|
| X = O | La691 |
| X = S | La692 |
| X = Se | La693 |
| X = $C(CH_3)_2$ | La694 |
| X = $NCH_3$ | La695 |
| X = N(i-Pr) | La696 |

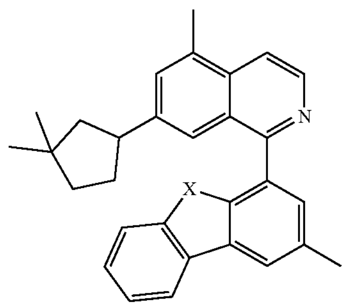
| | |
|---|---|
| X = O | La697 |
| X = S | La698 |
| X = Se | La699 |
| X = $C(CH_3)_2$ | La700 |
| X = $NCH_3$ | La701 |
| X = N(i-Pr) | La702 |
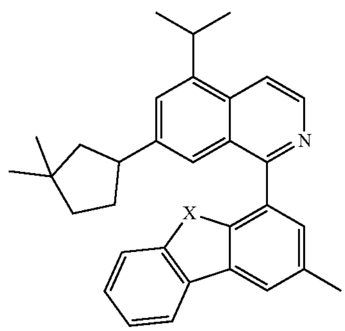
| | |
|---|---|
| X = O | La703 |
| X = S | La704 |
| X = Se | La705 |
| X = $C(CH_3)_2$ | La706 |
| X = $NCH_3$ | La707 |
| X = N(i-Pr) | La708 |
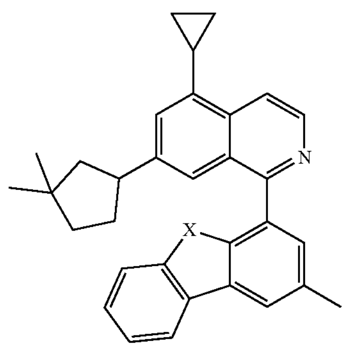
| | |
|---|---|
| X = O | La709 |
| X = S | La710 |
| X = Se | La711 |
| X = $C(CH_3)_2$ | La712 |
| X = $NCH_3$ | La713 |
| X = N(i-Pr) | La714 |
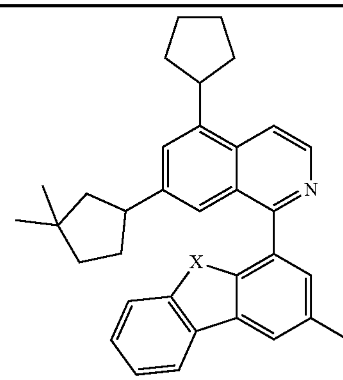
| | |
|---|---|
| X = O | La715 |
| X = S | La716 |
| X = Se | La717 |
| X = $C(CH_3)_2$ | La718 |
| X = $NCH_3$ | La719 |
| X = N(i-Pr) | La720 |
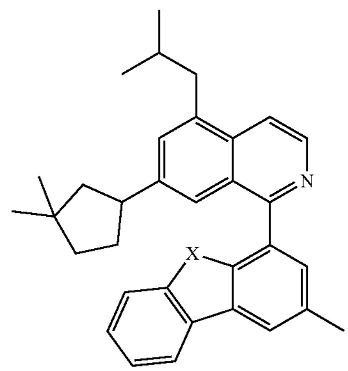
| | |
|---|---|
| X = O | La721 |
| X = S | La722 |
| X = Se | La723 |
| X = $C(CH_3)_2$ | La724 |
| X = $NCH_3$ | La725 |
| X = N(i-Pr) | La726 |
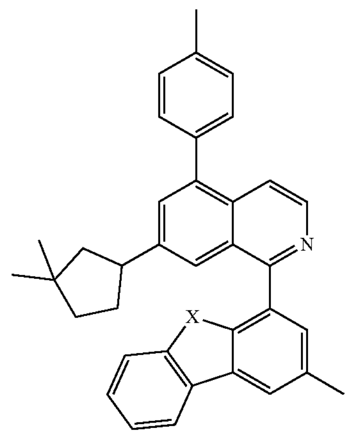
| | |
|---|---|
| X = O | La727 |
| X = S | La728 |
| X = Se | La729 |
| X = $C(CH_3)_2$ | La730 |
| X = $NCH_3$ | La731 |
| X = N(i-Pr) | La732 |

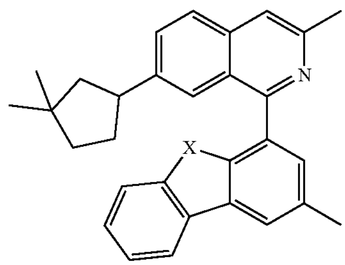
| X = O | La733 |
|---|---|
| X = S | La734 |
| X = Se | La735 |
| X = $C(CH_3)_2$ | La736 |
| X = $NCH_3$ | La737 |
| X = N(i-Pr) | La738 |
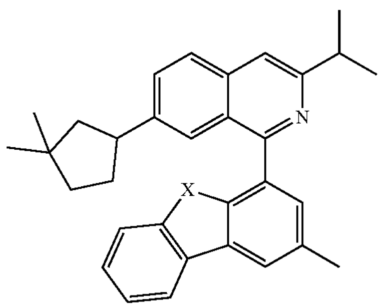
| X = O | La739 |
|---|---|
| X = S | La740 |
| X = Se | La741 |
| X = $C(CH_3)_2$ | La742 |
| X = $NCH_3$ | La743 |
| X = N(i-Pr) | La744 |
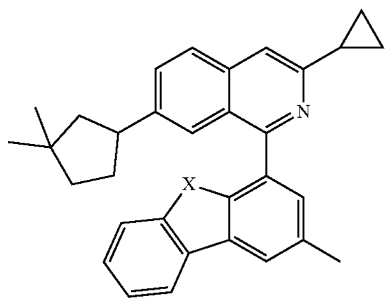
| X = O | La745 |
|---|---|
| X = S | La746 |
| X = Se | La747 |
| X = $C(CH_3)_2$ | La748 |
| X = $NCH_3$ | La749 |
| X = N(i-Pr) | La750 |
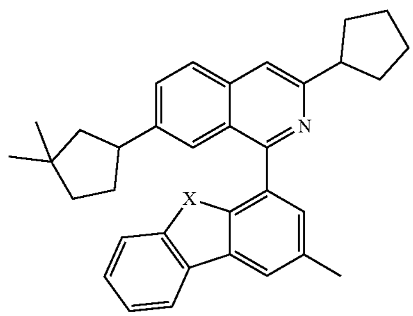
| X = O | La751 |
|---|---|
| X = S | La752 |
| X = Se | La753 |
| X = $C(CH_3)_2$ | La754 |
| X = $NCH_3$ | La755 |
| X = N(i-Pr) | La756 |
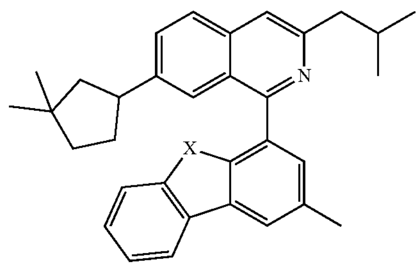
| X = O | La757 |
|---|---|
| X = S | La758 |
| X = Se | La759 |
| X = $C(CH_3)_2$ | La760 |
| X = $NCH_3$ | La761 |
| X = N(i-Pr) | La762 |
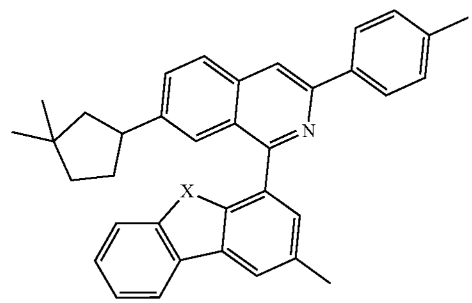
| X = O | La763 |
|---|---|
| X = S | La764 |
| X = Se | La765 |
| X = $C(CH_3)_2$ | La766 |
| X = $NCH_3$ | La767 |
| X = N(i-Pr) | La768 |
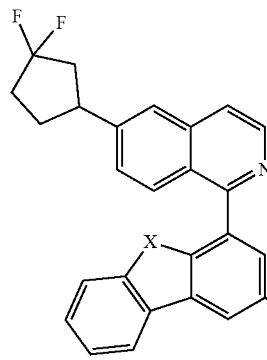
| X = O | La769 |
|---|---|
| X = S | La770 |
| X = Se | La771 |
| X = $C(CH_3)_2$ | La772 |
| X = $NCH_3$ | La773 |
| X = N(i-Pr) | La774 |

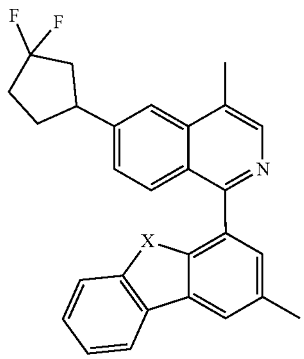
| | |
|---|---|
| X = O | La775 |
| X = S | La776 |
| X = Se | La777 |
| X = $C(CH_3)_2$ | La778 |
| X = $NCH_3$ | La779 |
| X = N(i-Pr) | La780 |
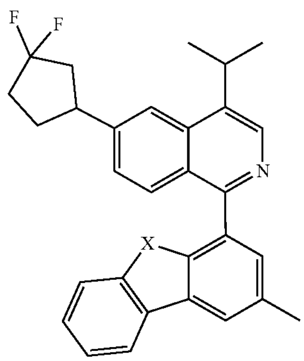
| | |
|---|---|
| X = O | La781 |
| X = S | La782 |
| X = Se | La783 |
| X = $C(CH_3)_2$ | La784 |
| X = $NCH_3$ | La785 |
| X = N(i-Pr) | La786 |
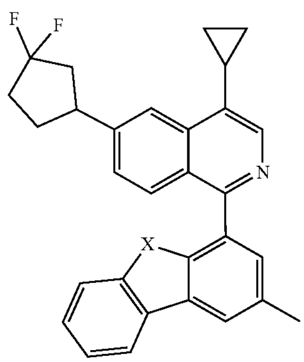
| | |
|---|---|
| X = O | La787 |
| X = S | La788 |
| X = Se | La789 |
| X = $C(CH_3)_2$ | La790 |
| X = $NCH_3$ | La791 |
| X = N(i-Pr) | La792 |
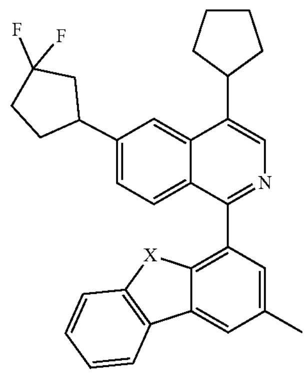
| | |
|---|---|
| X = O | La793 |
| X = S | La794 |
| X = Se | La795 |
| X = $C(CH_3)_2$ | La796 |
| X = $NCH_3$ | La797 |
| X = N(i-Pr) | La798 |
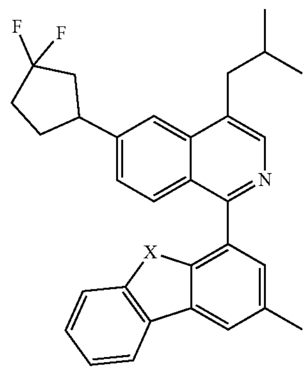
| | |
|---|---|
| X = O | La799 |
| X = S | La800 |
| X = Se | La801 |
| X = $C(CH_3)_2$ | La802 |
| X = $NCH_3$ | La803 |
| X = N(i-Pr) | La804 |
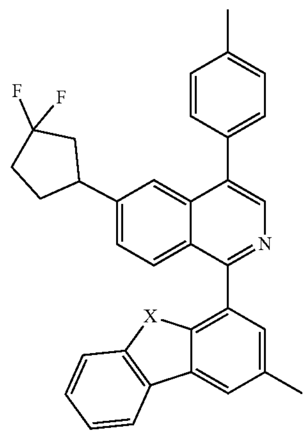
| | |
|---|---|
| X = O | La805 |
| X = S | La806 |
| X = Se | La807 |
| X = $C(CH_3)_2$ | La808 |
| X = $NCH_3$ | La809 |
| X = N(i-Pr) | La810 |

-continued
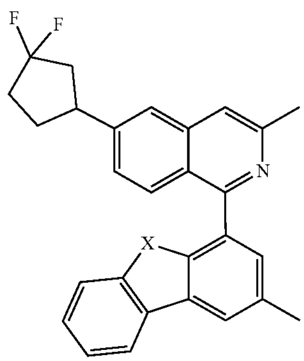
| | |
|---|---|
| X = O | La811 |
| X = S | La812 |
| X = Se | La813 |
| X = $C(CH_3)_2$ | La814 |
| X = $NCH_3$ | La815 |
| X = N(i-Pr) | La816 |
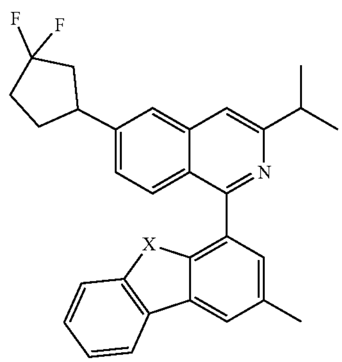
| | |
|---|---|
| X = O | La817 |
| X = S | La818 |
| X = Se | La819 |
| X = $C(CH_3)_2$ | La820 |
| X = $NCH_3$ | La821 |
| X = N(i-Pr) | La822 |
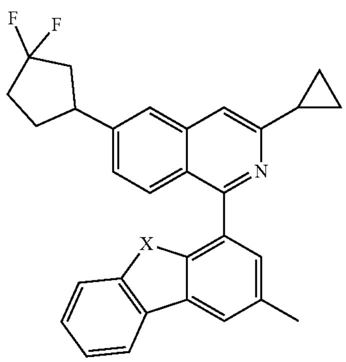
| | |
|---|---|
| X = O | La823 |
| X = S | La824 |
| X = Se | La825 |
| X = $C(CH_3)_2$ | La826 |
| X = $NCH_3$ | La827 |
| X = N(i-Pr) | La828 |
-continued
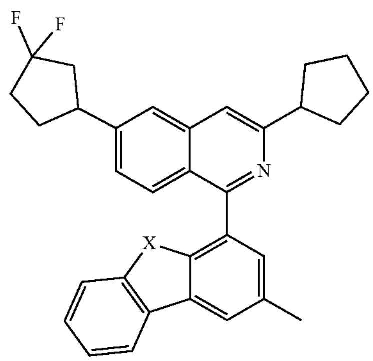
| | |
|---|---|
| X = O | La829 |
| X = S | La830 |
| X = Se | La831 |
| X = $C(CH_3)_2$ | La832 |
| X = $NCH_3$ | La833 |
| X = N(i-Pr) | La834 |
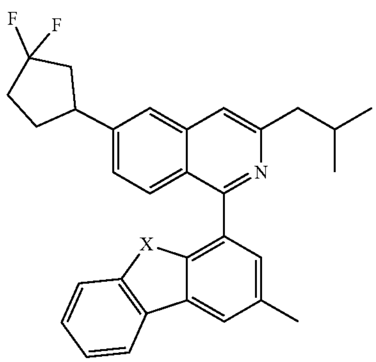
| | |
|---|---|
| X = O | La835 |
| X = S | La836 |
| X = Se | La837 |
| X = $C(CH_3)_2$ | La838 |
| X = $NCH_3$ | La839 |
| X = N(i-Pr) | La840 |
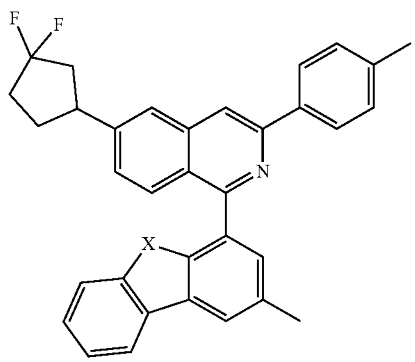
| | |
|---|---|
| X = O | La841 |
| X = S | La842 |
| X = Se | La843 |
| X = $C(CH_3)_2$ | La844 |
| X = $NCH_3$ | La845 |
| X = N(i-Pr) | La846 |

-continued
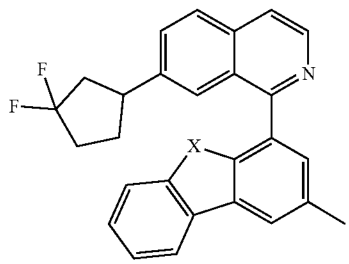
| | |
|---|---|
| X = O | La847 |
| X = S | La848 |
| X = Se | La849 |
| X = $C(CH_3)_2$ | La850 |
| X = $NCH_3$ | La851 |
| X = N(i-Pr) | La852 |
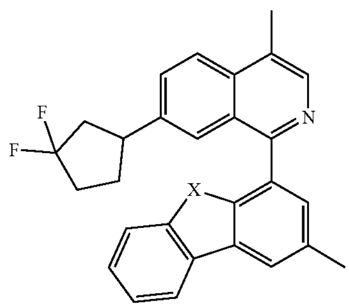
| | |
|---|---|
| X = O | La853 |
| X = S | La854 |
| X = Se | La855 |
| X = $C(CH_3)_2$ | La856 |
| X = $NCH_3$ | La857 |
| X = N(i-Pr) | La858 |
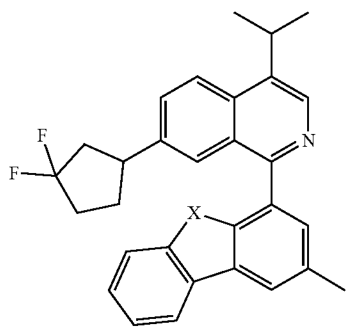
| | |
|---|---|
| X = O | La859 |
| X = S | La860 |
| X = Se | La861 |
| X = $C(CH_3)_2$ | La862 |
| X = $NCH_3$ | La863 |
| X = N(i-Pr) | La864 |
-continued
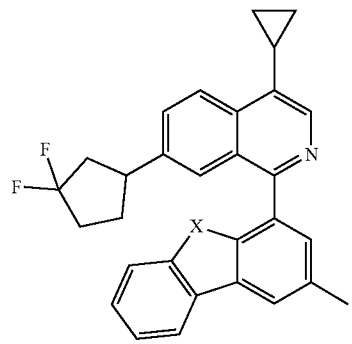
| | |
|---|---|
| X = O | La865 |
| X = S | La866 |
| X = Se | La867 |
| X = $C(CH_3)_2$ | La868 |
| X = $NCH_3$ | La869 |
| X = N(i-Pr) | La870 |
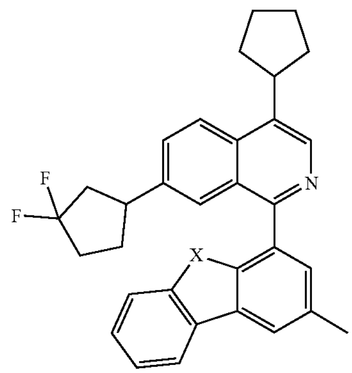
| | |
|---|---|
| X = O | La871 |
| X = S | La872 |
| X = Se | La873 |
| X = $C(CH_3)_2$ | La874 |
| X = $NCH_3$ | La875 |
| X = N(i-Pr) | La876 |
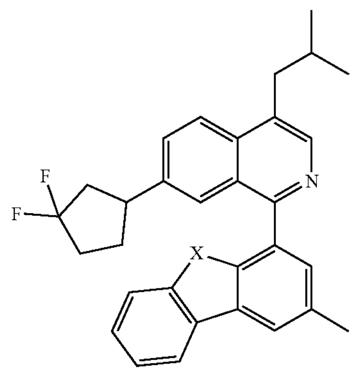
| | |
|---|---|
| X = O | La877 |
| X = S | La878 |
| X = Se | La879 |
| X = $C(CH_3)_2$ | La880 |
| X = $NCH_3$ | La881 |
| X = N(i-Pr) | La882 |

-continued
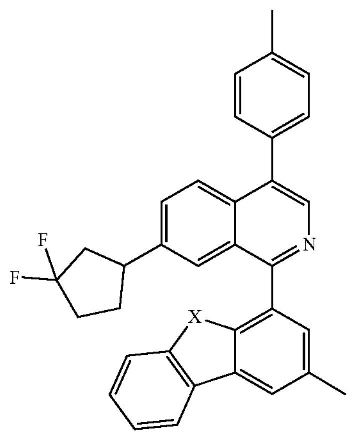
| | |
|---|---|
| X = O | La883 |
| X = S | La884 |
| X = Se | La885 |
| X = $C(CH_3)_2$ | La886 |
| X = $NCH_3$ | La887 |
| X = N(i-Pr) | La888 |
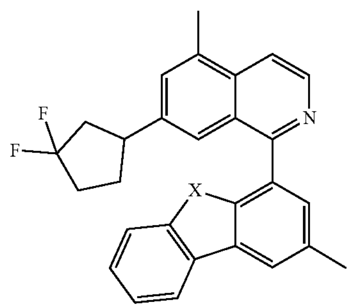
| | |
|---|---|
| X = O | La889 |
| X = S | La890 |
| X = Se | La891 |
| X = $C(CH_3)_2$ | La892 |
| X = $NCH_3$ | La893 |
| X = N(i-Pr) | La894 |
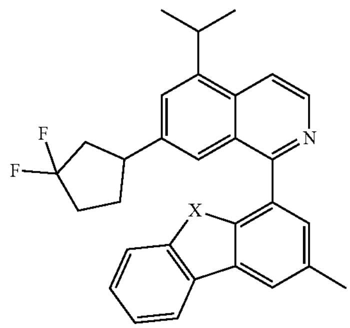
| | |
|---|---|
| X = O | La895 |
| X = S | La896 |
| X = Se | La897 |
| X = $C(CH_3)_2$ | La898 |
| X = $NCH_3$ | La899 |
| X = N(i-Pr) | La900 |
-continued
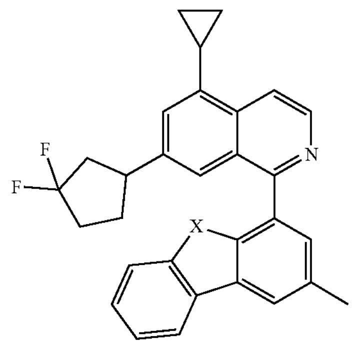
| | |
|---|---|
| X = O | La901 |
| X = S | La902 |
| X = Se | La903 |
| X = $C(CH_3)_2$ | La904 |
| X = $NCH_3$ | La905 |
| X = N(i-Pr) | La906 |
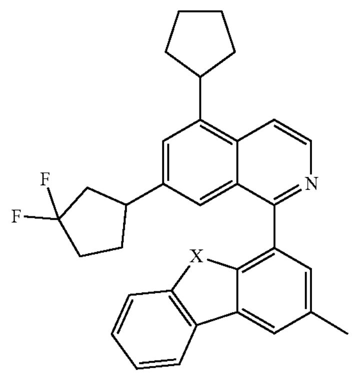
| | |
|---|---|
| X = O | La907 |
| X = S | La908 |
| X = Se | La909 |
| X = $C(CH_3)_2$ | La910 |
| X = $NCH_3$ | La911 |
| X = N(i-Pr) | La912 |
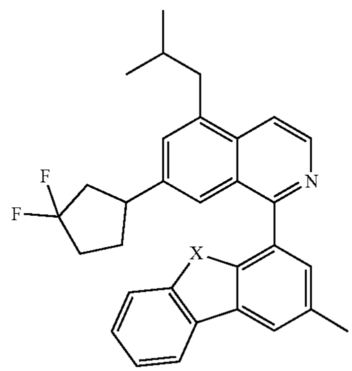
| | |
|---|---|
| X = O | La913 |
| X = S | La914 |
| X = Se | La915 |
| X = $C(CH_3)_2$ | La916 |
| X = $NCH_3$ | La917 |
| X = N(i-Pr) | La918 |

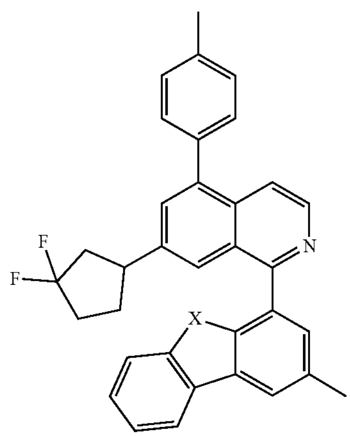
| | |
|---|---|
| X = O | La919 |
| X = S | La920 |
| X = Se | La921 |
| X = $C(CH_3)_2$ | La922 |
| X = $NCH_3$ | La923 |
| X = N(i-Pr) | La924 |
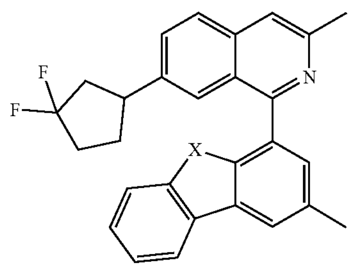
| | |
|---|---|
| X = O | La925 |
| X = S | La926 |
| X = Se | La927 |
| X = $C(CH_3)_2$ | La928 |
| X = $NCH_3$ | La929 |
| X = N(i-Pr) | La930 |
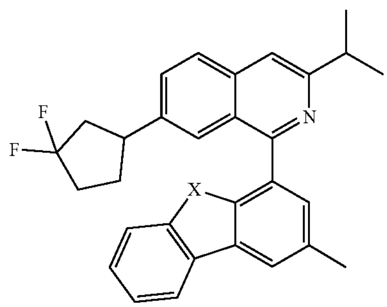
| | |
|---|---|
| X = O | La931 |
| X = S | La932 |
| X = Se | La933 |
| X = $C(CH_3)_2$ | La934 |
| X = $NCH_3$ | La935 |
| X = N(i-Pr) | La936 |
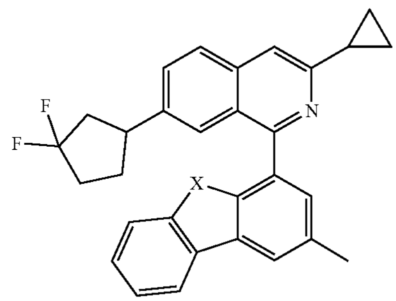
| | |
|---|---|
| X = O | La937 |
| X = S | La938 |
| X = Se | La939 |
| X = $C(CH_3)_2$ | La940 |
| X = $NCH_3$ | La941 |
| X = N(i-Pr) | La942 |
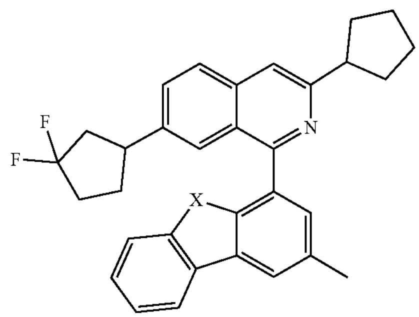
| | |
|---|---|
| X = O | La943 |
| X = S | La944 |
| X = Se | La945 |
| X = $C(CH_3)_2$ | La946 |
| X = $NCH_3$ | La947 |
| X = N(i-Pr) | La948 |
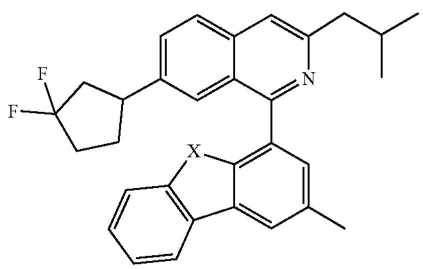
| | |
|---|---|
| X = O | La949 |
| X = S | La950 |
| X = Se | La951 |
| X = $C(CH_3)_2$ | La952 |
| X = $NCH_3$ | La953 |
| X = N(i-Pr) | La954 |
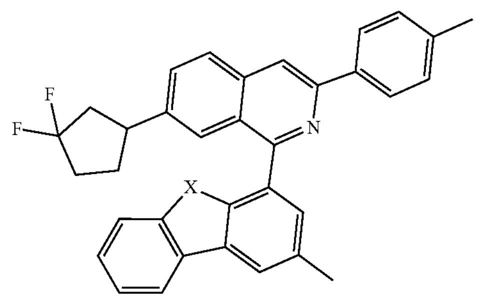

-continued

| | |
|---|---|
| X = O | La955 |
| X = S | La956 |
| X = Se | La957 |
| X = $C(CH_3)_2$ | La958 |
| X = $NCH_3$ | La959 |
| X = N(i-Pr) | La960 |

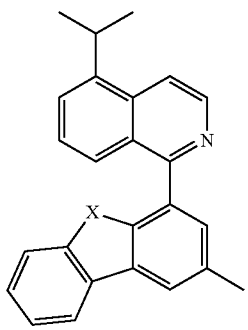

| | |
|---|---|
| X = O | La961 |
| X = S | La962 |
| X = Se | La963 |
| X = $C(CH_3)_2$ | La964 |
| X = $NCH_3$ | La965 |
| X = N(i-Pr) | La966 |

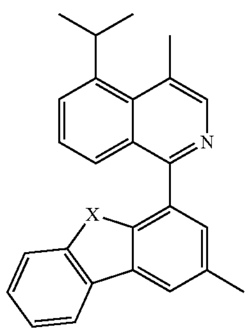

| | |
|---|---|
| X = O | La967 |
| X = S | La968 |
| X = Se | La969 |
| X = $C(CH_3)_2$ | La970 |
| X = $NCH_3$ | La971 |
| X = N(i-Pr) | La972 |

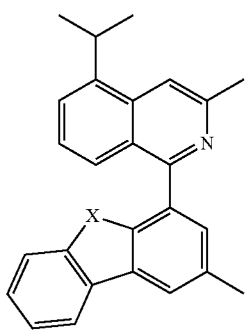

| | |
|---|---|
| X = O | La973 |
| X = S | La974 |
| X = Se | La975 |
| X = $C(CH_3)_2$ | La976 |
| X = $NCH_3$ | La977 |
| X = N(i-Pr) | La978 |

-continued

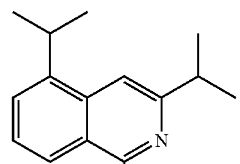
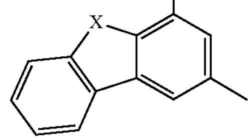

| | |
|---|---|
| X = O | La979 |
| X = S | La980 |
| X = Se | La981 |
| X = $C(CH_3)_2$ | La982 |
| X = $NCH_3$ | La983 |
| X = N(i-Pr) | La984 |

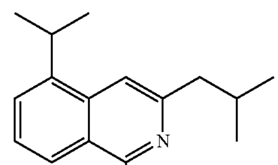
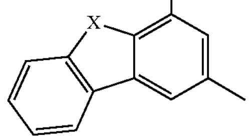

| | |
|---|---|
| X = O | La985 |
| X = S | La986 |
| X = Se | La987 |
| X = $C(CH_3)_2$ | La988 |
| X = $NCH_3$ | La989 |
| X = N(i-Pr) | La990 |

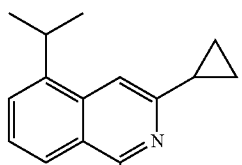
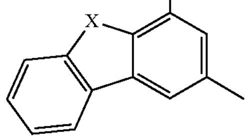

| | |
|---|---|
| X = O | La991 |
| X = S | La992 |
| X = Se | La993 |
| X = $C(CH_3)_2$ | La994 |
| X = $NCH_3$ | La995 |
| X = N(i-Pr) | La996 |

-continued
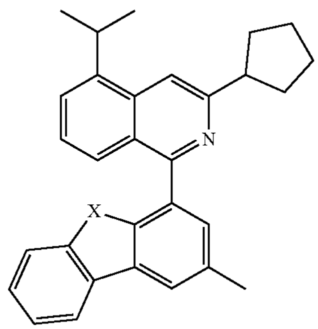
| | |
|---|---|
| X = O | La997 |
| X = S | La998 |
| X = Se | La999 |
| X = $C(CH_3)_2$ | La1000 |
| X = $NCH_3$ | La1001 |
| X = N(i-Pr) | La1002 |
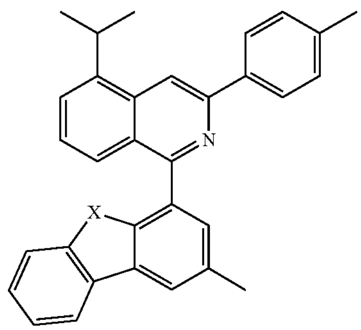
| | |
|---|---|
| X = O | La1003 |
| X = S | La1004 |
| X = Se | La1005 |
| X = $C(CH_3)_2$ | La1006 |
| X = $NCH_3$ | La1007 |
| X = N(i-Pr) | La1008 |
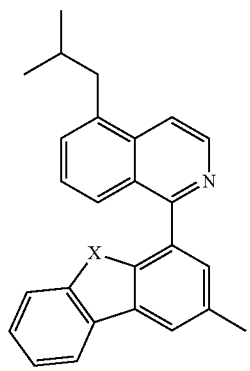
| | |
|---|---|
| X = O | La1009 |
| X = S | La1010 |
| X = Se | La1011 |
| X = $C(CH_3)_2$ | La1012 |
| X = $NCH_3$ | La1013 |
| X = N(i-Pr) | La1014 |
-continued
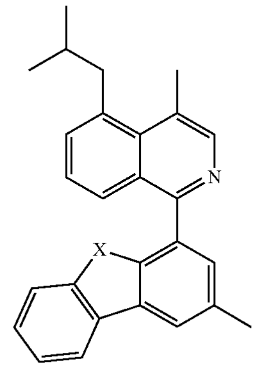
| | |
|---|---|
| X = O | La1015 |
| X = S | La1016 |
| X = Se | La1017 |
| X = $C(CH_3)_2$ | La1018 |
| X = $NCH_3$ | La1019 |
| X = N(i-Pr) | La1020 |
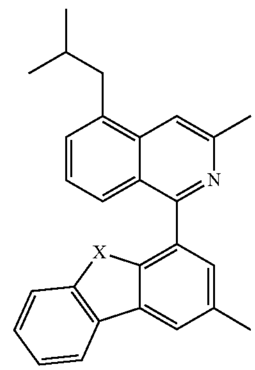
| | |
|---|---|
| X = O | La1021 |
| X = S | La1022 |
| X = Se | La1023 |
| X = $C(CH_3)_2$ | La1024 |
| X = $NCH_3$ | La1025 |
| X = N(i-Pr) | La1026 |
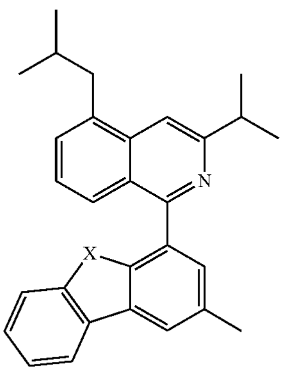
| | |
|---|---|
| X = O | La1027 |
| X = S | La1028 |
| X = Se | La1029 |
| X = $C(CH_3)_2$ | La1030 |
| X = $NCH_3$ | La1031 |
| X = N(i-Pr) | La1032 |

-continued
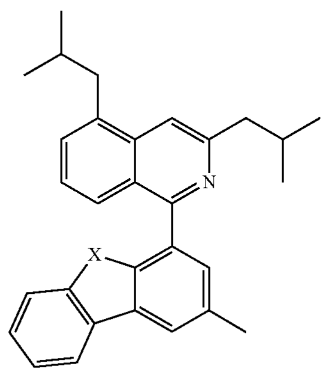
| | |
|---|---|
| X = O | La1033 |
| X = S | La1034 |
| X = Se | La1035 |
| X = $C(CH_3)_2$ | La1038 |
| X = $NCH_3$ | La1037 |
| X = N(i-Pr) | La1038 |
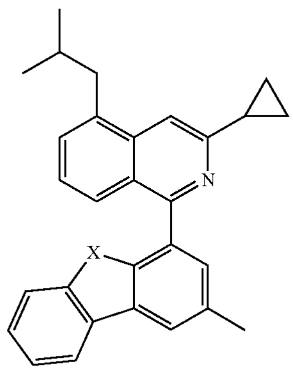
| | |
|---|---|
| X = O | La1039 |
| X = S | La1040 |
| X = Se | La1041 |
| X = $C(CH_3)_2$ | La1042 |
| X = $NCH_3$ | La1043 |
| X = N(i-Pr) | La1044 |
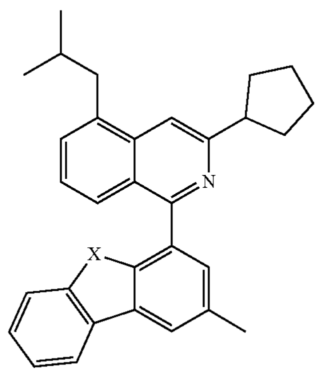
| | |
|---|---|
| X = O | La1045 |
| X = S | La1046 |
| X = Se | La1047 |
| X = $C(CH_3)_2$ | La1048 |
| X = $NCH_3$ | La1049 |
| X = N(i-Pr) | La1050 |
-continued
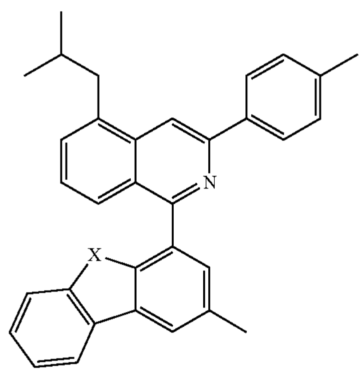
| | |
|---|---|
| X = O | La1051 |
| X = S | La1052 |
| X = Se | La1053 |
| X = $C(CH_3)_2$ | La1054 |
| X = $NCH_3$ | La1055 |
| X = N(i-Pr) | La1056 |
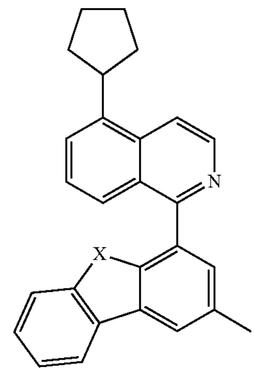
| | |
|---|---|
| X = O | La1057 |
| X = S | La1058 |
| X = Se | La1059 |
| X = $C(CH_3)_2$ | La1060 |
| X = $NCH_3$ | La1061 |
| X = N(i-Pr) | La1062 |
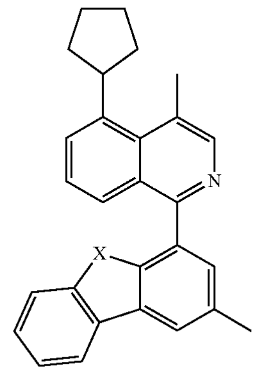
| | |
|---|---|
| X = O | La1063 |
| X = S | La1064 |
| X = Se | La1065 |
| X = $C(CH_3)_2$ | La1066 |
| X = $NCH_3$ | La1067 |
| X = N(i-Pr) | La1068 |

-continued
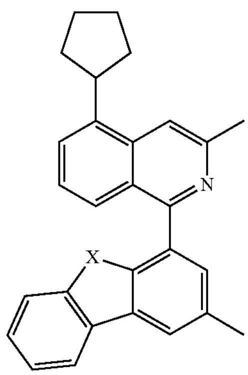
| | |
|---|---|
| X = O | La1069 |
| X = S | La1070 |
| X = Se | La1071 |
| X = $C(CH_3)_2$ | La1072 |
| X = $NCH_3$ | La1073 |
| X = N(i-Pr) | La1074 |
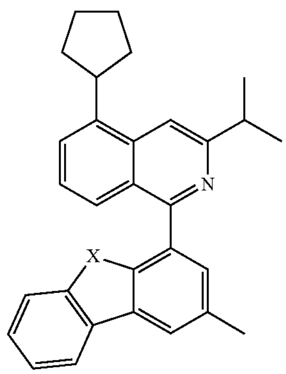
| | |
|---|---|
| X = O | La1075 |
| X = S | La1076 |
| X = Se | La1077 |
| X = $C(CH_3)_2$ | La1078 |
| X = $NCH_3$ | La1079 |
| X = N(i-Pr) | La1080 |
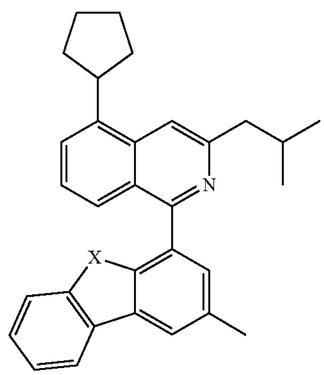
| | |
|---|---|
| X = O | La1081 |
| X = S | La1082 |
| X = Se | La1083 |
| X = $C(CH_3)_2$ | La1084 |
| X = $NCH_3$ | La1085 |
| X = N(i-Pr) | La1086 |
-continued
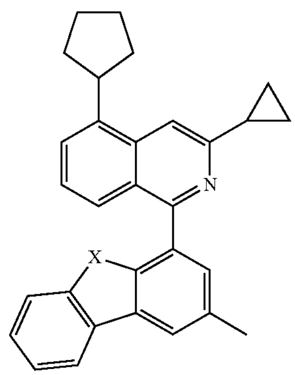
| | |
|---|---|
| X = O | La1087 |
| X = S | La1088 |
| X = Se | La1089 |
| X = $C(CH_3)_2$ | La1090 |
| X = $NCH_3$ | La1091 |
| X = N(i-Pr) | La1092 |
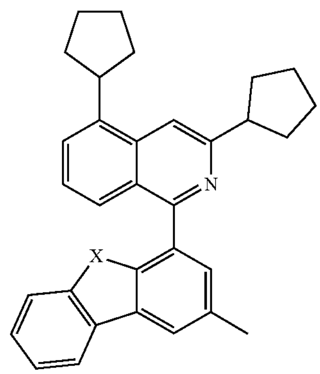
| | |
|---|---|
| X = O | La1093 |
| X = S | La1094 |
| X = Se | La1095 |
| X = $C(CH_3)_2$ | La1096 |
| X = $NCH_3$ | La1097 |
| X = N(i-Pr) | La1098 |
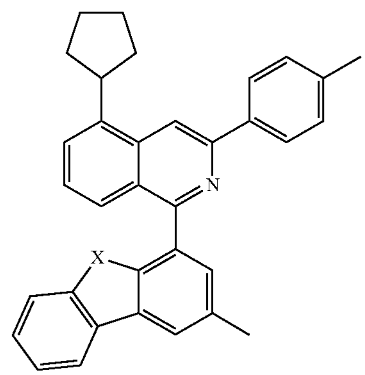
| | |
|---|---|
| X = O | La1099 |
| X = S | La1100 |
| X = Se | La1101 |
| X = $C(CH_3)_2$ | La1102 |
| X = $NCH_3$ | La1103 |
| X = N(i-Pr) | La1104 |

-continued
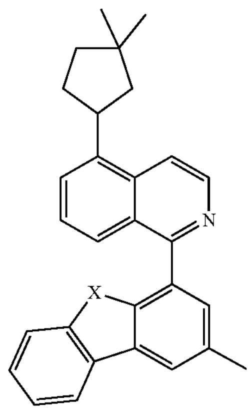
| | |
|---|---|
| X = O | La1105 |
| X = S | La1106 |
| X = Se | La1107 |
| X = $C(CH_3)_2$ | La1108 |
| X = $NCH_3$ | La1109 |
| X = N(i-Pr) | La1110 |
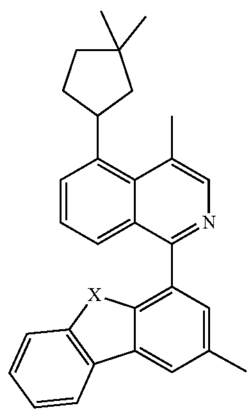
| | |
|---|---|
| X = O | La1111 |
| X = S | La1112 |
| X = Se | La1113 |
| X = $C(CH_3)_2$ | La1114 |
| X = $NCH_3$ | La1115 |
| X = N(i-Pr) | La1116 |
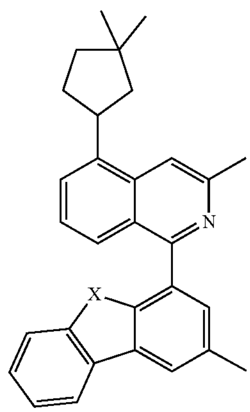
-continued
| | |
|---|---|
| X = O | La1117 |
| X = S | La1118 |
| X = Se | La1119 |
| X = $C(CH_3)_2$ | La1120 |
| X = $NCH_3$ | La1121 |
| X = N(i-Pr) | La1122 |
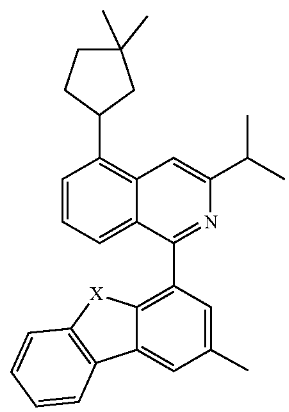
| | |
|---|---|
| X = O | La1123 |
| X = S | La1124 |
| X = Se | La1125 |
| X = $C(CH_3)_2$ | La1126 |
| X = $NCH_3$ | La1127 |
| X = N(i-Pr) | La1128 |
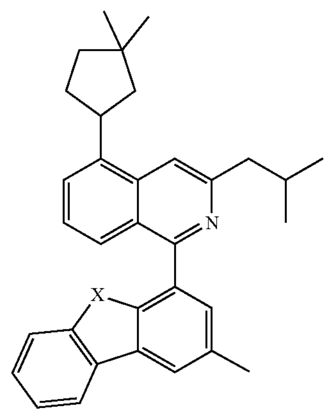
| | |
|---|---|
| X = O | La1129 |
| X = S | La1130 |
| X = Se | La1131 |
| X = $C(CH_3)_2$ | La1132 |
| X = $NCH_3$ | La1133 |
| X = N(i-Pr) | La1134 |

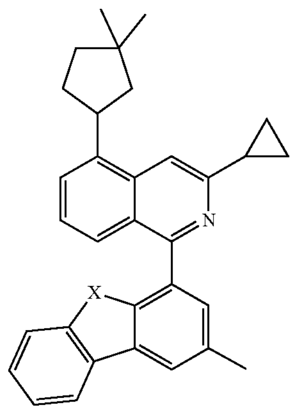
| | |
|---|---|
| X = O | La1135 |
| X = S | La1136 |
| X = Se | La1137 |
| X = $C(CH_3)_2$ | La1138 |
| X = $NCH_3$ | La1139 |
| X = N(i-Pr) | La1140 |
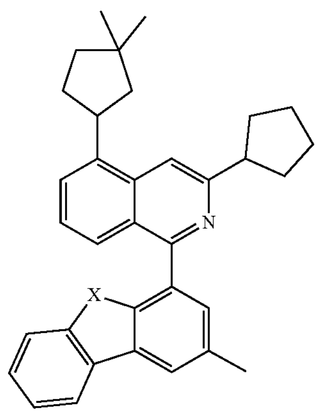
| | |
|---|---|
| X = O | La1141 |
| X = S | La1142 |
| X = Se | La1143 |
| X = $C(CH_3)_2$ | La1144 |
| X = $NCH_3$ | La1145 |
| X = N(i-Pr) | La1146 |
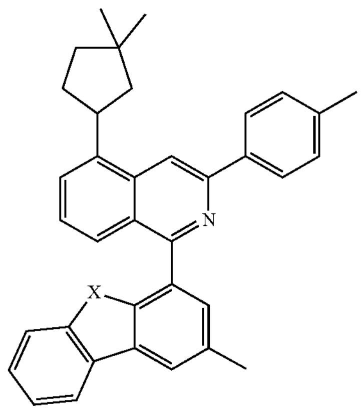
| | |
|---|---|
| X = O | La1147 |
| X = S | La1148 |
| X = Se | La1149 |
| X = $C(CH_3)_2$ | La1150 |
| X = $NCH_3$ | La1151 |
| X = N(i-Pr) | La1152 |
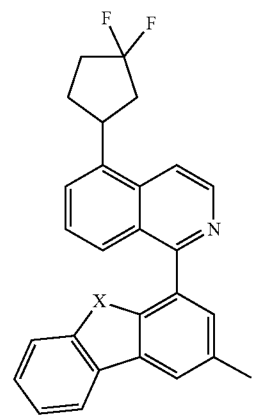
| | |
|---|---|
| X = O | La1153 |
| X = S | La1154 |
| X = Se | La1155 |
| X = $C(CH_3)_2$ | La1156 |
| X = $NCH_3$ | La1157 |
| X = N(i-Pr) | La1158 |
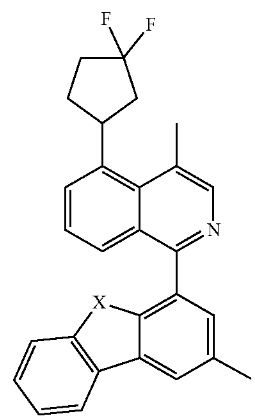
| | |
|---|---|
| X = O | La1159 |
| X = S | La1160 |
| X = Se | La1161 |
| X = $C(CH_3)_2$ | La1162 |
| X = $NCH_3$ | La1163 |
| X = N(i-Pr) | La1164 |

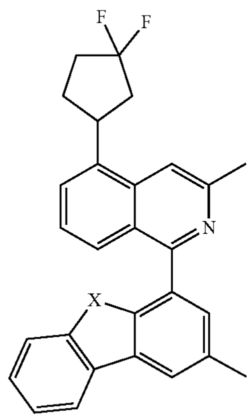
| | |
|---|---|
| X = O | La1165 |
| X = S | La1166 |
| X = Se | La1167 |
| X = $C(CH_3)_2$ | La1168 |
| X = $NCH_3$ | La1169 |
| X = N(i-Pr) | La1170 |
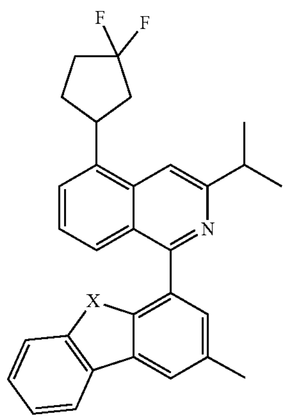
| | |
|---|---|
| X = O | La1171 |
| X = S | La1172 |
| X = Se | La1173 |
| X = $C(CH_3)_2$ | La1174 |
| X = $NCH_3$ | La1175 |
| X = N(i-Pr) | La1176 |
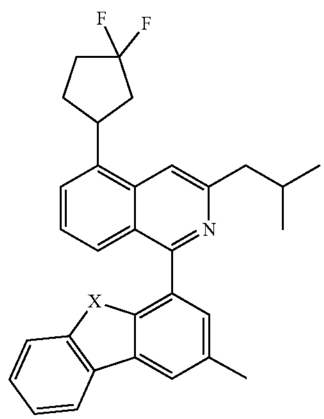
-continued
| | |
|---|---|
| X = O | La1177 |
| X = S | La1178 |
| X = Se | La1179 |
| X = $C(CH_3)_2$ | La1180 |
| X = $NCH_3$ | La1181 |
| X = N(i-Pr) | La1182 |
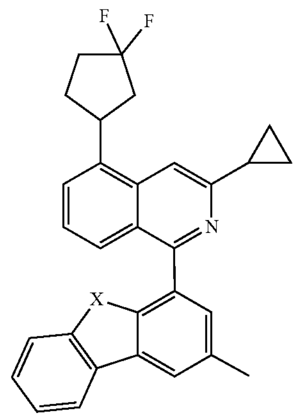
| | |
|---|---|
| X = O | La1183 |
| X = S | La1184 |
| X = Se | La1185 |
| X = $C(CH_3)_2$ | La1186 |
| X = $NCH_3$ | La1187 |
| X = N(i-Pr) | La1188 |
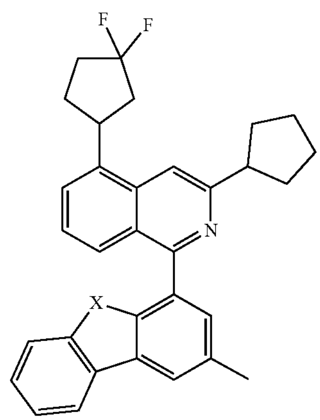
| | |
|---|---|
| X = O | La1189 |
| X = S | La1190 |
| X = Se | La1191 |
| X = $C(CH_3)_2$ | La1192 |
| X = $NCH_3$ | La1193 |
| X = N(i-Pr) | La1194 |

-continued
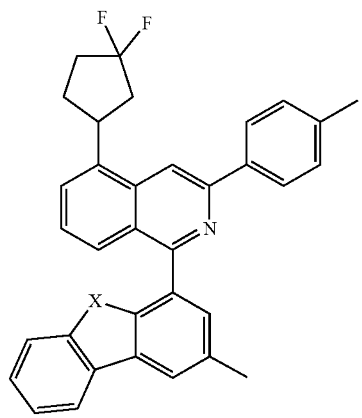
| | |
|---|---|
| X = O | La1195 |
| X = S | La1196 |
| X = Se | La1197 |
| X = $C(CH_3)_2$ | La1198 |
| X = $NCH_3$ | La1199 |
| X = N(i-Pr) | La1200 |
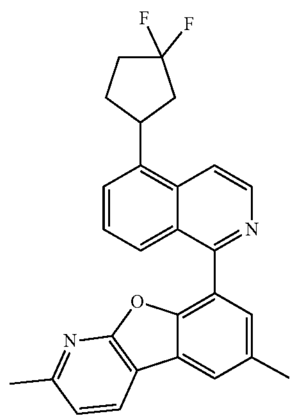
La1201
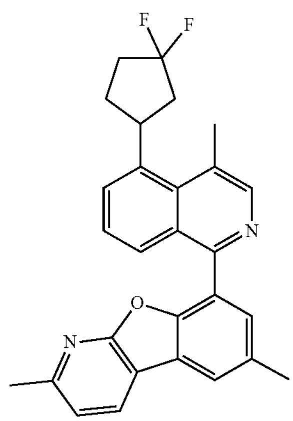
La1202
-continued
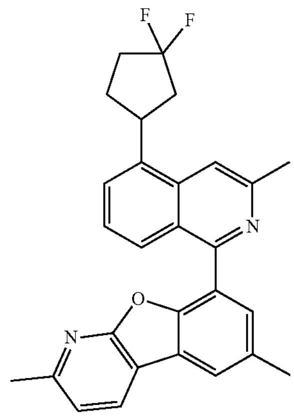
La1203
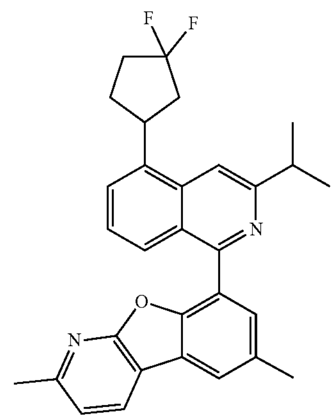
La1204
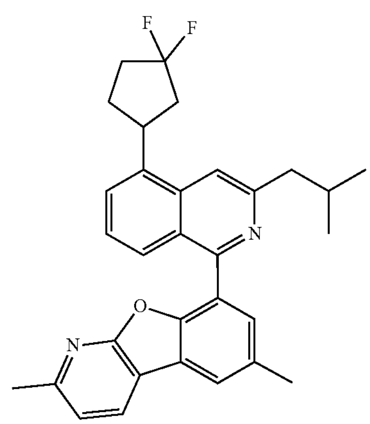
La1205

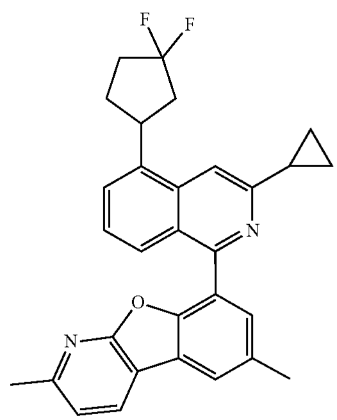
La1206
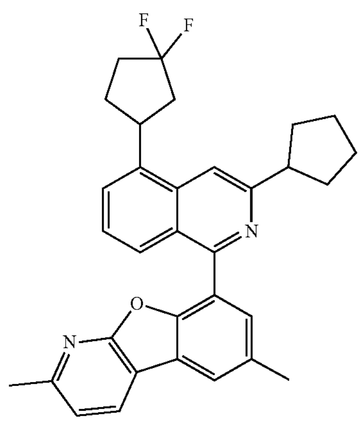
La1207
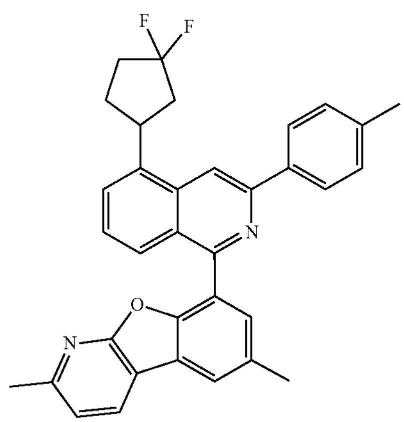
La1208
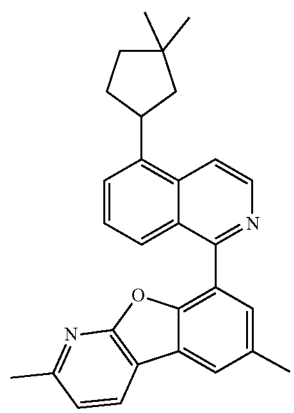
La1209
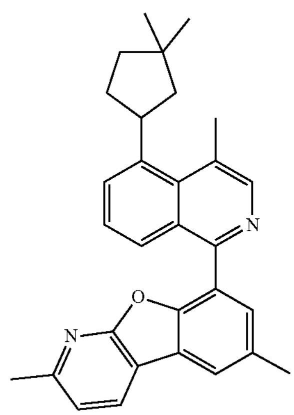
La1210
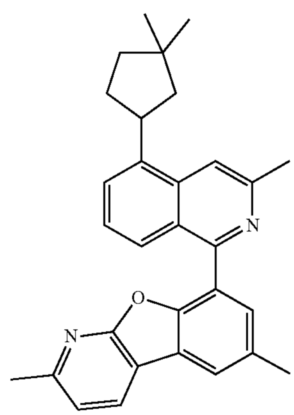
La1211

-continued
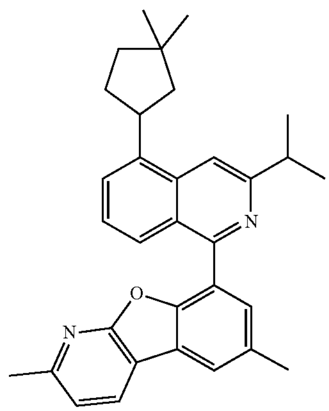
La1212
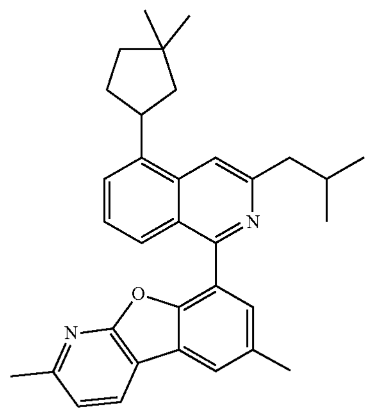
La1213
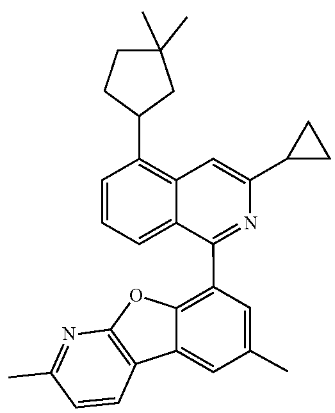
La1214
-continued
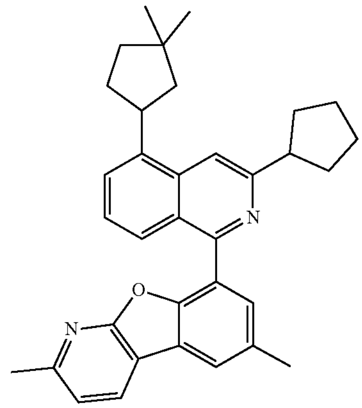
La1215
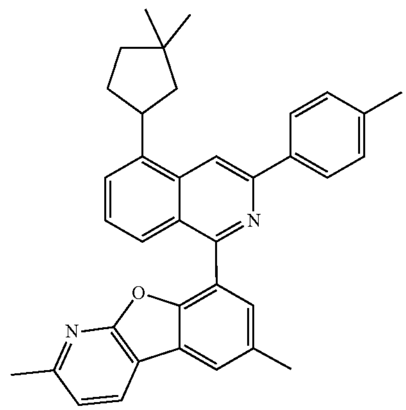
La1216
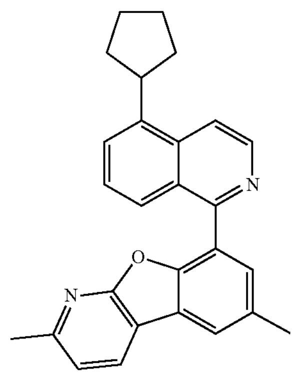
La1217

-continued
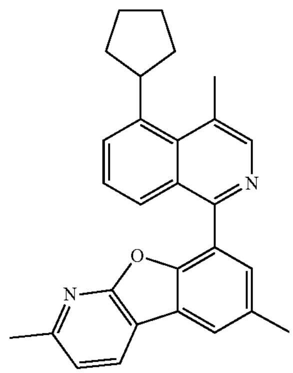
La1218
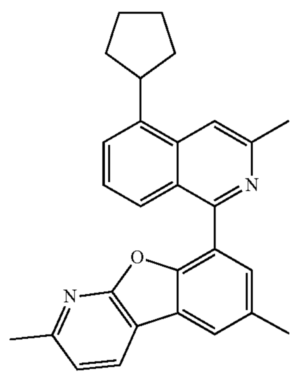
La1219
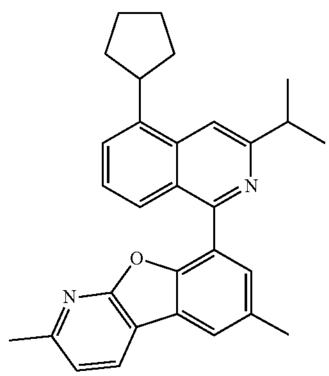
La1220
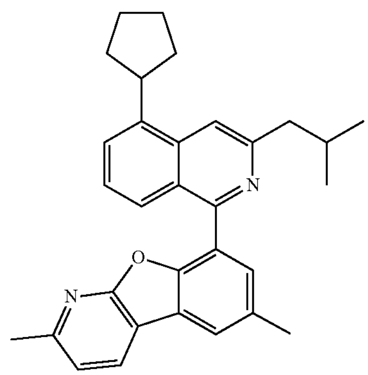
La1221
-continued
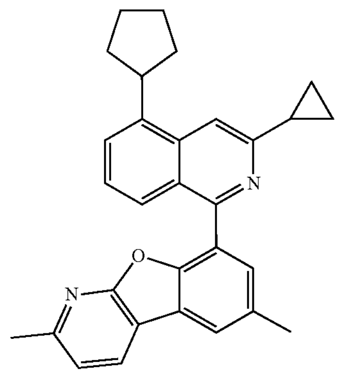
La1222
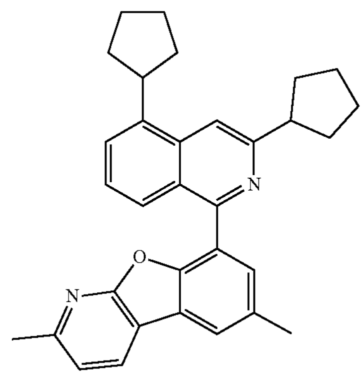
La1223
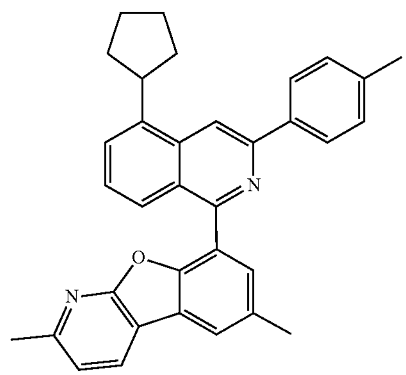
La1224

-continued
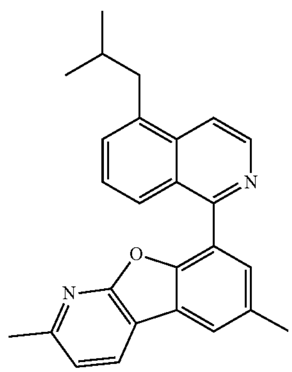
La1225
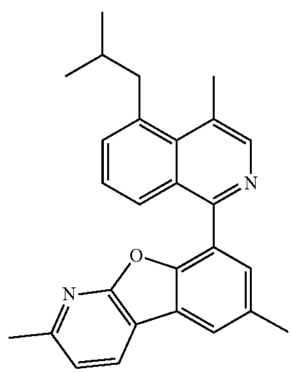
La1226
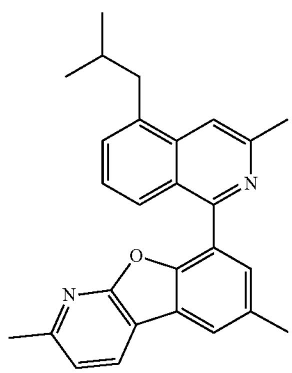
La1227
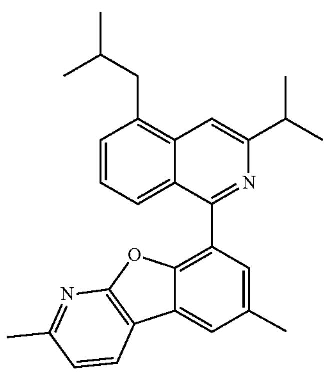
La1228
-continued
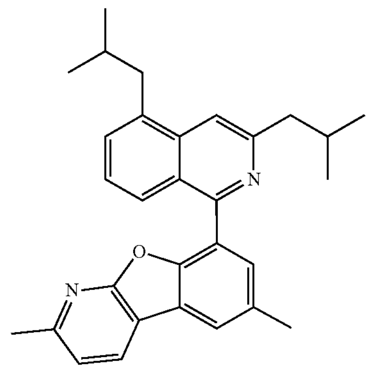
La1229
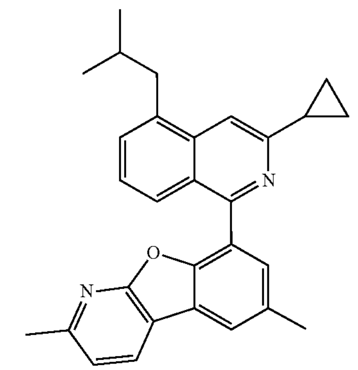
La1230
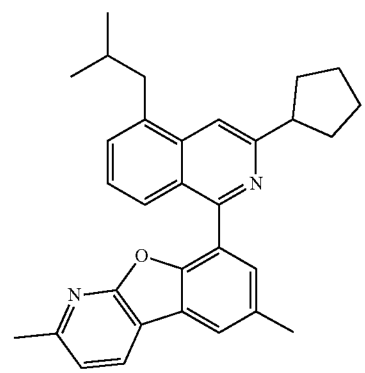
La1231
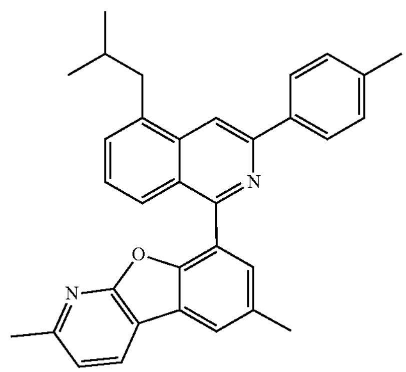
La1232

-continued
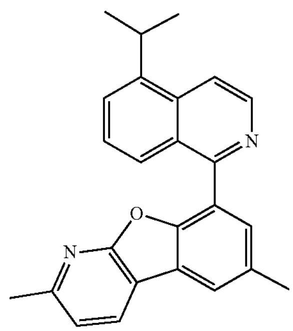
La1233
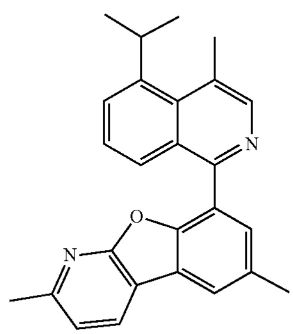
La1234
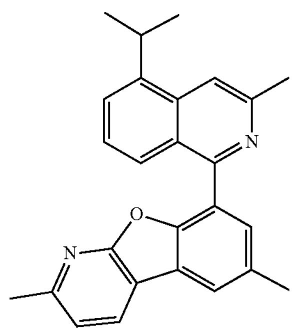
La1235
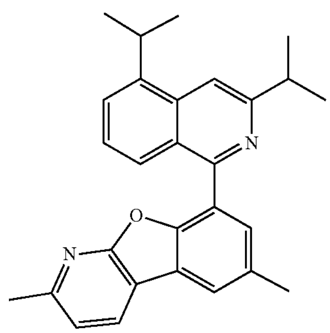
La1236
-continued
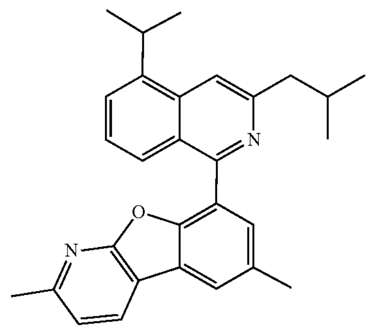
La1237
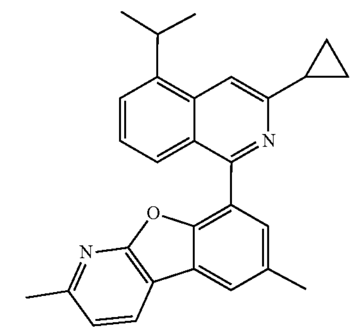
La1238
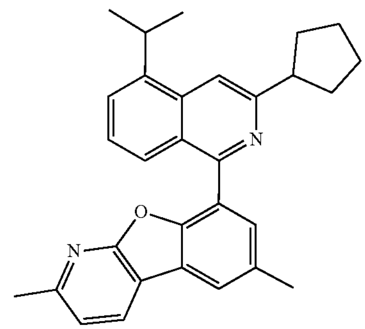
La1239
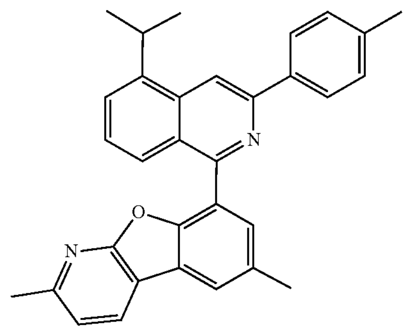
La1240

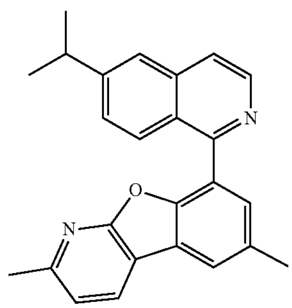
La1241
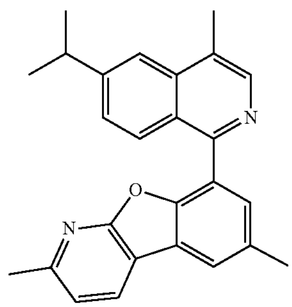
La1242
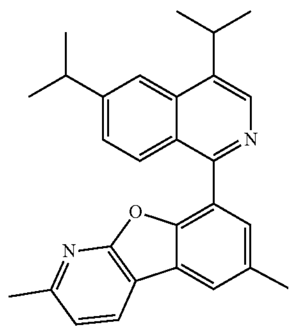
La1243
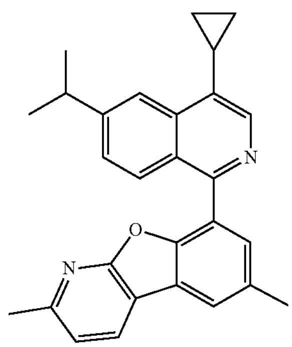
La1244
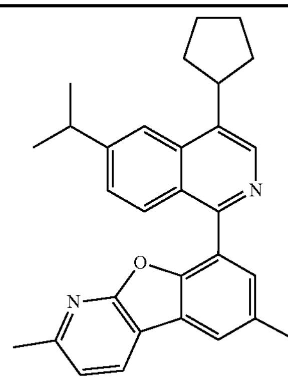
La1245
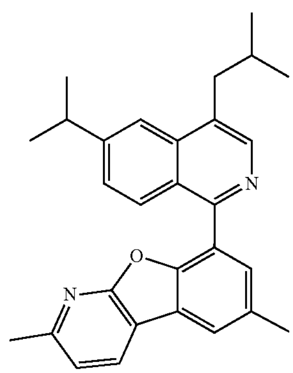
La1246
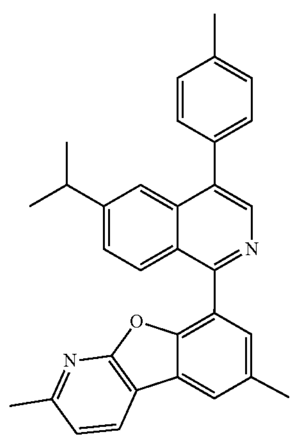
La1247
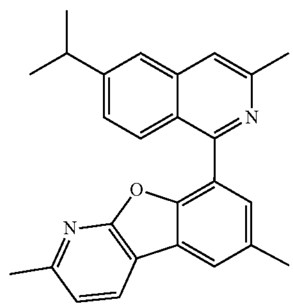
La1248

-continued
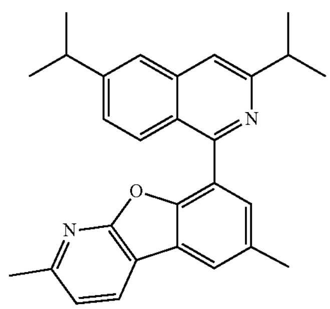
La1249
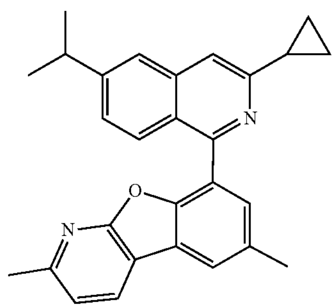
La1250
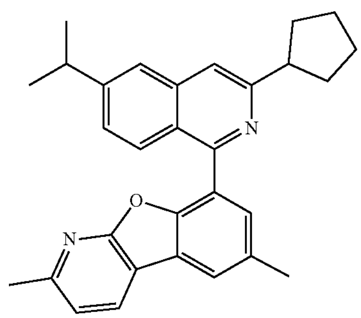
La1251
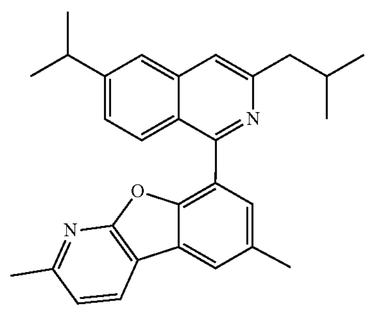
La1252
-continued
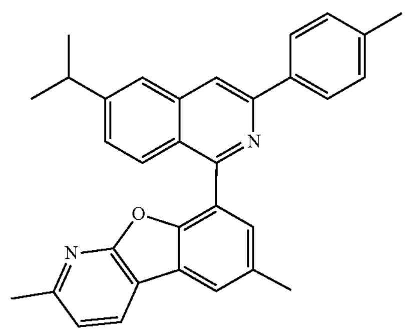
La1253
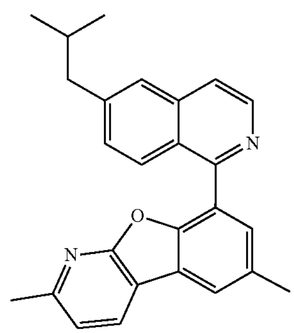
La1254
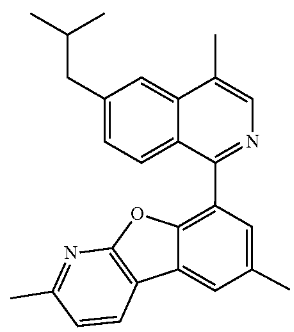
La1255
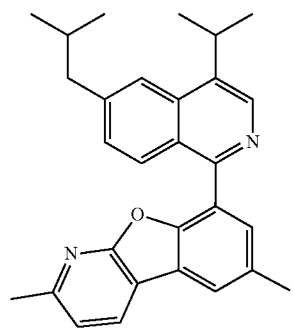
La1256

-continued
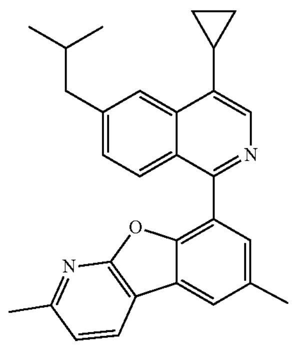
La1257
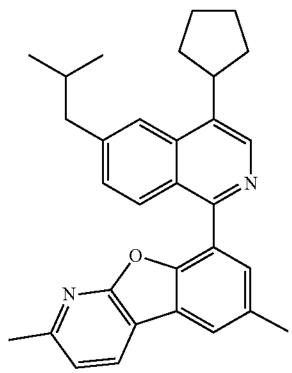
La1258
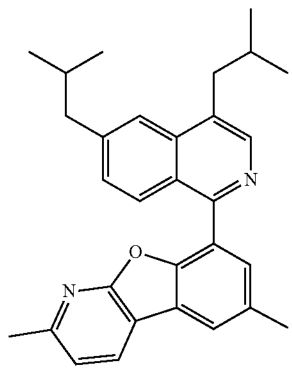
La1259
-continued
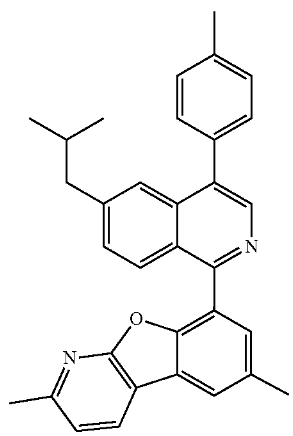
La1260
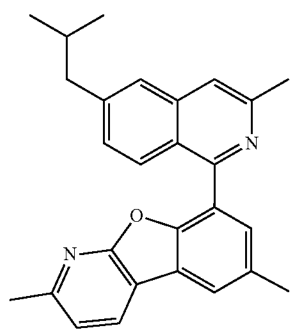
La1261
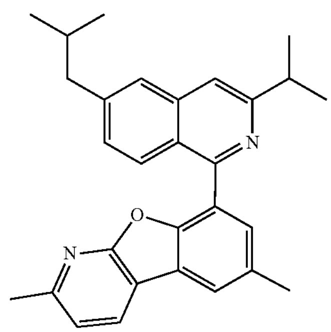
La1262
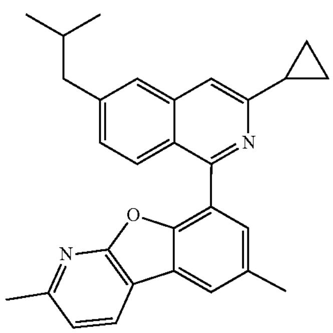
La1263

-continued
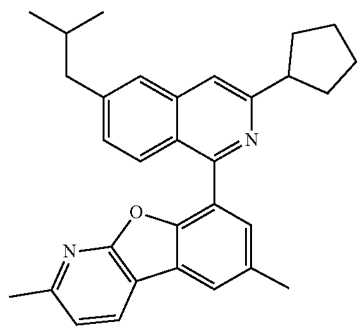
La1264
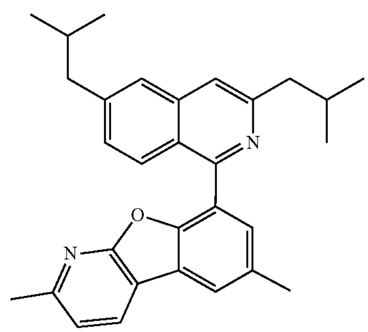
La1265
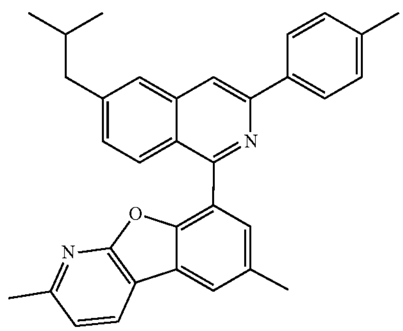
La1266
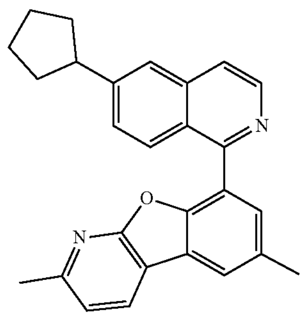
La1267
-continued
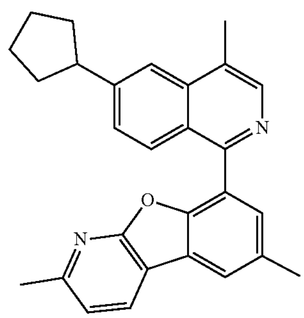
La1268
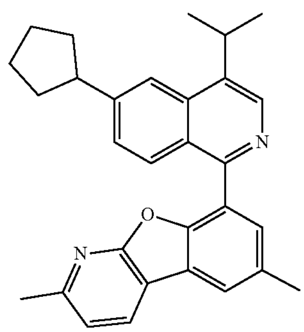
La1269
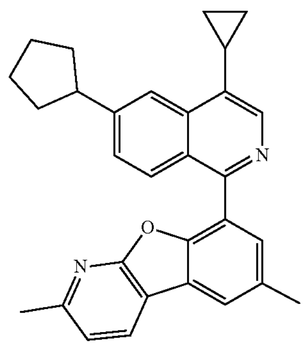
La1270
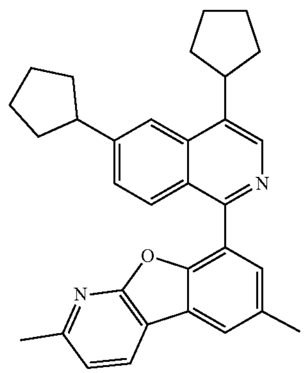
La1271

-continued
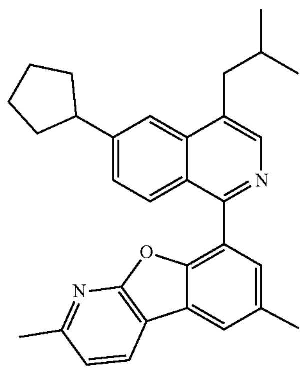
La1272
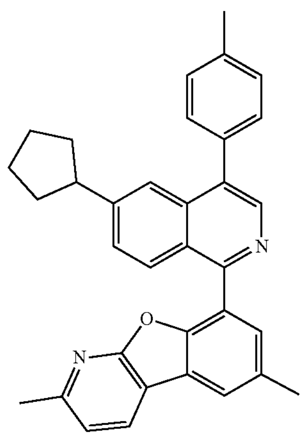
La1273
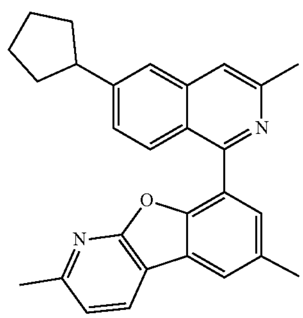
La1274
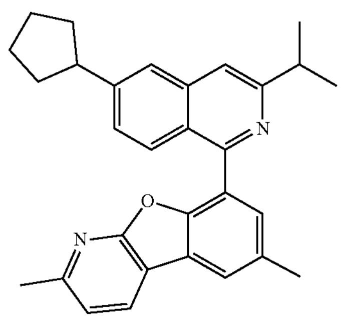
La1275
-continued
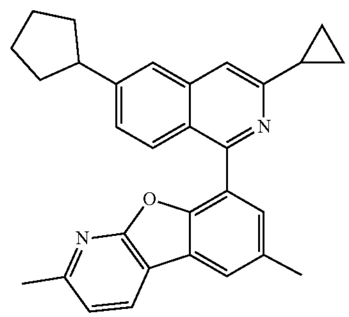
La1276
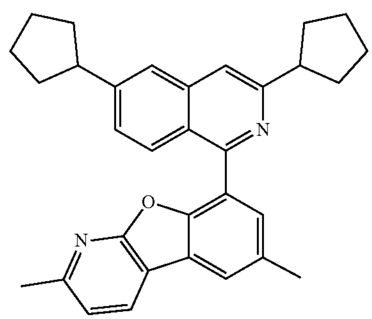
La1277
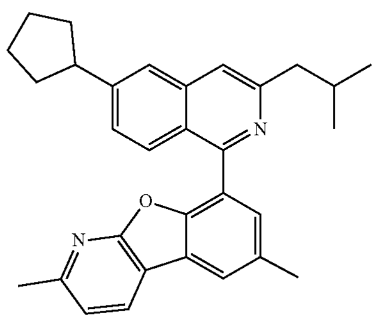
La1278
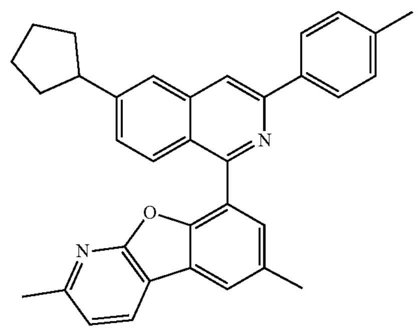
La1279

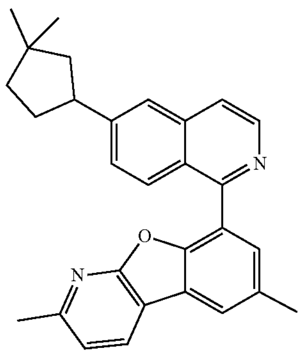
La1280
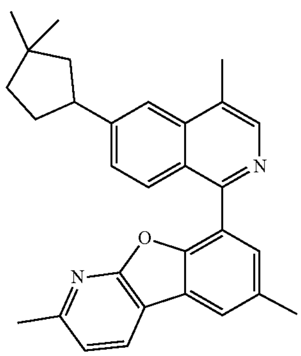
La1281
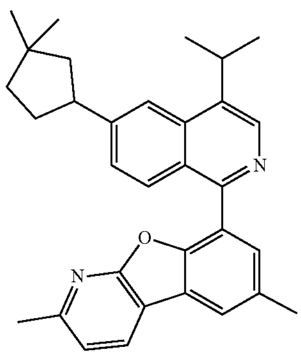
La1282
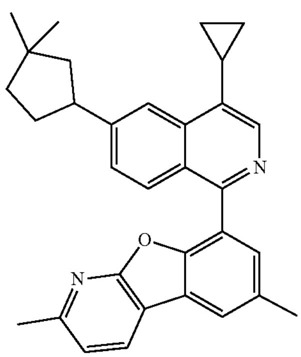
La1283
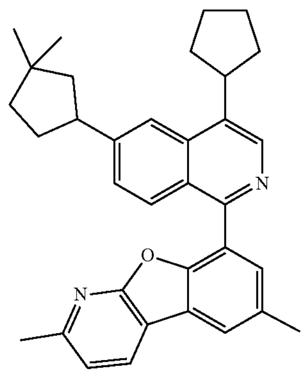
La1284
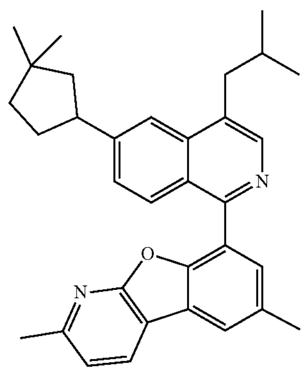
La1285
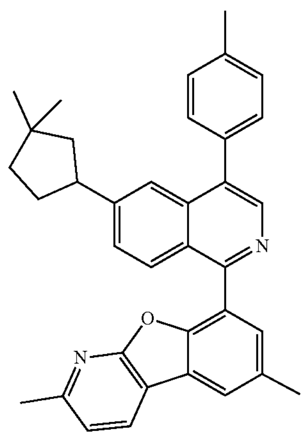
La1286

-continued
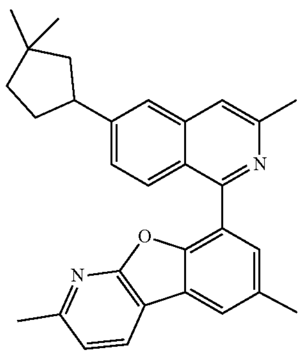
La1287
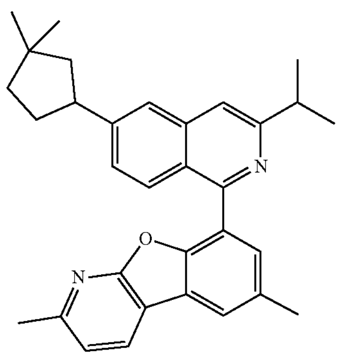
La1288
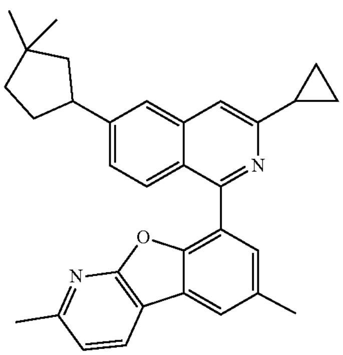
La1289
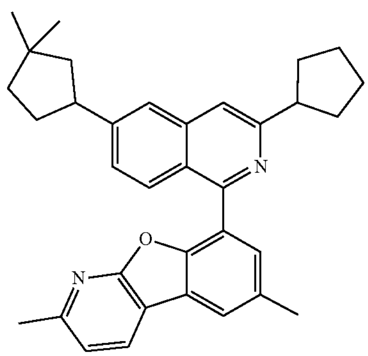
La1290
-continued
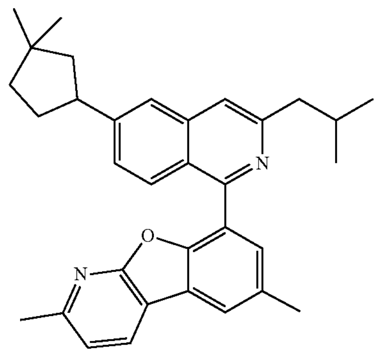
La1291
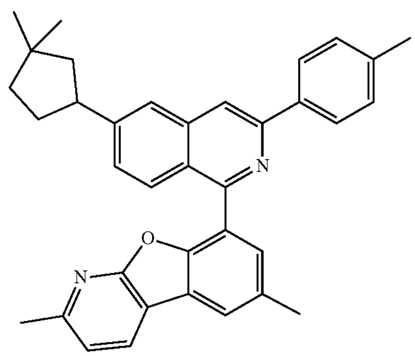
La1292
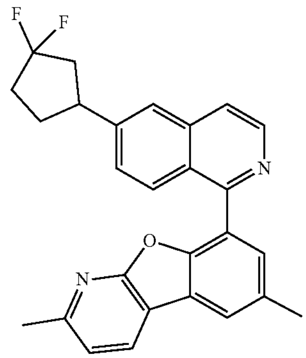
La1293
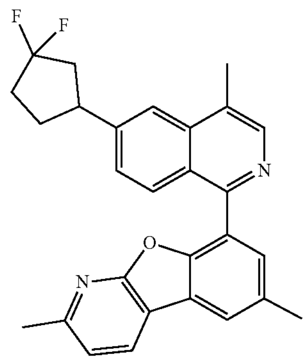
La1294

-continued
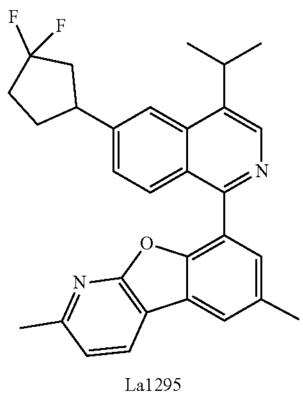 [SMILES: Cc1cc(-c2ncc(C(C)C)c3cc(C4CCC(F)(F)C4)ccc23)c2oc3nc(C)ccc3c2c1]
La1295
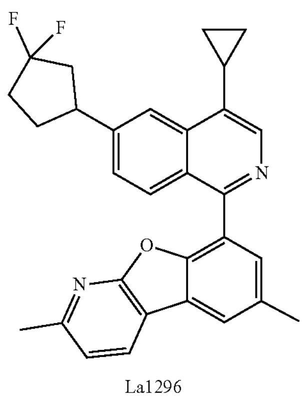 [SMILES: Cc1cc(-c2ncc(C3CC3)c3cc(C4CCC(F)(F)C4)ccc23)c2oc3nc(C)ccc3c2c1]
La1296
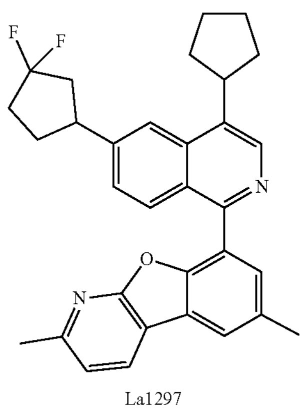 [SMILES: Cc1cc(-c2ncc(C3CCCC3)c3cc(C4CCC(F)(F)C4)ccc23)c2oc3nc(C)ccc3c2c1]
La1297
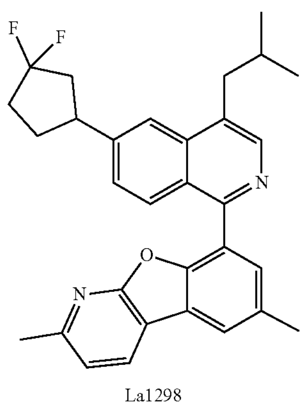 [SMILES: Cc1cc(-c2ncc(CC(C)C)c3cc(C4CCC(F)(F)C4)ccc23)c2oc3nc(C)ccc3c2c1]
La1298
-continued
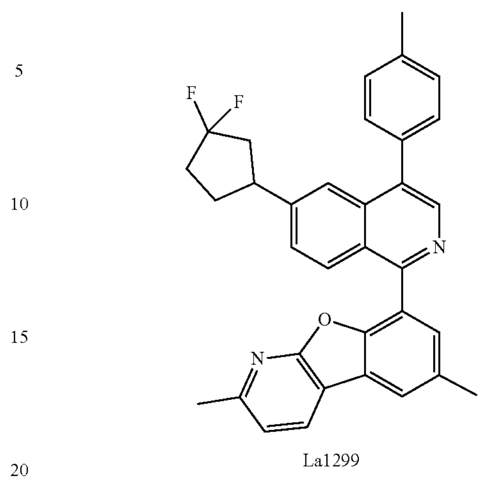
La1299
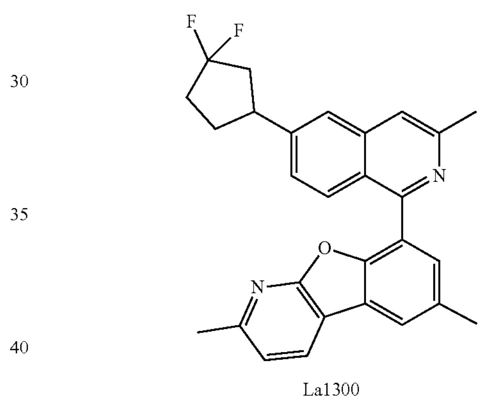
La1300
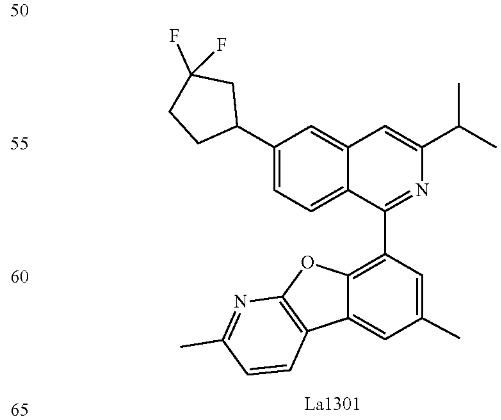
La1301

-continued

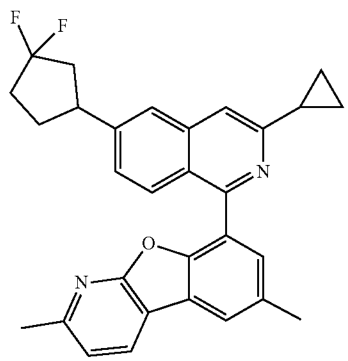

La1302

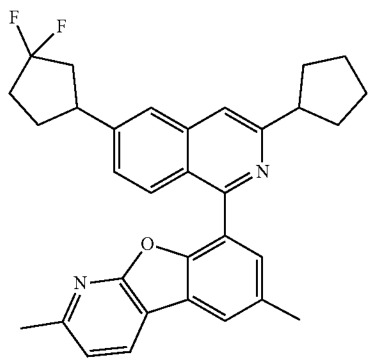

La1303

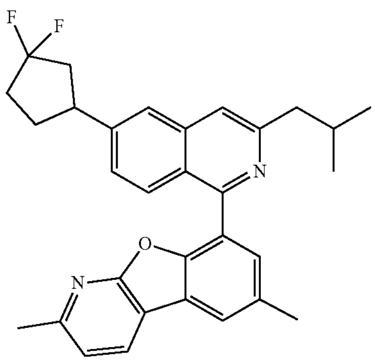

La1304

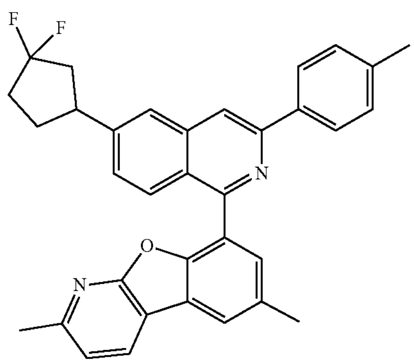

La1305

-continued

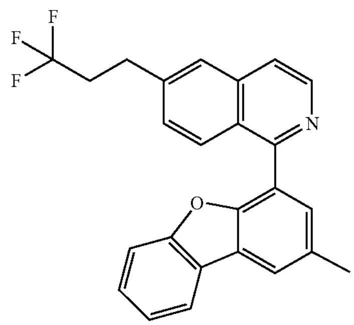

La1306

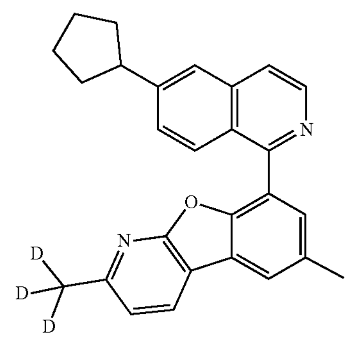 [SMILES: [2H]C([2H])([2H])c1ccc2c(n1)oc1c(-c3nccc4cc(C5CCCC5)ccc34)cc(C)cc12]

La, Lb, and Lc are different from each other, and any two of the three groups are connected to form a multidentate ligand, or the three groups are connected by a group; both the Lb and the Lc are a monoanionic bidentate ligand;

and the "different from each other" refers to having different parent nucleus structures, having a same parent nucleus structure with different substituents, or having a same parent nucleus structure with a same substituent at different positions.

2. The metal complex according to claim 1, wherein the Lb and the Lc are independently selected from any one of La1 to La1307 according to claim 1, corresponding parts or complete deuterides thereof, or corresponding parts or complete fluorides thereof; and the La, the Lb, and the Lc do not have a structure of the same number.

3. The metal complex according to claims 1, wherein the Lb and the Lc are independently selected from one of the following structural formulas (a) to (k):

Formula (a)

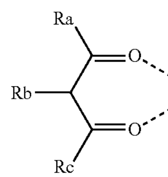

Formula (b)

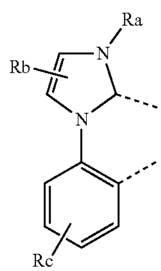

Formula (c)

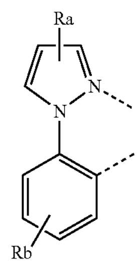

Formula (d)

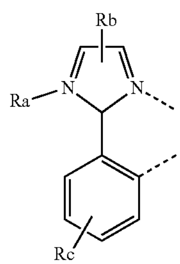

Formula (e)

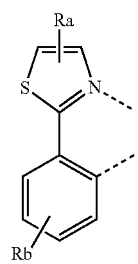

Formula (f)

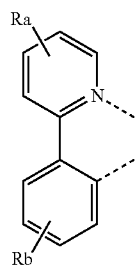

Formula (g)

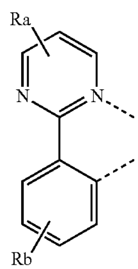

Formula (h)

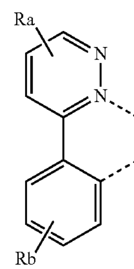

Formula (i)

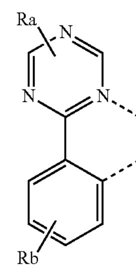

Formula (j)

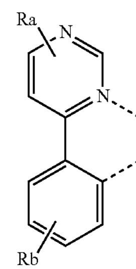

Formula (k)

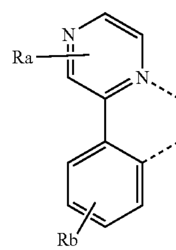

a dotted line refers to a bond connected to metal iridium;

the number of Ra, Rb, and Rc is a maximum substitution number;

the Ra, the Rb, and the Rc are independently selected from hydrogen, deuterium, halogen, substituted or unsubstituted $C_1$-$C_{20}$ alkyl, substituted or unsubstituted $C_3$-$C_{30}$ cycloalkyl, substituted or unsubstituted $C_1$-$C_{30}$ heteroalkyl, substituted or unsubstituted $C_7$-$C_{30}$ aralkyl, substituted or unsubstituted $C_1$-$C_{20}$ alkoxy, substituted or unsubstituted $C_6$-$C_{30}$ aryloxy, substituted or unsubstituted $C_2$-$C_{20}$ alkenyl, substituted or unsubstituted $C_3$-$C_{30}$ silyl, substituted or unsubstituted $C_6$-$C_{30}$ aryl, substituted or unsubstituted $C_3$-$C_{30}$ heteroaryl, substituted or unsubstituted $C_3$-$C_{30}$ arylsilyl, substituted or unsubstituted $C_0$-$C_{20}$ amino, cyano, nitrile, isonitrile, and phosphino; or two adjacent substituents are optionally connected into a ring or fused structure;

the "substituted" refers to substitution with deuterium, F, Cl, Br, $C_1$-$C_{10}$ alkyl, $C_1$-$C_{10}$ alkoxy, $C_3$-$C_{10}$ cycloalkyl, amino substituted with $C_1$-$C_{10}$ alkyl, $C_6$-$C_{30}$ aryl, $C_7$-$C_{30}$ aralkyl, cyano, nitrile, isonitrile, and phosphino;

and a heteroatom in the heteroalkyl or heteroaryl is at least one of S, O, and N.

4. The metal complex according to claim 3, wherein the Lb and the Lc are independently selected from the following structural formulas, corresponding parts or complete deuterides thereof, or corresponding parts or complete fluorides thereof; and the Lb and the Lc are not a ligand of the same number.
L1
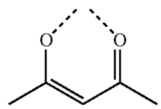
L2
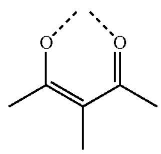
L3
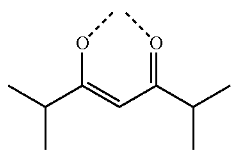
L4
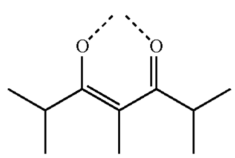
L5
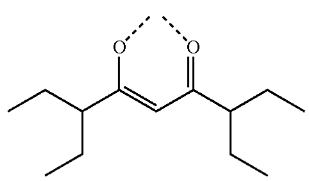
L6
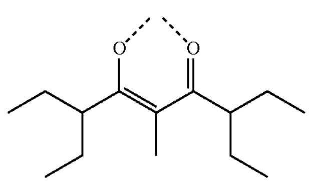
L7
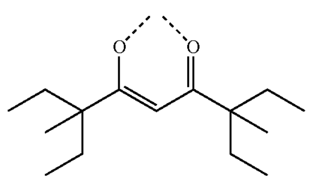
L8
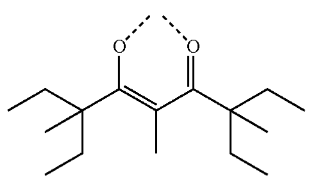
-continued
L9
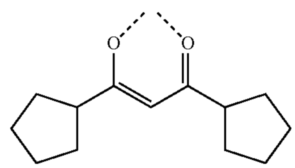
L10
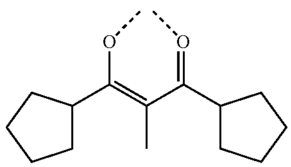
L11
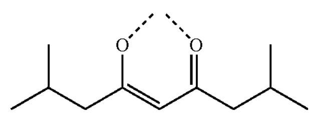
L12
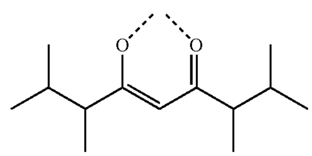
L13
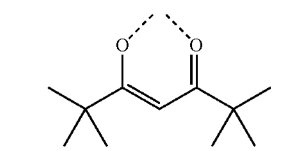
L14
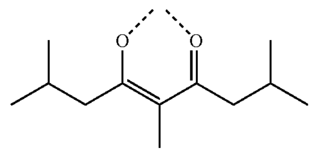
L15
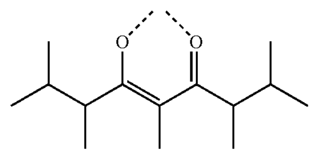
L16
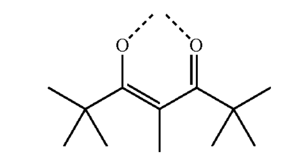
L17
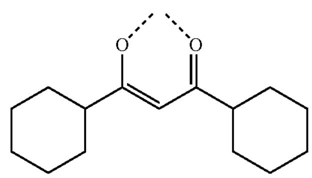
L18
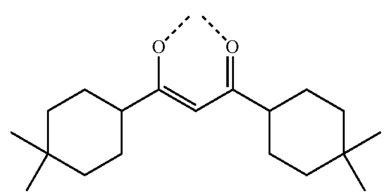

-continued
L19
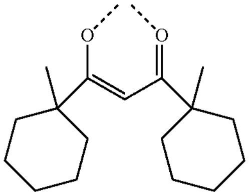
L20
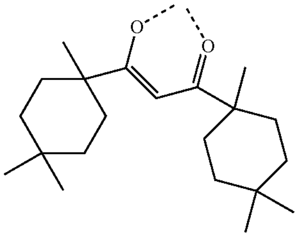
L21
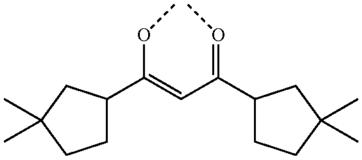
L22
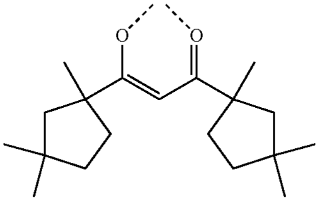
L23
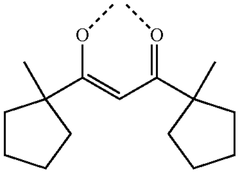
L24
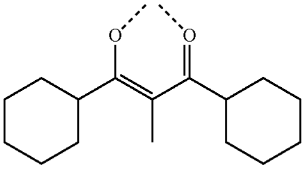
L25
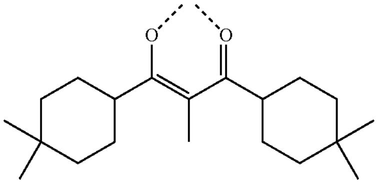
L26
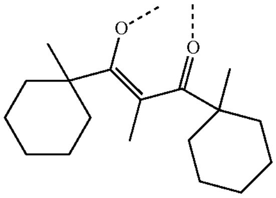
-continued
L27
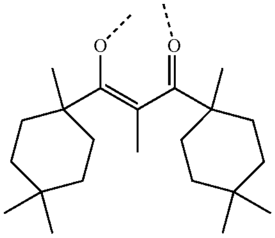
L28
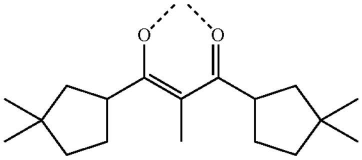
L29
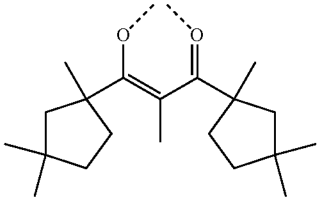
L30
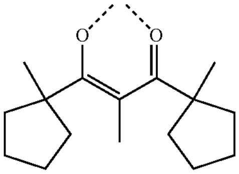
L31
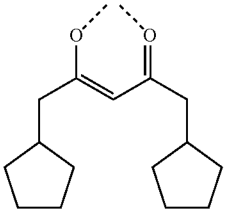
L32
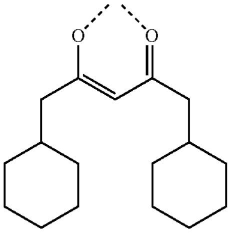
L33
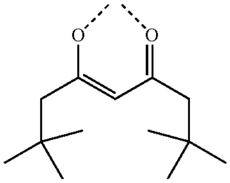

-continued
L34
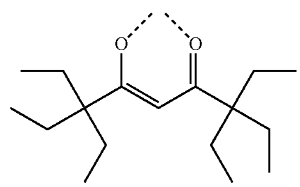
L35
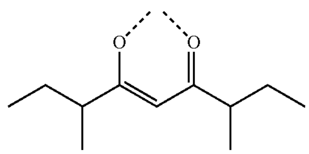
L36
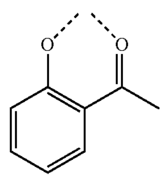
L37
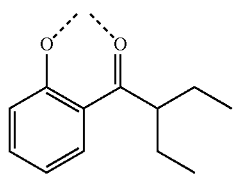
L38
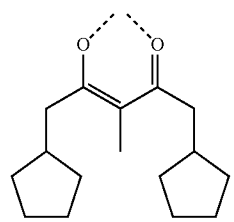
L39
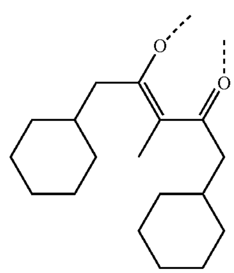
L40
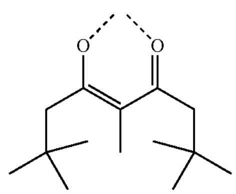
L41
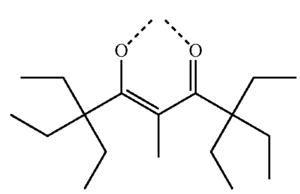
-continued
L42
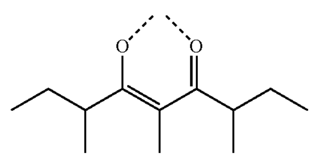
L43
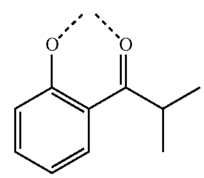
L44
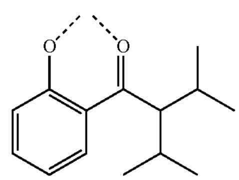
L45
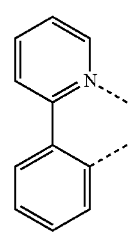
L46
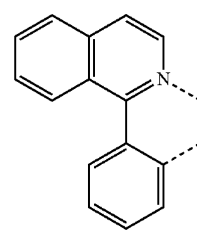
L47
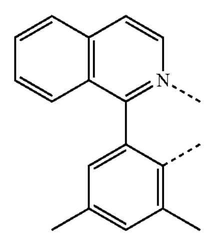
L48
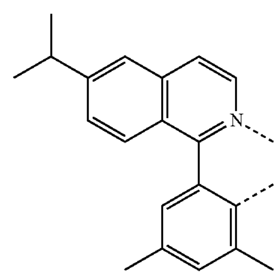

-continued
L49
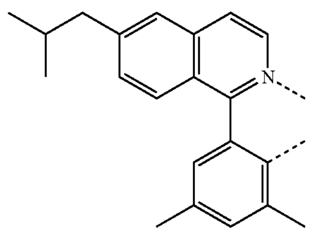
L50
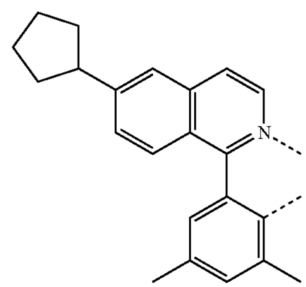
L51
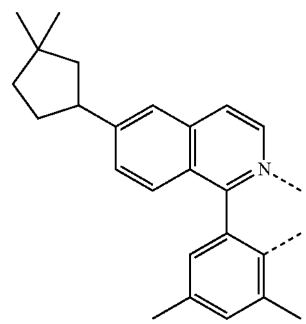
L52
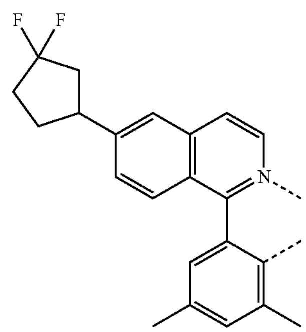
L53
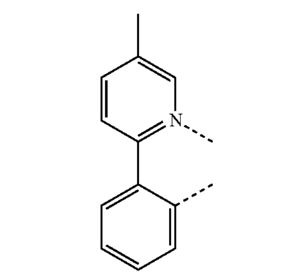
-continued
L54
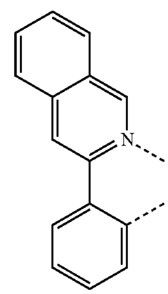
L55
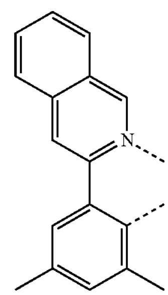
L56
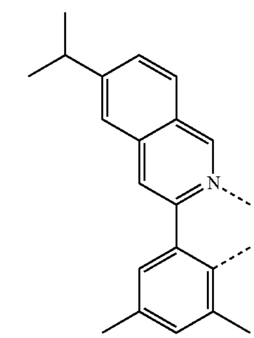
L57
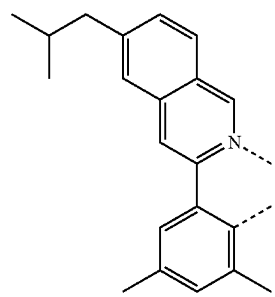
L58
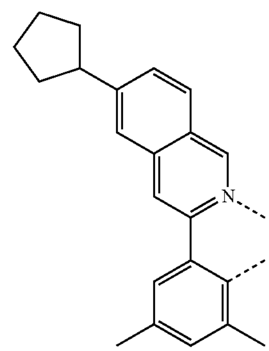

-continued
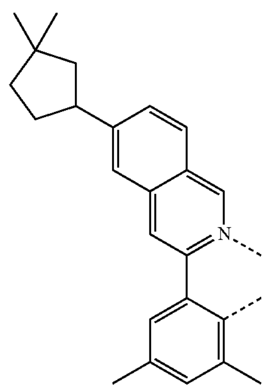
L59
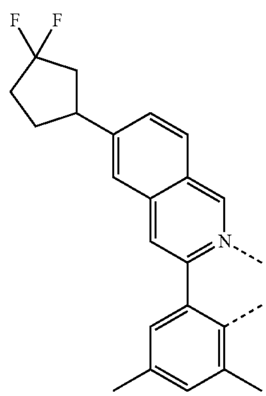
L60
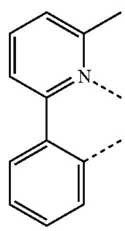
L61
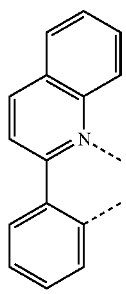
L62
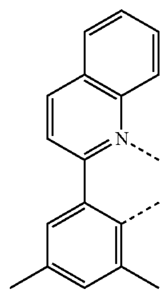
L63
-continued
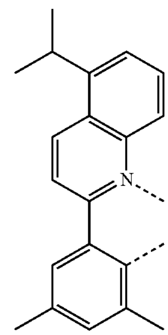
L64
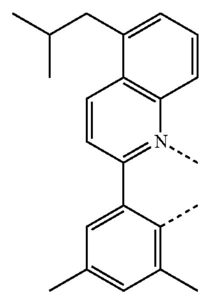
L65
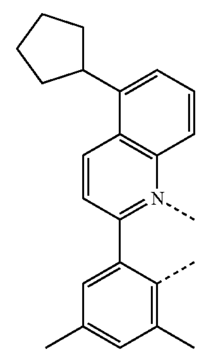
L66
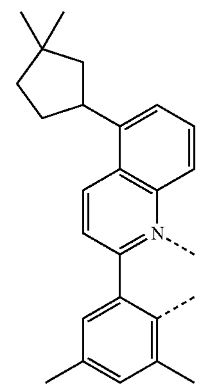
L67

L68
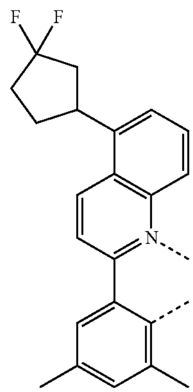
L69
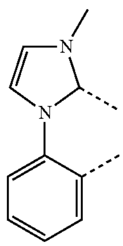
L70
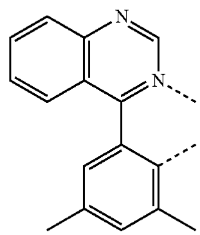
L71
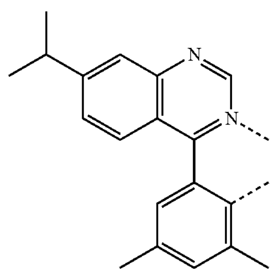
L72
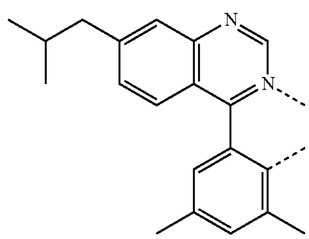
L73
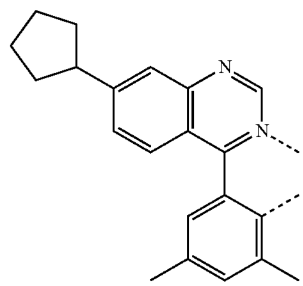
L74
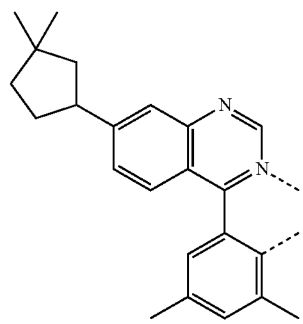
L75
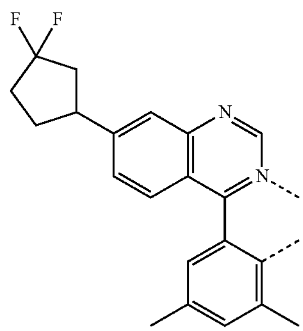
L76
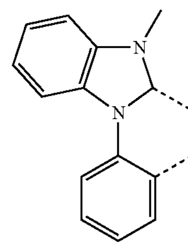
L77
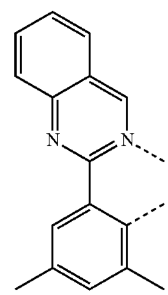

-continued
L78
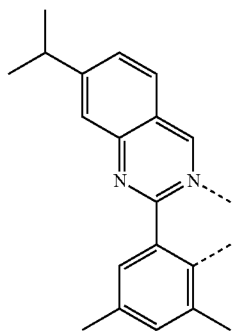
L79
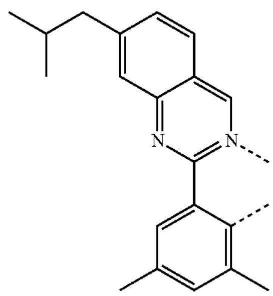
L80
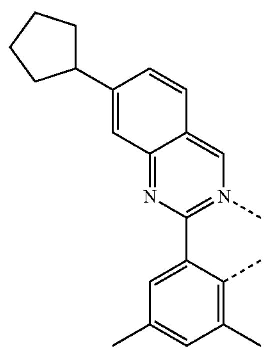
L81
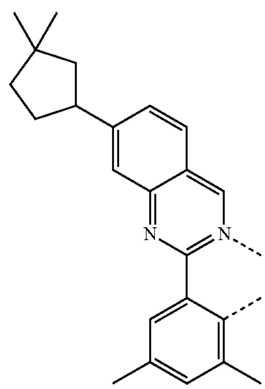
-continued
L82
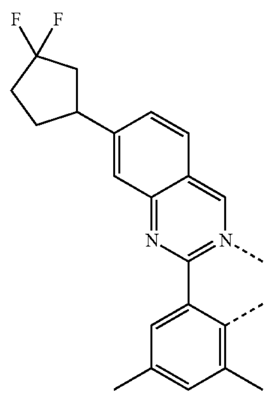
L83
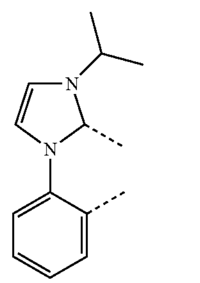
L84
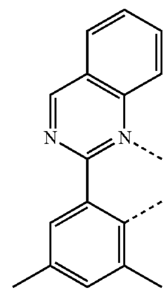
L85
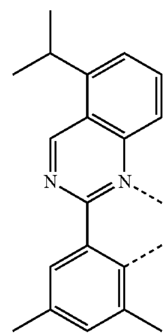
L86
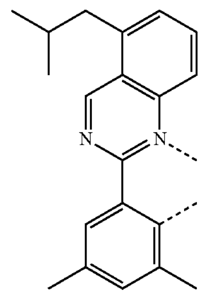

-continued
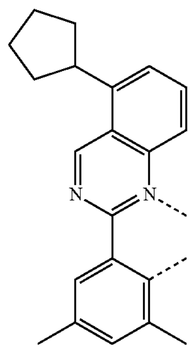
L87
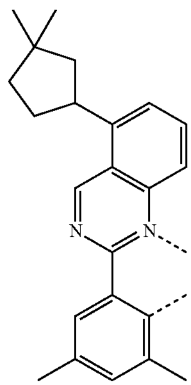
L88
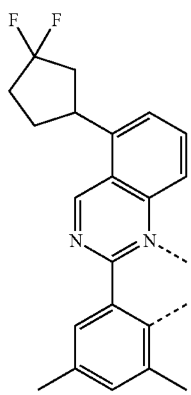
L89
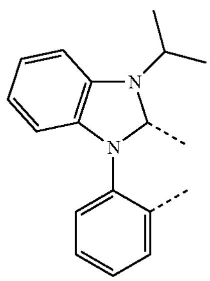
L90
-continued
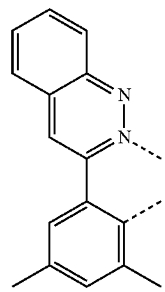
L91
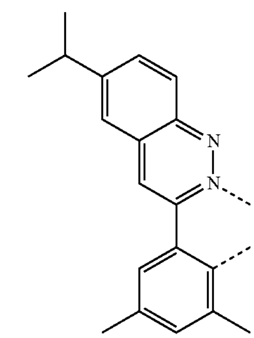
L92
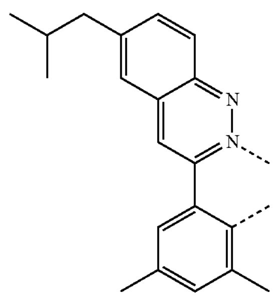
L93
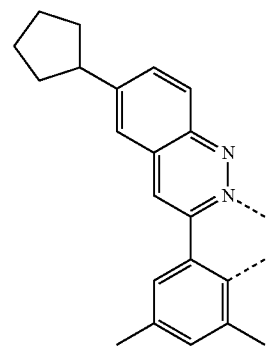
L94

L95
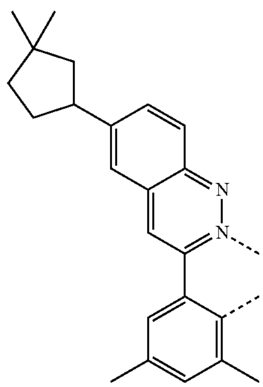
L96
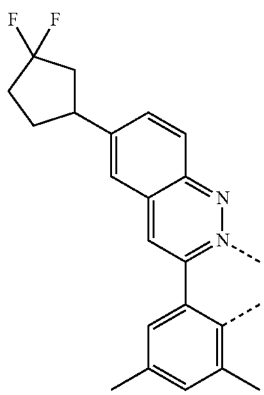
L97
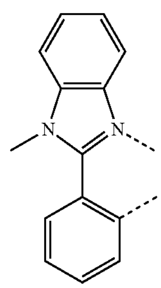
L98
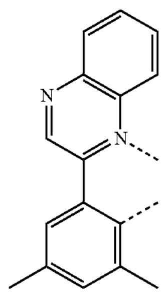
L99
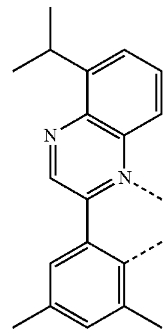
L100
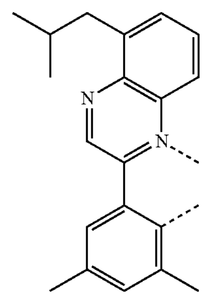
L101
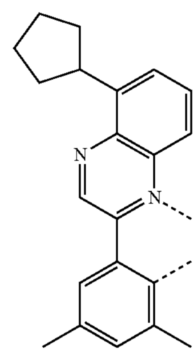
L102
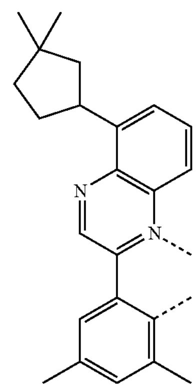

-continued
L103
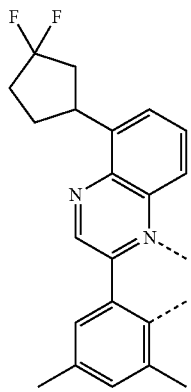
L104
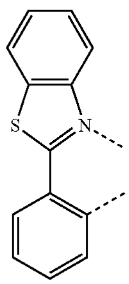
L105
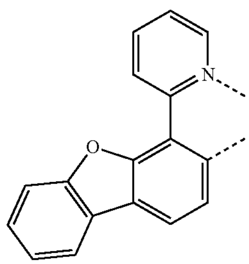
L106
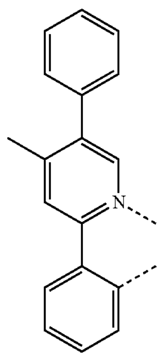
L107
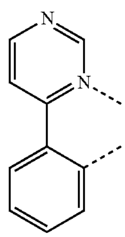
-continued
L108
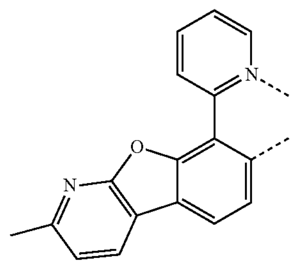
L109
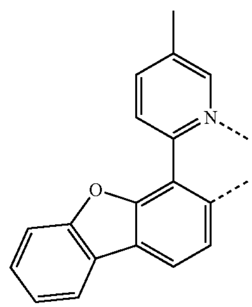
L110
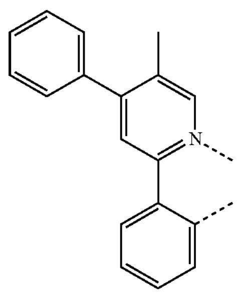
L111
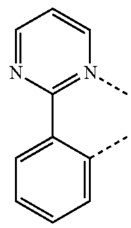
L112
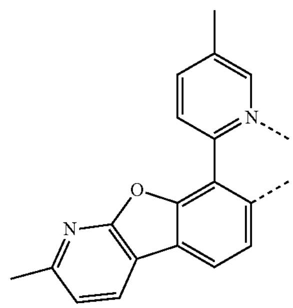

-continued
L113
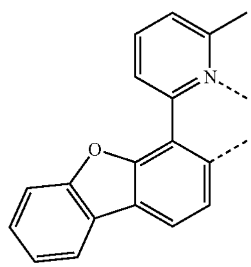
L114
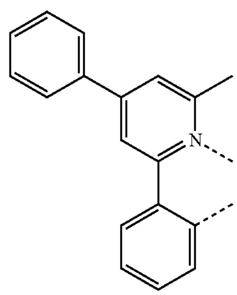
L115
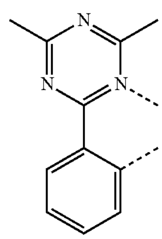
L116
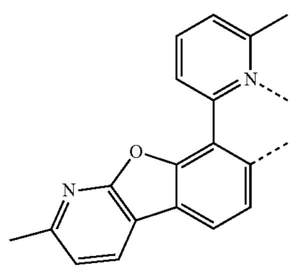
L117
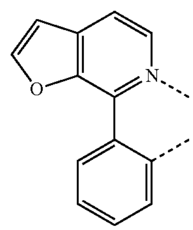
L118
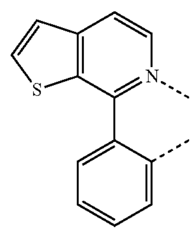
-continued
L119
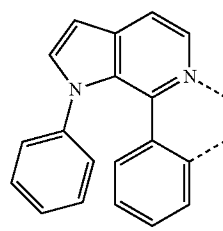
L120
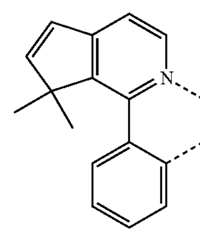
L121
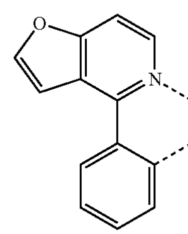
L122
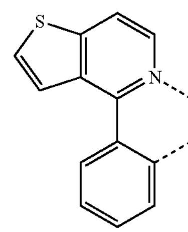
L123
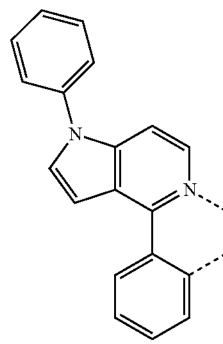
L124
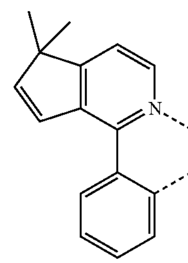

-continued
L125
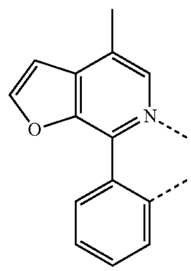
L126
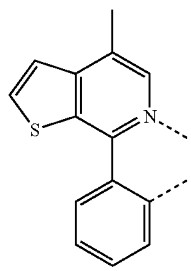
L127
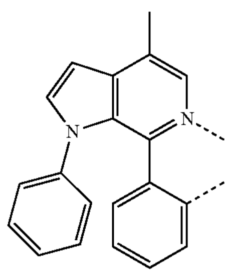
L128
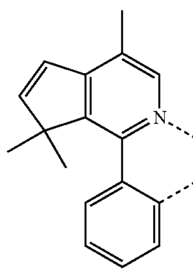
L129
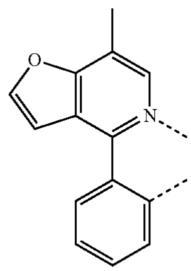
L130
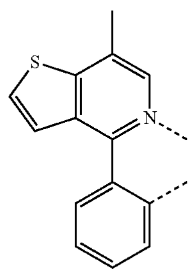
-continued
L131
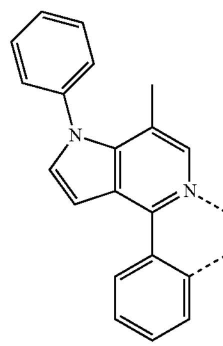
L132
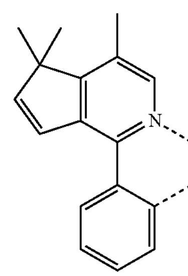
L133
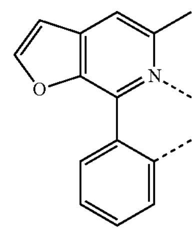
L134
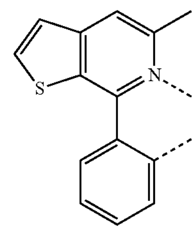
L135
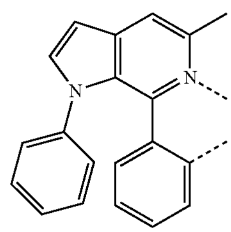
L136
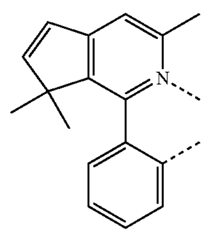

-continued
L137
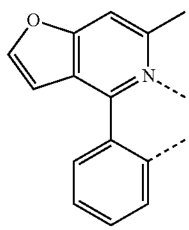
L138
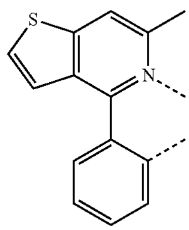
L139
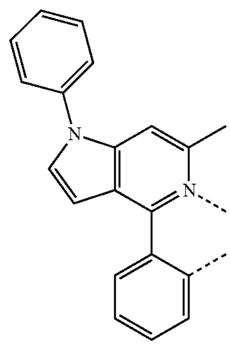
L140
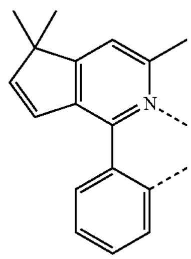
L141
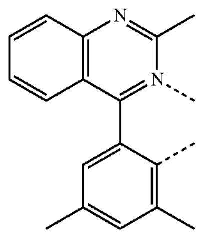
L142
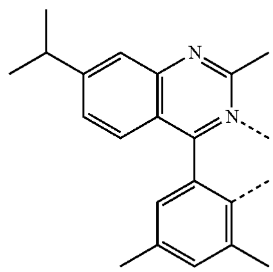
-continued
L143
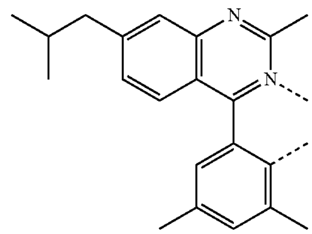
L144
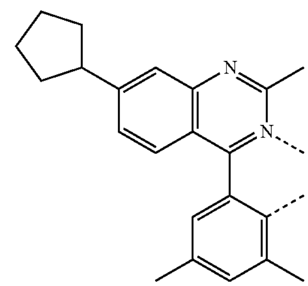
L145
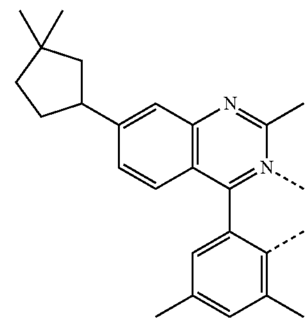
L146
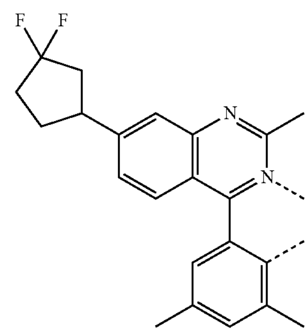
L147
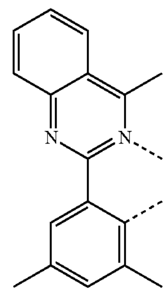

-continued
L148
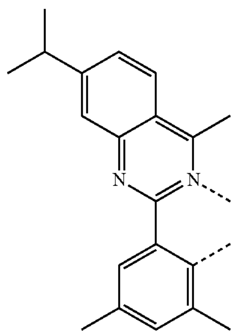
L149
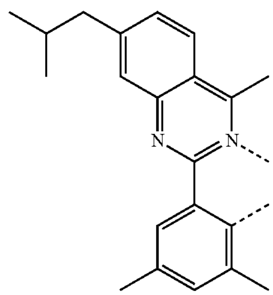
L150
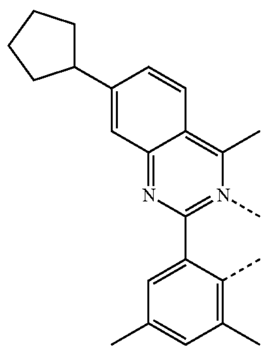
L151
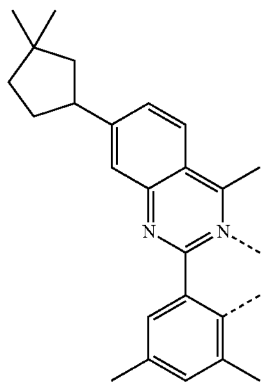
-continued
L152
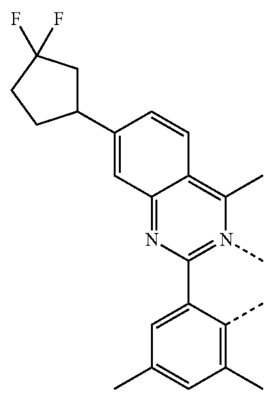
L153
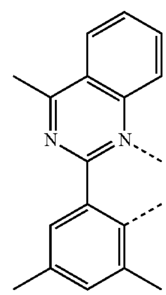
L154
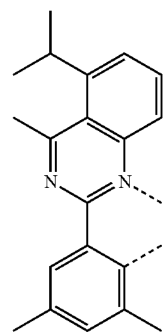
L155
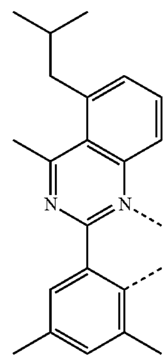

-continued
L156
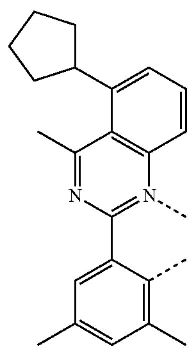
L157
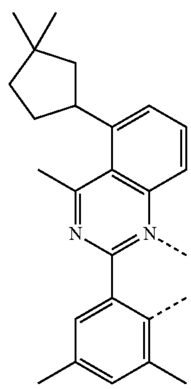
L158
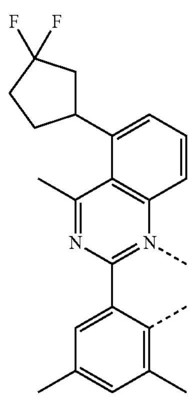
L159
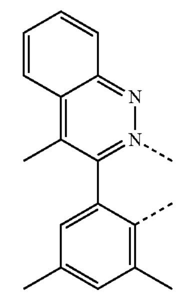
-continued
L160
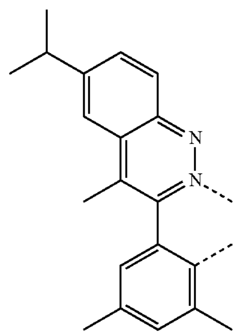
L161
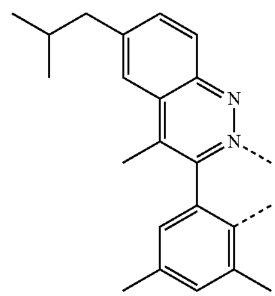
L162
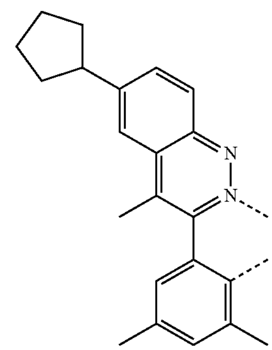
L163
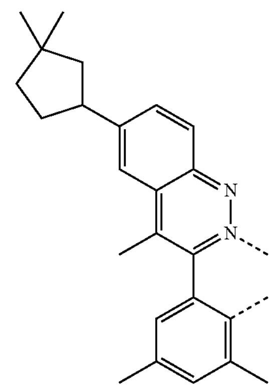

-continued
L164
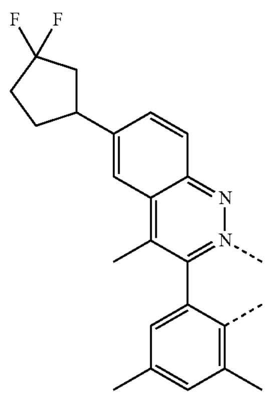
L165
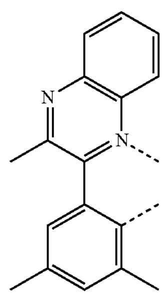
L166
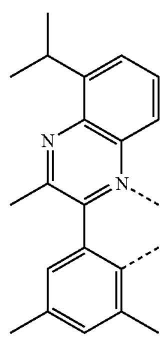
L167
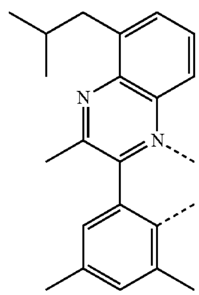
-continued
L168
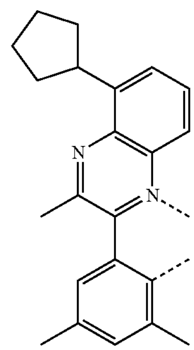
L169
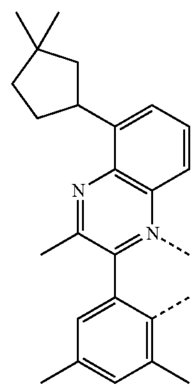
L170
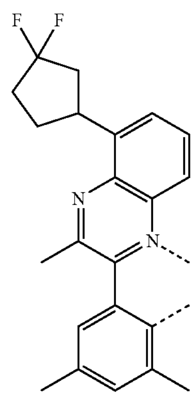
L171
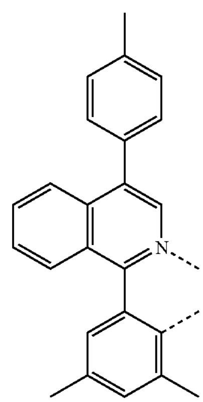

-continued
L172
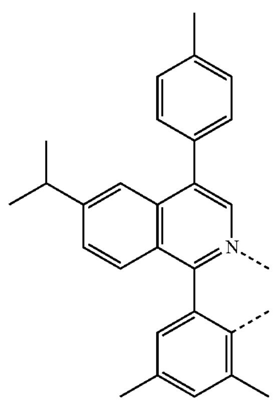
L173
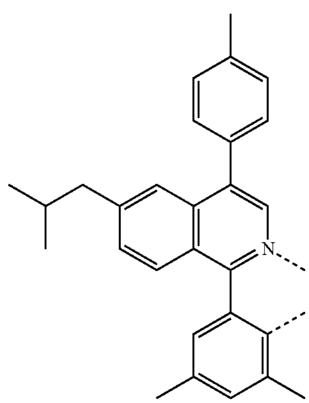
L174
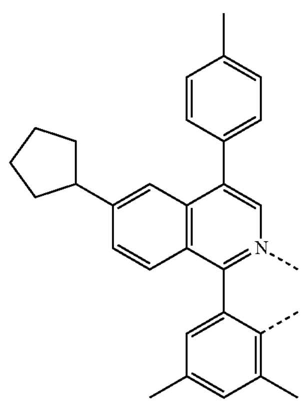
L175
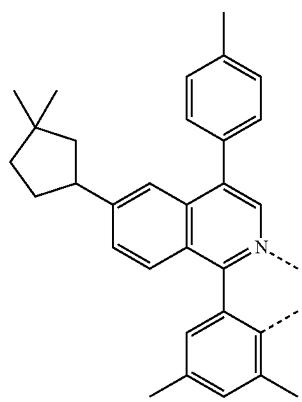
-continued
L176
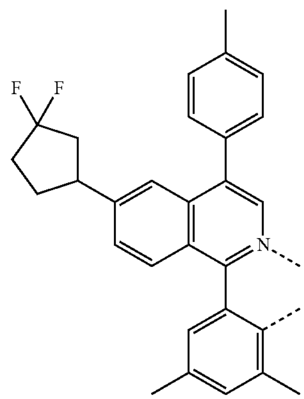
L177
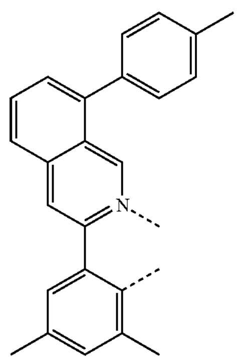
L178
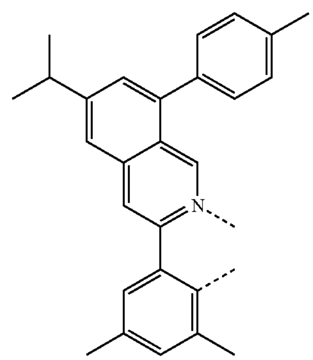
L179
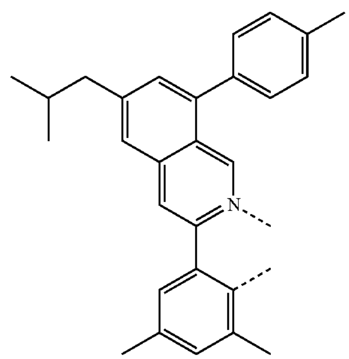

-continued
L180
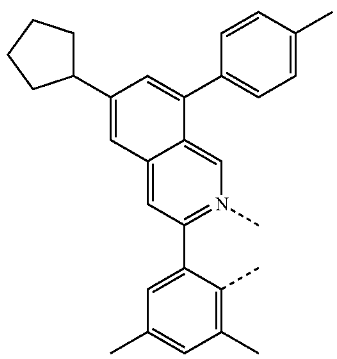
L181
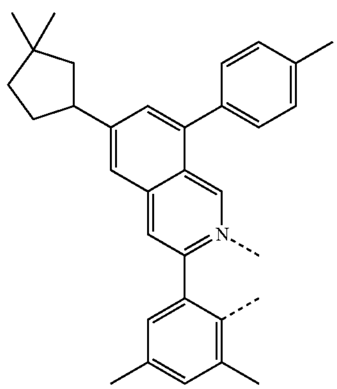
L182
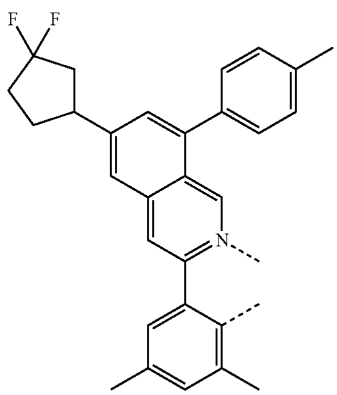
L183
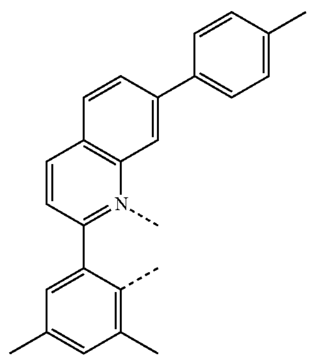
-continued
L184
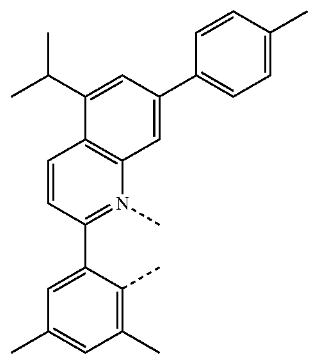
L185
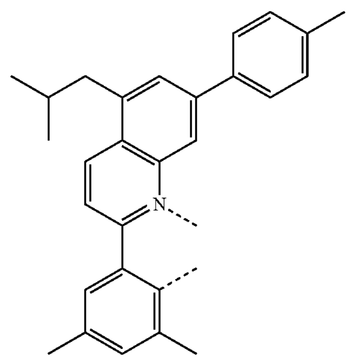
L186
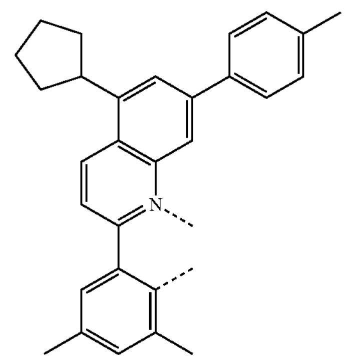
L187
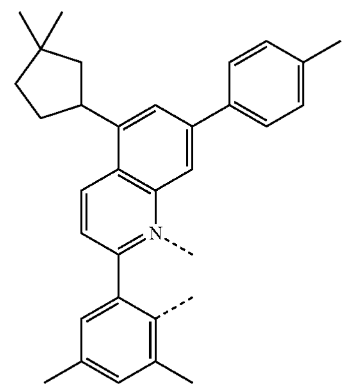

-continued
L188
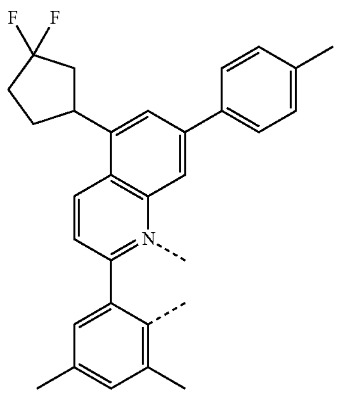
L189
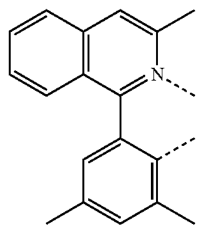
L190
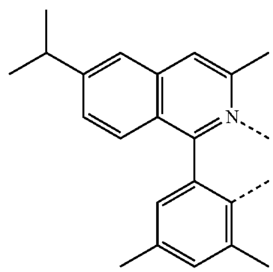
L191
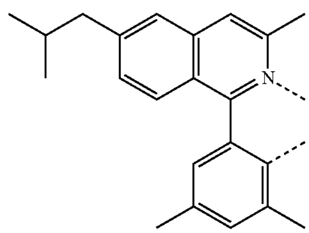
L192
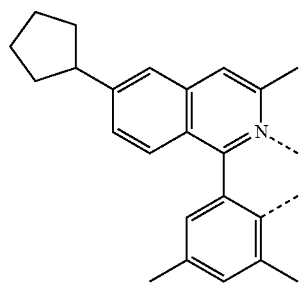
-continued
L193
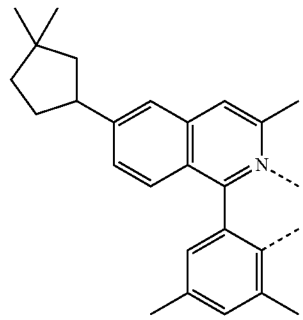
L194
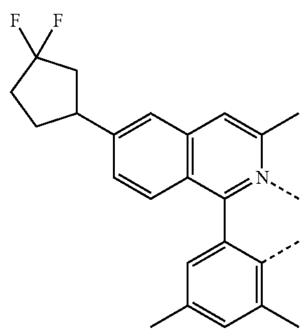
L195
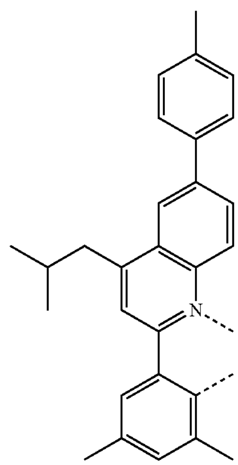
L196
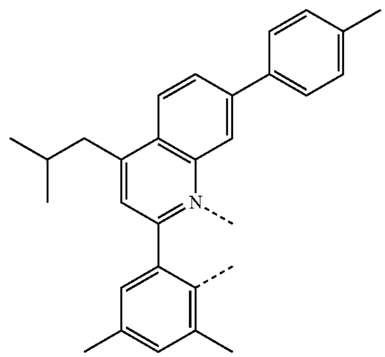

-continued
L197
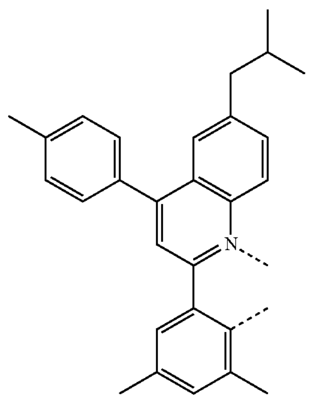
L198
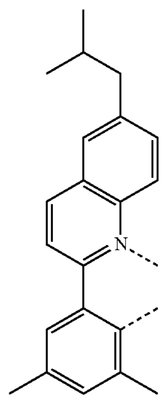
L199
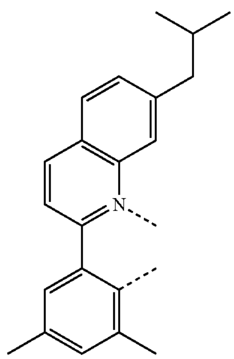
L200
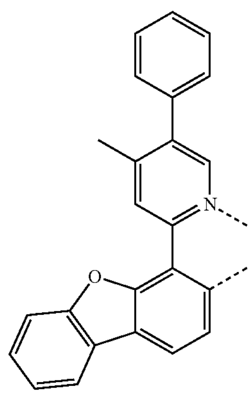
-continued
L201
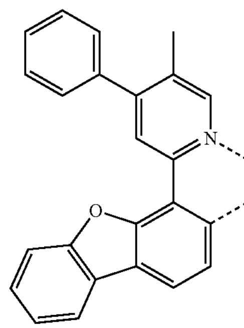
L202
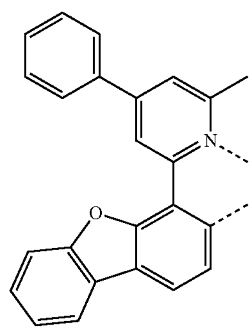
L203
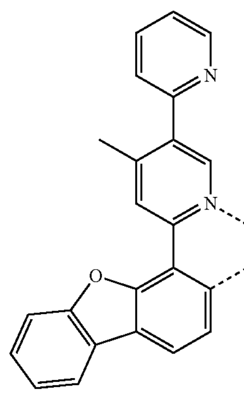
L204
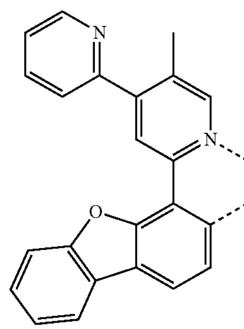

-continued
L205
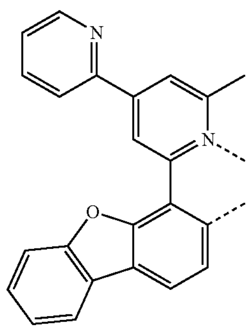
L206
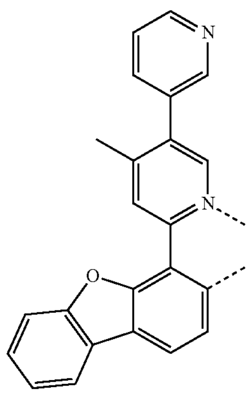
L207
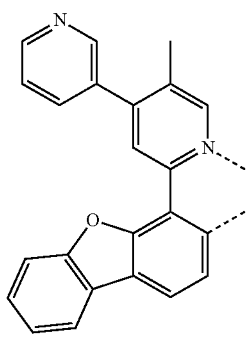
L208
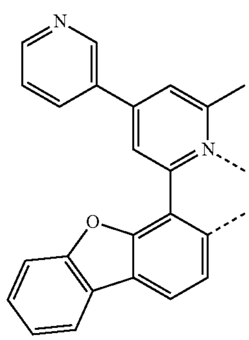
-continued
L209
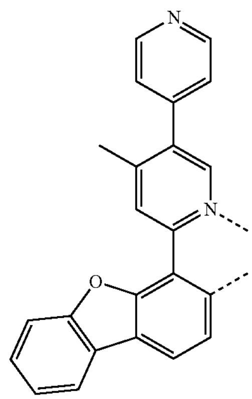
L210
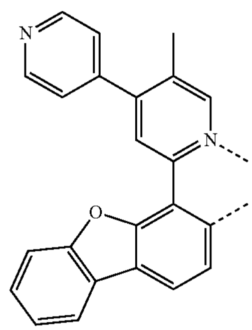
L211
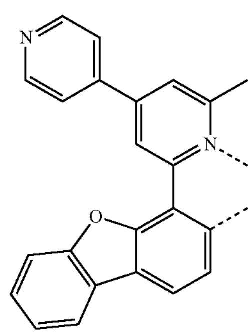
L212
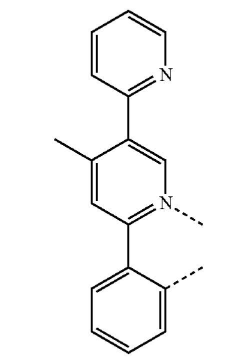

-continued
L213
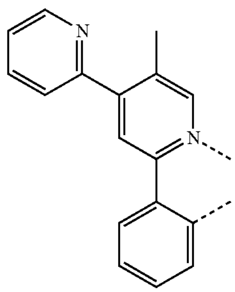
L214
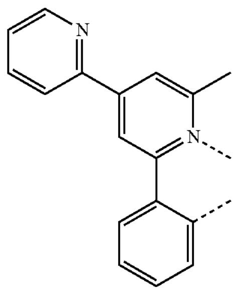
L215
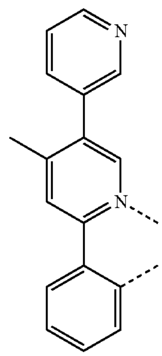
L216
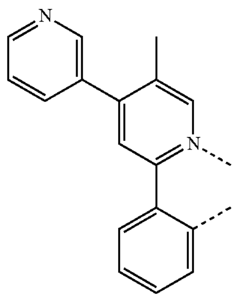
L217
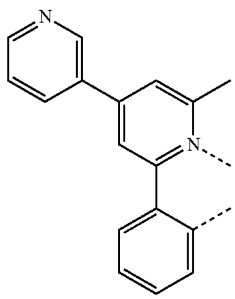
-continued
L218
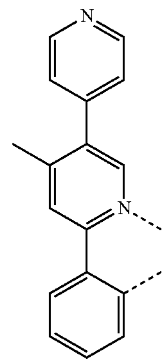
L219
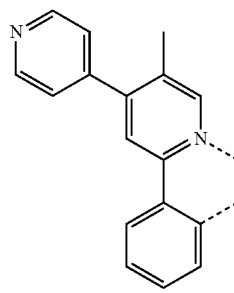
L220
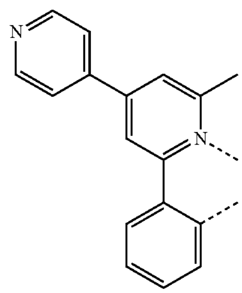
L221
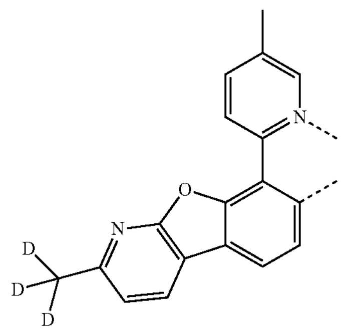
L222
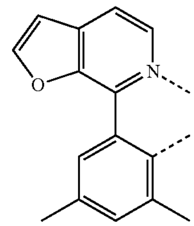
5. An electroluminescent device, comprising a cathode, an anode, and organic layers arranged between the cathode and the anode, wherein at least one of the organic layers comprises the metal complex according to claim 1.

6. The electroluminescent device according to claim 5, wherein the organic layers comprise a light-emitting layer, and the metal complex is used a red light-emitting doping material for the light-emitting layer; or the organic layers comprise a hole injection layer, and the metal complex is used as a hole injection material for the hole injection layer.

7. An electroluminescent device, comprising a cathode, an anode, and organic layers arranged between the cathode and the anode, wherein at least one of the organic layers comprises the metal complex according to claims 2.

8. The electroluminescent device according to claim 7, wherein the organic layers comprise a light-emitting layer, and the metal complex is used a red light-emitting doping material for the light-emitting layer; or the organic layers comprise a hole injection layer, and the metal complex is used as a hole injection material for the hole injection layer.

9. An electroluminescent device, comprising a cathode, an anode, and organic layers arranged between the cathode and the anode, wherein at least one of the organic layers comprises the metal complex according to claims 3.

10. The electroluminescent device according to claim 9, wherein the organic layers comprise a light-emitting layer, and the metal complex is used a red light-emitting doping material for the light-emitting layer; or the organic layers comprise a hole injection layer, and the metal complex is used as a hole injection material for the hole injection layer.

11. An electroluminescent device, comprising a cathode, an anode, and organic layers arranged between the cathode and the anode, wherein at least one of the organic layers comprises the metal complex according to claims 4.

12. The electroluminescent device according to claim 11, wherein the organic layers comprise a light-emitting layer, and the metal complex is used a red light-emitting doping material for the light-emitting layer; or the organic layers comprise a hole injection layer, and the metal complex is used as a hole injection material for the hole injection layer.

* * * * *